United States Patent
Tagawa et al.

(10) Patent No.: US 6,832,293 B1
(45) Date of Patent: Dec. 14, 2004

(54) AUDIO PLAYBACK APPARATUS AND METHOD FOR RESUMING INTERRUPTED PLAYBACK RECORDING

(75) Inventors: Kenji Tagawa, Katano (JP); Hideki Matsushima, Studio City, CA (US); Teruto Hirota, Moriguchi (JP); Tomokazu Ishikawa, Toyonaka (JP); Shinji Inoue, Neyagawa (JP); Masayuki Kozuka, Arcadia, CA (US)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/580,909

(22) Filed: May 26, 2000

(30) Foreign Application Priority Data

| May 28, 1999 | (JP) | 11-149893 |
| Aug. 24, 1999 | (JP) | 11-236724 |
| Dec. 28, 1999 | (JP) | 11-372605 |

(51) Int. Cl.$^7$ .............................................. G06F 12/02
(52) U.S. Cl. ................................ 711/115; 711/5; 711/4; 711/111; 711/103; 369/30.36; 369/83
(58) Field of Search ................................ 711/4, 5, 114, 711/115, 103; 369/30.36, 83

(56) References Cited

U.S. PATENT DOCUMENTS

| 5,122,999 | A | * | 6/1992 | Kimura et al. | 369/30.36 |
| 5,510,924 | A | | 4/1996 | Terui et al. | 359/43 |
| 5,689,704 | A | * | 11/1997 | Yoshida et al. | 711/111 |
| 6,188,650 | B1 | * | 2/2001 | Hamada et al. | 369/30.36 |
| 6,199,076 | B1 | * | 3/2001 | Logan et al. | 715/501.1 |
| 6,388,961 | B1 | * | 5/2002 | Ijichi | 369/30.36 |
| 6,434,103 | B1 | * | 8/2002 | Shitara et al. | 369/83 |
| 6,606,707 | B1 | * | 8/2003 | Hirota et al. | 713/172 |

FOREIGN PATENT DOCUMENTS

| EP | 0 5233 452 | 1/1993 |
| EP | 0 883 130 | 12/1998 |
| JP | 10-097766 | 4/1998 |

OTHER PUBLICATIONS

"Let's Play with MP3", DOS/Vmagazine, Soft Bank Publishing, Mar., 1998. (partial translation).

* cited by examiner

*Primary Examiner*—T Nguyen
(74) *Attorney, Agent, or Firm*—Wenderoth, Lind & Ponack, L.L.P.

(57) ABSTRACT

A semiconductor memory card stores a plurality of audio objects (AOBs) that compose a plurality of tracks and playlist information showing a reproduction order for the tracks. The semiconductor memory card also stores, as resume information (PLMG_RSM_PL), (1) a Playlist_Number showing which playlist information was used the last time playback was performed for the semiconductor memory card, (2) a Track_Number showing the last track to be played back, and (3) a Playback_Time showing a position at which where playback was stopped as a time expressed in relation to the start of the track.

10 Claims, 78 Drawing Sheets

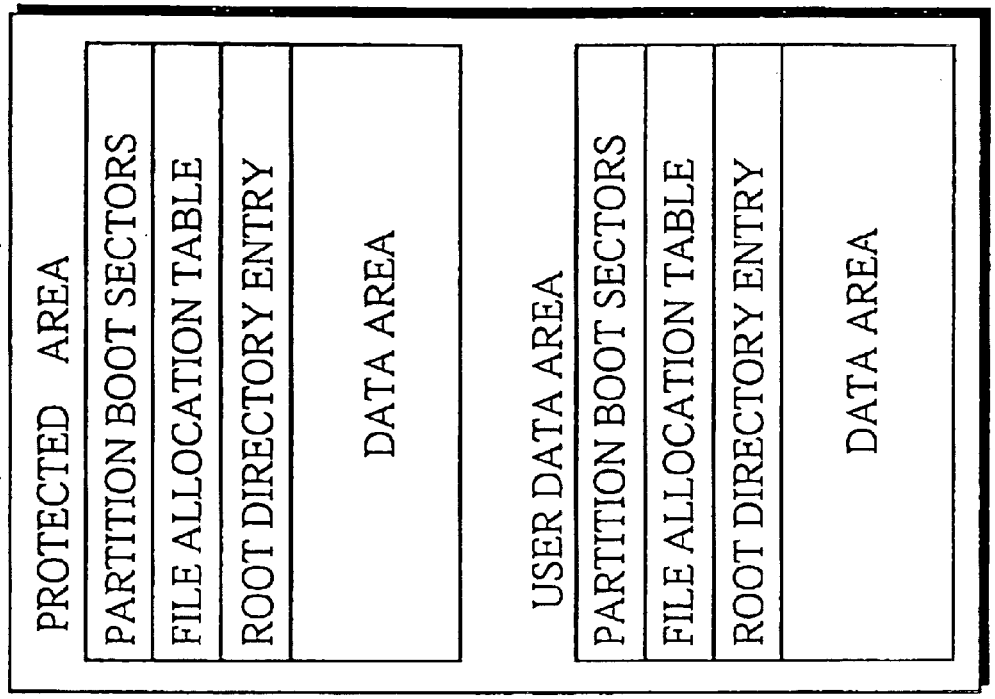
FIG. 4B  FILE SYSTEM LAYER (ISO/IEC 9293)
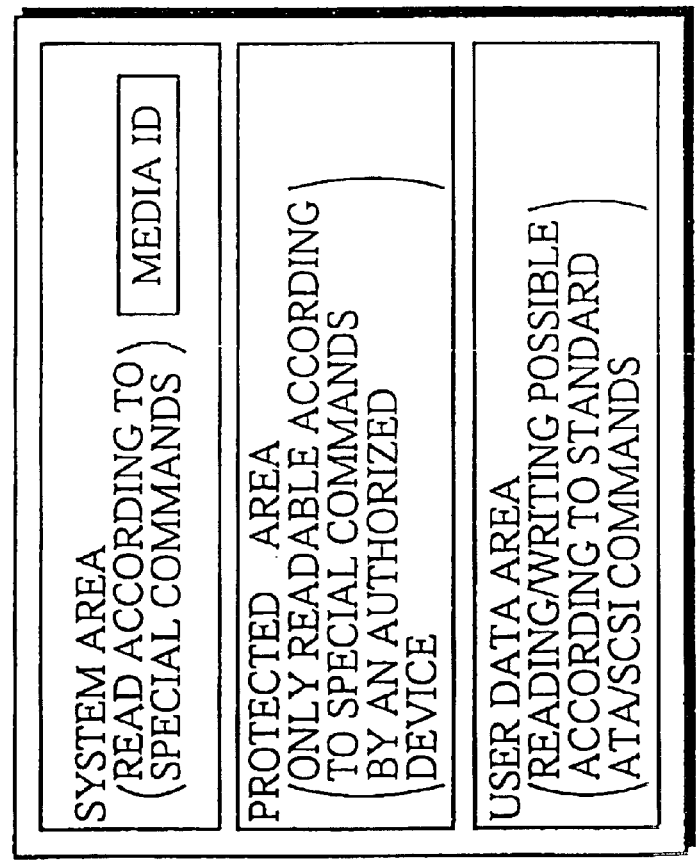
FIG. 4A  PHYSICAL LAYER USER DATA AREA      FIG. 8A
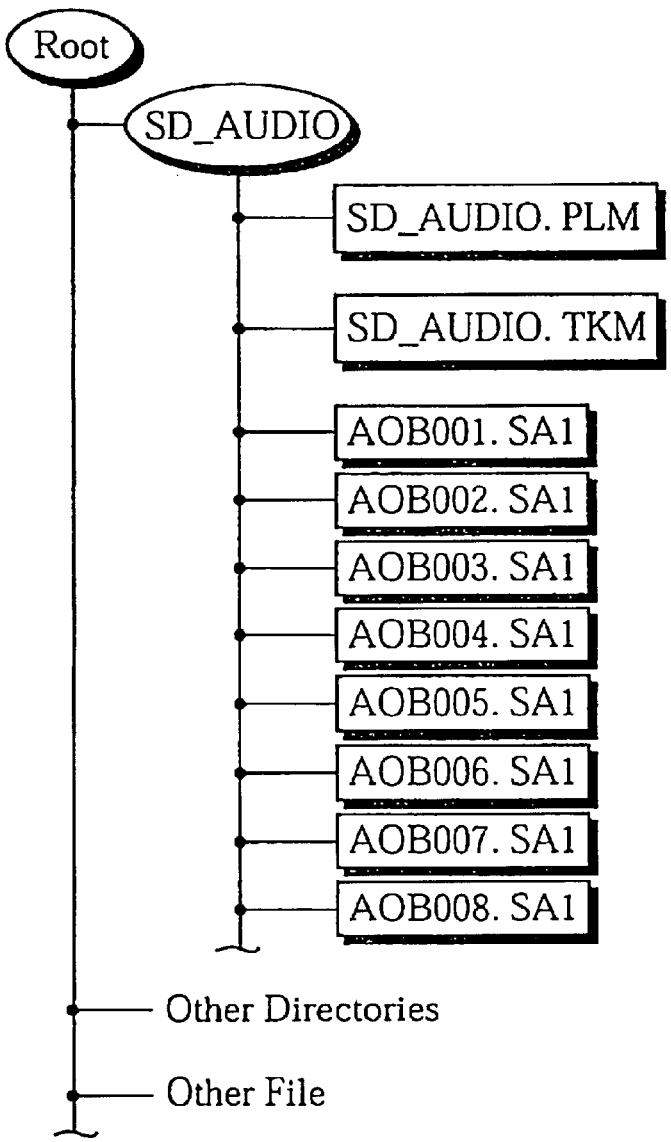
FIG. 8B
PROTECTED AREA
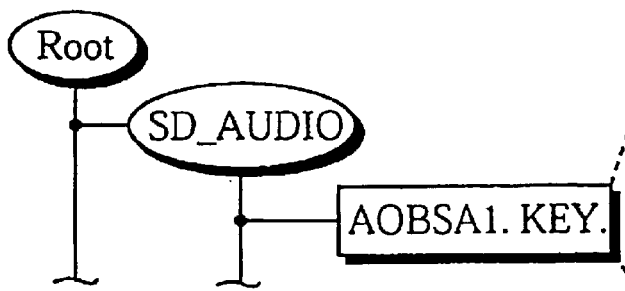

FIG. 11A

MPEG2-AAC format

| format | Audio_Data_Transport_Stream(ADTS) |
|---|---|
| Profile | Low Complexity(LC) profile(mandatory) |
| bitrate per channel** | between 16kbit/s(min.)and 72kbit/s(max.) Other bitrates are optional. |
| sampling_frequency | 48 kHz(mandatory) 44.1 kHz(mandatory) 32 kHz(mandatory) 24 kHz(mandatory) 22.05 kHz(mandatory) 16 kHz(mandatory) |
| channel_configuration | single_channel_element(mandatory) channel_pair_element(mandatory) |
| number_of_data_blocks_in_frame | 1 header/1 raw_data_block(mandatory) |

FIG. 11B

MPEG layer 3 format

| format | MPEG-1 layer 3 MPEG-2 layer 3 low sampling frequency |
|---|---|
| bitrate per channel** | MPEG 1:between 16kbit/s and 96kbit/s MPEG 2 LSF:between 16kbit/s and 80kbit/s Other bitrates and variable bitrate are optional. Bitrate index "0000",i.e. "free format" is not supported. |
| sampling_frequency | 48 kHz 44.1 kHz 32 kHz 24 kHz 22.05 kHz 16 kHz |
| mode | stereo joint_stereo single_cannel |

FIG. 11C  Windows Media Audio format

| format | Windows Media Audio format |
|---|---|
| bitrate per channel** | between 8kbit/s and 80kbit/s Other bitrates are optional. |
| sampling_frequency | 48 kHz 44.1 kHz 32 kHz 22.05 kHz 16 kHz |
| mode | monaural stereo |

FIG. 14

| sampling frequency | FNs_Middle_TMSRTE | | |
|---|---|---|---|
| | AAC | MPEGlayer3 | WMA |
| 48kHz | 47*N | 42*N | ××× |
| 44.1kHz | 43*N | 38*N | ××× |
| 32kHz | 32*N | 28*N | ××× |
| 24kHz | 24*N | 42*N | ××× |
| 22.05kHz | 22*N | 38*N | ××× |
| 16kHz | 16*N | 28*N | ××× |

※ N BEING THE PLAYBACK PERIOD "TIME_LENGTH"
OF AN AOB_ELEMENT TO AN ACCURACY OF 1/1000TH
OF ONE SECOND

FIG. 23A

| RELATIVE BYTE POSITION | FIELD NAME | CONTENT | NUMBER OF BYTES |
|---|---|---|---|
| 60 to 63 | DATA_OFFSET | FIRST ADDRESS OF AOB_BLOCK | 4 BYTES |
| 64 to 67 | SZ_DATA | DATA LENGTH OF AOB_BLOCK | 4 BYTES |
| 68 to 71 | TMSRTE_Ns | NUMBER OF TMSRT_entries | 4 BYTES |
| 72 to 73 | FNs_1st_TMSRTE | NUMBER OF AOB_FRAMEs IN FIRST AOB_ELEMENT | 2 BYTES |
| 74 to 75 | FNs_Last_TMSRTE | NUMBER OF AOB_FRAMEs IN LAST AOB_ELEMENT | 2 BYTES |
| 76 to 77 | FNs_Middle_TMSRTE | NUMBER OF AOB_FRAMEs IN AOB_ELEMENTS | 2 BYTES |
| 78 to 79 | TIME_LENGTH | PLAYBACK PERIOD OF AOB_ELEMENTS | 2 BYTES |
| | | TOTAL | 20 BYTES |

FIG. 23B

| sampling frequency | FNs_Middle_TMSRTE | | |
|---|---|---|---|
| | AAC | MPEGlayer3 | WMA |
| 48kHz | 47*N | 42*N | ××× |
| 44.1kHz | 43*N | 38*N | ××× |
| 32kHz | 32*N | 28*N | ××× |
| 24kHz | 24*N | 42*N | ××× |
| 22.05kHz | 22*N | 38*N | ××× |
| 16kHz | 16*N | 28*N | ××× |

※ N BEING THE PLAYBACK PERIOD "TIME_LENGTH" OF AN AOB_ELEMENT TO AN ACCURACY OF 1/1000TH OF ONE SECOND

FIG. 23C

TIME_LENGTH

TIME_LENGTH[15...8]

TIME_LENGTH[7...0]

TIME_LENGTH=2000 FOR AAC.MP3

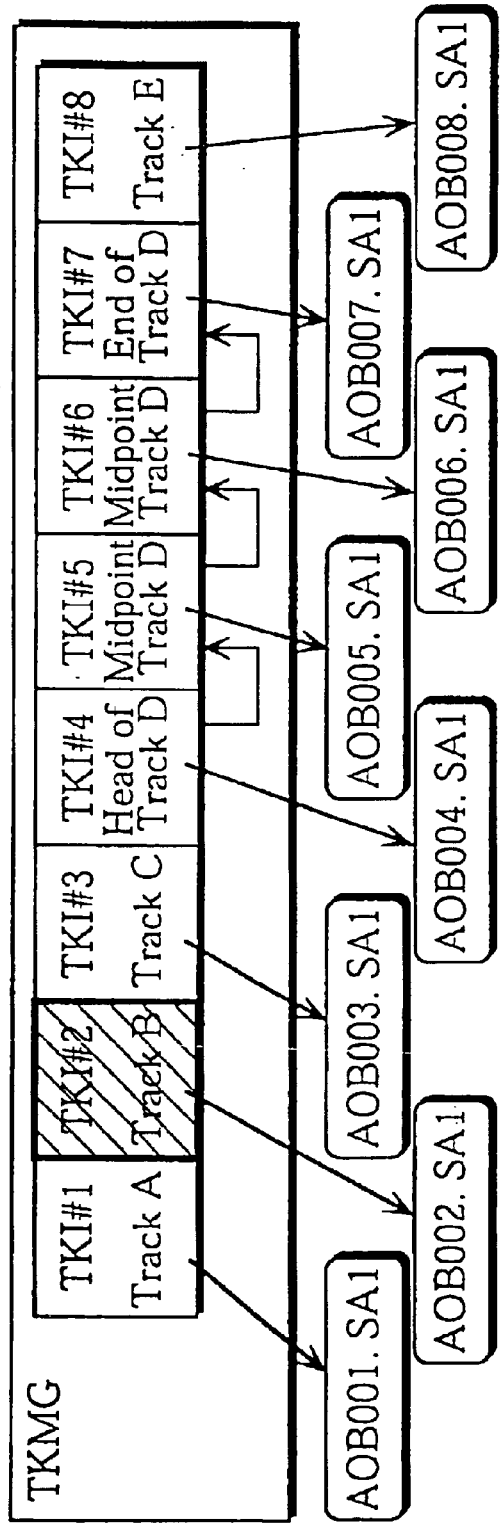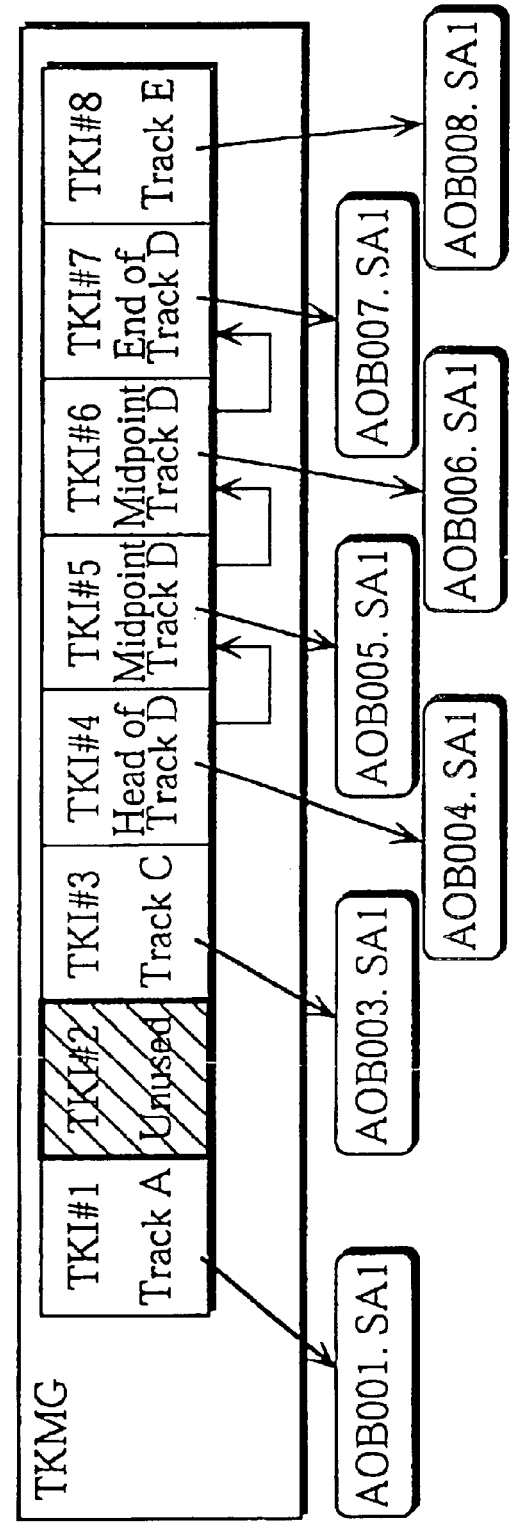

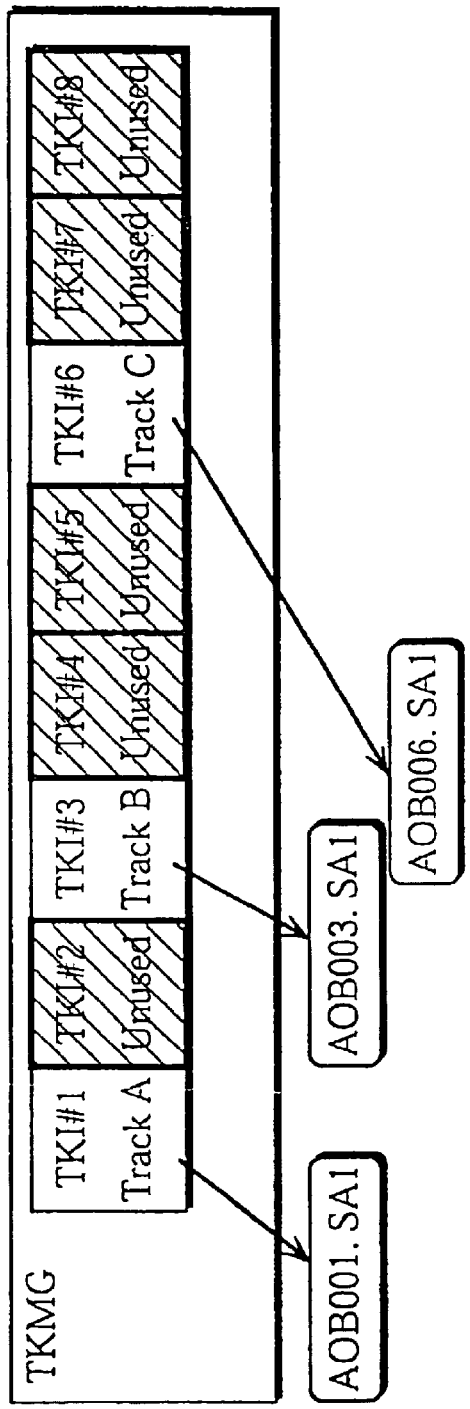
FIG. 28A   UPDATING TrackManager USING UNUSED TKI AT DIFFERENT POSITIONS (case 2)
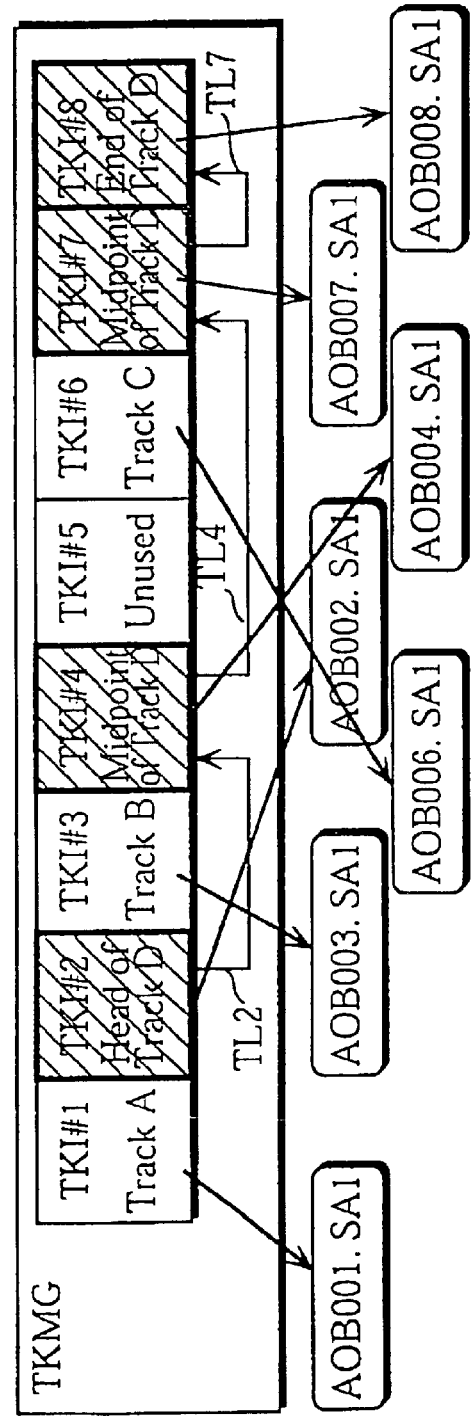
FIG. 28B

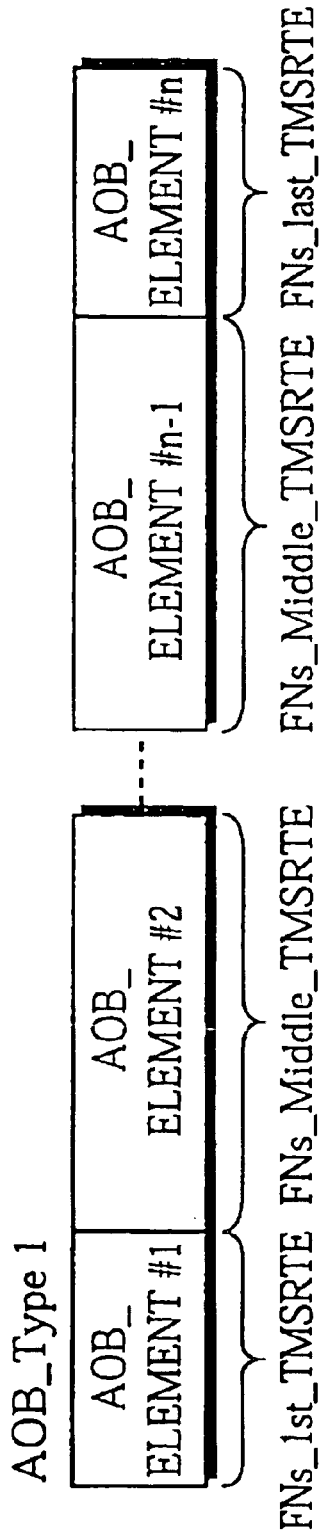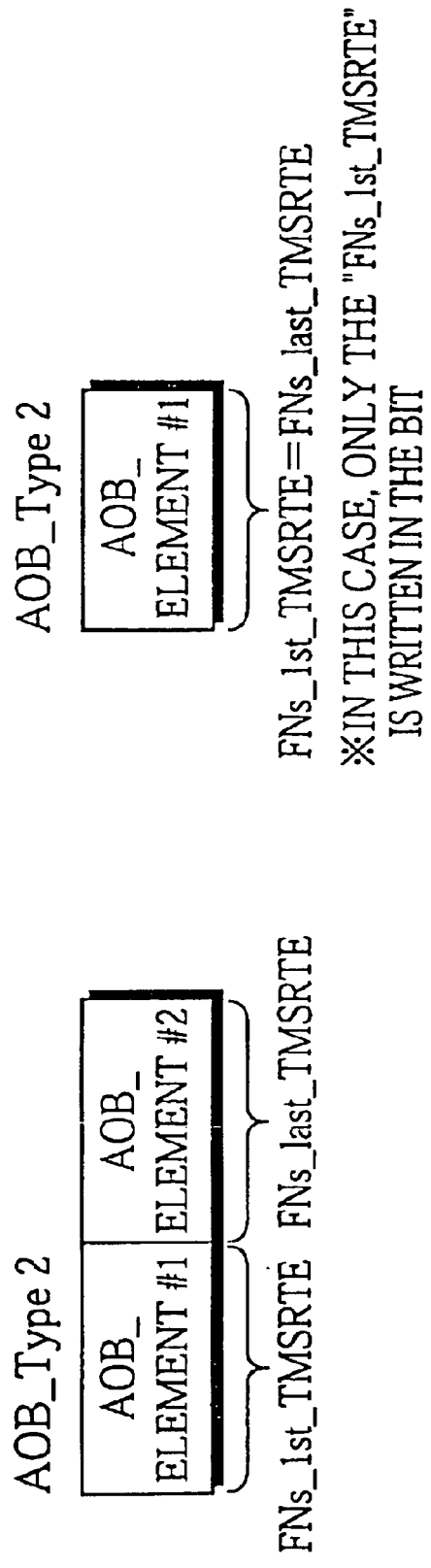

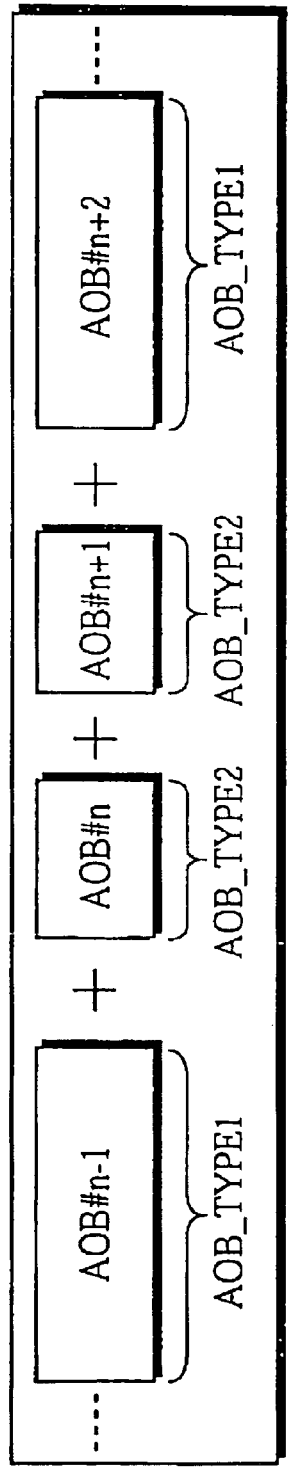
FIG. 31A PATTERN WHERE COMBINING OF AOBs POSSIBLE
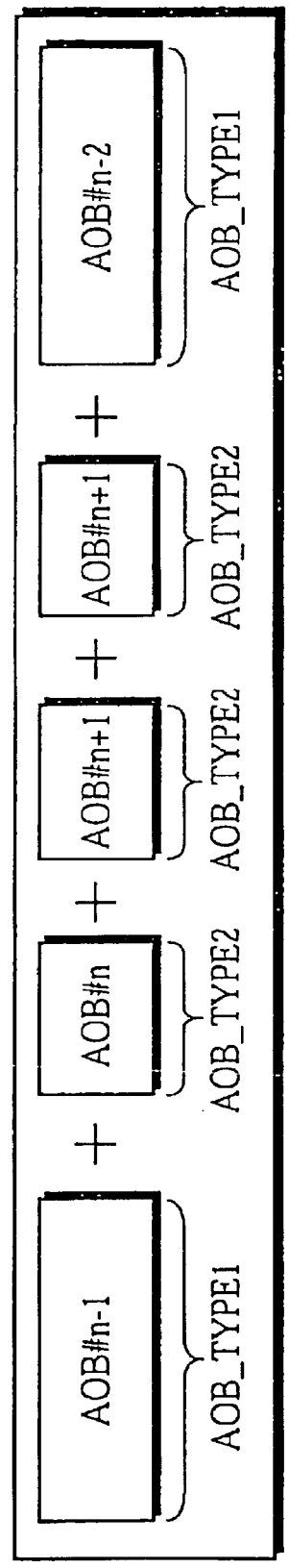
FIG. 31B PATTERN WHERE COMBINING OF AOBs NOT POSSIBLE

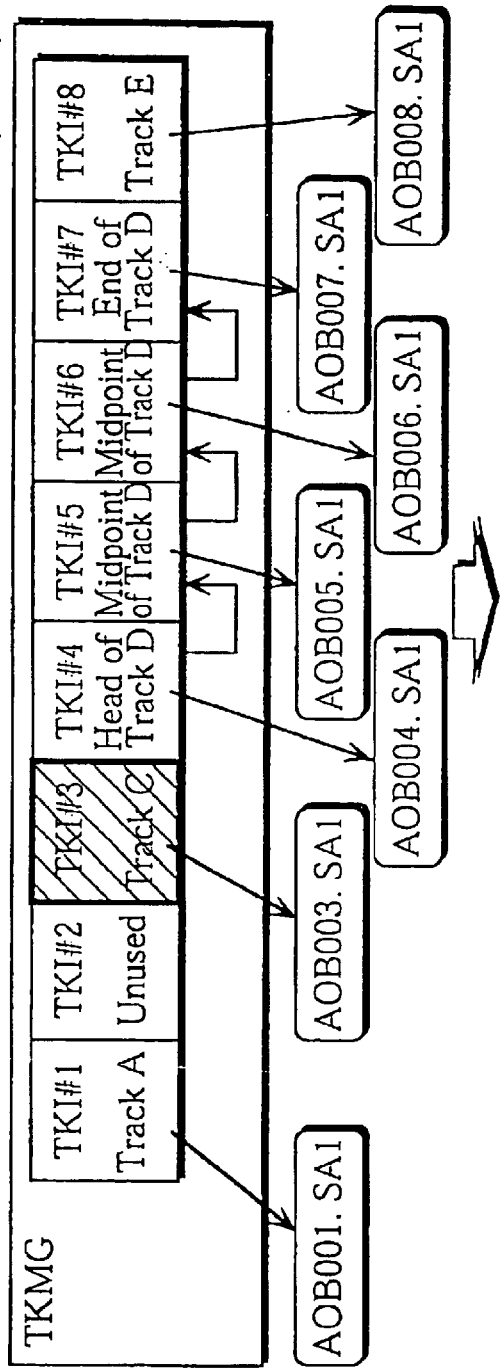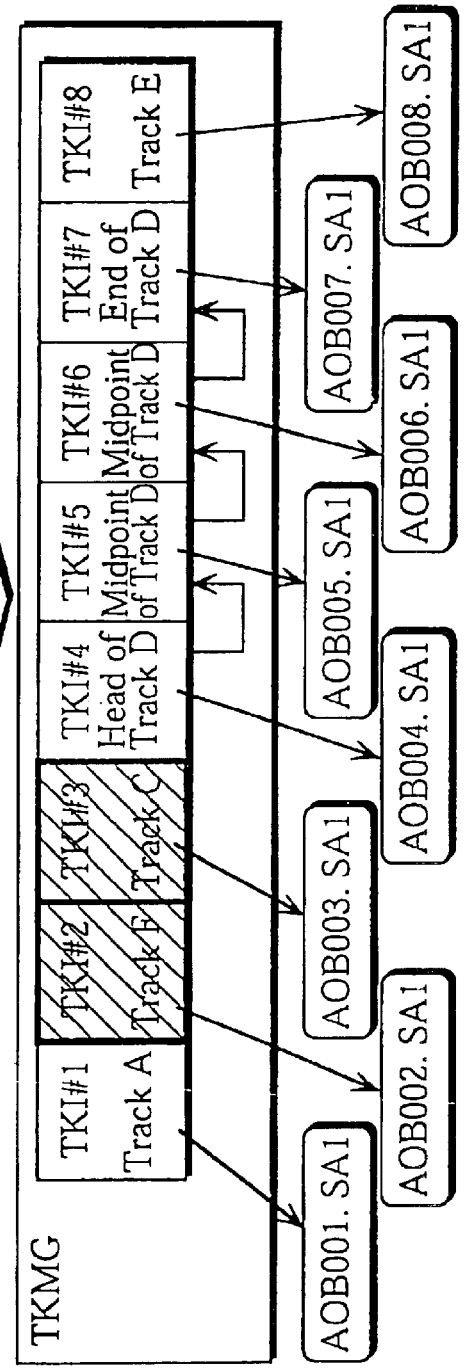
FIG. 33A
FIG. 33B

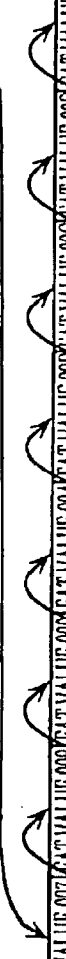
FIG. 34A SD-Audio DIRECTORY ENTRY
FIG. 34B SD-Audio DIRECTORY ENTRIES FIG. 50A
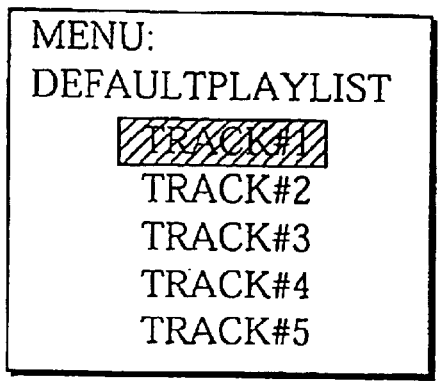
FIG. 50B
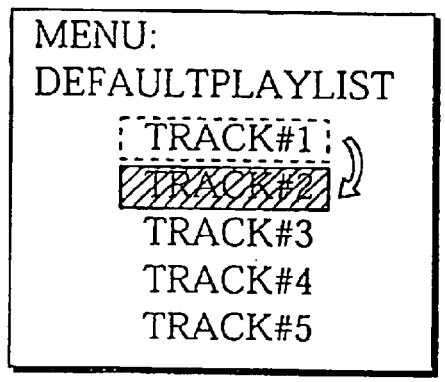
FIG. 50C
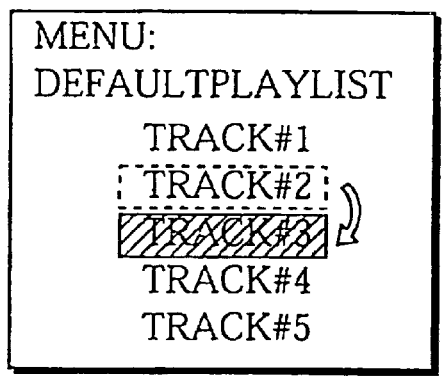
FIG. 50D
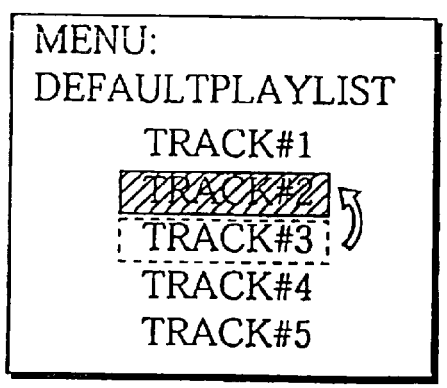
FIG. 50E
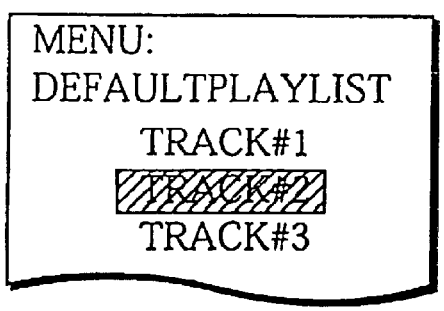
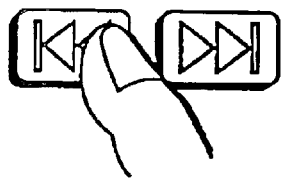
| PLAY | ···INDICATES THAT TRACK#2 SHOULD BE PLAYED BACK |
| Playlist | ···INDICATES THAT TRACK#2 SHOULD BE EDITED |

PLAYBACK TIME CODE=00:00:00.000

PLAYBACK TIME CODE=00:00:00.020

PLAYBACK TIME CODE=00:00:00.040

PLAYBACK TIME CODE=00:00:00.120

PLAYBACK POINT
PLAYBACK TIME CODE=00:00:01.000

PLAYBACK TIME CODE=00:00:01.240

PLAYBACK TIME CODE=00:00:03.240(2.000sec+1.240sec)

PLAYBACK TIME CODE=00:00:03.480

| BIT | FNs_1st_TMSRTE | 80 |
|---|---|---|
| | FNs_Last_TMSRTE | 50 |
| | FNs_Middle_TMSRTE | 94 |

PLAYBACK TIME CODE=00:04:40 (=280sec)
280sec=(80(=FNs_1st_TMSRTE)+148*94
(=FNs_Middle_TMSRTE)+8*20msec

FRAME POSITION
AT WHICH PLAYBACK
SHOULD START

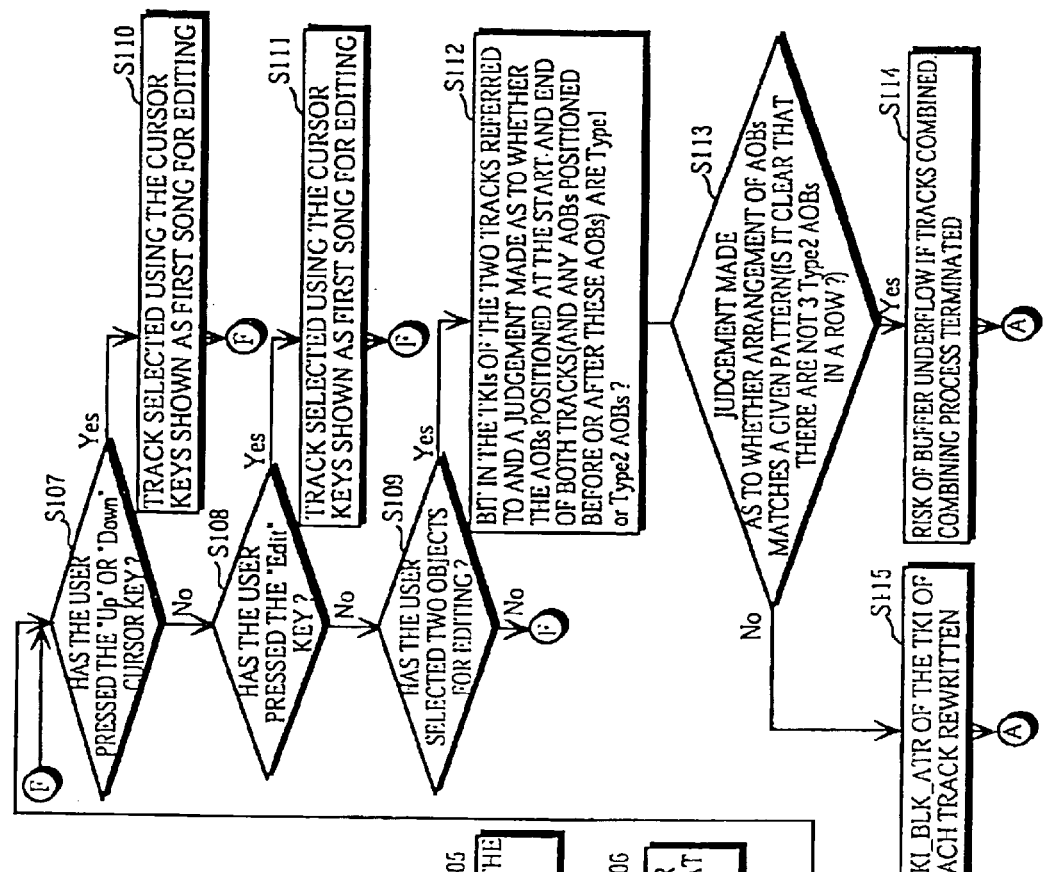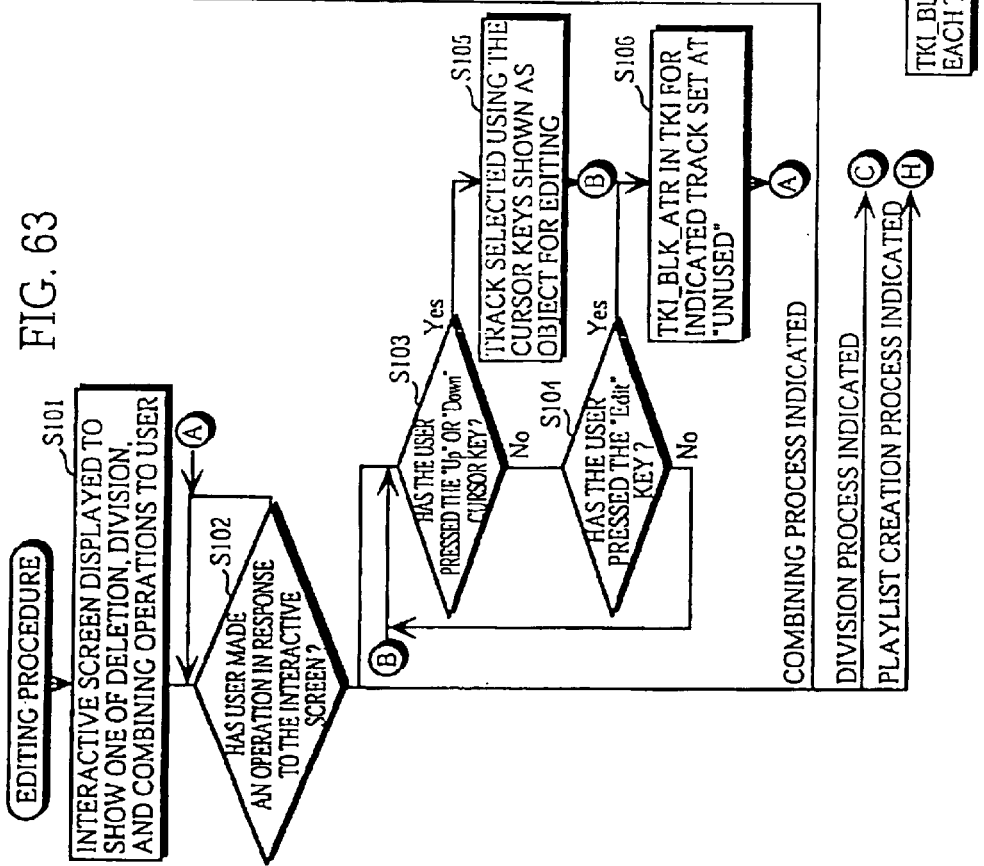
FIG. 63

FIG. 75

|  | Track_Number | Playback_Time |
|---|---|---|
| DefaultPlaylist.DPLGI.DPLI_RSM_PL | TrackC | 00:03:31.0000 |
| Playlist#1.PLGI.PLI_RSM_PL | FF | — — — |
| Playlist#2.PLGI.PLI_RSM_PL | TrackA | 00:01:11.0000 |
| Playlist#3.PLGI.PLI_RSM_PL | 00 | 00 |

AUDIO PLAYBACK APPARATUS AND METHOD FOR RESUMING INTERRUPTED PLAYBACK RECORDING

This application is based on application Nos. H11-149893, H11-236724, and H11-372605 filed in Japan, the contents of which are hereby incorporated by reference.

BACKGROUND OF THE INVENTION

1. Field of the Invention

The present invention relates to a semiconductor memory card that stores audio data, still image data and control data, and to a playback apparatus, recording apparatus, playback method, recording method, and computer-readable recording medium relating to such a semiconductor memory card. In particular, the present invention relates to improved storage of audio data and control data distributed as contents by a content distribution service, such as an electronic music distribution service.

2. Description of Background Art

Electronic music distribution enables users to purchase and receive music contents (e.g., songs and albums) via the Internet. Such technology has the potential to greatly increase the market for recorded music and is gradually becoming possible as the necessary hardware infrastructure is implemented. One way to store music contents that are obtained from an electronic music distribution service is on semiconductor memory cards whose portability makes them ideal. Accordingly, a great increase is expected in the demand for such cards.

Various kinds of semiconductor memory cards are available, such as Flash ATA cards and Compact Flash cards. Music contents can also be stored onto disc media, such as CD-R (Compact Disc-Recordable) or MiniDisc (MD). While there are a great variety of recording media that can be used for recording music contents, there are only a limited number of methods for indicating where the playback of a music content (track) should start. This operation is generally performed according to one of the following patterns.

When a music album is composed of a plurality of music contents (tracks), there are two main methods for indicating where the playback should start. The first method has the playback start from the first track in the album. The second method has the user indicate a track number and then has the playback start from the beginning of the indicated track.

In the first of these methods, the playback always starts with the same track and continues through all of the tracks in the album in the same order. If the user stops the playback midway through the album, recommencing the playback according to this method will result in the playback apparatus returning to the first track. The user will therefore end up having to listen to tracks that have just been played.

In the second method, the playback starts from the track indicated by the user. When the user stops the playback at a given point in the album and then starts playback once again, the user can have the playback restart from any track, such as the track following the track where playback was stopped. This means that the user does not have to listen to the tracks from the start once more. In this latter case, however, the user will still have to make several operations, such as inputting a track number. This can be troublesome, especially if the user does not know which track corresponds to which track number. In such cases, the user may indicate the wrong track, which will then be played back by the playback apparatus.

As described above, when playback is stopped and then recommenced, the two methods currently used either force the user to listen to all of the tracks in order from the beginning or to input a track number for the track from which the playback should start. This is far from ideal.

The following two methods are also sometimes used to indicate a position at which playback should commence. A third method has the user indicate a move of the playback position to a desired start time within a desired track using a forward or backward search function provided by a playback apparatus. A fourth method has the user indicate a desired track and a desired position within this track using a jog dial (or the like) and then commences reproduction from this position. Since both methods have the user indicate how far the playback previously progressed, they have the same drawback as the second method described above.

Current MiniDisc (MD) playback apparatuses use a reproduction method that indicates the playback position in a more user-friendly manner than the first to fourth methods given above.

When the user stops the playback of an MD, resume information showing the position where playback stopped is recorded in a nonvolatile memory in the MD player. When the user indicates playback of the same MD, the playback of the tracks recorded on the MD starts at the position given in the resume information.

The resume information is recorded in the MD player in a nonvolatile manner so that an interruption to the power supply does not result in the loss of the information. This means that the user can listen to part of a music album, turn off the player, and still have the playback resume at the position where playback was stopped. In this case, the user does not have to repeatedly listen to the tracks at the start of the album as in the first method, or to have to input a track number as in the second method, making this an ideal way to listen to all of the tracks included in an album.

With an MD, however, the resume information showing how far an album has been played back is stored within the hardware of the MD player. Accordingly, there is the problem that when an MD is ejected from a player and inserted into another player, the second player will play back the tracks on the MD starting from the first track in the album, in the same way as the first method.

As a specific example, when a user listens to some of the tracks on an album using a first playback apparatus, stops the playback, and then transfers the disc to another playback apparatus, this second playback apparatus will not store resume information showing the position reached by the playback of this disc. As a result, the playback will start from the start of the album and so make the user listen to the same tracks again.

Since discs are rarely transferred from one player to another during the playback of an album, the playback returning to the start of the album may not be such a significant problem. When the album is subjected to electronic music distribution before being recorded onto a recording medium, however, it is believed that there will be many cases where an album will be partially played back on one player and then transferred to another.

Electronic music distribution is achieved by having a computer owned by the user download a music album from a server computer operated by a record label. The user can then have the downloaded album played back on their computer. Since modern personal computers are capable of playing back music contents, users can listen to albums they have bought on their computer. Assume that the user listens to the album on a portable playback apparatus after listening to it on his/her computer.

In this case, the portable playback apparatus cannot know how far playback by the computer progressed, so that the album will be played back once again from the start. As the user will be subjected to the same songs that were played back by the computer, the user is likely to tire of the album quicker than if all of the tracks were played back.

As recording media become smaller and lighter, though larger in capacity, it becomes increasingly possible to record albums containing large numbers of tracks onto a single recording medium. It is believed that such a recording medium will often be transferred between playback apparatuses. If the playback returns to the beginning after a large number of tracks have been played, this will be very annoying for listeners.

SUMMARY OF THE INVENTION

It is a first object of the present invention to provide a semiconductor memory card that enables playback to be resumed from a previously stopped position without the same recorded material being played back and without a user having to indicate the playback position, even when the semiconductor memory card has been transferred between playback apparatuses.

It is a second object of the present invention to provide a semiconductor memory card that enables a playback apparatus to recommence the playback of an album that was commenced on a different playback apparatus without the same recorded material being played back.

The first object can be achieved by a semiconductor memory card, storing: an audio sequence in which a plurality of audio objects are arranged; and resume information showing a resume position for use when playback of the audio sequence resumes midway through the audio sequence.

Assume that an audio sequence corresponds to a music album, and that the user listens to a first part of the album on a playback apparatus. If the user then transfers the semiconductor memory card to another playback apparatus, this playback apparatus will be able to recommence the playback of the album at the stopped position by referring to the playback resume position shown by the resume information.

The resumption of playback based on the resume information does not require the user to make any particular operation. This means that the user does not have to go to the trouble of indicating a track (audio object) when transferring the semiconductor memory card to another playback apparatus.

The resume information may include at least one of type 1 position information and type 2 position information, the type 1 position information showing a type 1 resume position set according to a user operation, and the type position information showing a type 2 resume position that was automatically set when playback of the audio sequence last stopped.

Here, each audio object in the audio sequence may be provided with unique identification information, the type 1 position information showing the type 1 resume position using the identification information of one of the audio objects, and the type 2 position information showing the type 2 resume position using the identification information of one of the audio objects and time information showing an offset from a start of the one of the audio objects to the type 2 resume position.

The second object is achieved by the above construction. The type 2 position information includes an offset from the start of an audio object. When the semiconductor memory card is transferred between playback apparatuses, the second playback apparatus can commence playback at a position immediately following a point where playback by the first playback apparatus was stopped. This means that a user can start to listen to an album on a first playback apparatus, stop the playback, transfer the semiconductor memory card to another playback apparatus, and then have the playback continue from right after the stopped position. Unlike conventional technologies, the user does not have to put up with hearing the same tracks whenever the semiconductor memory card is transferred between playback apparatuses.

Albums obtained from an electronic music distribution service will often be transferred between different playback apparatuses. In such case, however, the user will not have to listen to the same tracks whenever the album is transferred to another playback apparatus.

BRIEF DESCRIPTION OF THE DRAWINGS

These and other objects, advantages and features of the invention will become apparent from the following description thereof taken in conjunction with the accompanying drawings which illustrate a specific embodiment of the invention. In the Drawings:

FIG. 4A shows the special region, the authentication region and the user region provided in the physical layer of the flash memory card 31;

FIG. 4B shows the composition of the authentication region and the user region in the file system layer;

FIGS. 8A and 8B show what directories are provided in the user region and the authentication region in the file system layer when the above two types of data are recorded in the application layer, as well as what kind of files are recorded in which directories;

FIG. 11A shows the parameters stipulated by ISO/IEC 13818-7 standard in tabular form;

FIG. 11B shows the parameters that should be used when encoding a file in MPEG-Layer 3 (MP3) format in tabular form;

FIG. 11C shows the parameters that should be used when encoding a file in Windows Media Audio (WMA) format in tabular form;

FIG. 14 shows the correspondence between the sampling_frequency and the number of AOB_FRAMEs included in an AOB_ELEMENT;

FIGS. 23A and 23B show the composition of the BIT;

FIG. 23C shows the Time_Length field;

FIGS. 27A and 27B show the deletion of a track;

FIG. 28A shows the TrackManager after the deletion of a track has been performed several times;

FIG. 28B shows how a new TKI and AOB file are written when "Unused" TKIs are present in the TrackManager;

FIG. 30A shows a Type1 AOB;

FIG. 30B shows Type2 AOBS;

FIG. 31A shows the combining of a plurality of tracks into a single track for a combination of a Type1+Type2+Type2+Type1 AOB;

FIG. 31B shows the combining of a plurality of tracks into a single track for a combination of a Type1+Type2+Type2+Type2+Type1 AOB;

FIGS. 33A and 33B show the division of a track to produce two tracks;

FIGS. 34A and 34B show the content of the SD_Audio directory entries in the SD_Audio directory including the AOB file "AOB003.SA1" before and after the division of the track;

FIGS. 50A to 50E show examples of the display on the LCD panel when a track is selected;

FIG. 63 is a flowchart showing the processing in the editing control program;

FIG. 75 shows how the PLI_RSM_PL (DPLI_RSM_PL) is set for the Default_Playlist_Information and each PLI;

DESCRIPTION OF THE PREFERRED EMBODIMENTS

The following describes a semiconductor memory card (flash memory card) that is an embodiment of the present invention, with reference to the attached figures.

The following paragraphs are arranged into a hierarchy using reference numbers with the notation given below.

{x1–x2_x3–x4}

The length of a reference number shows the level of the topic in the hierarchy. As a specific example, the number x1 is the number of a drawing that is being referred to in the explanation. The drawings attached to this specification have been numbered in the order in which they are referred to in the specification, so that the order of the drawings roughly matches the order of the explanation. The explanation of certain drawings has been divided into sections, with the reference number x2 giving the section number of a section in the explanation of a drawing indicated by the reference number x1. The reference number x3 shows the number of an additional drawing that is provided to show the details of the section indicated by the section number x2. Finally, the reference number x4 shows the number of a section in the explanation of this additional drawing.

First Embodiment

{1-1_2} External Appearance of the Flash Memory Card 31

Figure 1:
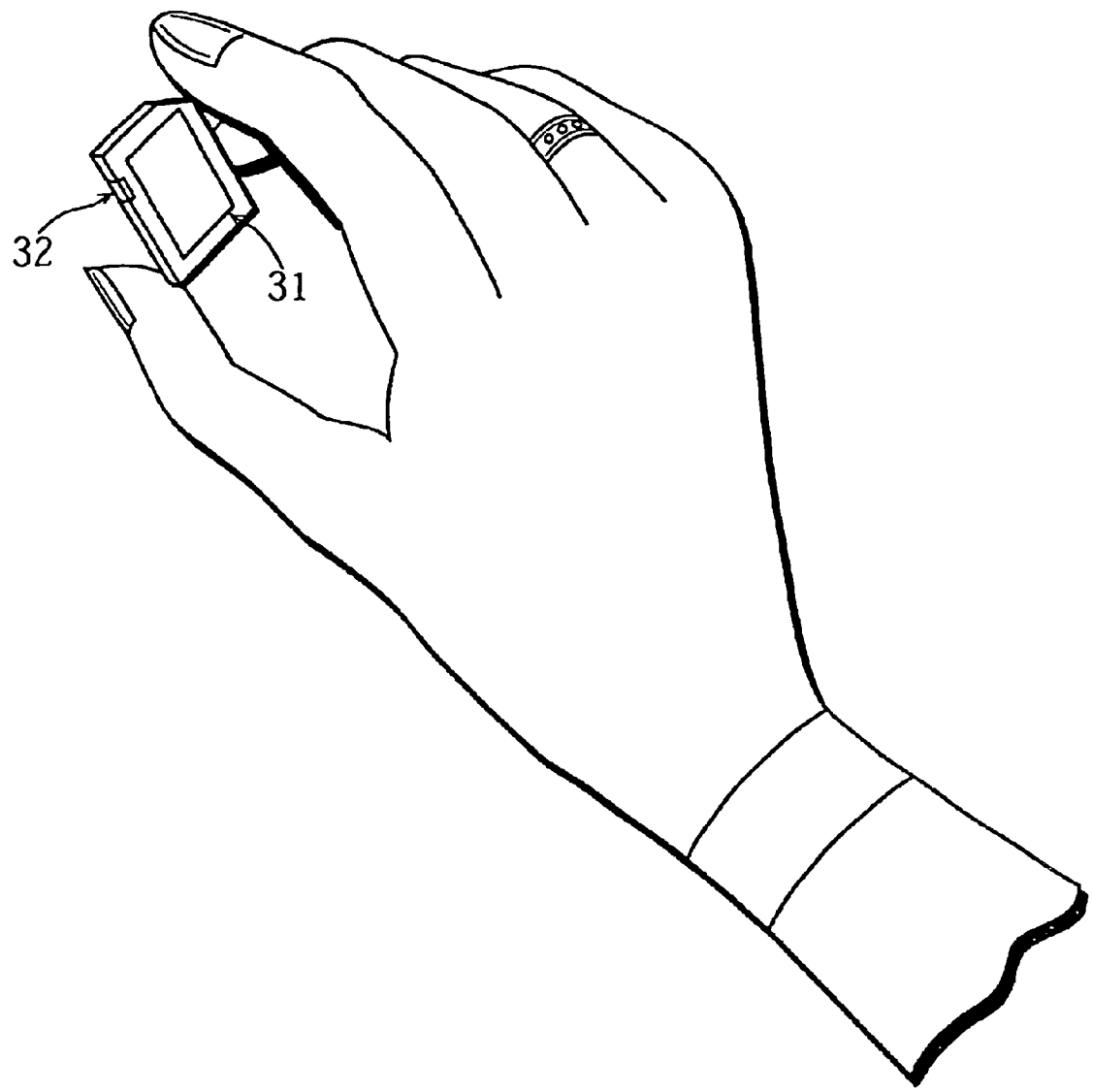
FIG. 1 shows the appearance of a flash memory card 31 when viewed from above.
Figure 2:
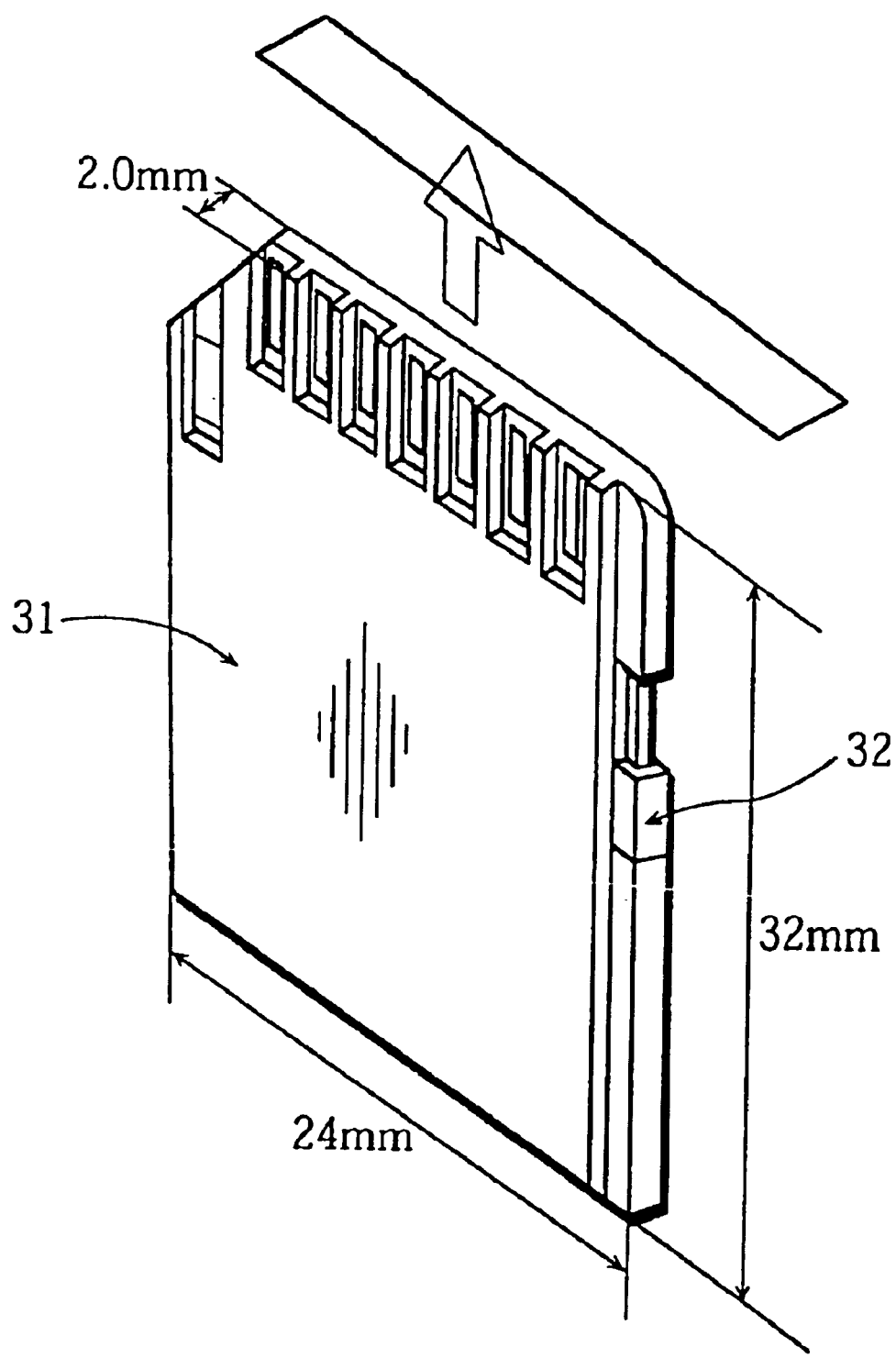
FIG. 2 shows the construction of the flash memory card 31 when viewed from below.

The present explanation starts with the external, appearance of the flash memory card 31. FIG. 1 shows the appearance of the flash memory card 31 when viewed from above, while FIG. 2 shows the construction of the flash memory card 31 when viewed from below. As shown in FIGS. 1 and 2, the flash memory card 31 is around the same size as a postage stamp, and so is large enough to be held by hand. Its approximate dimensions are 32.0 mm long, 24.0 mm wide, and 2.0 mm thick.

The flash memory card 31 can be seen to have nine connectors on its bottom edge for connecting the card to a compatible device and a protect switch 32 on one side to enable the user to set whether overwriting of the stored content of the flash memory card 31 is permitted or prohibited.

{3-1} Physical Construction of the Flash Memory Card 31

Figure 3:
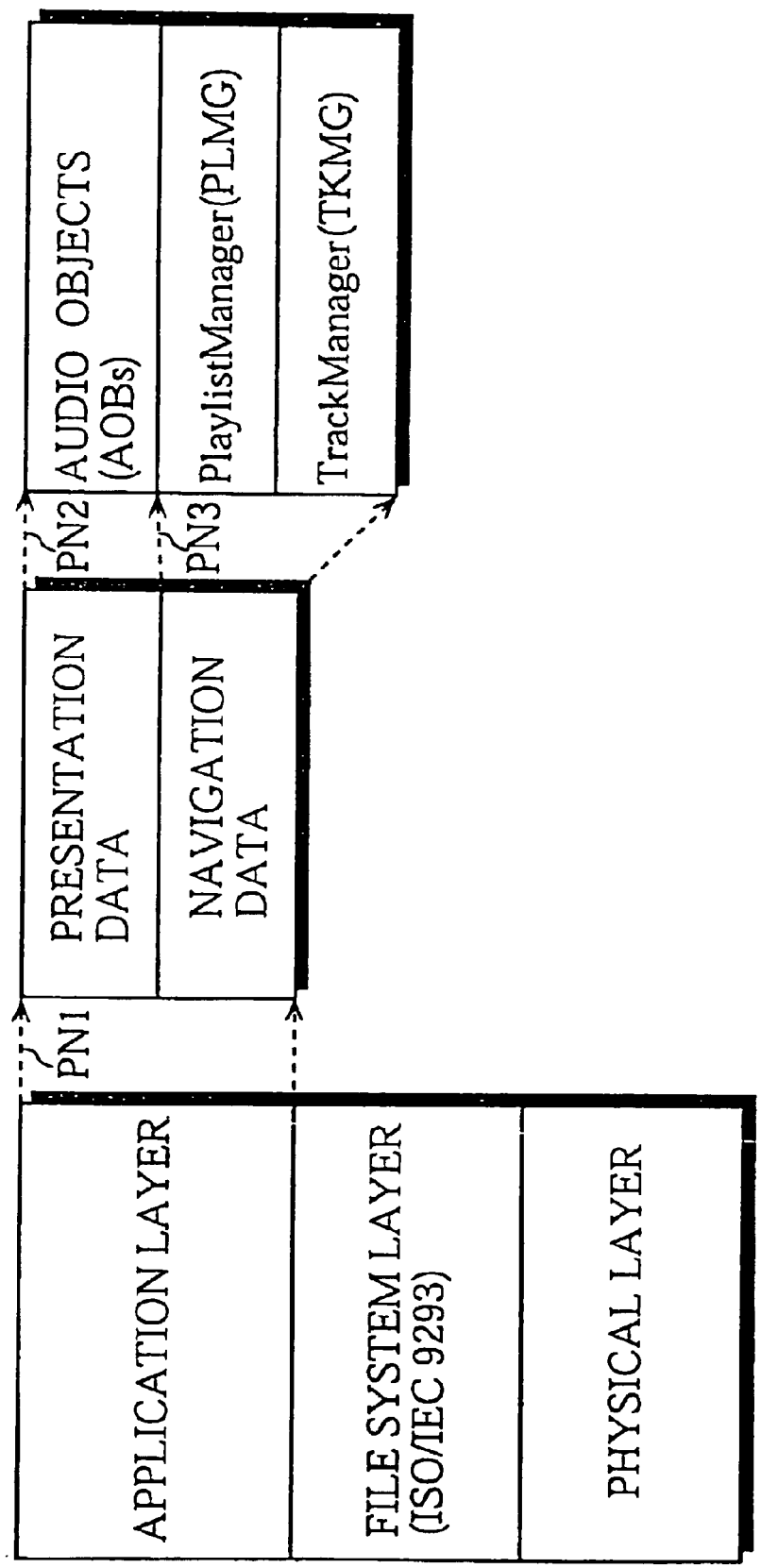
FIG. 3 shows the hierarchical composition of the flash memory card 31 in the embodiments.

FIG. 3 shows the hierarchical structure of the semiconductor memory card (hereafter referred to as the "flash memory card 31") of the present embodiment. As shown in FIG. 3, the flash memory card 31 is constructed with a physical layer, a file system layer and an application layer in the same way as a DVD (Digital Video Disc), though the logical and physical constructions of these layers are very different to those on a DVD.

{3-2} Physical Layer of the Flash Memory Card 31

The following describes the physical layer of the flash memory card 31. The flash memory is composed of a plurality of sectors, each of which stores 512 bytes of digital data. As one example, a 64 MB flash memory card 31 will have a storage capacity of 67,108,864 (=64*1,024*1.024) bytes, so that this card will include 131,072 (=67108864/512) valid sectors. Once the number of replacement sectors, which are provided for use in case of errors, is subtracted, the remaining number of valid sectors into which various kinds of data can be written is around 128,000.

{3-2_4A-1} Three Regions in the Physical Layer

The three regions shown in FIG. 4A are provided in the storage area composed of these valid sectors. These regions are the "special region", the "authentication region" and the "user region", and are described in detail below. The user region is characterized in that a device to which the flash memory card 31 is connected can freely read or write various kinds of data from or into this region. Areas within the user region are managed by a file system.

The special region stores a media ID that is a value uniquely assigned to each flash memory card 31. Unlike the user region, this region is read-only, so that the media ID stored in the special region cannot be changed.

The authentication region is a writeable region, like the user region. This region differs from the user region in that a device connected to the flash memory card 31 can access (i.e., read or write data in) the authentication region only if the flash memory card 31 and the device have first confirmed that each other is an authentic device. In other words, data can only be read from or written into the authentication region if mutual authentication has been successfully performed by the flash memory card 31 and the device connected to the flash memory card 31.

{3-2_4A-2} Uses of the Three Regions in the Physical Layer

When the device connected to the flash memory card 31 writes data into the flash memory card 31, the region used to store this data will depend on whether copyright protection is necessary for the data being written. When data that requires copyright protection is written into the flash memory card 31, the data is encrypted using a predetermined encryption key (called a "FileKey") before being written into the user area. This FileKey can be freely set by the copyright holder and, while the use of this FileKey provides some level of copyright protection, the FileKey used for encrypting the written data is itself encrypted to make the copyright protection more secure. Any value obtained by subjecting the media ID stored in the special region into a predetermined calculation can be used to encrypt the FileKey. The encrypted FileKey produced in this way is stored in the authentication region.

Since data that requires copyright protection is subjected to a two-step encryption process where the data is encrypted using a FileKey that is itself encrypted based on the media ID, copyright infringement, such as the production of unauthorized copies of this data, will be extremely difficult.

{3-2_4B-1} Overview of the File System

As can be understood, the construction of the physical layer of the flash memory card 31 strengthens the copyright protection of the data written in the flash memory card 31. The following describes the file system layer present on this physical layer. While the file system layer of a DVD uses a UDF (UniverSA1Disk Format)-type file system, the file system layer of the flash memory card 31 uses a FAT (File Allocation Table)-type file system, as described in ISO/IEC 9293.

Figure 5:
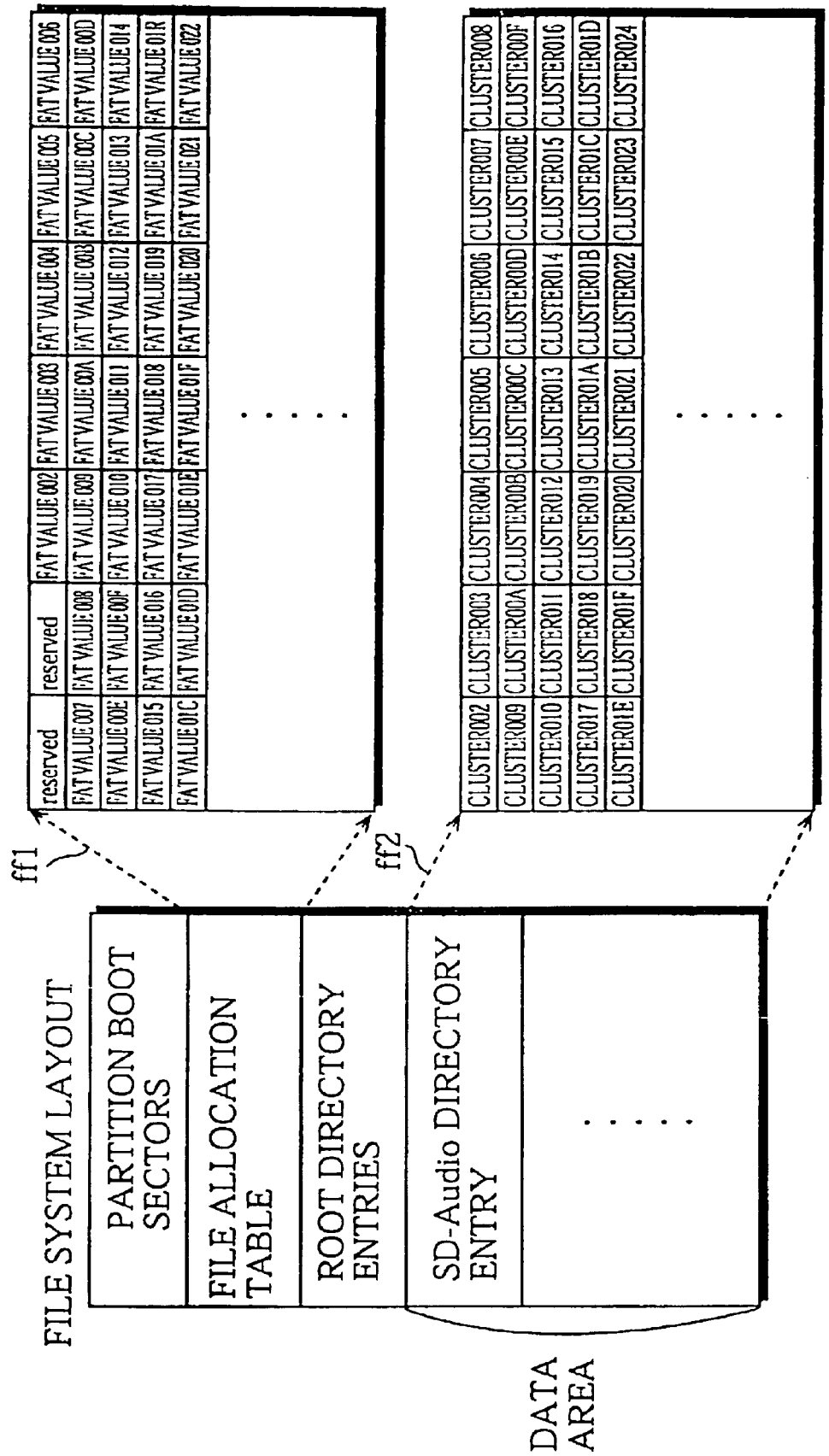
FIG. 5 shows the detailed composition of the file system layer.

FIG. 4B shows the construction of the authentication region and the user region in the file system layer. As shown in FIG. 4B, the authentication region and the user region in the file system each include "partition boot sectors", a "file allocation table (FAT)", a "root directory", and a "data region", meaning that the authentication region and the user region have the same construction. FIG. 5 shows the various parts of these file systems in more detail. The following describes the construction of the user region with reference to FIGS. 4A, 4B and 5.

{3-2_4B-2} Partition Boot Sectors

The partition boot sectors are sectors that store the data that will be referred to by a standard personal computer that is connected to the flash memory card 31 when the flash memory card 31 is set as the boot disk for the operating system (OS) of the personal computer.

{3-2_4B-3_5} Data Region

The data region can be accessed by a device connected to the flash memory card 31 in units no smaller than a "cluster". While each sector in the flash memory card 31 is 512 bytes in size, the cluster size is 16 KB, so that the file system layer reads and writes data in units of 32 sectors.

The reason the cluster size is set at 16 KB is that when data is written onto the flash memory card 31, part of the data stored in the flash memory card 31 first has to be erased before the write can be performed.

The smallest amount of data that can be erased in the flash memory card 31 is 16 KB, so that setting the smallest erasable size as the cluster size means that data writes can be favorably performed. The arrow ff2 drawn using a broken line in FIG. 5 shows the plurality of clusters 002, 003, 004, 005 . . . included in the data region. The numbers 002, 003, 004, 005, 006, 007, 008 . . . used in FIG. 5 are the three-digit hexadecimal cluster numbers that are exclusively assigned to identify each cluster. Since the c) smallest unit by which access can be performed is one cluster, storage positions within the data region are indicated using cluster numbers.

{3-2_4B-4_5} File Allocation System

The file allocation system has a file system construction in accordance with ISO/IEC 9293 standard, and so is made up of a plurality of FAT values. Each FAT value corresponds to a cluster and shows which cluster should be read after the cluster corresponding to the FAT value. The arrow ff1 shown by a broken line in FIG. 5 shows the plurality of FAT values 002, 003, 004, 005 . . . that are included in the file allocation table. The numbers 002, 003, 004, 005 . . . assigned to each FAT value show which cluster corresponds to each FAT value and therefore are the cluster numbers of the clusters corresponding to the FAT values.

{3-2_4B-5_5-1} Root Directory Entries

The "root directory entries" are information showing what kinds of files are present in the root directory. As specific examples, the "filename" of an existing file, its "filename extension", the "revision time/date" and "number of first cluster in file" showing where the start of the file is stored can be written as the root directory entry of a file.

{3-2_4B-5_5-2} Directory Entries for Subdirectories

Information relating to files in the root directory is written as root directory entries, though information relating to subdirectories is not written as the root directory entries. Directory entries for subdirectories are instead produced in the data region. In FIG. 5, the SD-Audio directory entry given in the data region is one example of a directory entry for a subdirectory. Like a root directory entry, an SD-Audio directory entry includes the "filename" of a file present in this subdirectory, its "filename extension", the "revision time/date" and "number of first cluster in file" showing where the start of the file is stored.

{3-2_4B-5_6-1} Storage Format for AOB Files

Figure 6:
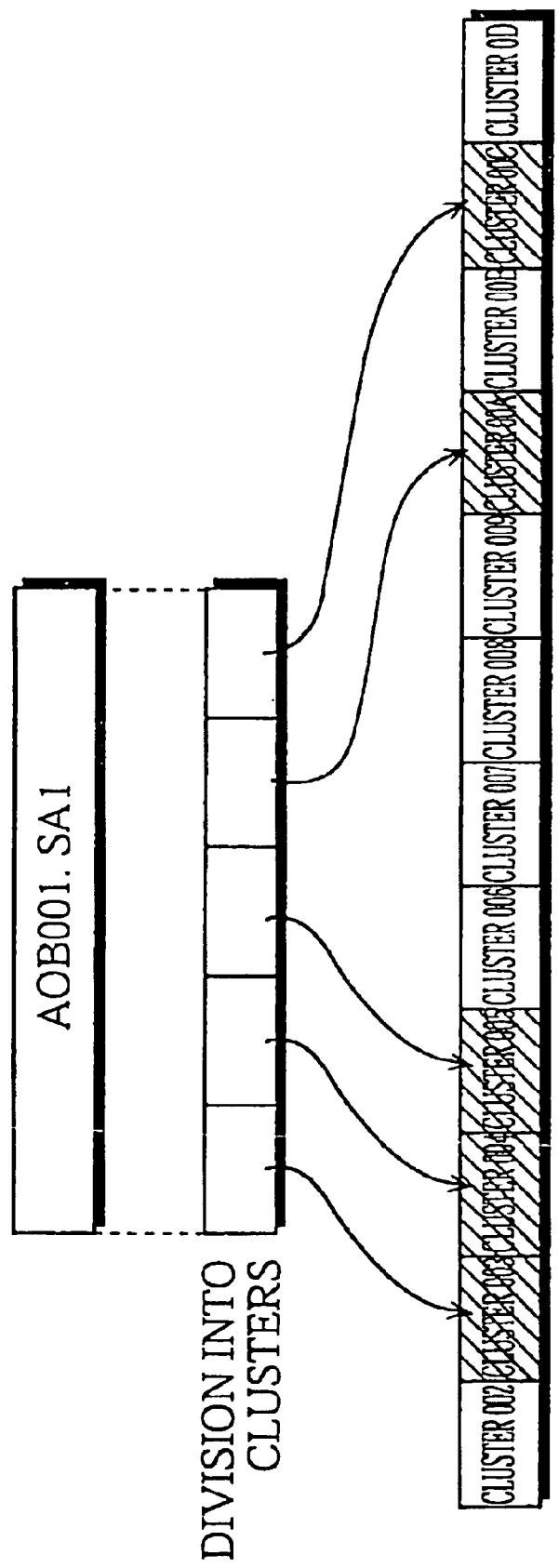
FIG. 6 is a representation of when the AOB file "AOB001.SA1" is divided into five parts that are stored in clusters 003, 004, 005, 00A, and 00C.

The following describes the file storage method by showing how a file named "AOB001.SA1" is stored in the SD-Audio directory, with reference to FIG. 6. Since the smallest unit by which the data region can be accessed is one cluster, the file "AOB001.SA1" needs to be stored in the data region in parts that are no smaller than one cluster. The file "AOB001.SA1" is therefore stored having first been divided into clusters. In FIG. 6, the file "AOB001.SA1" is divided into five parts in keeping with the cluster size, and the resulting parts are stored into the clusters numbered 003, 004, 005, 00A, and 00C.

{3-2_4B-5_7-1} Storage Format for AOB Files

Figure 7:
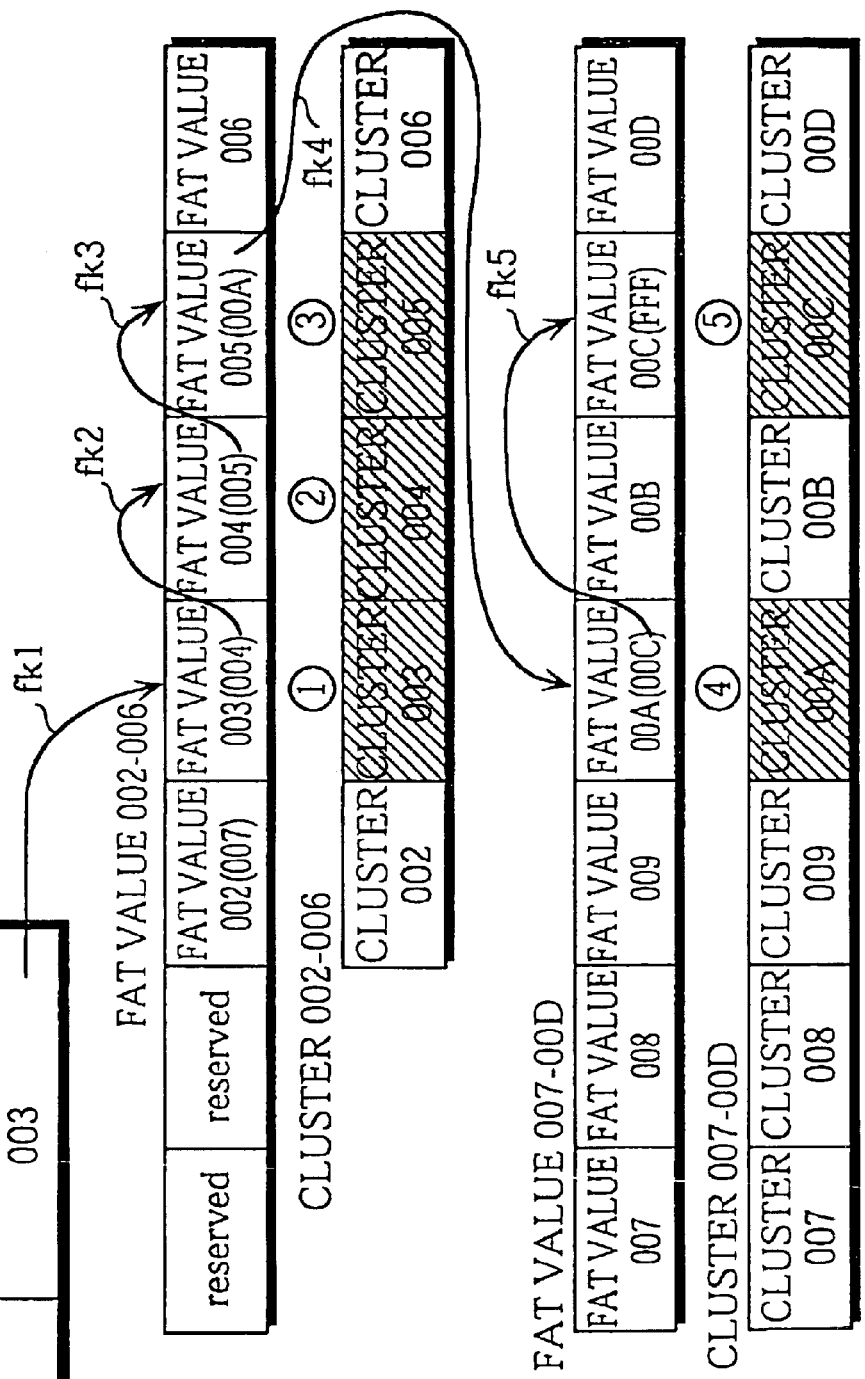
FIG. 7 shows one example of the settings of the directory entries and file allocation table when the AOB file "AOB001.SA1" is recorded in a plurality of clusters.

When the file "AOB001.SA1" is divided up into parts and stored, a directory entry and the file allocation table need to be set as shown in FIG. 7. FIG. 7 shows one example of how the directory entry and file allocation table need to be set when the file "AOB001.SA1" is stored having been divided up into parts and stored. In FIG. 7, the start of the file "AOB001.SA1" is stored in cluster 003, so that cluster number 003 is written into "the number of first cluster in file" in the SD-Audio directory entry to indicate the cluster storing the first part of the file. As shown in FIG. 7, the following parts of the file "AOB001.SA1" are stored in clusters 004 and 005. As a result, while the FAT value 003(004) corresponds to cluster 003 that stores the first part of the file "AOB001.SA1", this value indicates cluster 004 as the cluster storing the next part of the file "AOB001.SA1". In the same way, while the FAT values 004 (005) and 005 (00A) respectively correspond to clusters 004 and 005 that store the next parts of the file "AOB001.SA1", these values respectively indicate cluster 005 and cluster 00A as the clusters storing the next parts of the file "AOB001.SA1". By reading the clusters with the cluster numbers written into these FAT values in order as shown by the arrows fk1, fk2, fk3, fk4, fk5 . . . in FIG. 7, all of the parts produced by dividing the file "AOB001.SA1" can be read. As explained above, the data region of the flash memory card 31 is accessed in units of clusters, each of which is associated with a FAT value. Note that the FAT value that corresponds to the cluster storing the final part of an AOB file (the cluster 0° C. in the example shown in FIG. 7) is set the cluster number FFF to show that the corresponding cluster stores the final part of a file.

This completes the explanation of the file system in the flash memory card 31 of the present invention. The following describes the application layer that exists on this file system.

{3-3} Overview of the Application Layer in the Flash Memory Card 31

An overview of the application layer in the flash memory card 31 is shown in FIG. 3. As shown by the arrow PN1 drawn with a broken line in FIG. 3, the application layer in the flash memory card 31 is composed of presentation data and navigation data that is used to control the playback of the presentation data. As shown by the arrow PN2, the presentation data includes sets of audio objects (AOB sets) that are produced by encoding audio data that represents music, for example. As shown by the arrow PN3, the navigation data includes a "PlaylistManager" (PLMG) and a "TrackManager" (TKMG).

{3-3_8A,B-1} Directory Composition

FIGS. 8A and 8B show what kind of directories are present in the user region and the authentication region in the file system layer when these two types of data are stored in the application layer, as well as showing what files are arranged into these directories.

The filenames "SD_AUDIO.PLM" and "SD_AUDIO.TKM" in FIG. 8A indicate the files in which the PlaylistManager (PLMG) and TrackManager (TKMG) composing the navigation information are stored. Meanwhile, the filenames "AOB001.SA1", "AOB002.SA1", "AOB003.SA1", "AOB004.SA1", . . . indicate the files ("AOB" files) storing the audio objects that are, the presentation data. The letters "SA" in the filename extension of the filename "AOB0xx.SA1" are an abbreviation for "Secure Audio", and show that the stored content of this file requires copyright protection. Note that while only eight AOB files are shown in the example in FIG. 8A, a maximum of 999 AOB files can be stored in an SD-Audio directory.

When copyright protection is required for presentation data, a subdirectory called an "SD-Audio directory" is provided in the authentication region and an encryption key storing file "AOBSA1.KEY" is produced in this SD-Audio directory.

FIG. 8B shows the encryption key storing file "AOBSA1.KEY" that is stored under the "SD-Audio" legend (i.e., within the "SD-Audio directory"). This encryption key storing file "AOBSA1.KEY" stores a sequence of encryption keys that is produced by arranging a plurality of encryption keys into a predetermined order.

The SD-Audio directory shown in FIGS. 8A and 8B is stored in a server computer managed by a record label that uses electronic music distribution. When a consumer orders a music content, the corresponding SD-Audio directory is compressed, encrypted and transmitted to the consumer via a public network. The consumer's computer receives this SD-Audio directory, decrypts it, decompresses it and so obtains the original SD-Audio directory. Note that the expression "public network" here refers to any kind of network that can be used by the public, such as a wired communication network, e.g., an ISDN network, or a wireless communication network, e.g., a mobile telephone system. It is also possible for a consumer's computer to download an AOB file from a server computer operated by a record label and then produce an SD-Audio directory, such as that shown in FIGS. 8A and 8B, in the flash memory card 31.

{3-3_9-1} Correspondence Between the "AOBSA1.KEY" File and the AOB Files

Figure 9:
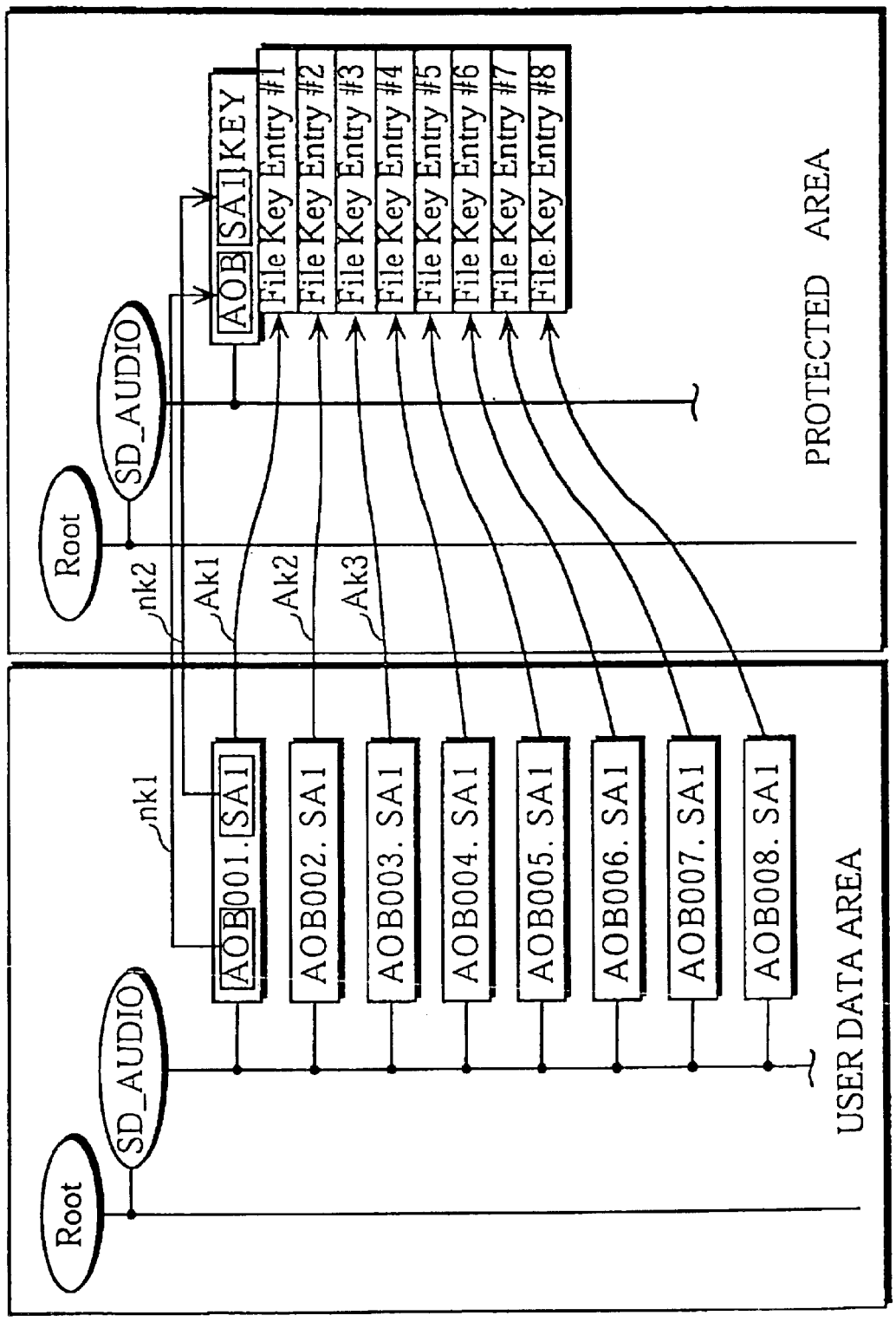
FIG. 9 shows the correspondence between the file "AOBSA1.KEY" and the AOB files in the SD_Audio directories.

FIG. 9 shows the correspondence between the "AOBSA1.KEY" file in the SD-Audio directory and the AOB files. The FileKeys used when encrypting files in the user region shown in FIG. 9 are stored in the corresponding encryption key storing file in the authentication region.

The encrypted AOB files and the encryption key storing file correspond according to the predetermined rules (1), (2), and (3) described below.

(1) The encryption key storing file is arranged into a directory with the same directory name as the directory in which the encrypted file is stored. In FIG. 9, AOB files are arranged into the SD-Audio directory in the user region and the encryption key storing file is arranged into a directory called the SD-Audio directory in the authentication region, in accordance with this rule.

(2) The encryption key storing file is given a filename produced by combining the first three letters of the filename of the AOB files in the data region with the predetermined ".key" extension. When the filename of an AOB file is "AOB001.SA1", the encryption key storing file is given the filename "AOBSA1.KEY" produced by adding the first three characters "AOB", "SA1", and the extension ".key", as shown by the arrows nk1 and nk2 in FIG. 9.

(3) The filename of an AOB file is given a serial number showing the position of the FileKey corresponding to this audio object in the sequence of encryption keys given in the encryption key storing file.

The "File Key Entries #1, #2, #3, . . . #8" show the first positions of the regions in which the respective FileKeys in the encryption key storing file are stored. Meanwhile, the filenames of AOB files are assigned the serial numbers "001", "002", "003", "004" . . . . These serial numbers show the positions of the corresponding FileKeys in the encryption key sequence, so that the FileKey that was used to encrypt each AOB file will be present in the "FileKey Entry" with the same serial number. In FIG. 9, the arrows Ak1, Ak2, Ak3, . . . show the correspondence between AOB files and FileKeys. In other words, the file "AOB001.SA1" corresponds to the FileKey whose storage position is indicated by the "FileKey Entry#2", and the file "AOB003.SA1" corresponds to the FileKey whose storage position is indicated by the "FileKey Entry#3". As can be understood from rule (3), different FileKeys are used to encrypt different AOB files, with these FileKeys being stored in "FileKey Entries" with the serial numbers "001", "002", "003", "004", etc., given in the filenames of the corresponding AOB files.

Since each AOB file is encrypted using a different FileKey, the exposure of the encryption key used for one AOB file will not enable users to decrypt other AOB files. This means that when AOB files are stored in an encrypted form on a flash memory card 31, the damage caused by the exposure of one FileKey can be minimized.

{3-3_10-1} Internal Composition of an AOB File

Figure 10:
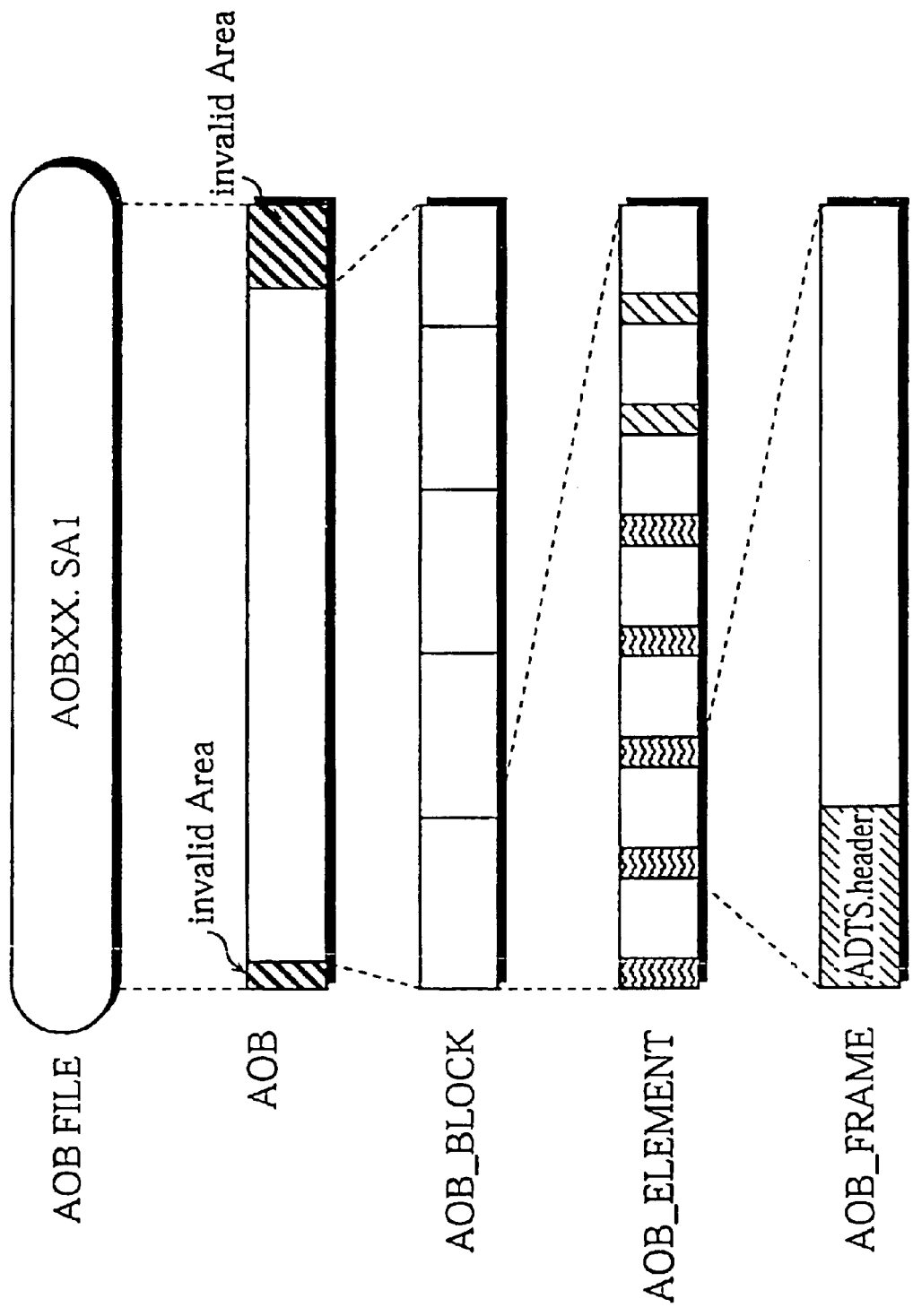
FIG. 10 shows the hierarchical composition of the data in an AOB file.

The following describes the internal composition of an AOB file. FIG. 10 shows the hierarchical data structure of an AOB file. The first level in FIG. 10 shows the AOB file, while the second level shows the audio object (AOB) itself. The third level shows the AOB_BLOCKs, the fourth level an AOB_ELEMENT, and the fifth level an AOB_FRAME.

The AOB_FRAME on the fifth level in FIG. 10 is the smallest unit composing the AOB, and is composed of audio data in ADTS (Audio Data Transport Stream) format and an ADTS header. Audio data in ADTS format is encrypted according to MPEG2-AAC (Low Complexity Profile) format and is stream data that can be played back at a transfer rate of 16 Kbps to 144 Kbps. Note that the transfer rate for PCM (Pulse Code Modulation) that is recorded on a conventional compact disc is 1.5 Mbps, so that data in ADTS format generally uses a lower transfer rate than PCM. The data construction of a sequence of AOB_FRAMEs is the same as the sequence of audio frames included in an audio data transport stream distributed by an electronic music distribution service. This means that the audio data transport stream to be stored as AOB_FRAME sequence is encoded according to MPEG2-ACC standard, encrypted, and transmitted on a public network to the consumer. AOB files are produced by dividing the transmitted audio data transport stream into a sequence of AOB_FRAMEs and storing these AOB_FRAMEs.

{3-3_10-1_11} MPEG2-AAC

MPEG2-AAC is described in detail in ISO/IEC 13818-7:1997(E) "Information Technology—Generic Coding of Moving Pictures and Associated Audio Information—Part7 Advanced Audio Coding (AAC)".

It should be noted that audio objects can only be compressed according to MPEG2-AAC using the parameters in the parameter table shown in FIG. 11A that is defined in ISO/IEC13818-7. This parameter table is composed of a "Parameter" column, a "Value" column, and a "Comment" column.

The legend "profile" in the Parameter column shows the only LC-profile can be used, as stipulated under ISO/IEC 13838-7. The legend "sampling_frequency#index" in the Parameter column shows that the sampling frequencies "48 kHz, 44.1 kHz, 32 kHz, 24 kHz, 22.05 kHz, and 16 kHz" can be used.

The legend "number_of_data_block_in_frame" in the Parameter column shows that the ratio of one header to one raw_data_block is used.

Note that while this explanation describes the case where AOB_FRAMEs are encoded according to MPEG-AAC format, AOB_FRAMEs may instead be encoded according to another format, such as MPEG-Layer3 (MP3) format or Windows Media Audio (WMA). When doing so, the parameters shown in the parameter tables of FIG. 11B or FIG. 11C must be used.

{3-3_10-2_12} Composition of an AOB_FRAME

While each AOB_FRAME includes audio data that is encoded according to the restrictions described above, the data length of the audio data in each AOB_FRAME is restricted to a playback time of only 20 ms. However, since MPEG2-AAC is a variable bitrate (VBR) encoding method, the data length of the audio data in each AOB_FRAME will vary. The following describes the composition of an AOB_FRAME, with reference to FIG. 12.

Figure 12:
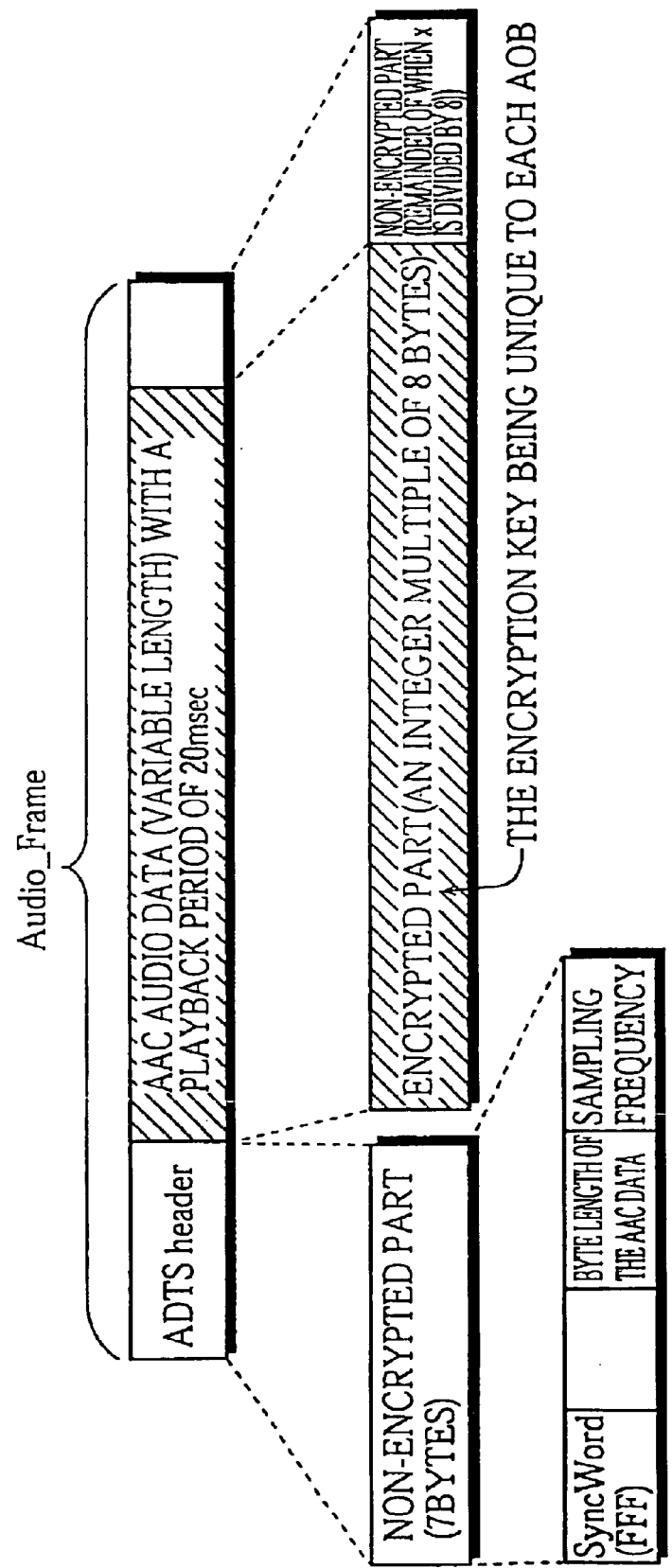
FIG. 12 shows the detailed construction of an AOB_FRAME.

The first level in FIG. 12 shows the overall composition, while the second level shows how each part of an AOB_FRAME is encrypted. As can be seen from the drawing, the ADTS header corresponds to a non-encrypted part. The audio data includes both an encrypted part and a non-encrypted part. The encrypted part of the audio data is composed of a plurality of eight-byte pieces of encrypted data, each of which is produced by encrypting an eight-byte piece of audio data using a 56-bit FileKey. When encryption is performed on 64-bit pieces of audio data, the non-encrypted part of the audio data is simply a final part of the data that cannot be encrypted due to it being shorter than 64 bits.

The third level in FIG. 12 shows the content of the ADTS header that is in the non-encrypted part of the AOB_FRAME. The ADTS header is seven bytes long, and includes a 12-bit synch word (set at FFF), the data length of the audio data in this AOB_FRAME, and the sampling frequency used when the audio data was encoded.

{3-3_10-3_13} Setting of the Byte Length of an AOB_FAM

Figure 13:
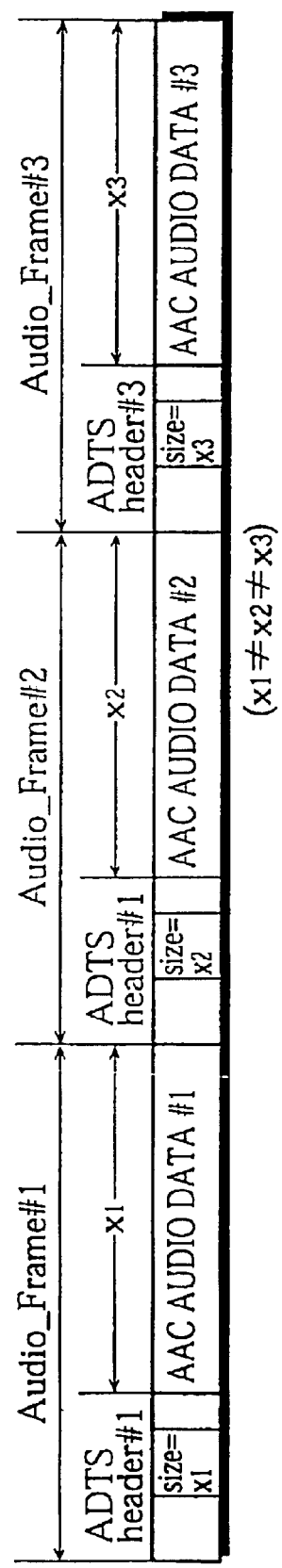
FIG. 13 shows how the byte length of the audio data in each of three AOB_FRAMEs is set.

FIG. 13 shows how the byte length of the audio data in each of three AOB_FRAMEs is set. In FIG. 13, the data length of audio data#1 included in AOB_FRAME#1 is x1, the data length of audio data#1 included in AOB_FRAME#2 is x2, and the data length of audio data#1 included in AOB_FRAME#3 is x3. When the data lengths x1, x2, and x3 are all different, the data length x1 will be written in the ADTS header of AOB_FRAME#1, the data length x2 will be written in the ADTS header of AOB_FRAME#2, and the data length x3 will be written in the ADTS header of AOB_FRAME#3.

Although the audio data is encrypted, the ADTS header is not, so that a playback device can know the data length of the audio data in an AOB_FRAME by reading the data length given in the ADTS header of the AOB_FRAME.

This completes the explanation of an AOB_FRAME.

{3-3_10-4} AOB_ELEMENT

The following describes the AOB_ELEMENT shown on the fourth level in FIG. 10.

An "AOB_ELEMENT" is a group of consecutive AOB_FRAMEs. The number of AOB_FRAMEs in an AOB_ELEMENT depends on the value set as the sampling_frequency_index shown in FIG. 1A and the encoding method used. The number of AOB_FRAMEs in an AOB_ELEMENT is set so that the total playback time of the included AOB_FRAMEs will be around two seconds, with this number depending on the sampling frequency and encoding method used.

{3-3_10-5_14} Number of AOB_FRAMEs in an AOB_ELEMENT

FIG. 14 shows the correspondence between the sampling frequency and the number of AOB_FRAMEs included in an AOB_ELEMENT. The number N given in FIG. 14 represents the playback period of an AOB_ELEMENT in seconds. When MPEG-ACC is used as the encoding method, the value of N is "2".

When the sampling_frequency is 48 kHz, the number of AOB_FRAMEs included in an AOB_ELEMENT is given as 94 (=47*2), while when the sampling_frequency is 44.1 kHz, the number of AOB_FRAMEs included in an AOB_ELEMENT is given as 86(=43*2). When the sampling_frequency is 32 kHz, the number of AOB_FRAMEs is given as 64 (=32*2), when the sampling_frequency is 24 kHz, the number of AOB_FRAMEs is given as 48(=24*2), when the sampling_frequency is 22.05 kHz, the number of AOB_FRAMEs is given as 44 (=22*2), and when the sampling_frequency is 16 kHz, the number of AOB_FRAMEs included in an AOB_ELEMENT is given as 32 (=16*2). However, when an editing operation, such as the division of an AOB, has been performed, the number of AOB_FRAMEs included in an AOB_ELEMENT at the start or end of an AOB may be less than a number calculated in this way.

While no header or other special information is provided for each AOB_ELEMENT, the data length of each AOB_ELEMENT is instead shown by a time search table.

Figure 15:
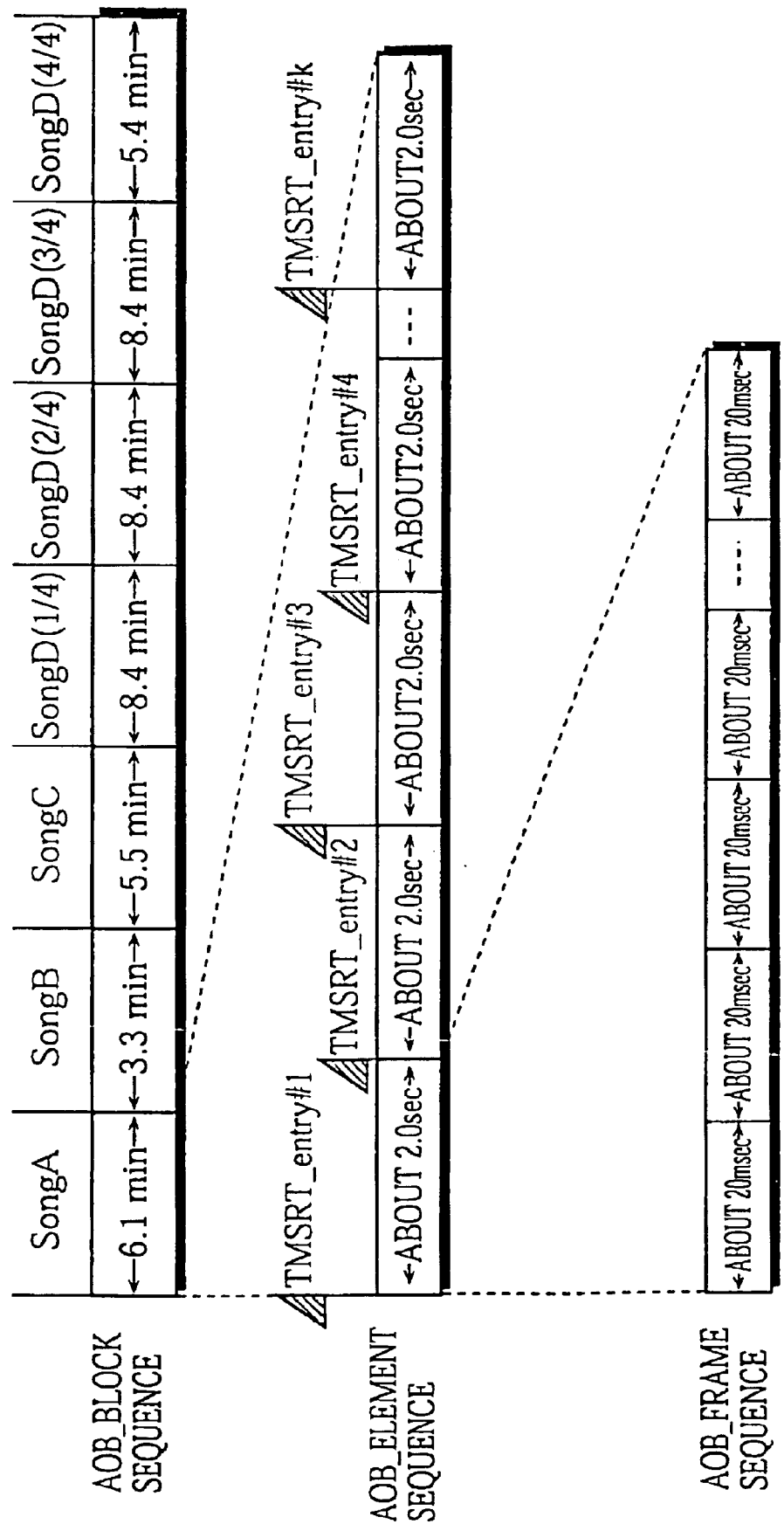
FIG. 15 shows examples of the playback periods of AOB_ELEMENTs and the playback periods of AOB_FRAMEs.

{3-3_10-6_15} One Example of the Playback Periods of AOB_ELEMENTS and AOB_FRAMEs FIG. 15 shows one example of the playback periods of AOB_ELEMENTs and AOB_FRAMEs. The first level in FIG. 15 shows a plurality of AOB_BLOCKs, while the second level shows a plurality of AOB_ELEMENTs. The third level shows a plurality of AOB_FRAMEs.

As shown in FIG. 15, an AOB_ELEMENT has a playback period of around 2.0 seconds, while an AOB_FRAME has a playback period of 20 milliseconds. The "TMSRT_entry" given to each AOB_ELEMENT shows that the data length of each AOB_ELEMENT is given in the time search table. By referring to the TMSRT_entries, a playback apparatus can perform a forward or backward search where, for example, intermittent bursts of music are played back by repeatedly playing back 240 milliseconds of audio data and then skipping two seconds of audio data in the desired direction.

{3-3_10-7} AOB_BLOCK

This completes the explanation of an AOB_ELEMENT. The following describes the concept of the AOB_BLOCKs shown on the third level of the data construction of an AOB file given in FIG. 10.

Each "AOB_BLOCK" is composed of valid AOB_ELEMENTS. Only one AOB_BLOCK exists in each AOB_FILE. While an AOB_ELEMENT has a playback period of around two seconds, an AOB_BLOCK has a maximum playback period of 8.4 minutes. The 8.4 minute limitation is imposed to restrict the size of the time search table to 504 bytes or less.

{3-3_10-8} Restriction of the Time Search Table

The following describes in detail why the size of the time search table is restricted by limiting the playback period.

When a playback apparatus performs a forward or backward search, the playback apparatus skips the reading of two seconds of audio data before playing back 240 milliseconds. When skipping two seconds of data, the playback apparatus could in theory refer to the data lengths shown in the ADTS headers of AOB_FRAMEs, though this would mean that the playback apparatus would have to consecutively detect 100 (2 seconds/20 milliseconds) AOB_FRAMEs just to skip two seconds of audio data. This would amount to an excessive processing load for the playback apparatus.

To reduce the processing load of a playback apparatus, the read addresses for data at two-second intervals can be written into a time search table that is then referred to by the playback apparatus when performing a forward or backward search. By writing information that enables read addresses that are two or four seconds ahead or behind to be found quickly into the time search table (such information being the data sizes of AOB_ELEMENTS), a playback apparatus will only need to refer to this information when performing a forward or backward search. The data size of audio data with a playback period of two seconds will depend on the bitrate used when playing back the audio data. As stated earlier, a bitrate in the range of 16 Kbps to 144 Kbps is used, so that the amount of data played back in two seconds will be in a range from 4 KB(=16 Kbps×2/8) to 36 KB(=144 Kbps×2/8). Since the amount of data played back in two seconds will be in a range from 4 KB to 36 KB, the data length of each entry in the time search table for writing the data length of audio data needs to be two bytes (=16 bits) long. This is because a 16-bit value is capable of expressing a number in the range 0-64 KB.

On the other hand, if the total data size of the time search table needs to be restricted to 504 bytes (this being the data size of the TKTMSRT described later), for example, the maximum number of entries in the time search table can be calculated as 504/2=252.

Since an entry is provided every two seconds, the playback time corresponding to this maximum of 252 entries is 504 seconds (=2s*252), or, in other words., 8 minutes and 24 seconds (=8.4 minutes). This means that setting the maximum playback period for an AOB_BLOCK at 8.4 minutes limits the data size of the time search table to 504 bytes.

{3-3_10-9} Regarding AOBs

This concludes the description of AOB_BLOCKs. The following describes AOBs.

The AOBs shown on the second level of FIG. 10 are regions that have invalid areas at either end. Only one AOB is present in each AOB file.

The invalid areas are regions that are read and written along with the AOB_BLOCKs and are stored in the same clusters as the AOB_BLOCKs. The start and end position of the AOB_BLOCKs within an AOB are shown by BITs included in the navigation data. These BITs are described in detail later in this specification.

This completes the explanation of what data is stored in an AOB file. The following describes what kind of content is played back when the eight AOBs and AOB_BLOCKs shown in the AOB file in FIG. 9 are successively read.

{3-3_10$^{-10}$_16}

Figure 16:
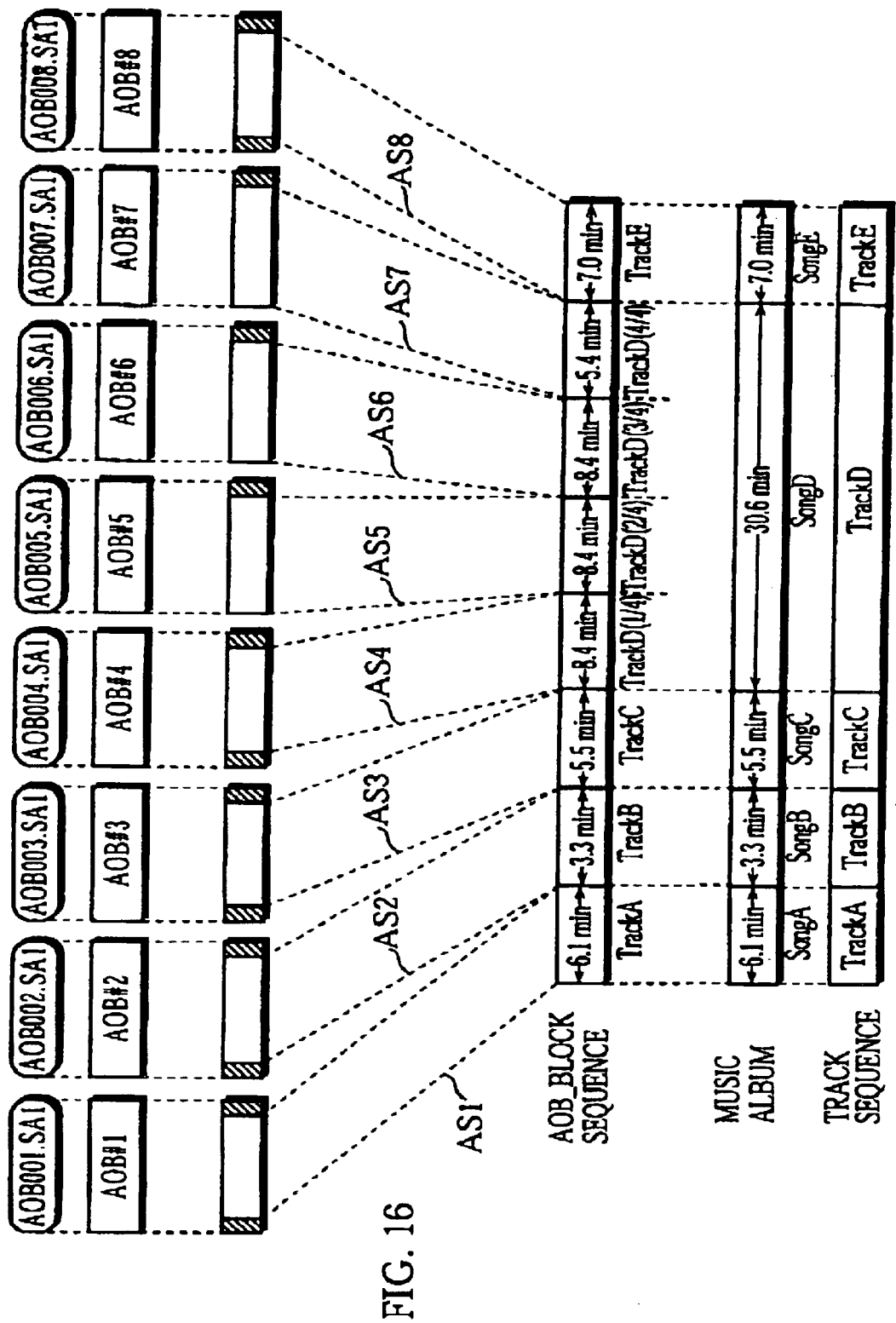
FIG. 16 shows what is reproduced when the AOBs and AOB_BLOCKs recorded in an AOB file are consecutively played back.

FIG. 16 shows the playback content when the AOBs and AOB_BLOCKs in this AOB file are successively read. The first level in FIG. 16 shows the eight AOB files in the user region, while the second level shows the eight AOBs recorded in these AOB files. The third level shows the eight AOB_BLOCKs included in these AOBs.

The fifth level shows the titles of five contents composed by these AOB files. In this example, the "contents" are the five songs SongA, SongB, SongC, SongD, and SongE, while the "title" is a music album composed of these five songs. The broken lines AS1, AS1, AS3, . . . AS7, and AS8 show the correspondence between the AOB_BLOCKs and the parts into which the album is divided, so that the fourth level in FIG. 16 shows the units used to divide the music album shown on the fifth level.

By referring to the broken lines, it can be seen that the AOB_BLOCK included in AOB#1 is a song (SongA) with a playback period of 6.1 minutes. The AOB_BLOCK included in AOB#2 is a song (SongB) with a playback period of 3.3 minutes. The AOB_BLOCK included in AOB#3 is a song (SongC) with a playback period of 5.5 minutes. In this way, "AOB001.SA1" to "AOB003.SA1" each correspond to a different song. The sixth level of FIG. 16 is a track sequence composed of tracks TrackA to TrackE. These tracks TrackA–TrackE correspond to the five songs SongA, SongB, SongC, SongD, and SongE, and are each treated as a separate playback unit.

On the other hand, AOB#4 has a playback period of 8.4 minutes and is the first (or "head") part of the song SongD that has a playback period of 30.6 minutes. The AOB_BLOCKs included in AOB#5 and AOB#6 are middle parts of the song SongD and also have playback periods of 8.4 minutes. The AbB_BLOCK included in AOB#7 is the end part of the song SongD and has a playback period of 5.4 minutes. In this way, a song that has a total playback period of 30.6 minutes is divided into (8.4+8.4+8.4+5.4-minute)

parts that are each included in a different AOB. As can be seen from FIG. 16, every song included in an AOB file is subjected to a maximum playback period of 8.4 minutes.

This explanation clearly shows that limiting the playback periods of AOBs as described above restricts the data size of the time search table corresponding to each AOB. The following describes the navigation data included in each time search table.

{3-3 BA,B-2}

The navigation data is composed of the two files "SD_Audio.PLM" and "SD_Audio.TKM" mentioned earlier. The file "SD_Audio.PLM" includes the PlaylistManager, while the file "SD_Audio.TKM" includes the TrackManager.

As mentioned as part of the explanation of the presentation data, a plurality of AOB files store encoded AOBs, though no other information, such as the playback period of the AOBs, the names of the songs represented by the AOBs, or credits for the songwriter(s), is given. While a plurality of AOBs are recorded in a plurality of AOB files, no indication as to the playback order of the AOBs is provided. To inform a playback apparatus of such information, the TrackManager and PlaylistManager are provided.

The TrackManager shows the correspondence between the AOBs recorded in AOB files and tracks, and includes a plurality of pieces of track management information that LL: each give a variety of information, such as the playback period of AOBs and the song names and songwriters of the various AOBs.

In this specification, the term "track" refers to a meaningful playback unit for users, so that when copyrighted music is stored on a flash memory card 31, each song is a separate track. Conversely, when an "audio book" (i.e., copyrighted literature stored as recorded audio) is recorded on a flash memory card 31, each chapter or paragraph can be set as a separate track. The TrackManager is provided to manage a plurality of AOBs recorded in a plurality of AOB files as a group of tracks.

A Playlist sets the playback order of a plurality of tracks. A plurality of Playlists can be included in the PlaylistManager.

The following describes the TrackManager with reference to the drawings.

{17-1_18} Detailed Composition of the PlaylistManager and TrackManager

Figure 17:
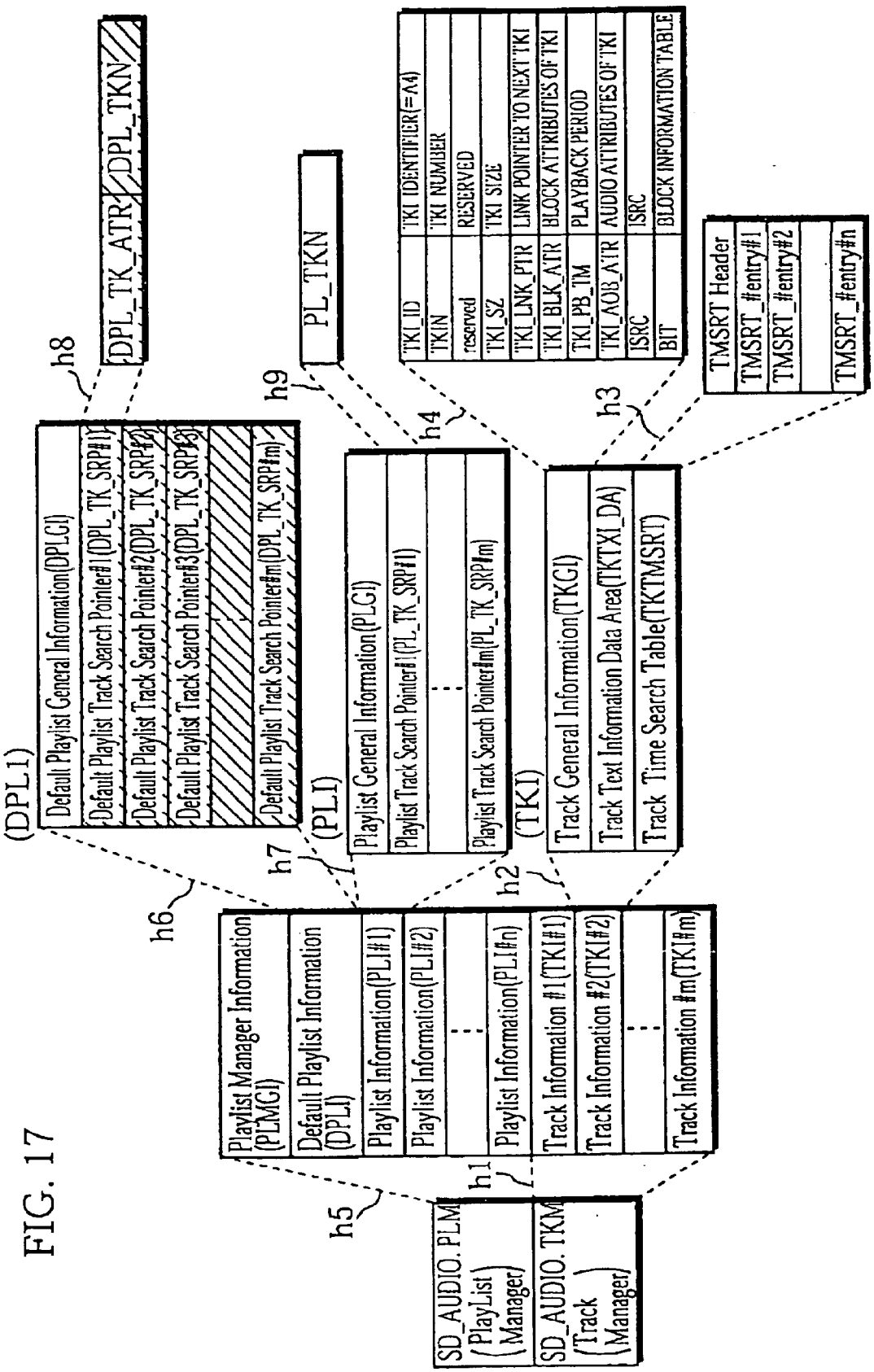
FIG. 17 shows the hierarchical composition of the PlaylistManager and TrackManager used in the embodiments in detail.
Figure 18:
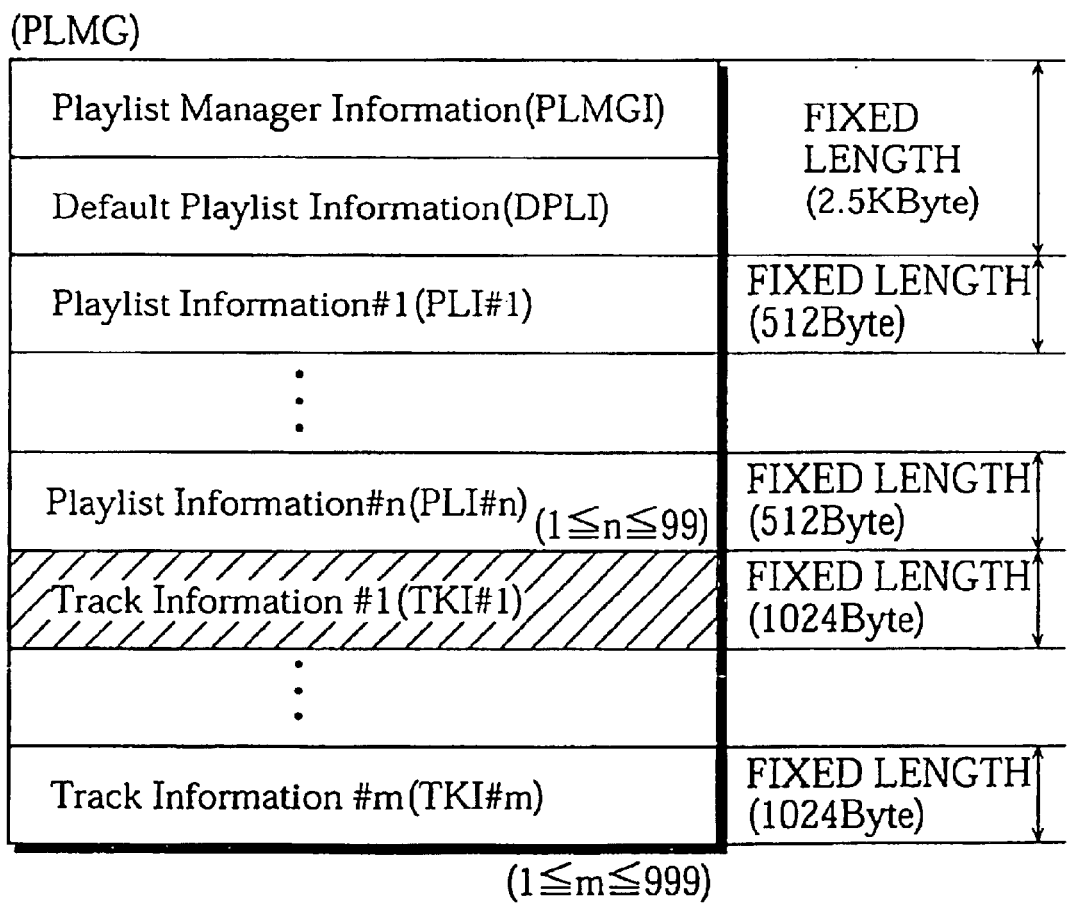
FIG. 18 shows the sizes of the PlaylistManager and the TrackManager.

FIG. 17 shows the detailed composition of the PlaylistManager and TrackManager in this embodiment as a hierarchy. FIG. 18 shows the sizes of the PlaylistManager all and the TrackManager. The right side of FIG. 17 shows the items on the left side in more detail, with the broken lines indicating which items are being shown in more detail.

As shown in FIG. 17, the TrackManager is composed of the Track Information (TKI) #1, #2, #3, #4... #n, as shown by the broken line hl. These TKIs are information for managing the AOBs recorded in AOB files as tracks, and each correspond to a different AOB file. From FIG. 17, it can be seen that each TKI is composed of Track_General_Information (TKGI), Track_Text_Information (TKTXTI_DA) in which text information exclusive to a track can be written, and a Track_Time_Search_Table (TKTMSRT) that serves as a time search table.

From FIG. 18, it can be seen that each TKI has a fixed size of 1,024 bytes, which means that total size of the TKGI and the TKTXTI_DA is fixed at 512 bytes due to the size of the TKTMSRT being fixed at 512 bytes. In the TrackManager, a total of 999 TKIs can be set.

As shown by the broken line h3, the TKTMSRT is composed of a TMSRT_Header and TMSRT_entries #1, #2, #3 ... #n.

{17-2_19} Correspondence of TKI with AOB Files and AOBs

Figure 19:
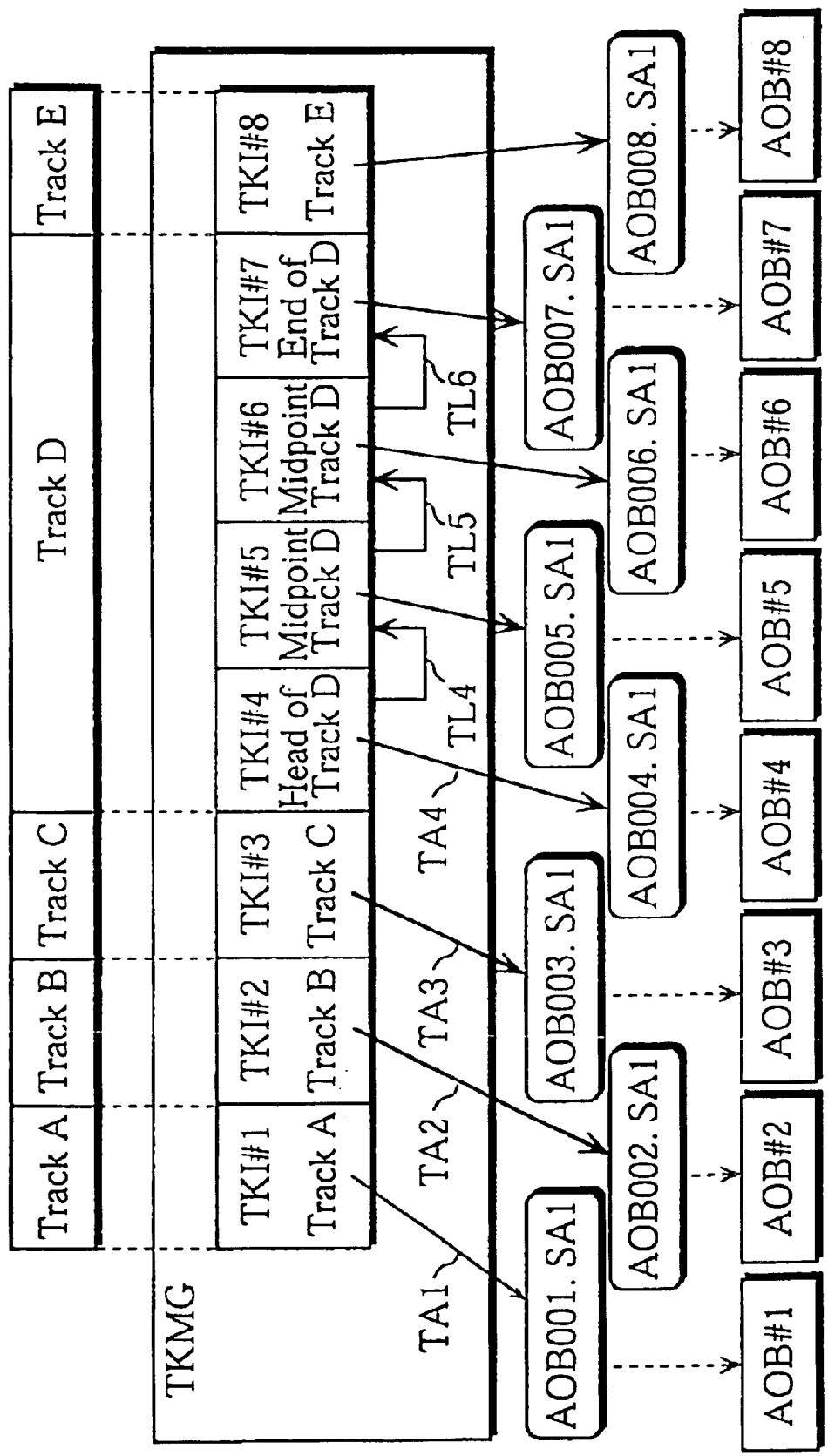
FIG. 19 shows the correspondence between the TKIs shown in FIG. 17 and the AOBs and AOB files shown in FIG. 16.

FIG. 19 shows how the TKIs shown in FIG. 17 correspond to the AOB files and AOBs shown in FIG. 16. The boxes on the first level in FIG. 19 show a sequence of tracks composed of tracks TrackA to TrackE, the large frame on the second level shows the TrackManager, while the third and fourth levels show the eight AOB files given in FIG. 16. The eight AOB files are recorded in the eight AOBs shown in FIG. 16, and compose a music album including tracks TrackA, TrackB, TrackC, TrackD, and TrackE. The second level shows the eight TKIs. The numbers "1", "2", "3", "4" assigned to each TKI are the serial numbers used to identify each TKI, with each TKI corresponding to the AOB file that has been given the same serial number 001, 002, 003, 004, 005 . . . .

With this in mind, it can be seen from FIG. 19 that TKI#1 corresponds to the file "AOB001.SA1", that TKI#2 corresponds to the file "AOB002.SA1", TKI#3 corresponds to the file "AOB003.SA1", and TKI#4 corresponds to the file "AOB004.SA1". The correspondence between TKIs and AOB_FRAMEs is shown by the arrows TA1, TA2, TA3, TA4 . . . in FIG. 19.

In this way, each TKI corresponds to a different AOB recorded in an AOB file and gives detailed information that applies only to the corresponding AOB.

{17-3_20} Data Composition of a TKTMSRT

Figure 20:
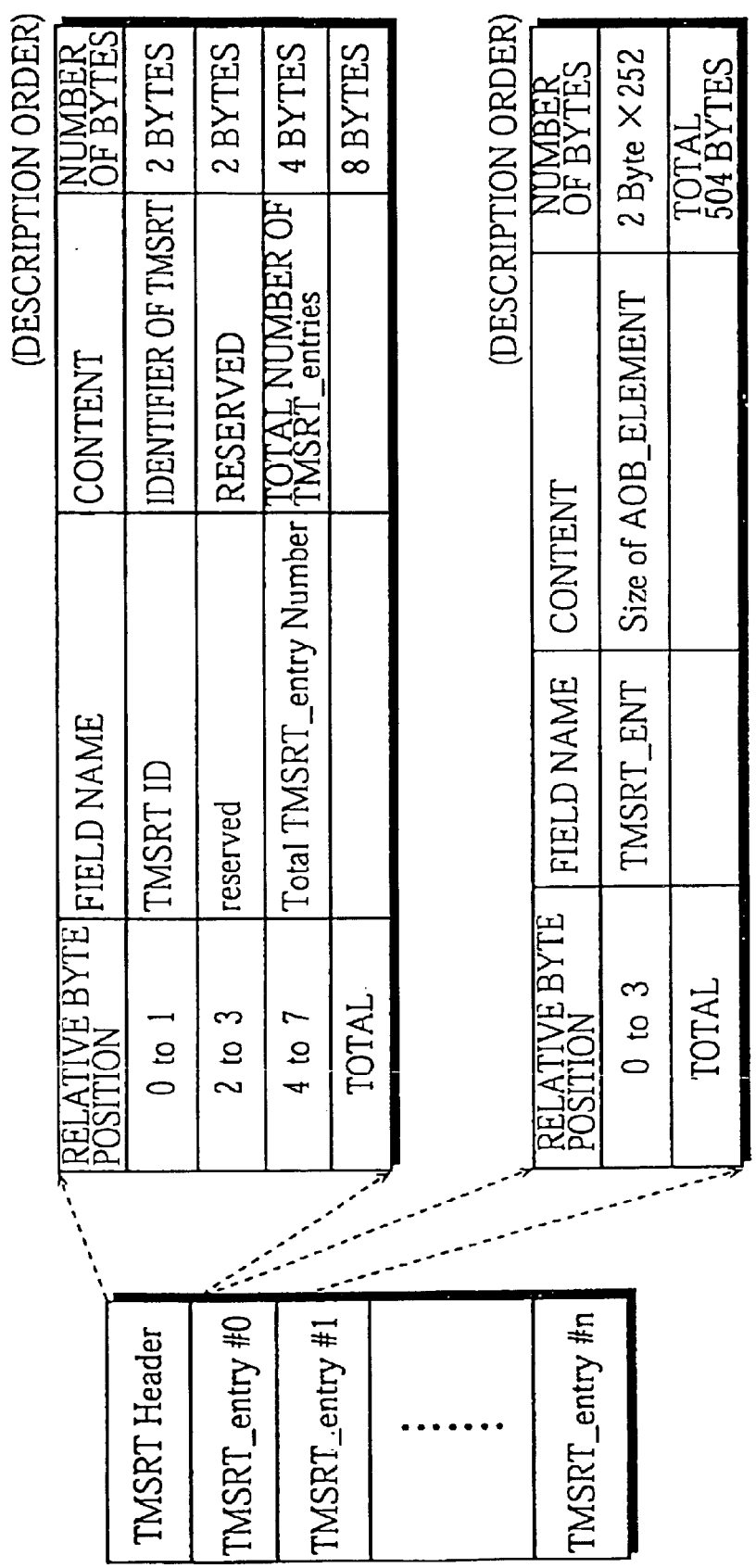
FIG. 20 shows the detailed data composition of the TKTMSRT shown in FIG. 17.

The following describes the information that applies to single AOBs recorded in AOB files, starting with the TKTMSRT. FIG. 20 shows the data composition of the TKTMSRT in detail.

The right side of FIG. 20 shows the detailed data composition of the time search table header (TMSRT_Header). In FIG. 20, the TMSRT_Header has a data size of eight bytes, and is made up of three fields. The first two bytes are a TMSRT_ID, the next two bytes are reserved, and the final four bytes are a Total TMSRT_entry_Number.

A unique ID for identifying the TMSRT is recorded in the "TMSRT_ID". The total number of TMSRT_entries in the present TMSRT is recorded in the "Total TMSRT_entry Number".

{17-3_21-1} Specific Example of the TKTXSRT

Figure 21:
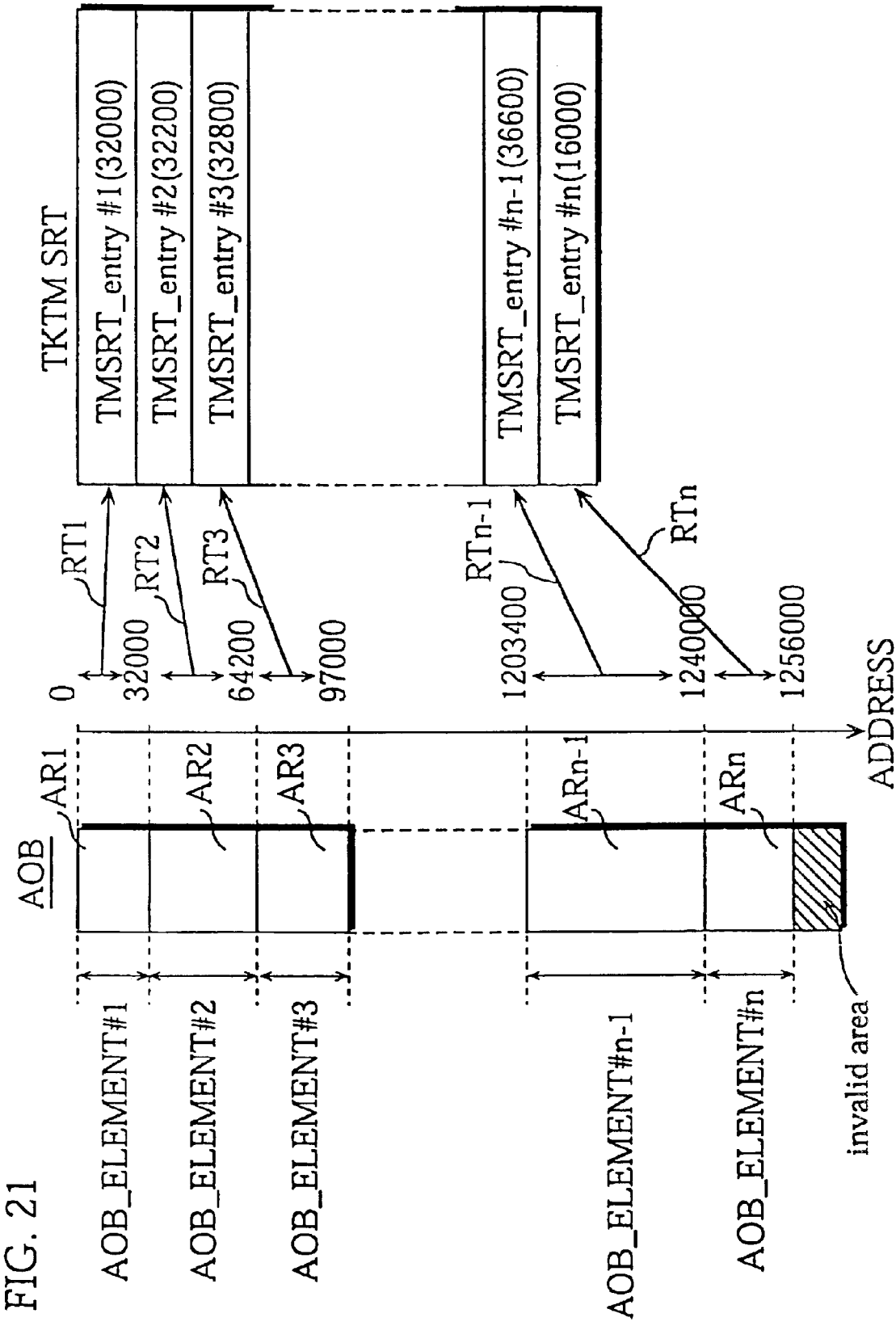
FIG. 21 shows one example of the TKTMSRT.

The following describes a TKTMSRT in detail. FIG. 21 shows one example of a TKTMSRT. The left side of FIG. 21 shows an AOB, while the right side shows the corresponding TKTMSRT. The AOB on the left side of FIG. 21 is composed of a plurality of AOB_ELEMENTs numbered #1, #2, #3 #n that occupy the regions numbered AR1, AR2, AR3 . . . ARn to the right.

The numbers such as "0", "32000", "64200", "97000", oil "1203400", and "1240000" show the relative addresses of ti) areas AR1, AR2, AR3, ARn-1, ARn occupied by the AOB_ELEMENTs with respect to the start of the AOB_BLOCK. As examples, AOB_ELEMENT#2 is recorded at a position that is at a distance "32000" from the start of the AOB_BLOCK, while AOB_ELEMENT#3 is recorded at a position that is at a distance "64200" from the start of the AOB_BLOCK and AOB_ELEMENT#n-1 is recorded at a position that is at a distance "1203400" from the start of the AOB_BLOCK.

It should be noted that the distance between each occupied region and the start of the AOB_BLOCK is not a multiple of a certain value, meaning that the regions occupied by AOB_ELEMENTs are not of the same size. The reason the occupied regions have different sizes is that the varying amounts of data are used to encode each AOB_FRAME.

Since the size of the region occupied by each AOB_ELEMENT differs, it is necessary to inform a playback apparatus in advance of the position of each AOB_ELEMENT in an AOB when performing a jump to the start of an AOB_ELEMENT. For this purpose, a plurality of TMSRT_entries are given in the TKTMSRT. The arrows RT1, RT2, RT3 . . . RTn-1, RTn show the correspondence between the regions AR1, AR2, AR3 . . . ARn-1, ARn occupied by each AOB_ELEMENT and TMSRT_entry#1, TMSRT_entry#2, TMSRT_entry#3 TMSRT_entry#n-1, TMSRT_entry#n. In other words, the size of the region AR1 occupied by AOB_ELEMENT#1 is written in the TMSRT_entry#1, while the sizes of the regions AR2 and AR3 occupied by AOB_ELEMENT#2 and AOB_ELEMENT#3 are written in the TMSRT_entries #2 and #3.

Since the occupied area AR1 takes up the region from the start of the AOB to the start of the AOB_ELEMENT#2 "32000", the size "32000" (=32000-0) is written in the TMSRT_entry#1. The occupied area AR2 takes up the region from the start of the AOB_ELEMENT#2 "32000" to the start of the AOB_ELEMENT#3 "64200", so that the size "32200" (=64200-32000) is written in the TMSRT_entry#2. The occupied area AR3 takes up the region from the start of the AOB_ELEMENT#3 "64200" to the start of the AOB_ELEMENT#4 "97000", so that the size "32800" (=97000-64200) is written in the TMSRT_entry#3. In the same way, the occupied area ARn-1 takes up the region from the start of the AOB_ELEMENT#n-1 "1203400" to the start of the AOB_ELEMENT#n "1240000", the size "36600" (=1240000-1203400) is written in the TMSRT_entry#n-1.

{17-3_21-2} How the TKTMSRT is read

In this way, the data sizes of AOB_ELEMENTs are written in a time search table. However, since the data length of each AOB_BLOCK is restricted to a maximum of 8.4 minutes, the total number of AOB ELEMENTs included in a single AOB is limited to a predetermined number ("252" as shown in FIG. 20) or less. Since the number of AOB_ELEMENTs is restricted, the number of TMSRT_entries corresponding to AOB_ELEMENTs is also restricted, which restricts the size of the TKTMSRT including these TMSRT_entries to within a predetermined size. Since the size of the TKTMSRT is restricted, a playback apparatus can read and use TKIs in the following way.

The playback apparatus reads a certain AOB and on commencing playback of the AOB, reads the corresponding TKI and stores it in a memory. This corresponding TKI is kept in the memory while the playback of this AOB continues. Once the playback of the AOB ends, the following AOB is read, and when the playback of this AOB commences, the playback apparatus overwrites the TKI corresponding to this following AOB into the memory in place of the old TKI. This next TKI is kept in the memory while the playback of this following AOB continues.

By reading and storing TKIs in this way, the necessary capacity of the memory in the playback apparatus can be minimized while still enabling special playback functions such as forward and backward search to be realized. While the present embodiment describes the case where the data length from the first address of an AOB_ELEMENT to the first address of the next AOB_ELEMENT is written in the TMSRT_entry, relative addresses from the start of the AOB_BLOCK to the first addresses of AOB ELEMENTs may be written in there instead.

{17-3_21-3} Specifying a Cluster Including an AOB_ELEMENT

The following describes how an AOB_ELEMENT may be read using the TKTMSRT. The TKTMSRT includes the size of each AOB_ELEMENT, so that when AOB_ELEMENT#y, which is the $y^{th}$ AOB_ELEMENT from the start of an AOB, is to be read, the cluster u that satisfies Equation 1 given below is calculated, and data positioned with the offset v from the start of the cluster u is read.

Cluster $u$=(Total of the TMSRT_entries from AOB_ELEMENT#1 to AOB_ELEMENT#y-1+DATA_Offset)/Cluster size           Equation 1

Offset v=(Total of the TMSRT_entries from AOB_ELEMENT#1 to AOB_ELEMENT#y-1+DATA_Offset) mod Cluster size where c=a mod b indicates that c is the remainder produced when a is divided by b The DATA_Offset is written in the BIT and is described later in this specification.

{17-4} TKTXI_DA

This completes the explanation of the time search table (TKTMSRT). The following describes the Track_Text_Information Data Area (TKTXI_DA) recorded in the upper part of the TKTMSRT.

The Track_Text_Information Data Area (TKTXTI_DA) is used to store text information showing the artist name, album name, mixer, producer, and other such information. This area is provided even when such text information does not exist.

{17-5} TKGI

The following describes the TKGI recorded in the upper part of the TKTXI_DA. In FIG. 17, several sets of information shown as the identifier "TKI_ID" of the TKI, the TKI number "TKIN", the TKI size "TKISZ", a link pointer to the next TKI "TKI_LNK_PTR", block attributes "TKIBLK_ATR", a playback period "TKI_PB_TM", the audio attributes "TKI_AOB_ATR", an "ISRC", and block information "BIT". Note that only some of this information has been shown in FIG. 17 to simplify the representation.

{17-5_22-1} TKGI

Figure 22:
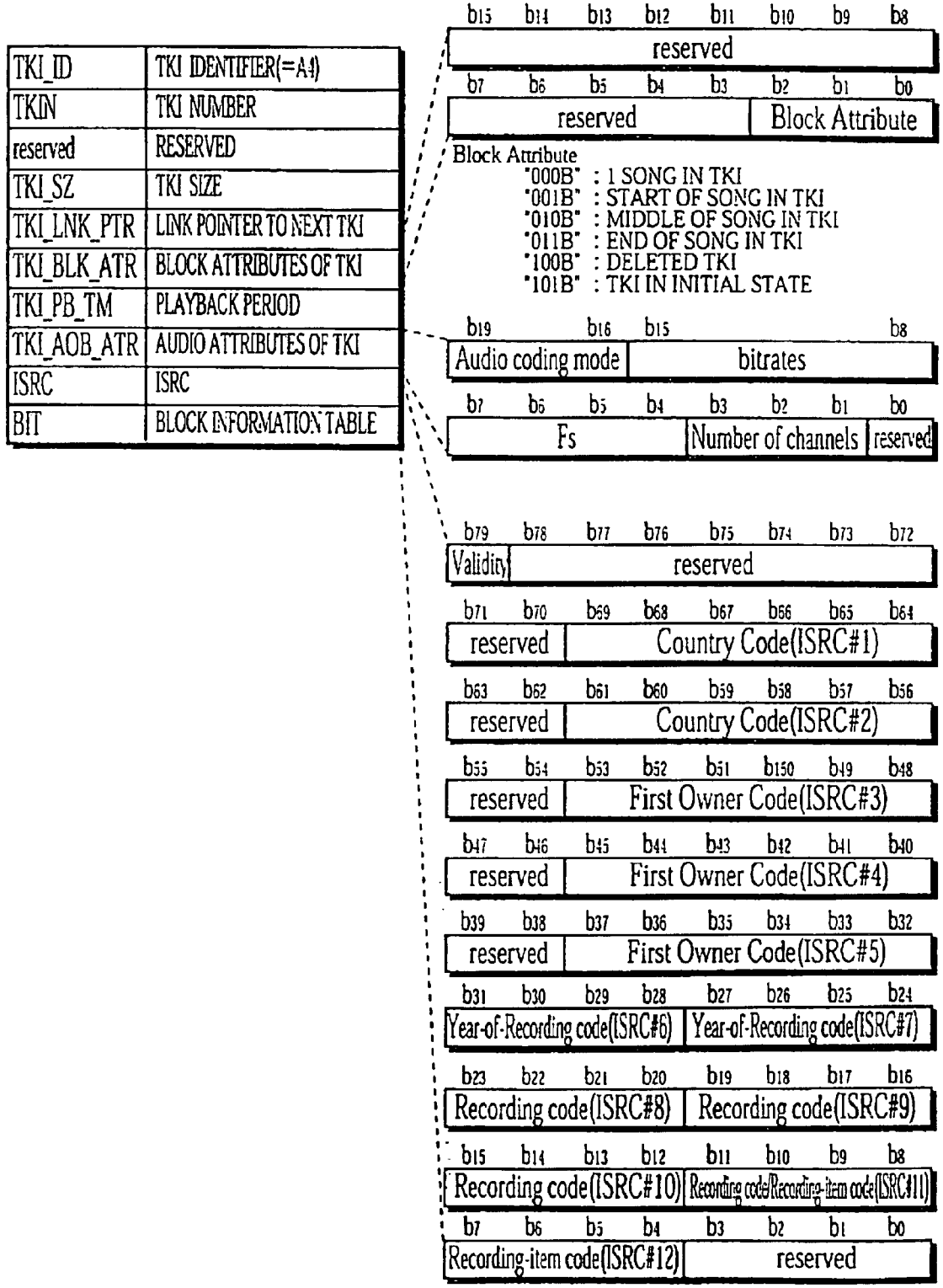
FIG. 22 shows the detailed composition of the TKGI.

The following describes the composition of a TKGI in detail, with reference to FIG. 22. The difference between FIG. 17 and FIG. 22 is that the data composition of the TKGI that was shown in FIG. 17 is arranged on the left side of this drawing, and that the bit compositions of "TKI BLK_ATR", "TKI_AOB_ATR" and "ISRC" are clearly shown.

{17-5_22-2} TKZ_ID

A unique ID for a TKI is written in the "TKIID". In the present embodiment, a two-byte "A4" code is used.

{17-5_22-3} TKIN

A TKI number in the range of 1 to 999 is written in the "TKIN". Note that the TKIN of each TKI is unique. In the present embodiment, the position of each TKI in the Track-Manager is used as the TKIN. This means that "1" is written as the TKI number of TKI#1, "12"1 is written as the TKI number of TKI#2, and "3" is written as the TKI number of TKI#3.

{17-5_22-4} TKI_SZ

The data size of the TKI in byte units is written in the "TKI_SZ". In FIG. 22, 1,024 bytes is given as the data size of the TKI so that each TKI in the present embodiment is 1,024 bytes long.

{17-5_22-5} TKI_LN_PTR

The TKIN of the TKI to which the present TKI is linked is written in the "TKI_LNK_PTR". The following describes such links between TKIs.

When a track is composed of a plurality of AOBs which are recorded in a plurality of AOB files, these AOB files will be managed as a single track by linking the plurality of TKIs that correspond to these AOB files. To link a plurality of TKIs, it is necessary to show the TKI of the AOB file that follows after the AOB file of the present TKI. Accordingly, the TKIN of the TKI that follows the present TKI is written in TKI_LNK_PTR.

{17-5_22-6_19} TK_LNK_PTR

The following describes the settings made for the TKI_LNK_PTR in the eight TKIs shown in FIG. 19. The track information numbered #1 to #3 and #8 each correspond to separate tracks, so no information is set in their TKI_LNK_PTR. The track information TKI#4, TKI#5, TKI#6, TKI#7 correspond to the four AOB files that compose TrackD, so that the next track information is indicated in the TKI_LNK PTR of these TKIs. As shown by the arrows TL4, TL5, and TL6 in FIG. 19, "TKI#5[11] is set in the TKI_LNK_PTR of TKI#4, "TKI#6" is set in the TKI_LNK_PTR of TKI#5, and "TKI#7" is set in the TKI_LNK_PTR of TKI#6.

As a result, a playback apparatus can refer to the TKI_LNK_PTRs given in the TKIs corresponding to these four AOB files and so find out that the four TKIs TKI#4 to TKI#7 and the four AOB files "AOB004.SA1" to AOB007. SA1" compose a single track, TrackD.

{17-5_22-7} TKI_BLK_ATR

The attributes of present TKI are written in the "TKIBLK_ATR". In FIG. 22, the information shown within the broken lines extending form the TKI_BLK_ATR shows the bit composition of the TKI_BLK_ATR. In FIG. 22, the TKI_BLK_ATR is shown as being 16 bits long, with the bits from b3 to bl5 being reserved for future use. The three bits from bit b2 to b0 are used to show the attributes of the TKI.

When one TKI corresponds to a complete track, the value "00b" is written in the TKI_BLK_ATR (this setting is hereafter referred to as "Track"). When several TKIs correspond to the same track, the value "001b" is written in the TKI_BLK_ATR of the first TKI (this setting is hereafter referred to as "Head_of_Track"), the value "010b" is written in the TKI_BLK_ATRs of the TKIs that correspond to AOBs in the middle of the track (this setting is hereafter referred to as "Midpoint_of_Track"), and the value "011b" is written in the TKI_BLK_ATR of the TKI that corresponds to the AOB at the end of the track (this setting is hereafter referred to as "End_of_Track"). When a TKI is unused but a TKI region exists, which is to say, when there is a deleted TKI, the value "100b" is written in the TKI_BLK_ATR (this setting is hereafter referred to as "Unused"). When a TKI is unused and no TKI region exists, the value "101b" is written in the TKI_BLK_ATR.

{17-5_22-8_19} Example Setting of the TRI_BLK_ATR

The following describes the settings of the TKI_BLK_ATR for each TKI in the example shown in FIG. 19.

By referring to the TKI_BLK_ATR of each TKI, it can be seen that the four pairs TKI#1 ("AOB001.SA1"), TKI#2 ("AOB002.SA1"), TKI#3 ("AOB003.SA1"), and TKI#8 ("AOB008.SA1") each correspond to separate tracks since the TKI_BLK_ATR of each of TKI#1, TKI#2, TKI#3, and TKI#8 is set as "Track".

The TLK_BLK_ATR of TKI#4 is set at "Head_of_Track", the TLK_BLK_ATR of TKI#7 is set at "End_of_Track", and the TLK_BLK_ATR of TKI#5 and TKI#6 is set at "Midpoint_of_Track". This means that the AOB file ("AOB004.SA1") corresponding to TKI#4 is the start of a track, the AOB files ("AOB005.SA1") and ("AOB006.SA1") corresponding to TKI#5 and TKI#6 are midpoints of the track, and the AOB file ("AOB007.SA1") corresponding to TKI#7 is the end of a track.

By classifying the combinations of TKI and corresponding AOB file in accordance with the settings of the TKI_BLK_ATR in the TKI, it can be seen that the combination of TKI#1 and "AOB001.SA1" composes a first track (TrackA). '37' Likewise, the combination of TKI#2 and "AOB002.SA1"composes a second track (TrackB) and the combination of TKI#3 and "AOB003.SA1" composes a third track (TrackC). The combination of TKI#4 and "AOB004.SA1" composes the first part of the fourth track (TrackD), the combinations of TKI#5 with "AOB005.SA1" and TKI#6 with "AOB006.SA1" compose central parts of TrackD, and the combination of TKI#7 and "AOB007.SA1" composes the end part of TrackD. Finally, the combination of TKI#8 and "AOB008.SA1" composes a fifth track (TrackE).

{17-5_22-9} TKI_PB_TM

The playback period of the track (song) composed of the AOB recorded in the AOB file corresponding to a TKI is written in the "TKI_PB_TM" in the TKI.

When a track is composed of a plurality of TKIs, the entire playback period of the track is written in the TKI_PB_TM of the first TKI corresponding to the track, while the playback period of the corresponding AOB is written into the second and following TKIs for the track.

{117-5_22-10} TKI_MOB_ATR

The encoding conditions used when producing an AOB, which is to say information such as (1) the sampling frequency at which the AOB recorded in the corresponding AOB file was sampled, (2) the transfer bitrate, and (3) the number of channels, is written in the "TKI_AOB_ATR" in a TKI. The bit composition of the TKI_AOB_ATR is shown within the broken lines that extend from the "TKI_AOB_ATR" in FIG. 22.

In FIG. 22, the TKI_AOB_ATR is composed of 32 bits, with the coding mode being written in the four-bit field from bit b16 to bit b19. When the AOB is encoded according to MPEG-2 AAC (with ADTS header), the value "0000b" is written into this field, while when the AOB is encoded according to MPEG-layer 3 (MP3), the value "0001b" is written. When the AOB is encoded according to Windows Media Audio (WMA), the value "0010b" is written in this field.

The bitrate used when encoding the AOB is written in the eight-bit field between bit b15 and bit b8. When the AOB is encoded according to MPEG-2 AAC (with ADTS header), a value between "16" and "72" is written into this field, while when the AOB is encoded according to MPEG1-layer 3 (MP3), a value between "16" and "96" is written. When the AOB is encoded according to MPEG1-layer 3 (MP3) LSF, a value between "16" and "80" is written into this field, while when the AOB is encoded according to Windows Media Audio (WMA), a value between "8" and "16" is written.

The sampling frequency used when encoding the AOB is written in the four-bit field between bit b7 and bit b4. When the sampling frequency is 48 kHz, the value "0000b" is written in this field. When the sampling frequency is it 44.1 kHz, the value is "0001b", when the sampling frequency is 32 kHz, the value is "001b", when the sampling frequency is 24 kHz, the value "0010b", when the sampling frequency is 22.05 kHz, the value "0001b", and when the sampling frequency is 16 kHz, the value "010b".

The number of channels is written in the three-bit field from bit b3 to bit b1. When one channel (i.e., monaural) is used, the value "000b" is written in this field, while when two channels (i.e., stereo) is used, the value "001b" is written in this field.

The twelve-bit field from bit b31 to bit 20 is reserved for future use, as is the bit b0.

{17-5_22-11} ISRC

An ISRC (International Standard Recording Code) is written in the TKGI. In FIG. 22, the broken lines extending from the "ISRC" box show the content of the ISRC. As shown in the drawing, the ISRC is composed of ten bytes, with a Recording-item code (#12) being written into the four-bit field between bit b4 and bit b7. A Recording code/Recording-item code (#11) is written in the four-bit field between bit b8 and bit b11.

A Recording Code (ISRC#10, #9, #8) is written in the twelve-bit field between bit b12 and bit b23. A Year-of-Recording code (ISRC#6, #7) is written in the eight-bit field b24 and bit b31.

The First Owner Code (ISRC #3, #4, #5) is written in the six-bit field between bit b32 and bit b37, the six-bit field between bit b40 and bit b45, and the six-bit field between bit b48 and bit b53. The Country Code (ISRC #1, #2, #3) is written in the six-bit field between bit b56 and bit b61 and the six-bit field between bit b64 and bit b69. A one-bit Validity flag is written in a one-bit field composed of bit b79. A detailed description of ISRC can be found in IS03901:1986 "Documentation-International Standard Recording Code (ISRC)".

{17-5_22-12_23A-1} BIT

The "Block Information Table (BIT)" is a table for managing an AOB_BLOCK, and has the detailed composition shown in FIGS. 23A and 23B.

As shown in FIG. 23A, a BIT is composed of a DATA_OFFSET field that occupies a region from the 60th byte to the 63rd byte, an SZ_DATA field that occupies a region from the 64th byte to the 67th byte, a TMSRTE_Ns field that occupies a region from the 68th byte to the 71st byte, an FNs_1st_TMSRTE field that occupies a region from the 72nd byte to the 73rd byte, an FNs_Last_TMSRTE that occupies a region from the 74th byte to the 75th byte, an FNs_Middle_TMSRTE field that occupies a region from the 76th byte to the 77th byte, and a TIME_LENGTH field that occupies a region from the 78th byte to the 79th byte.

Each of these fields is described in detail below.

{17-5_22-12_23A-2} DATA_Offset

The relative address of the start of an AOB_BLOCK from the boundary between clusters is written in the "DATA_OFFSET" as a value given in byte units. This expresses the size of an invalid area between an AOB and the AOB_BLOCK. As one example, when a user records a radio broadcast on a flash memory card 31 as AOBs and wishes to delete an intro part of a track over which a DJ has spoken, the DATA_OFFSET in the BIT can be set to have the track played back without the part including the DJ's voice.

{17-5_22-12_23A-3} SZ_DATA

The data length of an AOB_BLOCK expressed in byte units is written in "SZ_DATA". By subtracting a value produced by adding the SZ_DATA to the DATA_Offset from the file size (an integer multiple of the cluster size), the size of the invalid area that follows the AOB_BLOCK can be found.

{17-5_22-12_23A-4} TMSRTE_Ns

The total number of TMSRT_Entries included in an AOB_BLOCK is written in "TMSRTE_Ns".

{17-5_22-12_23A-5} "FNs_1st_TMSRTE", "FNs_Last_TMSRTE", "FNs_Middle_TMSRTE"

The number of AOB_FRAMEs included in the AOB_ELEMENT positioned at the start of a present AOB_BLOCK is written in "IFNs_1st_TMSRTE".

The number of AOB_FRAMEs included in the AOB_ELEMENT positioned at the end of the present AOB_BLOCK is written in "FNs_Last_TMSRTE".

The number of AOB_FRAMEs included in each AOB_ELEMENT apart from those at the start and the end of the present AOB_BLOCK, which is to say AOB_ELEMENTs in the middle of the AOB_BLOCK, is written in "FNs_Middle_TMSRTE".

The playback period of an AOB_ELEMENT is written in the format shown in FIG. 23C in the "TIME_LENGTH" field to an accuracy in the order of milliseconds. As shown in FIG. 23C, the "TIME_LENGTH" field is 16-bits long. When the encoding method used in MPEG-ACC or MPEG-Layer3, the playback period of an AOB_ELEMENT is two seconds, so that {D} the value "2000" is written in the "TIME_LENGTH" field.

{17-5_22-13_23B}

FIG. 23B shows the number of AOB_FRAMEs indicated by "FNs_Middle TMRTE". In the same way as FIG. 14, FIG. 23B shows the relationship between the sampling_frequency and C} the number of AOB_FRAMEs included in an AOB_ELEMENT in the middle of an AOB_BLOCK.

The relationship between the sampling_frequency and the number of frames included in the AOB_ELEMENT shown in FIG. 23B is the same as that shown in FIG. 14, which is to say, the number of frames in an AOB_ELEMENT depends on the sampling frequency used. The number of frames written in "FNs_1st_TMSRTE" and "FNs_Last TMSRTE" will fundamentally be the same as the number written in "FNs_Middle_TMSRTE", though when an invalid area is present in the AOB_ELEMENTs at the start and/or end of an AOB_BLOCK, the values given in "FNs_1st_TMSRTE" and/or "FNs_Last_TMSRTE" will differ from the value in "FNs Middle_TMSRTE".

{17-5_22-14_24} Example of a Stored AOB_ELEMENT

Figure 24:
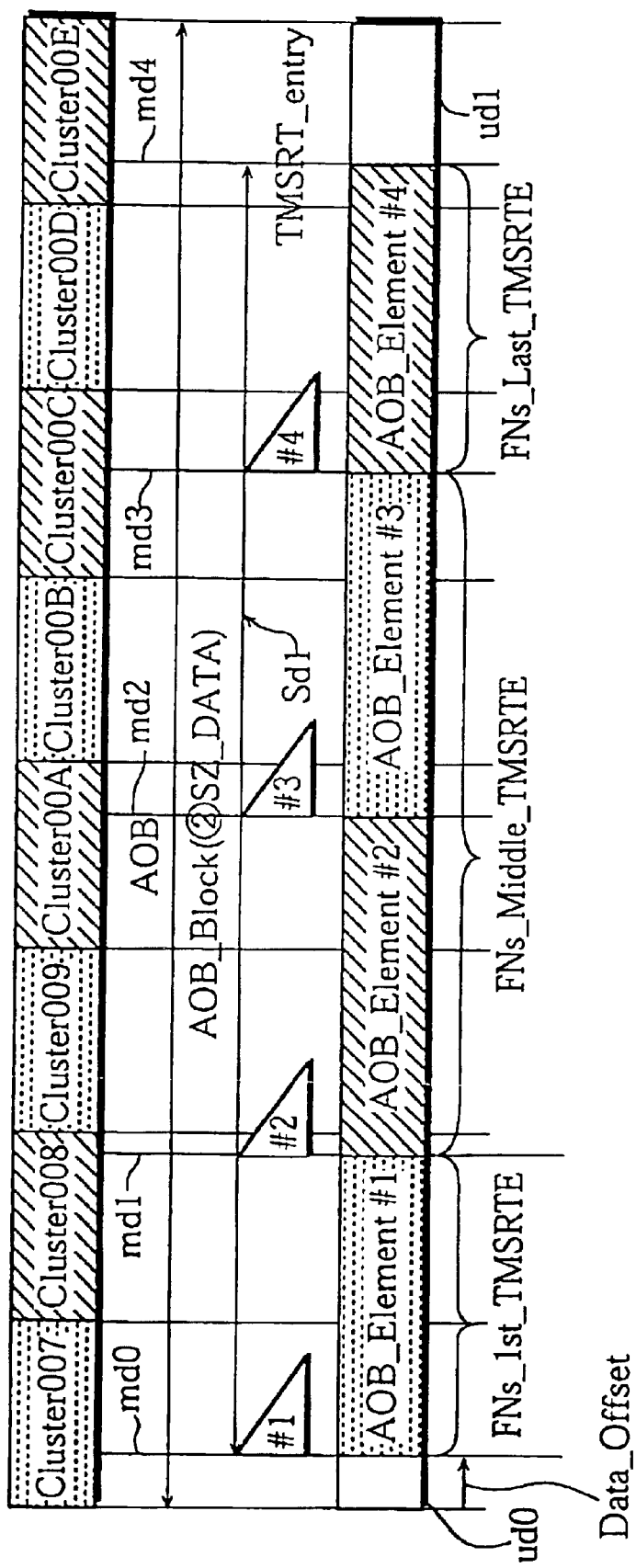
FIG. 24 shows cluster 007 to 00E into which the AOB composed of AOB_ELEMENT#1 to AOB_ELEMENT#4 are stored.

FIG. 24 shows the clusters 007 to 00E that store the AOB composed of AOB_ELEMENT#1 to AOB_ELEMENT#4. The following describes the settings in the BIT when an AOB is stored as shown in FIG. 24. AOB_ELEMENT#1 to AOB_ELEMENT#4 that are stored in cluster 007 to cluster 00E are indicated in FIG. 24 by the triangular flags, with TMSRT_entries being set in the TKI for each of AOB_ELEMENT#1 to AOB_ELEMENT#4.

In this example, the first part of AOB_ELEMENT#1 at the start of the AOB is stored in cluster 007, while the last part of AOB_ELEMENT#4 at the end of the AOB is stored in cluster 00E. The AOB_ELEMENTs #1 to #4 occupy the region between md0 in cluster 007 to md4 in cluster 00E. As shown by arrow sd1 in FIG. 24, the SZ_DATA in the BIT indicates that AOB_ELEMENTs #1 to #4 occupy a region from the start of cluster 007 to the end of cluster 00E, and so does not indicate that there are the invalid areas ud0 and ud1 in clusters 007 and 00E that are not occupied by an AOB_ELEMENT.

On the other hand, the AOB also includes the parts b0 and ud1 that are present in clusters 007 and 00E but are not occupied by AOB_ELEMENT#1 or AOB_ELEMENT#4. The DATA_Offset given in the BIT gives the length of the unoccupied region ud0, which is to say, a position value for the start of the AOB_ELEMENT#1 relative to the start of cluster 007.

In FIG. 24, the AOB_ELEMENT#1 occupies a region from md0 in cluster 007 to md1 in cluster 008.

This AOB_ELEMENT#1 does not occupy all of cluster 008, with the remaining part of the cluster being occupied by AOB_ELEMENT#2. AOB_ELEMENT#4 occupies a region from md3 midway through cluster 00C to md4 midway through cluster 00E. In this way, AOB ELEMENTs may be stored across cluster boundaries, or in other words, AOB_ELEMENTs can be recorded without regard for the boundaries between clusters. The "FNs_1st_TMSRTE" in the BIT shows the number of frames in AOB_ELEMENT#1 that is located in clusters 007 and 008, while the "FNs_Last_TMSRTE" in the BIT shows the number of frames in AOB_ELEMENT#4 that is located in clusters 00C to 00E.

In this way, AOB_ELEMENTs can be freely positioned without regard for the boundaries between clusters. The BIT provides information showing the offset from a cluster boundary to an AOB_ELEMENT and the number of frames in each AOB_ELEMENT.

{17-5_22-14_25} Use of the Number of Frames given in each AOB_ELEMENT (part 1)

The following describes how the number of frames in each AOB_ELEMENT given in the BIT is used. This number of frames given in the BIT is used when forward or backward search is performed. As mentioned earlier, such operations play back 240 milliseconds of data after first skipping data with a playback period of two seconds.

Figure 25:
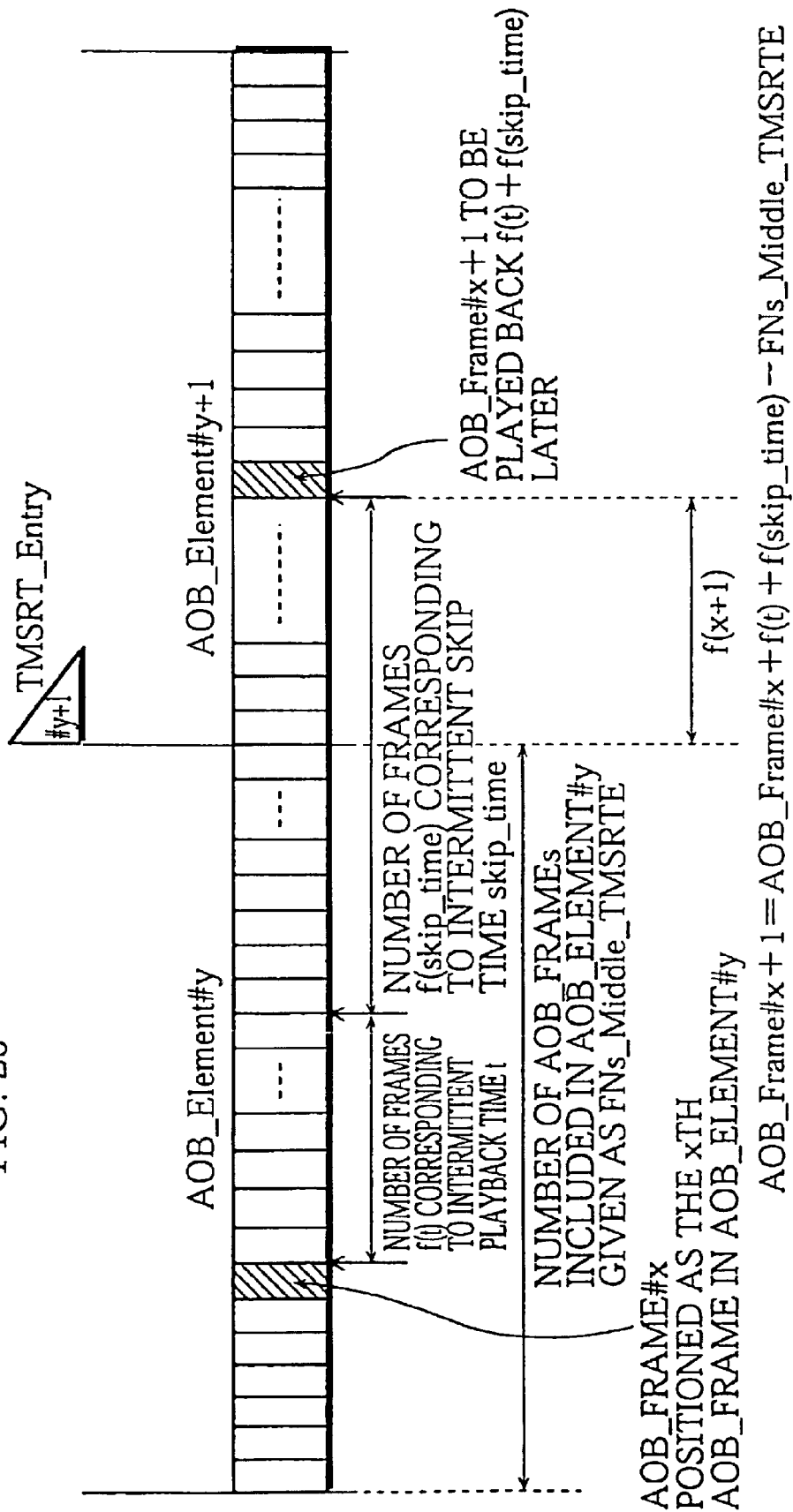
FIG. 25 shows how the next AOB_FRAME#x+1 to be played back is set when forward search is performed starting from the AOB_FRAME#x in an arbitrary AOB_ELEMENT#y in an AOB.

FIG. 25 shows how AOB_FRAME#x+1, which should be played back next, is set when performing forward search starting from an AOB_FRAME#x in an AOB_ELEMENT#y in an AOB.

FIG. 25 shows the case when a user selects forward search during the playback of AOB_FRAME#x included in AOB_ELEMENT#y. In FIG. 25, "t" represents the intermittent playback period (here, 240 milliseconds), "f(t)" shows the number of frames that correspond to this intermittent playback period, "skip_time" shows the length of the period that should be skipped between intermittent playback periods (here, two seconds), "f(skip_time)" shows the number of frames that correspond to this skip time. Intermittent playback is achieved by repeating the three procedures (1), (2), and (3) described below.

(1) The playback apparatus refers to the TMSRT_entry in the TKTMSRT and jumps to the start of the flag symbol (AOB_ELEMENT).
(2) The playback apparatus performs playback for 240 milliseconds.
(3) The playback apparatus jumps to the start of the next flag symbol (AOB_ELEMENT).

The AOB_FRAME#x+1 that exists 2s+240 ms from the AOB_FRAME#x included in the AOB_ELEMENT#y will definitely be present in the AOB_ELEMENT#y+1. When specifying the AOB_FRAME#x+1 that is 2s+240 ms from the AOB_FRAME#x, the first address of the next AOB_ELEMENT#y+1 can be immediately calculated by reading a TMSRT_entry from the TKTMSRT, though a playback apparatus cannot know the number of AOB_FRAMEs from the start address of the AOB_ELEMENT#y+1 to the AOB_FRAME#x+1 from the TMSRT_entry alone.

To calculate this number of AOB_FRAMES, it is necessary to subtract the total number of frames included in the AOB_ELEMENT#y from the total of (1) the number#x showing the position of the AOB_FRAME#x relative to the start of the AOB_ELEMENT#y, (2) f(t) and (3) f(skip_time). To simplify the calculation of the relative frame position of AOB_FRAME#x+1 in AOB_ELEMENT#y+1, the "FNs_1st_TMSRTE", "FNs_Middle_TMSRTE", and "FNs_Last_TMSRTE" for each AOB_ELEMENT are written in the BIT, as mentioned above.

{17-5_22-15_26A} Use of the Number of Frames Given in Each AOB_ELEMENT (part 2)

Figure 26A:
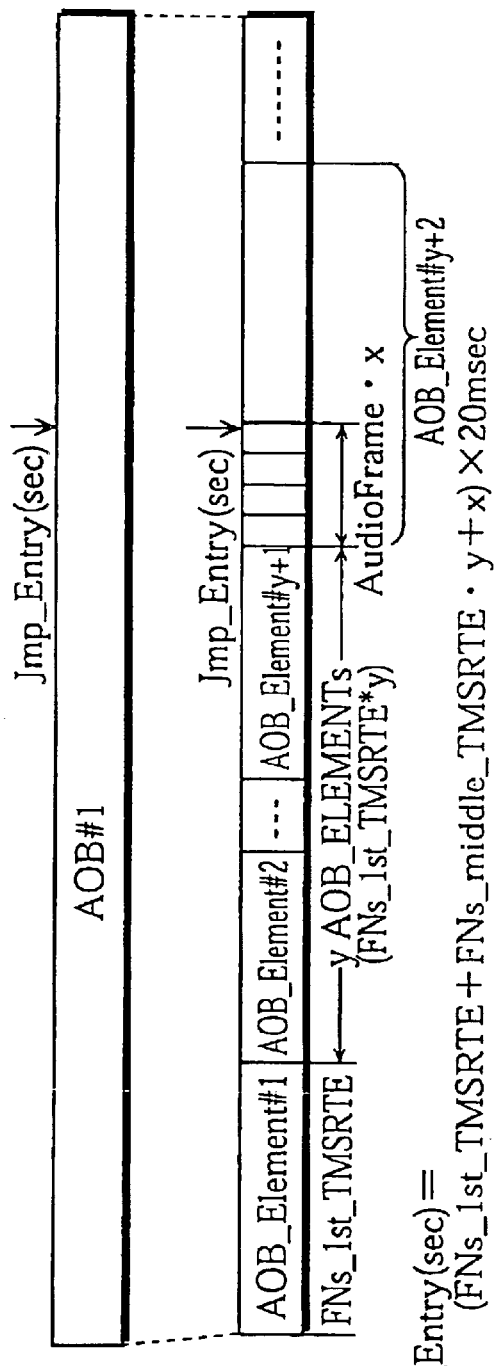
FIGS. 26A and 26B show how an AOB, an AOB_ELEMENT, and an AOB_FRAME that correspond to an arbitrary playback time code are specified.
Figure 26B:
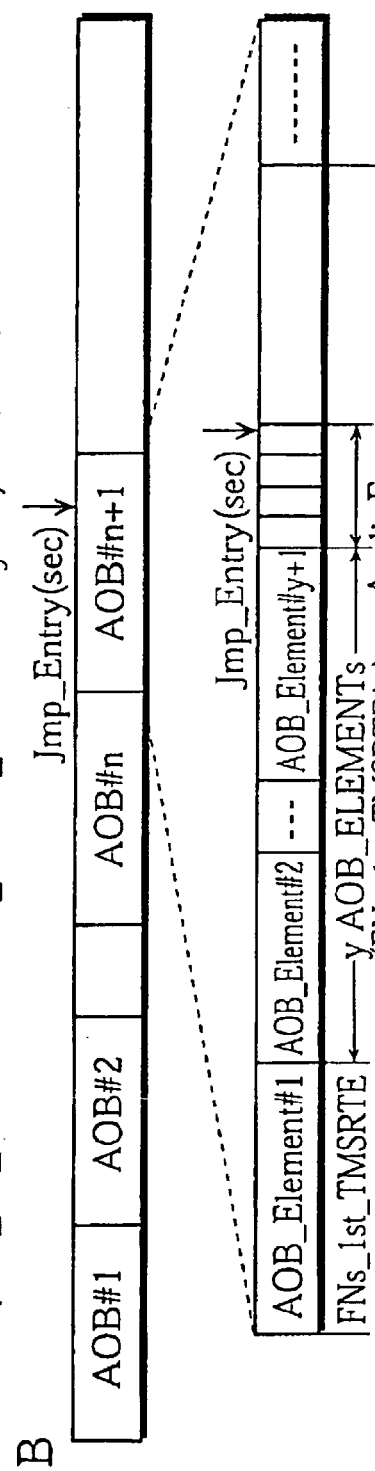

The number of frames written in the BIT is also used when the playback apparatus performs a time search function where playback starts at a point indicated using a time code. FIG. 26A, shows how a playback apparatus can specify the AOB_ELEMENT and AOB_FRAME corresponding to the playback start time indicated by the user. When playback is to commence from a time indicated by the user, the indicate time (in seconds) is set in the Jmp_Entry field, the playback should begin from an AOB_ELEMENT#Y and an AOB_FRAME position x that satisfy Equation 2 given below.

$$Jmp\_Entry(sec)=(FNs\_1st\_TMSRTE+FNs\_middle\_TMSRTE*y+x)*20\ msec \qquad \text{Equation 2}$$

Since the "FNs_1st_TMSRTE" and "FNs_Middle_TMSRTE" are provided in the BIT, these can be substituted into Equation 2 to calculate the AOB_ELEMENT#y and AOB_FRAME#x. Having done this, a playback apparatus can refer to the TKTMSRT of the AOB, calculate the first address of the AOB_ELEMENT#y+2 (which is the $(y+2)^{th}$ AOB_ELEMENT in this AOB), and start the search for AOB_FRAME#x from this first address. On finding the $x^{th}$ AOB_FRAME, the playback apparatus starts the playback from this frame. In this way, the playback apparatus can start the playback of data from the time indicated by Jmp_Entry (in seconds).

In this way, a playback apparatus does not have to search for the ADTS header parts of AOB_FRAMEs, and only needs to perform the search in AOB_ELEMENTs that are given in the TMSRT_entries in the TKTMSRT. This means that the playback apparatus can find a playback position a) corresponding to an indicated playback time at high speed.

In the same way, when the Jmp_Entry is set and the time search function is used on a track that is composed of a plurality of AOBs, the playback apparatus only needs to calculate an AOB_ELEMENT#y and AOB_FRAME#x that satisfy Equation 3 below.

$$Jmp\_Entry\ (in\ seconds)=\text{Playback period from AOB\#1 to}\ AOB\#n+(FNs\_1st\_TMSRTE(\#n+1)+FNs\_middle\_TMSRTE(\#n+1)*y+x)*20m\ sec \qquad \text{Equation 3}$$

The total playback period of the AOBs from AOB#1 to AOB#n is as follows.

Total Playback Period from AOB#1 to AOB#n=["FNs_1st_TMSRTE" (#1)+"FNs_Middle_TMSRTE" (#1)*(Number of TMSRT_entries(#1)−2)+"FNs_Last_TMSRTE" (#1)+"FNs_1st_TMSRTE" (#2)+("FNs_Middle_TMSRTE " (#2)*Number of TMSRT_entries (#2)−2)+"FNs_Last_TMSRTE" (#2)+"FNs_1st_TMSRTE" (#3)+("FNs_Middle_TMSRTE" (#3) *Number of TMSRT_entries (#3)−2)+"FNs_Last_TMSRTE" (#3) . . . +"FNs_1st_TMSRTE" (#n)+("FNs_Middle_TMSRTE" (#n)* Number of TMSRT_entries (#n)−2)+"FNs_Last_TMSRTE" (#n)]*20 msec Having calculated an AOB#n, an AOB_ELEMENT#y, and AOB_FRAME#x that satisfy Equation 3, the playback apparatus refers to the TKTMSRT corresponding to the AOB#n+1, searches for the $x^{th}$ AOB_FRAME from the address at which the $(y+2)^{th}$ AOB_ELEMENT (i.e., AOB_ELEMENT#y+2) is positioned, and starts the playback from this $X^{th}$ AOB_FRAME.

{17-5_22-16_27A,B} Deletion of an AOB File and a TKI

This completes the explanation of all of the information included in the TKI. The following describes how the TKI is updated in the following four cases. In the first case (case1), a track is deleted. In the second case (case2) a track is deleted and a new track is recorded. In the third case (case3) two out of a plurality of tracks are selected and combined into a single track. Finally, in the fourth case (case4), one track is divided to produce two tracks.

The following describes case1 where a track is deleted.

FIGS. 27A and 27B show the partial deletion of a track. The example in FIGS. 27A and 27B corresponds to the TrackManager shown in FIG. 19, and assumes that the user has indicated the partial deletion of Track B. The AOB corresponding to TrackB is recorded in "AOB002.SA1", which is associated with TKI#2. This means that the deletion of "AOB002.SA1" is accompanied by the setting of "Unused" into the TKI_BLK_ATR of TKI#2. This state where "AOB002.SA1" has been deleted and "Unused" has been set into the TKI_BLK_ATR of TKI#2 is shown in FIG. 27B. Since "AOB002. SA1" has been deleted, the region that was formerly occupied by "AOB002.SA1" is freed to become an unused region. As mentioned above, the other change is that "Unused" is set in the TKI_BLK_ATR of TKI#2.

{17-5_22-17_28A,B} Assignment of TKIs when a New AOB is Recorded

The following describes case2 where a new track is recorded after the deletion of a track.

FIG. 28A shows the TrackManager after the deletion of tracks has been performed several times. As shown in FIG. 28A, if the tracks corresponding to TKI#2, TKI#4, TKI#7, and TKI#8 have been deleted, then "Unused" is set in the TKI_BLK_ATR of these TKI. While AOB files are deleted in the same way as conventional data files, the TrackManager is updated by merely setting "Unused" in the TKI_BLK_ATR of the corresponding TKI. These means that TKIs whose TKI_BLK_ATRs are set at "Unused" can appear at different places in the TrackManager.

FIG. 28B shows how a new TKI and AOB file are written when a TKI whose TKI BLK_ATR is "Unused" is present in the TrackManager. Like in FIG. 28A, the TKI#2, TKI#4, TKI#5, TKI#7, and TKI#8 in FIG. 28B are set as "Unused".

In FIG. 28B, the new track to be written is composed of four AOBs. The unused TKIs used to record these AOBs are determined according to the DPL_TK_SRPs or can be freely chosen. In the present example, the unused TKIs numbered TKI#2, TKI#4, TKI#7, and TKI#8 are used to record the TKIs for the new track.

Since these four AOBs compose one track, "Head_of_Track" is set in the TKI_BLK_ATR of TKI#2, "Middle_of_Track" is set in the TKI_BLK_ATR of TKI#4 and TKI#7, and "End_of_Track" is set in the TKI_BLK_ATR of TKI#8. The TKI_LNK_PTR in each of the four TKIs, TKI#2, TKI#4, TKI#7, and TKI#8, used to compose the new TrackD is set so as to show the TKI forming the next part of TrackD, so that as shown by the arrows TL2, TL4, and TL7, TKI#4 is set in the TKI_LNK_PTR of TKI#2, TKI#7 is set in the TKI_LNK_PTR of TKI#4, and TKI#8 is set in the TKI_LNK_PTR of TKI#7.

After this, the files "AOB002.SA1", "AOB004.SA1", "AOB007.SA1", and "AOB008.SA1" having the same numbers as TKI#2, TKI#4, TKI#7, TKI#8 are produced, and the four AOBs composing TrackD are stored in these four files.

By appropriately setting the TKI_LNK_PTRs and TKI_BLK_ATRs, this fourth track TrackD can be managed using TKI#2, TKI#4, TKI#7, and TKI#8.

As described above, when a new track is written onto the flash memory card 31, TKIs in the TrackManager that are set as "Unused" are assigned as the TKIs to be used for tracks that are to be newly recorded.

{17-5_22-18_29A,B} Setting of TKI when Combining Two Tracks

The following describes the updating of the TKI when combining tracks (case3).

Figure 29A:
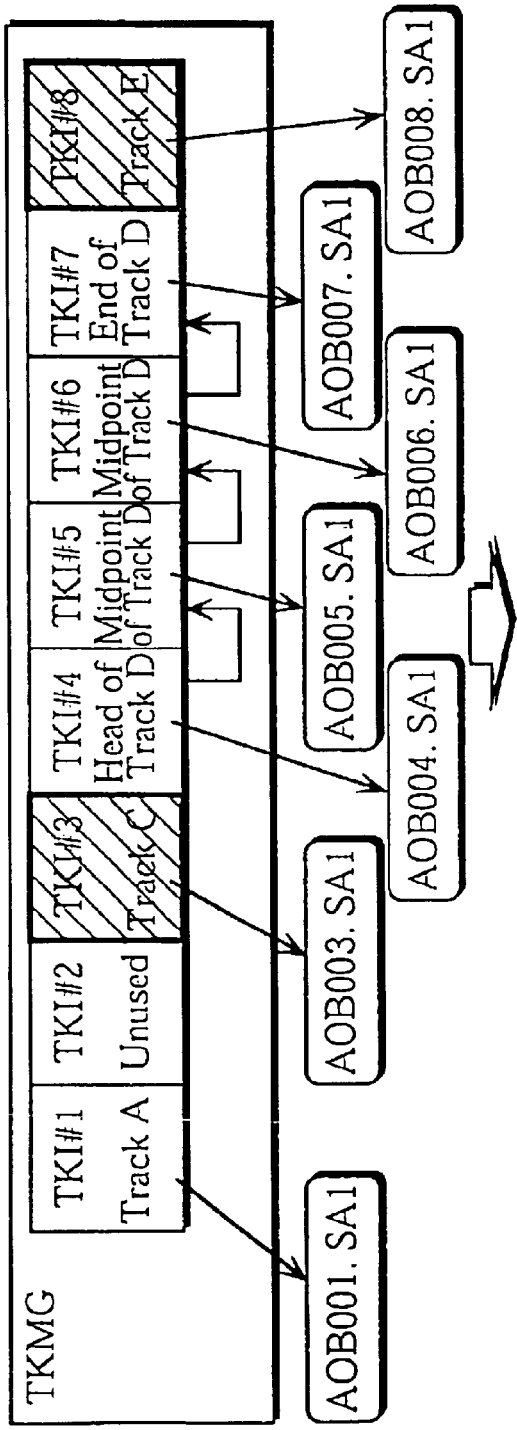
FIGS. 29A and 29B shows how the TKIs are set when two tracks are combined to produce a new track.
Figure 29B:
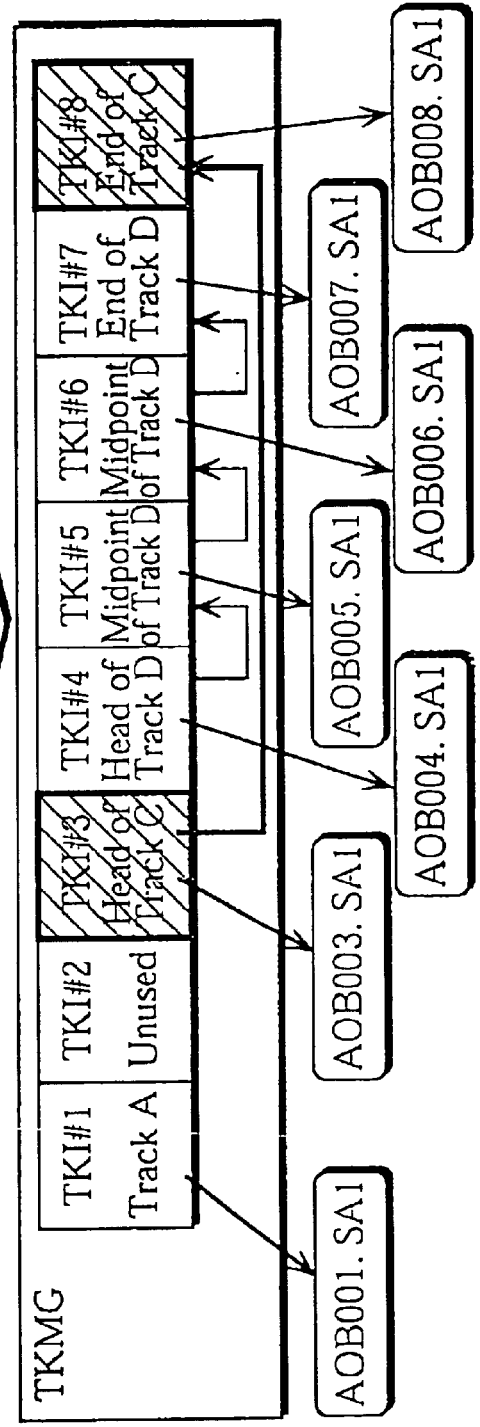

FIGS. 29A and 29B show how the TKIs are set when two tracks are combined to produce a new track. The example in FIG. 29A uses the same TrackManager as FIG. 19 and shows the case when the user performs an editing operation to combine TrackC and TrackE into a single track.

In this case, the AOBs that correspond to TrackC and TrackE are recorded in the AOB files "AOB003.SA1" and "AOB008.SA1" which correspond to TKI#3 and TKI#8, so that the TKI_BLK_ATRs of TKI#3 and TKI#8 are rewritten. FIG. 29B shows the TKI_BLK_ATR of these TKIs after rewriting. In FIG. 29A, the TKI_BLK_ATRs of TKI#3 and TKI#8 is written as "Track", but in FIG. 29B the TKI_BLK_ATR of TKI#3 is rewritten to "Head_of_Track" and the TKI_BLK_ATR of TKI#8 is rewritten as "End_of_Track". By rewriting the TKI_BLK_ATRs in this way, the AOB files "AOB003.SA1" and "AOB008.SA1" which correspond to TKI#3 and TKI#8 end up being treated as parts of a single track, the new TrackC. This operation is accompanied by the TKI_LNK_PTR of TKI#3 being rewritten to indicate TKI#8.

It should be particularly noted here that while the TKI_BLK_ATRs in the TKI are rewritten, no processing is performed to physically combine the AOB files "AOB003.SA1" and "AOB008.SA1". This is because AOB files are each encrypted using different FileKeys, so that when combining AOB files, it would be necessary to perform two processes for each AOB file to first decrypt the encrypted AOB file and then to re-encrypt the result, resulting in an excessive processing load. Also, an AOB file combined in this way would be encrypted using a single FileKey, which would make the combined track less secure that the tracks used to produce it.

The TKI is originally designed so as to suppress the size of the TKTMSRT, so that the physical combining of AOB files by an editing operation would also carry the risk of the TKI becoming too large.

For the reasons given above, editing operations that combine tracks leave the AOB files in their encrypted state and are achieved by merely changing the attributes given by the TKI_BLK_ATRs.

{17-5_22-18_29A,B-1_30, 31} Conditions that Should be Satisfied when Combining Tracks The combining of tracks is performed by changing the TKI_BLK_ATR attributes as described above, but the AOBs that are included in the combined tracks should satisfy the conditions given below.

A first condition is that the AOB that is to compose a latter part of a new track needs to have the same audio attributes (audio coding mode, bitrate, sampling frequency, number of channels, etc.) as the AOB that is to compose the first part of the new track. If an AOB has different audio attributes to the preceding or succeeding AOB, the playback apparatus will have to reset the operation of the decoder, which makes seamless (i.e., uninterrupted) playback of consecutive AOBs difficult.

The second condition is that in the track produced by the combining, three or more AOBs made up of only AOB_ELEMENTs whose number of AOB_FRAMEs is below the required number for an "FNs_Middle_TMSRTE" cannot be linked.

AOBs are classified into two types depending on whether at least one AOB_ELEMENT includes a same number of AOB_FRAMEs as the number of frames stipulated for an "FNs_Middle_TMSRTE". The Type1 AOB includes at least one AOB_ELEMENT having this number of AOB_FRAMEs, while the Type2 AOB includes no AOB_ELEMENT having this number of AOB_FRAMEs.

In other words, AOB_ELEMENTs in a Type2 AOB have fewer AOB_FRAMEs than "FNs_Middle_TMSRTE", and the second condition stipulates that three Type2 AOBs cannot be linked together.

The reason for the second condition is as follows. When the playback apparatus reads AOBs successively, it is preferable for a sufficient number of AOB_FRAMEs to accumulate in the buffer of the playback apparatus, though this cannot be achieved when there are consecutive Type2 AOBs. In such case, an underflow is likely to occur in the buffer of the playback apparatus, so that uninterrupted playback by the playback apparatus can no longer be guaranteed. Therefore, in order to avoid such underflows, the second condition stipulating that three or more Type2 AOBs cannot be linked continuously is used.

FIG. 30A shows a Type1 AOB, while FIG. 30B shows two examples of Type2 AOBs. In FIG. 30B, both AOBs are composed of less than two AOB_ELEMENTS, with none of the AOB_ELEMENTs including a number of AOB_FRAMEs that is set for an "FNs_Middle_TMSRTE". Since the absence of an AOB_ELEMENT with the number of AOB_FRAMEs set for an "FNs_Middle_TMSRTE" is the condition by which an AOB is classified as a Type2 AOB, this means that all of the AOBs shown in this drawing are classified as Type2 AOBS.

In FIG. 31A, a combining of Type1+Type2+Type2+Type1 AOBs into a single track is shown. As this combining does not involve the linking of three Type2 AOBs, these AOBs may be linked to form a single track.

FIG. 31B shows the linking of Type1+Type2+Type2+Type2+Type1 AOBs into a single track. This combining would result in there being three consecutive Type2 AOBs, and so is prohibited.

Figure 32A:
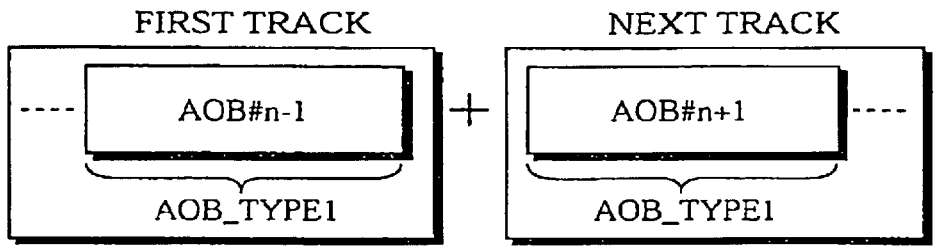
FIG. 32A shows a pattern where a Type1 AOB is present at the end of a preceding track and a Type1 AOB is present at the start of a next track.
Figure 32B:
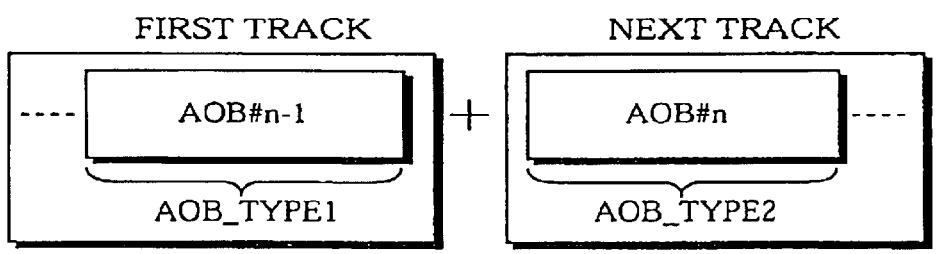
FIG. 32B shows a pattern where a Type1 AOB is present at the end of a first track and a Type2 AOB is present at the start of a next track.

{17-522-18629A,B-1_32} Combining of Tracks with Respect to Combinations of Type1 and Type2 AOBS In the combining of AOBs into a single track shown in FIG. 31A, if the last AOB in the first track is a Type1 AOB, the combining can be performed regardless of whether the first part of this track is a Type1 AOB or a Type2 AOB. FIG. 32A shows the case where the last AOB in the first track is a Type1 AOB and the first AOB in the next track is also a Type1 AOB. FIG. 32B shows the case where the last AOB in the first track is a Type1 AOB and the first AOB in the next track is a Type2 AOB. As the second condition is satisfied in both of these cases, the illustrated tracks can be combined into a single track.

When the last AOB in the first track is a Type2 AOB and the preceding AOB in the first track is a Type 1 AOB, this first track can be combined with a following track that starts with a Type1 AOB regardless of whether the first AOB in the first track is a Type1 AOB or a Type2 AOB.

Figure 32C:
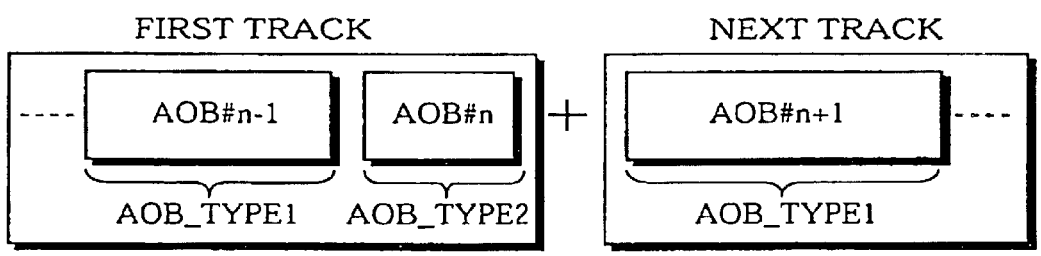
FIG. 32C shows a pattern where Type1 and Type2 AOBs are present at the end of a first track and a Type1 AOB is present at the start of a next track.
Figure 32D:
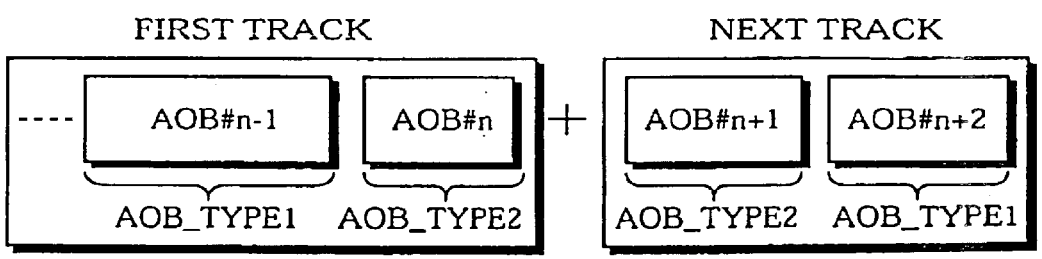
FIG. 32D shows a pattern where Type1 and Type2 AOBs are present at the end of a first track and Type2 and Type1 AOBs are present at the start of a next track.

FIG. 32C shows the case where the first track ends with a Type1 AOB and a Type2 AOB in that order and the second track starts with a Type1 AOB. FIG. 32D shows the case where the first track ends with a Type1 AOB and a Type2 AOB in that order and the second track starts with a Type2 AOB and a Type1 AOB in that order. As the second condition is satisfied in both of these cases, the illustrated tracks can be combined into a single track.

Figure 32E:
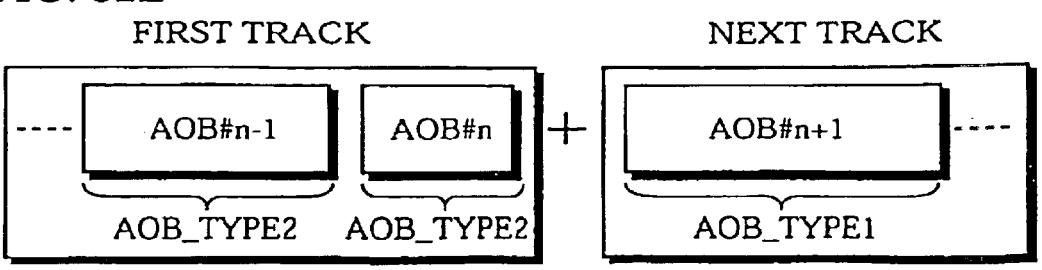
FIG. 32E shows a pattern where two Type2 AOBs are present at the end of a first track and a Type1 is present at the start of a next track.

When the first track ends with a Type2 AOB and the immediately preceding AOB is also a Type2 AOB, this first track can be combined with a following track that starts with a Type1 AOB. FIG. 32E shows the case where the first track ends with two Type2 AOBs and the second track starts with a Type1 AOB. As the second condition is satisfied in this case, the illustrated tracks can be combined into a single track. In this way, when two tracks are to be combined, an investigation is performed to see whether the two tracks satisfy the first and second conditions and the two tracks are only combined if they are judged to satisfy these conditions.

The following describes the updating of the TKI for case4 where a track is divided.

{17-5_22-19_33A,B} Settings for the TKI When a Track is Divided

FIGS. 33A and 33B show examples of when a single track is to be divided to produce two new tracks. For these examples, the content of the TrackManager is the same as in FIG. 27, with the user being assumed to have performed an editing operation that divides TrackC into two new tracks, TrackC and TrackF. When TrackC is to be divided into a new TrackC and TrackF, the AOB file "AOB002.SA1" is generated corresponding to TrackF. FIG. 33A shows that TKI#2 is set as "Unused", with this TKI#2 being assigned to the newly generated AOB file. "AOB002.SA1".

{17-5_22-19_33A,B-1_34A,B} Updating of the Directory Entries and the FAT Values

When the AOB file "AOB003.SA1" is divided to produce "AOB002.SA1" the directory entries and FAT values have to be updated. This updating is explained below. FIG. 34A shows how the SD-Audio Directory Entry in the SD-Audio Directory to which the AOB file "AOB003.SA1" belongs is written before the file is divided.

The AOB file "AOB003.SA1" is divided into a plurality of parts that are stored in clusters 007, 008, 009, 00A . . . 00D, 00E. In this case, the first cluster number for the AOB file "AOB003.SA1" given in the directory entry is written as "007". The values (008), (009), (00A) . . . (00D), (00E) are also written in the FAT values 007, 008, 009, 00A 00D corresponding to the clusters 007, 008, 009, 00A . . . 00D.

When the AOB file "AOB003.SA1" is divided so that its latter part becomes the new AOB file "AOB002.SA1", a "filename", a "filename extension" and a "number of first clusters in file" for the new AOB file "AOB002.SA1" are added to the SD-Audio directory entry. FIG. 34B shows how the SD-Audio Directory Entry in the SD-Audio Directory to which the AOB file "AOB003.SA1" belongs is written after the AOB file "AOB003.SA1" has been divided.

In FIG. 34B, the cluster 00F stores a copy of cluster 00B that includes the boundary indicated by the user when dividing the file. The parts of the AOB file "AOB002.SA1" that follow the part included in the cluster 00B are stored in the clusters 00C, 00D, 00E as before. Since the first part of the AOB file "AOB002.SA1" is stored in the cluster 00F and the remaining parts are stored in the clusters 00C, 00D, 00E, 00F" is written into the "number of first cluster in file" for the new AOB file "AOB002.SA1", while (00C), (00D), (00E) are written into the FAT values 00F, 00C, 00D, 00E corresponding to the clusters 00F, 00C, 00D, and 00E.

{17-5_22-19_33A,B-2_35A,B}

Setting of the Information Fields in the TXI The following describes how the information fields in the TKI are set for the AOB file "AOB002.SA1" once this file has been obtained by updating the directory entries and the FAT values. When generating a TKI for a divided track, there are two kinds of information fields in the TKI. These are (1) information that can be copied from the original TKI and (2) information obtained by updating the information in the original TKI. The TKTXTI_DA and ISRC are the former type, while the BIT, the TKTMSRT and other information fields are the latter type. Since both types of information exist, the present embodiment generates a TKI for a divided track by copying the original TKI to produce a template for the new TKI, and then dividing/updating the TKTMSRT and BIT in this template and updating the remaining information fields.

Figure 35A:
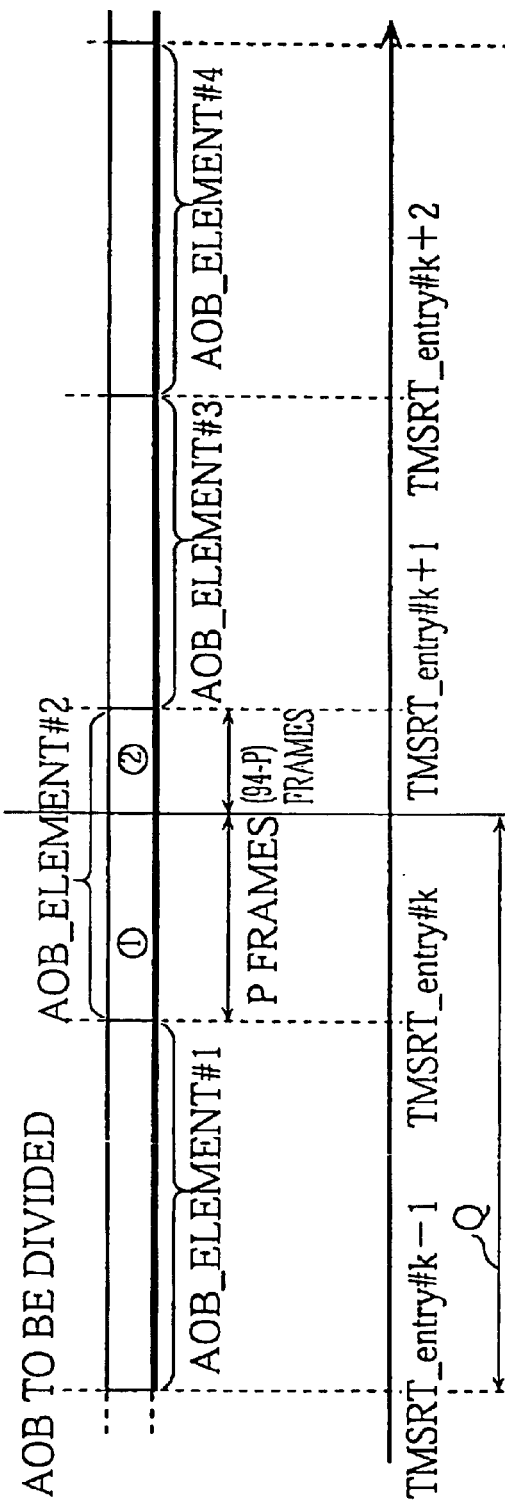
FIG. 35A shows the division of an AOB midway through AOB_ELEMENT#2.
Figure 35B:
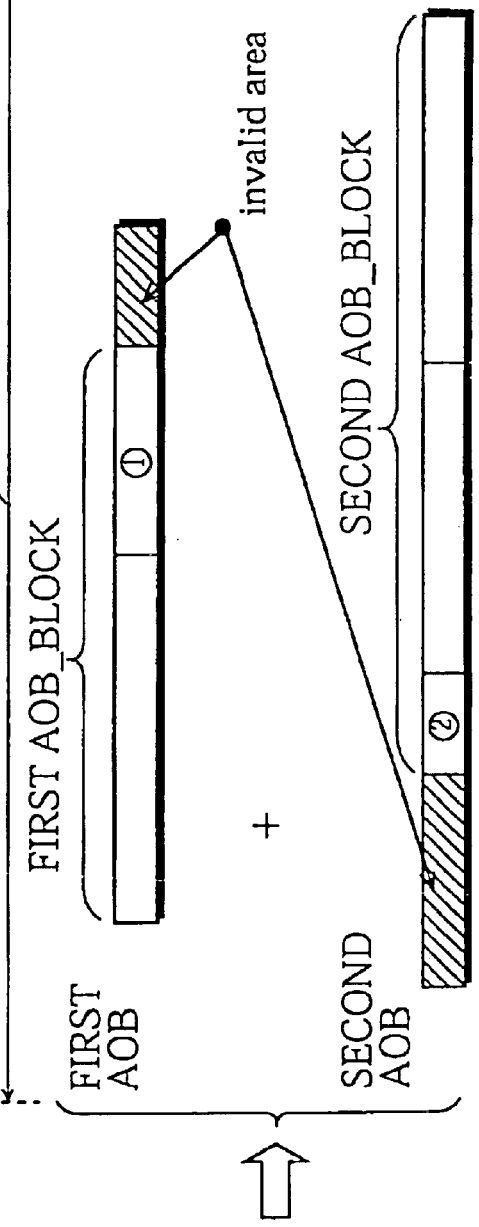
FIG. 35B shows the two AOBs, AOB#1 and AOB#2, obtained by dividing an AOB midway through AOB_ELEMENT#2.

FIG. 35A shows the case where an AOB_FRAME in an AOB is divided. The first level in FIG. 35A shows the four AOB_ELEMENTS, AOB_ELEMENT#1, AOB_ELEMENT#2, AOB_ELEMENT#3, and AOB_ELEMENT#4. The data lengths of these AOB_ELEMENTs are set in the TKTMSRT as the four TMSRT_entries #1, #2, #3, and #4. If the boundary bd1 for the division is set in AOB_ELEMENT#2 in FIG. 35A, AOB_ELEMENT#2 is divided into a first region (1) made up of the frames located before the boundary bd1 and a second region (2) composed of the frames located after the boundary bd1. FIG. 35B shows the two AOBs AOB#1 and AOB#2 obtained by dividing the AOB midway though AOB_ELEMENT#2.

Figure 36:
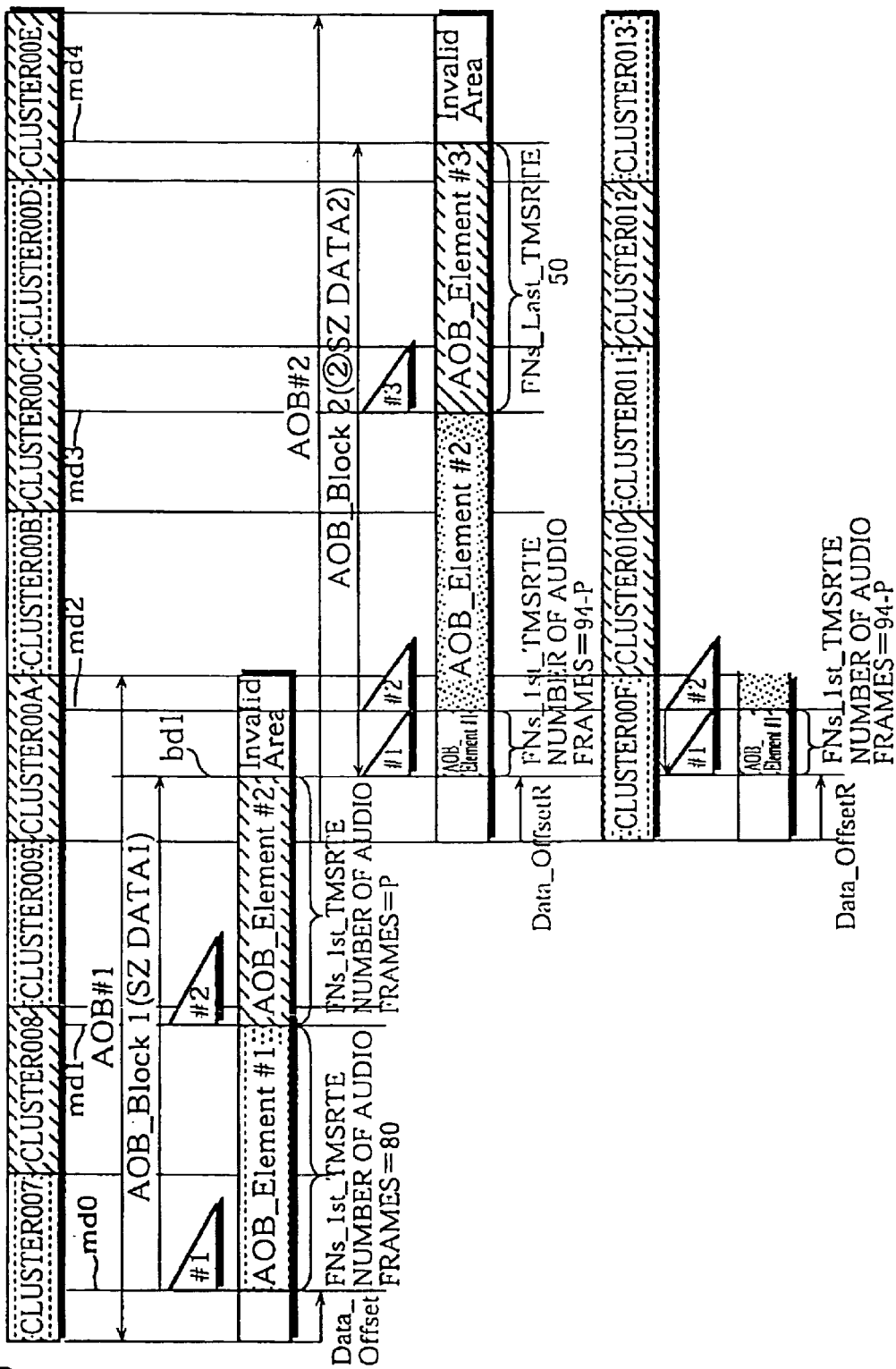
FIG. 36 shows how the BIT is set when an AOB is divided as shown in FIG. 35.

FIG. 36 shows how the BIT is set when an AOB is divided as shown in FIGS. 35A and 35B. The AOB shown in FIGS. 35A and 35B is divided at the boundary bd1. The AOB#1 produced by this division includes the two AOB_ELEMENTs AOB_ELEMENT#1 and AOB_ELEMENT#2, while the other AOB#2 produced by this division includes the three AOB_ELEMENTs, AOB_ELEMENT#1, AOB_ELEMENT#2, and AOB_ELEMENT#3.

In FIG. 36, these AOB_ELEMENTS have also been given the triangular flags to shows the settings of the TMSRT_entries included in the TKIs corresponding to these AOBS. The explanation will first focus on AOB#1 which is obtained by this division. AOB-ELEMENT#1 and AOB-ELEMENT#2 that are included in AOB#1 occupy cluster 007 to cluster 00A, so that AOB#1 is handled as being the composite of cluster 007 to cluster 00A. AOB_ELEMENT#2 in AOB#1 has a data length that ends not at the end of cluster 00A, but at the boundary bd1 that is present within cluster 00A, so that the SZ_DATA for AOB#1 is given as the amount of data from the region md0 to the boundary bd1 in cluster 00A. The "FNs_1st_TMSRTE" for AOB#1 is the same as before division, while the "FNs_Last_TMSRTE" for AOB#1 differs from the value used before division in that it now indicates the number of frames from the start of AOB_ELEMENT#2 before division to the boundary bd1.

The following describes AOB#2 which is obtained by this division. AOB_ELEMENT#1, AOB_ELEMENT#2, and AOB_ELEMENT#3 that are included in AOB#2 occupy cluster 00B to cluster 007. Cluster 00F includes a copy of the content of cluster 00A. The reason cluster 0° F. stores a copy of cluster 00A is that cluster 00A is occupied by AOB_ELEMENT#2 in AOB#1, so that it is necessary to assign a different cluster to AOB_ELEMENT#1 in AOB#2.

AOB_ELEMENT#1 in AOB#2 has a data length that starts not at the beginning of cluster 00F, but at the boundary bd1 that is present within cluster 00F, so that the SZ_DATA for AOB#2 is given as the amount of data from the start of cluster 00B to a point midway through cluster 00E plus the data length of the part of cluster 00F occupied by AOB_ELEMENT#1.

The part of AOB_ELEMENT#2 in AOB#1 that is included in the copy of cluster 00A stored in cluster 00F needs to be excluded from AOB#2, so that the DATA_Offset field in the BIT of AOB#2 is set at the size of the part of AOB_ELEMENT#2 in AOB#1 included in cluster 00F.

As can be seen from FIG. 36, the division of the AOB result in only the AOB_ELEMENT that includes the boundary for the division being divided into two and in the other AOB_ELEMENTs positioned before and after the divided AOB_ELEMENT remaining unchanged. As a result, the "FN_Last_TMSRTE" of AOB#2 is set at the same value for the "AOB_ELEMENT#4" before the division, and the "FNs_1st_TMSRTE" of AOB#2 is set at AOB_ELEMENT#1 of AOB#2, which is to say, the number of frames included in the part that follows the boundary once AOB_ELEMENT#2 has been divided.

{17-5_22-19_33A,B-4_37} Setting of the BIT

Figure 37:
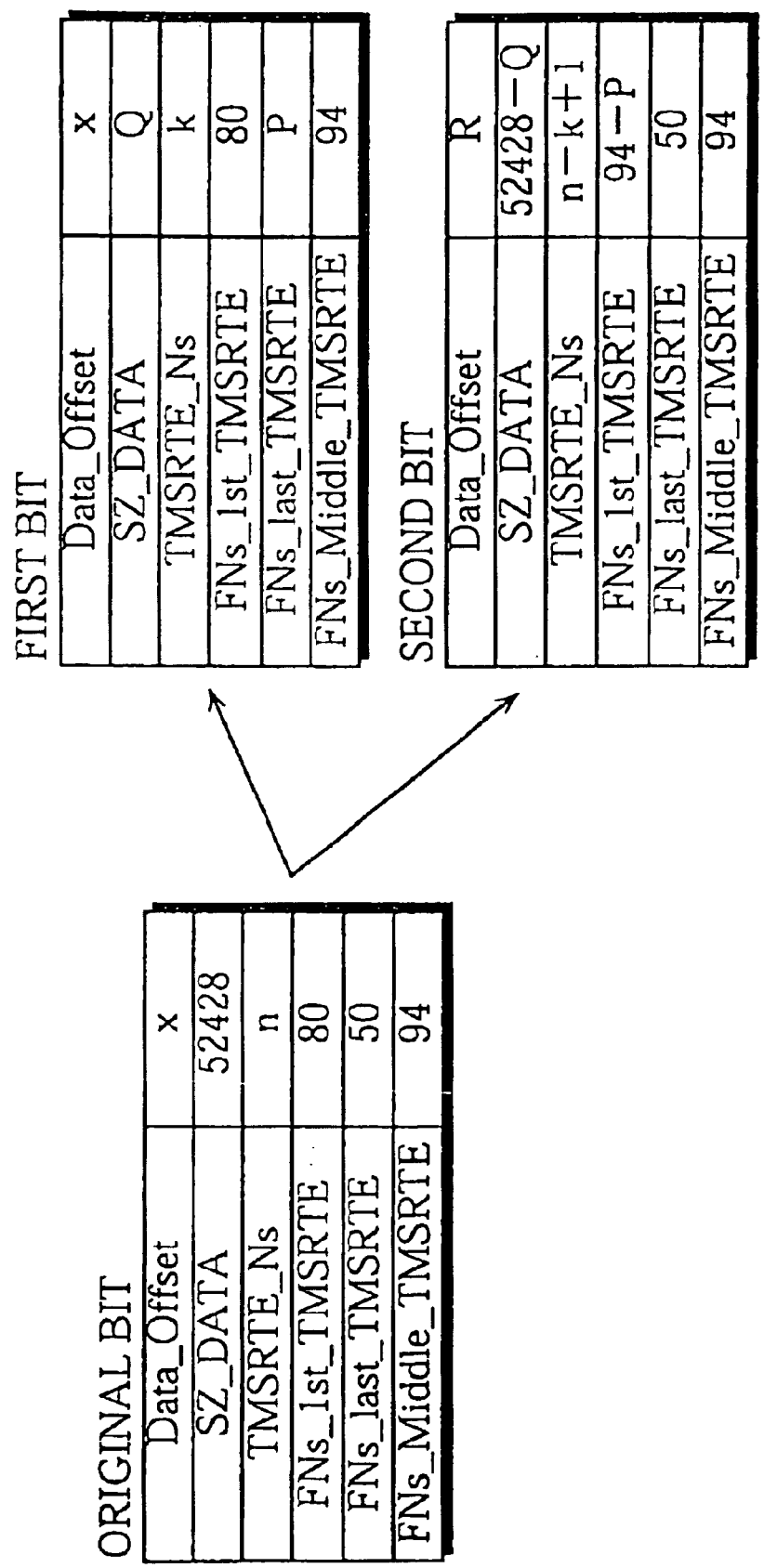
FIG. 37 shows a specific example of changes in the BIT before and after division.

FIG. 37 shows a more specific example of changes in the BITs as a result of the division of a track. The left side of FIG. 37 shows an example of the settings of the BIT before division. In this BIT, the Data_Offset is set as "X", the SZ_DATA is set at "52428", and the TMSRTE_Ns is set at "n". The FNs_1st_TMSRTE is set at "80 frames", the FNs_Middle_TMSRTE is set at "94 frames", and the FNs_Last_TMSRTE is set at "50 frames".

The right side of FIG. 37 shows the settings of two BITs produced by the division of a track. When the AOB corresponding to the BIT on the left side of FIG. 37 is divided as shown in FIG. 35A, the Data_Offset in the BIT of the first track produced by the division is set at "X" like the track before division", the "SZ_DATA" is updated to the data length "Q" from the start to the division point Q, and the TMSRTE_Ns is set at "k" which shows the number of TMSRT_entries from the first TMSRT_entry to the $k^{th}$ TMSRT_entry. The FNs_1st TMSRTE and FNs_Middle_TMSRTE are respectively set at "80" and "94" frames in the same way as the BIT before division, but since the final AOB_ELEMENT in the AOB of the first track produced by the division includes "p" AOB_FRAMES, the FNs_Last TMSRTE is set at "p frames."

In the BIT of the second track produced by the division, the "Data_Offset" is set at "R", the "SZ_DATA" is set at (original SZ#DATA "52428"-data length up to division point Q), and the TMSRTE_Ns is set at "n-k+1" produced by adding one (for the kth TMSRT_entry that is newly added as a result of the division) to the number of TMSRT_entries from the $k^{th}$ TMSRT_entry to the $n^{th}$ TMSRT_entry.

The FNs_Middle_TMSRTE and FNs_Last_TMSRTE are set at the same values as the BIT before division, which is to say, "94 frames" and "50 frames" respectively.

The first AOB_ELEMENT in the AOB of this second track includes "94-p" AOB_FRAMES, so that "94-p" is set in the FNs_1st_TMSRTE of the BIT corresponding to this track.

{17-5_22-19_33A,B-5_38} Setting of the BIT

Figure 38:
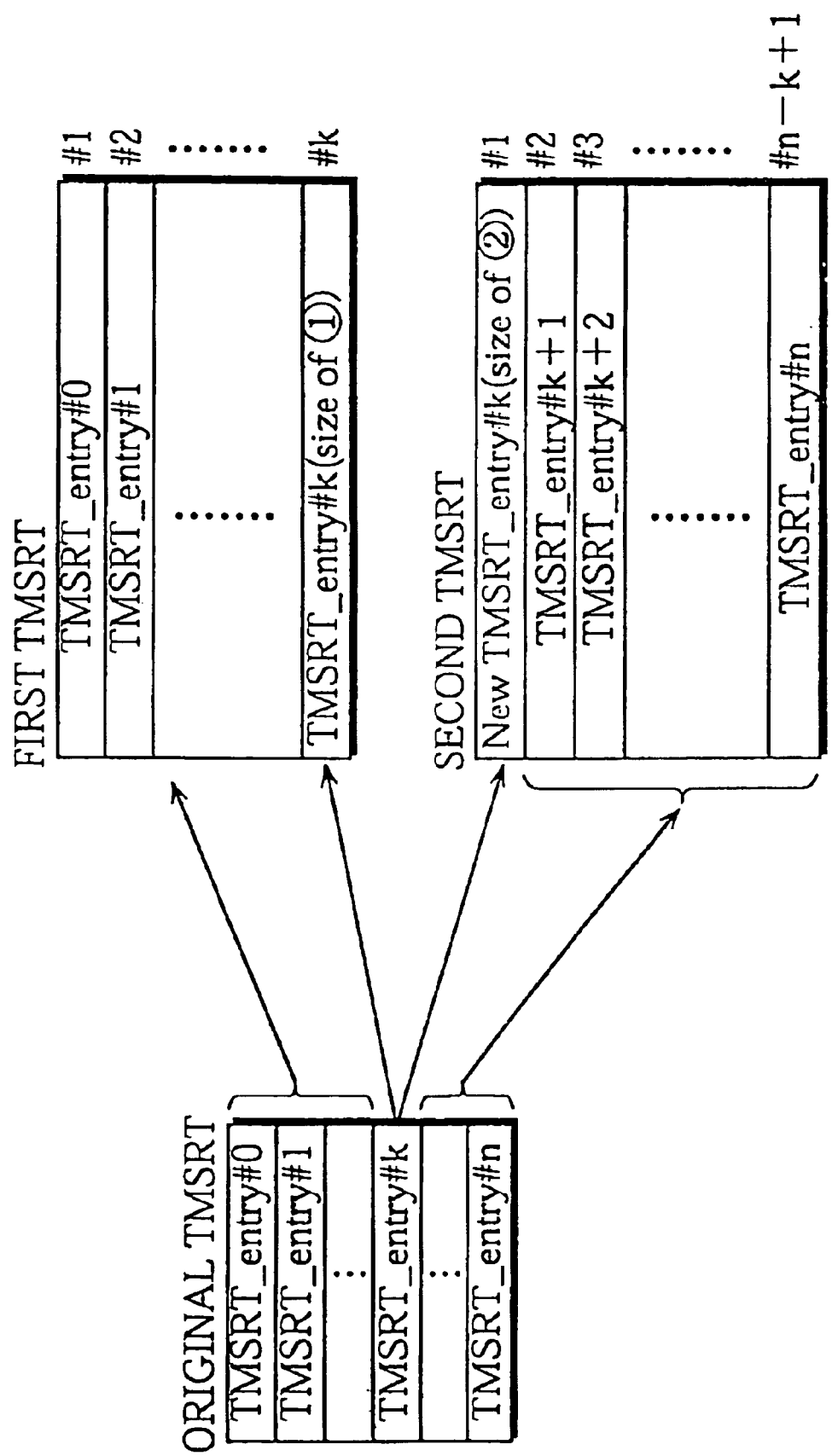
FIG. 38 shows a specific example of changes in the TKTMSRT before and after division.

FIG. 38 shows the TKTMSRT after division. The following explains the settings of the TMSRT first. The TMSRT of the first track includes the TMSRT_entries from the first TMSRT_entry of the AOB before division to the kth TMSRT_entry, which is to say, the TMSRT_entries #1 to #k.

It should be noted here that the AOB_ELEMENT#k that includes the boundary for the division only includes region (1), so that the $k^{th}$ TMSRT_entry only includes a data size corresponding to this region (1). The TMSRT of the second track includes the TMSRT_entries from the kth TMSRT_entry of the AOB before division to the nth TMSRT_entry, which is to say, the TMSRT_entries #k to #n. It should be noted here that the AOB_ELEMENT#k that includes the boundary for the division only includes region (2), so that the $k^{th}$ TMSRT_entry only includes a data size corresponding to this region (2).

The copying of the TKI is accompanied by the division and updating of the TKTMSRT and the BIT, and once the remaining information has been updated, the TKIs for the new tracks produced by the division will be complete. In the same way as when combining tracks, the AOB files are not decrypted, so that two tracks can be produced by dividing an AOB file in its encrypted state. Since the division of an AOB file in does not involve decryption and re-encryption, the processing load of dividing a track can be suppressed. This means that tracks can be edited even by a playback apparatus with limited processing power.

This completes the explanation of the TKI. The following describes the Playlists.

{17-6} PlaylistManager

As shown by the broken lines h5 in FIG. 17, the PlaylistManager shown is made up of PlaylistManager_Information (PLMGI) for managing the Playlists stored in the flash memory card 31, Default_Playlist_Information (DPLI) for managing all of the track stored in the flash memory card 31, and PlaylistInformation (PLI) #1, #2, #3, #4 . . . #m. Each PLI is information for a user-defined Playlist. As shown by the broken lines h6, the DPLI is composed of Default_Playlist_General_Information (DPLGI) and Default_Playlist_Track_Search_Pointers (DPL_TK_SRP) #1, #2, #3, #4 . . . #m. As shown by the broken lines h7, each PLI is composed of Playlist_General_Information (PLGI), and Playlist_Track_Search_Pointers (PL_TK_SRP) #1, #2, #3, #4 . . . #m.

The DPLI referred to here differs from each PLI in the following way. While the DPLI has to indicate all of the tracks stored in the flash memory card 31, a PLI does not have this restriction and can indicate any number of the tracks. This opens up various possibilities for the user. As representative examples, the user can generate Playlist_Information indicating only his (her) favorite tracks and store this Playlist_Information in the flash memory card 31, or can have a playback apparatus automatically generate Playlist_Information that only indicates tracks of a certain genre, out of a plurality of tracks stored in the flash memory card 31, and store the resulting Playlist Information in the flash memory card 31.

{17-7_18} Number of Playlists and Their Data Sizes

As shown in FIG. 18, a maximum of 99 Playlists can be stored on one flash memory card 31. The combined data size of the PlaylistManager_Information (PLMGI) and the Default Playlist Information (DPLI) is also fixed at 2,560 bytes. Each PLI has a fixed length of 512 bytes. The "DPL_TK_SRP" included in the Default Playlist Information includes a "DPL_TK_ATR" and a "DPL_TKIN". On the other hand, the "PL_TK_SRP". The format of the FPL)TK_ATR, DPL_TKIN, and PL_TKIN fields is shown in FIGS. 39A and 39B.

{17-8_39-1} Format of DPL_TK_SRP

Figure 39:
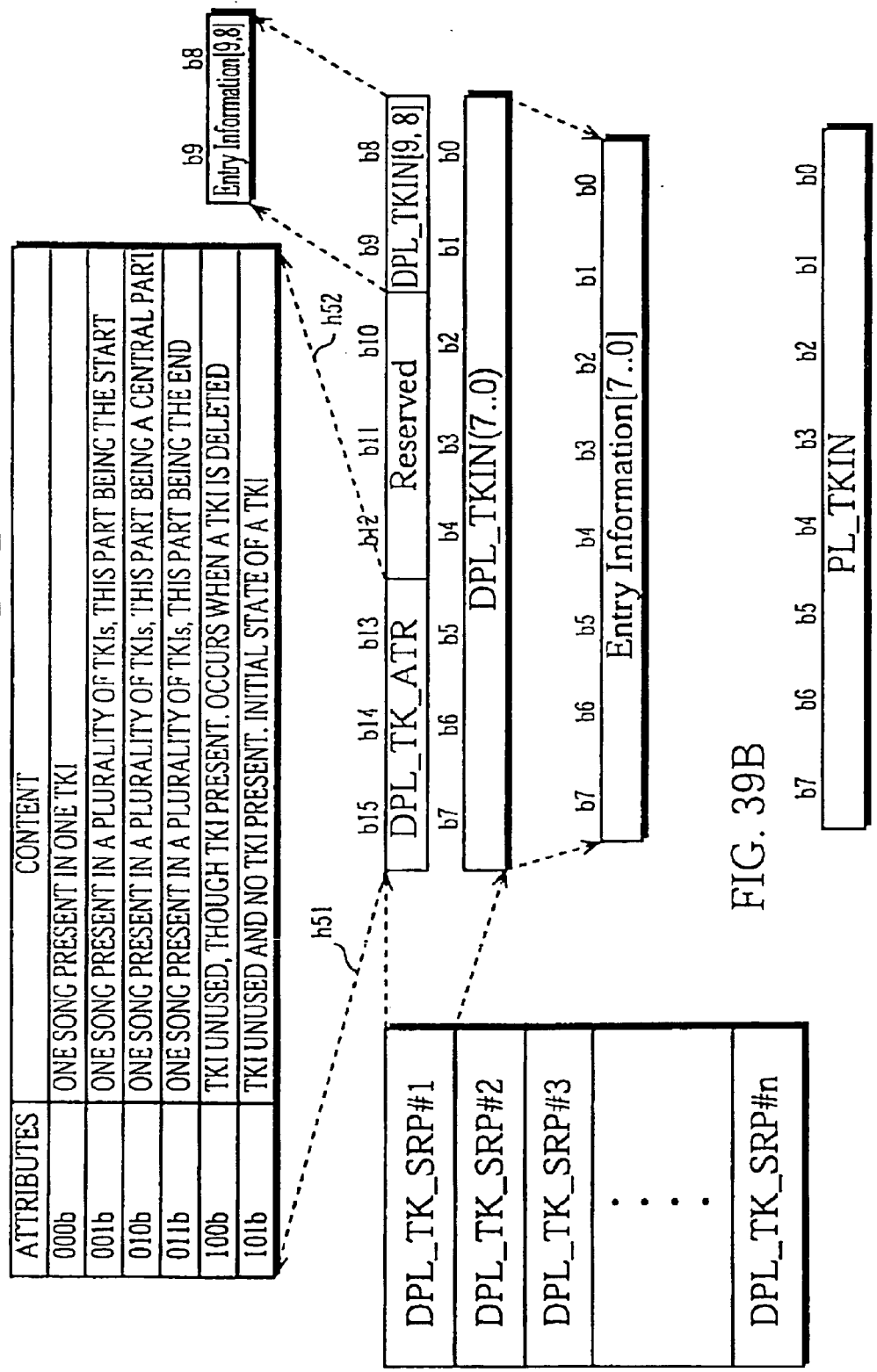
FIG. 39A shows the format of a DPL_TK_SRP.
FIG. 39B shows the format of a PL_TK_SRP.

FIG. 39A shows the format of the DPL_TK_SRP. In FIG. 39A, the DPL_TKIN is written in the 0th to 9th bits in the DPL_TK SRP, while the DPL_TK ATR is written in the 13th to 15th bits. The 10th to 12th bits in the DPL_TK_SRP are reserved for future use.

The TKI number is written in the DPL_TKIN that occupies the 0th to 9th bits in the DPL_TK SRP. This enables a TKI to be specified.

{17-9_39B} Format of the PL_TX_SRP

FIG. 39B shows the format of the PL_TK_SRP. This is a ten-bit field in which PL_TKIN, which is to say, a TKI number, is written.

{17-8_39A-2} Composition of DPL_TX_ATR

The broken lines h51 and h52 that extend from the DPL_TK_ATR in FIG. 39A show an example setting of the DPL_TK_ATR. As can be seen from this drawing, the DPL_TK_ATR is set for a DPL_TK_SRP in the same way as TKI_BLK_ATR is set for a TKI, which is to say, the DPL_TK_ATR is set at one of "Track", "Head_of_Track" "Midpoint_of_Track", and "End_of_Track".

In more detail, when the TKI indicated by the TKIN is used and an Audio Object (AOB) corresponding to one complete track is recorded in the AOB file corresponding: to the indicated TKI (i.e., when the TKI_BLK_ATR of the TKI is "Track"), the value "00b" is set in the "DPL_TK_ATR".

When the TKI indicated by the TKIN is used and an Audio Object (AOB) corresponding to only the start of a track is recorded in the AOB file corresponding to the indicated TKI (i.e., when the TKI_BLK_ATR of the TKI is "Head_of_Track"), the value "001b" is set in the "DPL_TK_ATR". When the TKI indicated by the TKIN is used and an Audio Object (AOB) corresponding to a midway part track is recorded in the AOB file corresponding to the indicated TKI (i.e., when the TKI_BLK_ATR of the TKI is "Midpoint_of_Track"), the value "010b" is set in the "DPL_TK_ATR". When the TKI indicated by the TKIN is used and an Audio Object (AOB) corresponding to an end part of a track is recorded in the AOB file corresponding to the indicated TKI (i.e., when the TKI_BLK_ATR of the TKI is "End_of_Track"), the value "011b" is set in the "DPL_TK_ATR".

Conversely, when the TKI indicated by the TKIN is unused and the TKI region is merely established, which corresponds to when a TKI has been deleted (i.e., when the TKI_BLK_ATR of the TKI is "Unused"), the value "10b" is set in the DPL_TK ATR.

When the TKI indicated by the TKIN is unused and no TKI region has been established, which is to say, when a TKI is in an initial state, the value "101b" is set in the "DPL_TK_ATR".

Since the number of a TKI is written in the DPL_TKIN, it is clear which of the plurality of TKI corresponds to nm each DPL_TK_SRP. The position of the DPL_TK_SRP in the Default_Playlist_Information shows when the AOB corresponding to the TKI that in turn corresponds to the DPL_TK_SRP will be played back, i.e., the ordinal position of the AOB in the Default_Playlist. As a result, the order of the DPL_TK_SRP items in the Default_Playlist denotes the order in which a plurality of tracks will be played, or in other words, determines the playback order of tracks.

Figure 40:
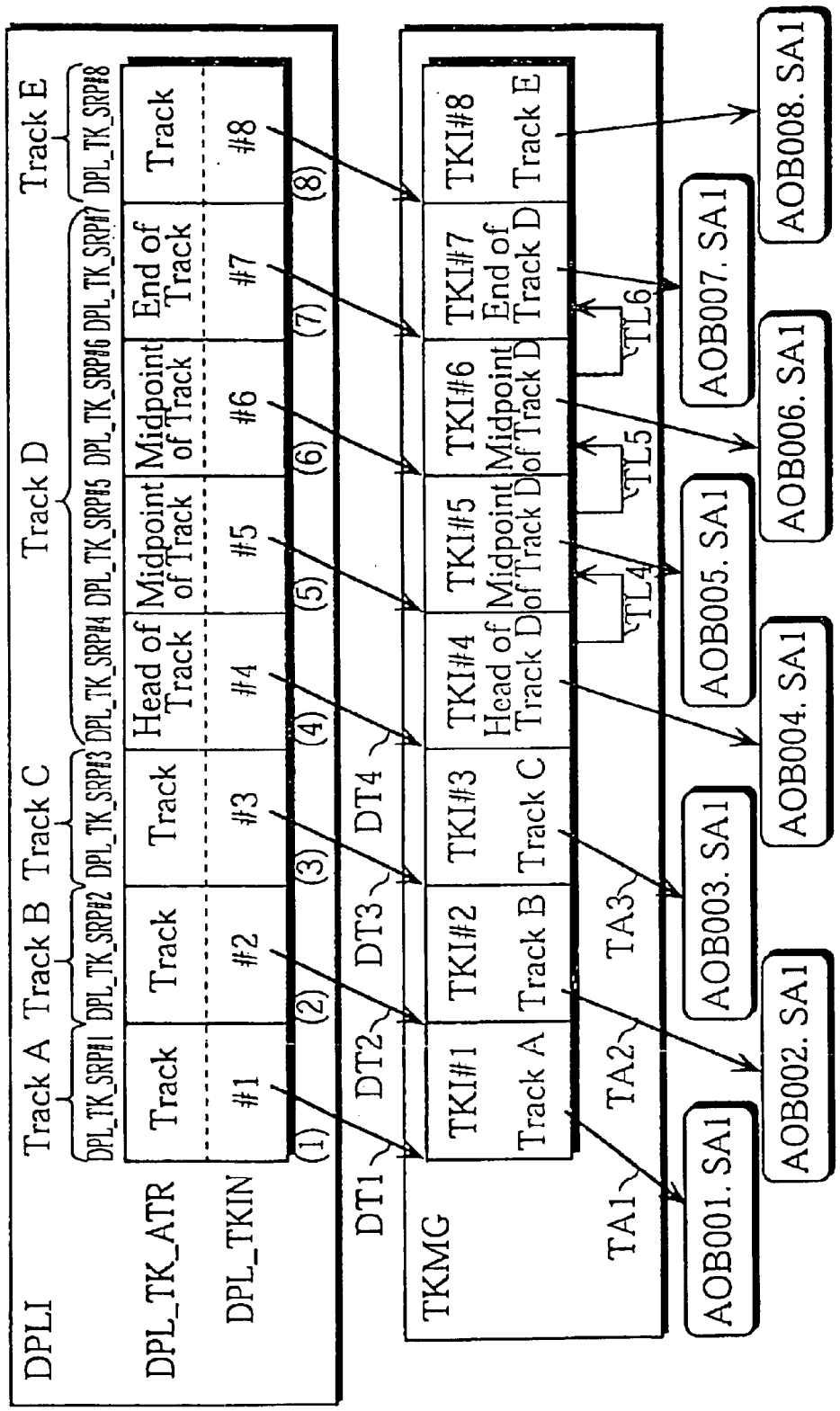
FIG. 40 shows the interrelation between the Default_Playlist_Information, the TKIs, and the AOB files.

{17-9_40-1} Interrelationship Between the Default_Playlist Information, TKI, and AOB Files FIG. 40 shows the interrelationship between the Default_Playlist_Information, the TKI, and the AOB files. The second, third, and fourth levels in this drawing are the same as the first, second, and third levels in FIG. 19, and so show a TrackManager including eight TKI and eight AOB files. FIG. 40 differs from FIG. 19 in that a box showing the Default_Playlist_Information is given on the first level. The eight small divisions shown in this box show the eight DPL_TK_SRP included in the Default_Playlist_Information. The upper part of each division shows the DPL_TK_ATR, while the lower part shows the DPL_TKIN.

As shown by the arrows DT1, DT2, DT3, DT4 . . . in FIG. 40, DPL_TK_SRP#1 and TKI#1 are related, as are DPL_TK_SRP#2 and TKI#2, DPL_TK_SRP#3 and TKI#3, and in DPL_TK_SRP#4 and TKI#4.

Looking at the DPL_TK_ATR fields in the DPL_TK_SRP, it can be seen that "Track" has been set for each of DPL_TK SRP#1, DPL_TK SRP#2, DPL_TK SRP#3, and DPL_TK_SRP#8. In other words, the four combinations DPL_TK_SRP#1 _TKI#1("AOB001.SA1"), DPL_TK_SRP#2 TKI#2("AOB002.SA1"[1]), DPL_TK_SRP#3 TKI#3("AOB003.SA1"), DPL_TK_SRP#8 _TKI#8 ("AOB008.SA1") correspond to four separate tracks.

Meanwhile, none of DPL_TK_SRP#4, DPL_TK_SRP#5, DPL_TK_SRP#6, and DPL_TK_SRP#7 has a DPL_TK_ATR set as "Track". Instead, the DPL_TK_SRP#4 of DPL_TK_ATR is set at "Head_of_Track", the DPL_TK_ATR of DPL_TK_SRP#7 is set at "End_of_Track" and the DPL_TK_ATRs of DPL_TK_SRP#5 and DPL_TK_SRP#6 are set at "Midpoint_of_Track".

This means that TKI#4 ("AOB004.SA1"), which is related to DPL_TK_SRP#4, is the start of a track, TKI#5 ("AOB005.SA1") and TKI#6("AOB006.SA1"), which are respectively related to DPL_TK_SRP#5 and DPL_TKSRP#6, are middle parts of a track, and TKI#7 ("AOB007.SA1"), which is related to DPL_TK_SRP#7, is the end of a track.

The DPL_TK_SRP entries in the DefaultPlaylist show in what order the AOBs corresponding to each TKI are to be played back. The DPL_TKINs of DPL_TK_SRP#1, #2, #3, #4 #8 in the DefaultPlaylist of FIG. 40 indicate TKI#1, #2, #3, #4 ... #8. As shown by the arrows (1) (2) (3) (4). . . (8), the AOB file "AOB001.SA1" corresponding to TKI#1 will be played back first, "AOB002.SA1" corresponding to TKI#2 will be played back second, "AOB003.SA1" corresponding to TKI#3 will be played back third, and "AOB004.SA1" corresponding to TKI#4 will be played back fourth.

{17-10_41} Example Settings for the DefaultPlaylist and Playlist_Information

Figure 41:
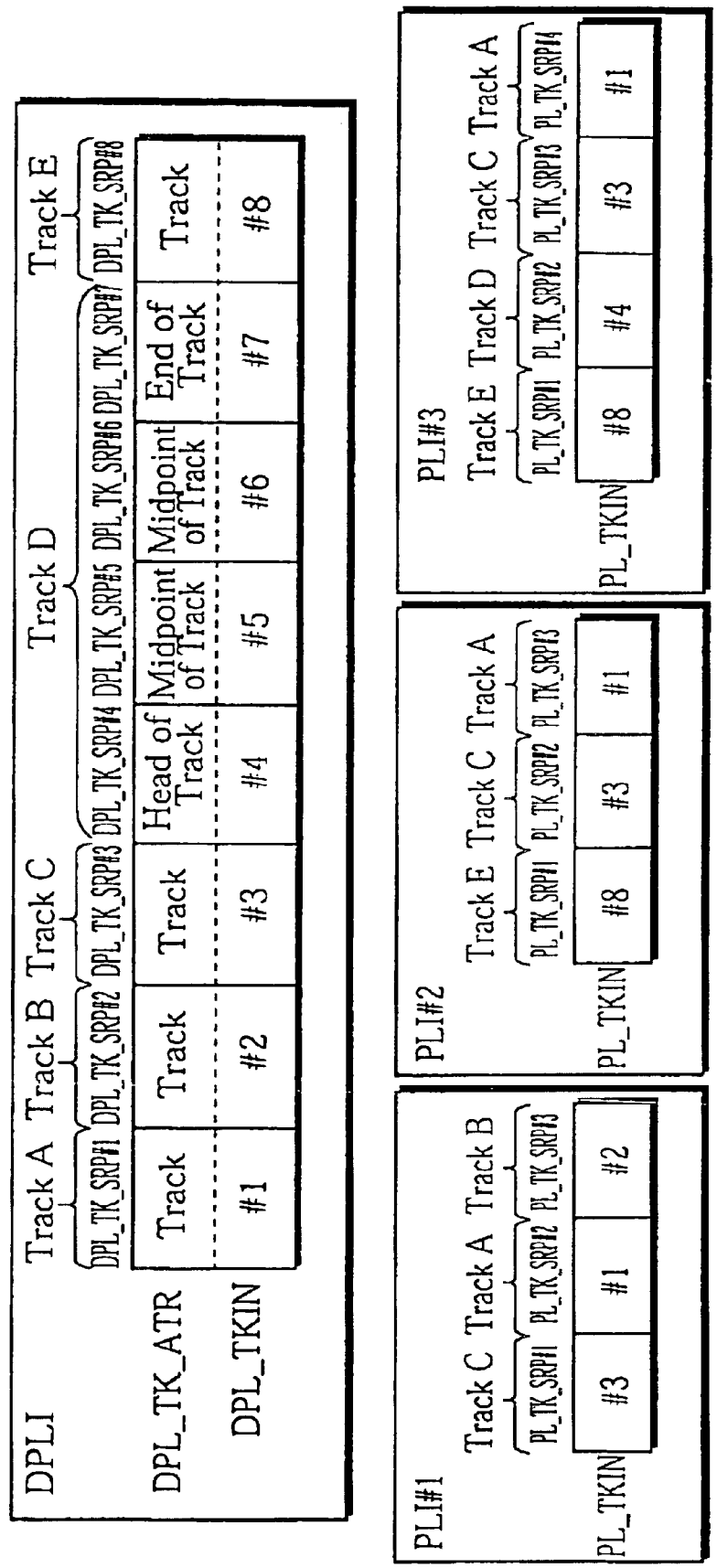
FIG. 41 shows example settings for the Default_Playlist and several PLIs.

FIG. 41 shows example settings for the Default_Playlist and the Playlist_Information using the same notation as FIG. 40. In FIG. 41, the box on the first level shows the Default_Playlist, while the three boxes on the second level show the PLIs.

The small divisions in the box showing the Default_Playlist shows the eight DPL_TK_SRP values included in the Default_Playlist, while the small divisions in the boxes illustrating each PLI show three or four PL_TK_SRP values. The setting of the TKIN of each DPL_TK_SRP included in the Default_Playlist Information is the same as in FIG. 40. However, the settings of the TKIN of the PL_TK_SRP included in each PLI are completely different to those in the DPLTK_SRP.

{17-10_42} Correspondence Between the DPL_TR_SRP and the TKI

Figure 42:
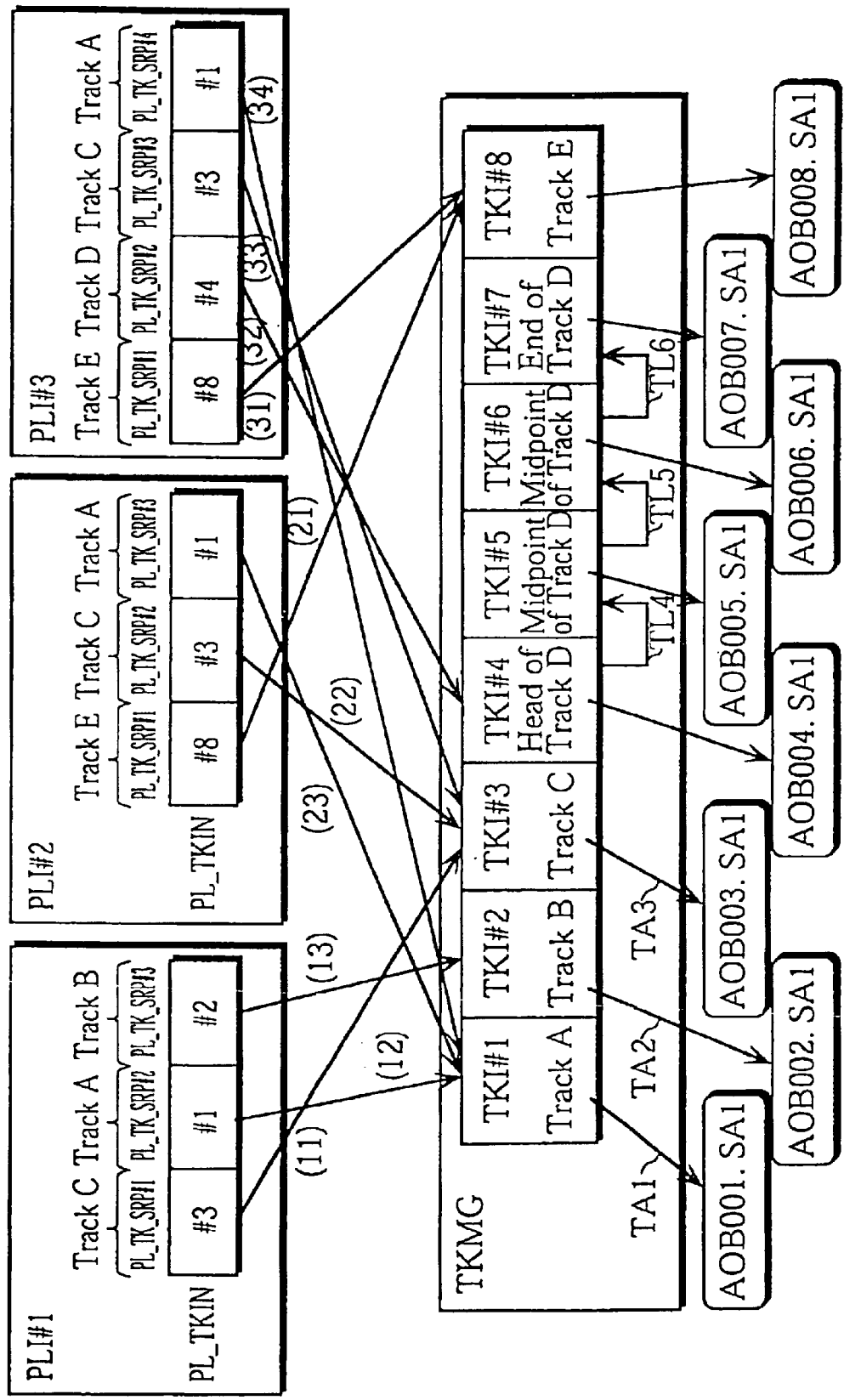
FIG. 42 shows how the DPL_TK_SRPs correspond to TKIs using the same notation as FIG. 40.

FIG. 42 shows the correspondence between the DPL_TK_SRP and the TKI using the same notation as in FIG. 40. In FIG. 42, Playlist#1 is composed of PL_TK_SRP#1, #2, #3. Of these, #3 is written as the PL_TKIN of PL_TK_SRP#1, while #1 is written as the PL_TKIN of PL_TK_SRP#2 and #2 as the PL_TKIN of PL_TK SRP#3. This means that when tracks are played back according to Playlist#1, a plurality of AOBs will be played back as shown by the arrows (11) (12) (13) in the order AOB#3, AOB#1, AOB#2.

Playlist#2 is composed of PL_TK_SRP#1, #2, #3. Of these, #8 is written as the PL_TKIN of PL_TK_SRP#1, while #3 is written as the PL_TKIN of PL_TK_SRP#2 and #1 as the PL_TKIN of PL_TK SRP#3. This means that when tracks are played back according to Playlist#2, a plurality of AOBs will be played back, as shown by the arrows (21) (22) (23) in the order AOB#8, AOB#3, AOB#1, which is to say, in a completely different order to Playlist#1.

Playlist#3 is composed of PL_TK_SRP#1, #2, #3, #4, the PL_TKIN of these PL_TK_SRP#1 to #4 are respectively set as #8, #4, #3, and #1. This means that when tracks are played back according to Playlist#3, a plurality of AOBs will be played back as follows. First, AOB#8 that composes TrackE is played back as shown by the arrow (31). Next, AOB#4, AOB#5, AOB#6, and AOB#7 that compose TrackD are played back as shown by the arrow (32). After this, AOB#3 and AOB#1 that respectively compose TrackC and TrackA are played back as shown by the arrows (33) and (34).

Of special note here is that when a track is composed of a plurality of TKI, only the TKI number of the start of the track is written into the PL_TK_SRP entry. In more detail, while the DPL_TK_SRP values given in the Default_Playlist_Information specifies the four TKIs (TKI#4, TKI#5, TKI#6, TKI#7) that compose TrackD, the PL_TK_SRP given in a set of Playlist_Information does not need to indicate all four TKIs. For this reason, PL_TK_SRP#2 in Playlist#3 only indicates TKI#4 out of TKI#4 to TKI#7.

On the other hand, a DPLI including a plurality of DK_TK_SRP has a data size that is no greater than one sector and is always loaded into the RAM of a playback apparatus. When tracks are played back according to a Playlist, the playback apparatus refers to the DK_TK_SRPs that are loaded into its RAM and so can search for TKIs at high speed. To play back TKIs (AOBs) using a PL_TK_SRP that only indicates the TKI number of the first TKI, a playback apparatus searches the DPL_TK_SRP loaded in its RAM based on the TKI indicated by the PL_TK_SRP and judges whether the current track is composed of a plurality of TKI. If so, the playback apparatus executes the appropriate procedure for playing back all of the corresponding TKIs (AOBs).

As described above, the Default_Playlist and a plurality of PLIs are written in the PlaylistManager. If different playback orders are written in the DPL_TKINs and PL_TKINs of the DPL_TK_SRPs and PL_TK_SRPs composing such playlists, it becomes possible to play back AOBs in different orders. By offering a variety of playback orders to the user in this way, the user can be given the impression of there being a number of music albums stored in the flash memory card 31.

Of special note here is that the data size of the DPL_TK_SRP corresponding to an AOB file is small (at no more than two bytes), while the data size of the TKI corresponding to an AOB file is large (at up to 1,024 bytes). When reordering the TKI in the TrackManager, a large number of accesses need to be made to the flash memory card 31, but when the DPL_TK SRPs are reordered in the Default_Playlist_Information or a PLI, this can be performed with fewer accesses to the flash memory card 31.

In view of this, when the navigation data is edited, the order of the DPL_TK_SRPs in the Default_Playlist is actively changed in accordance with the editing operation, while the order of the TKI in the TrackManager is left unchanged in spite of the editing operation.

{17-9_40-2_43A,B} Reordering of the DPL_TK_SRP

Figure 43A:
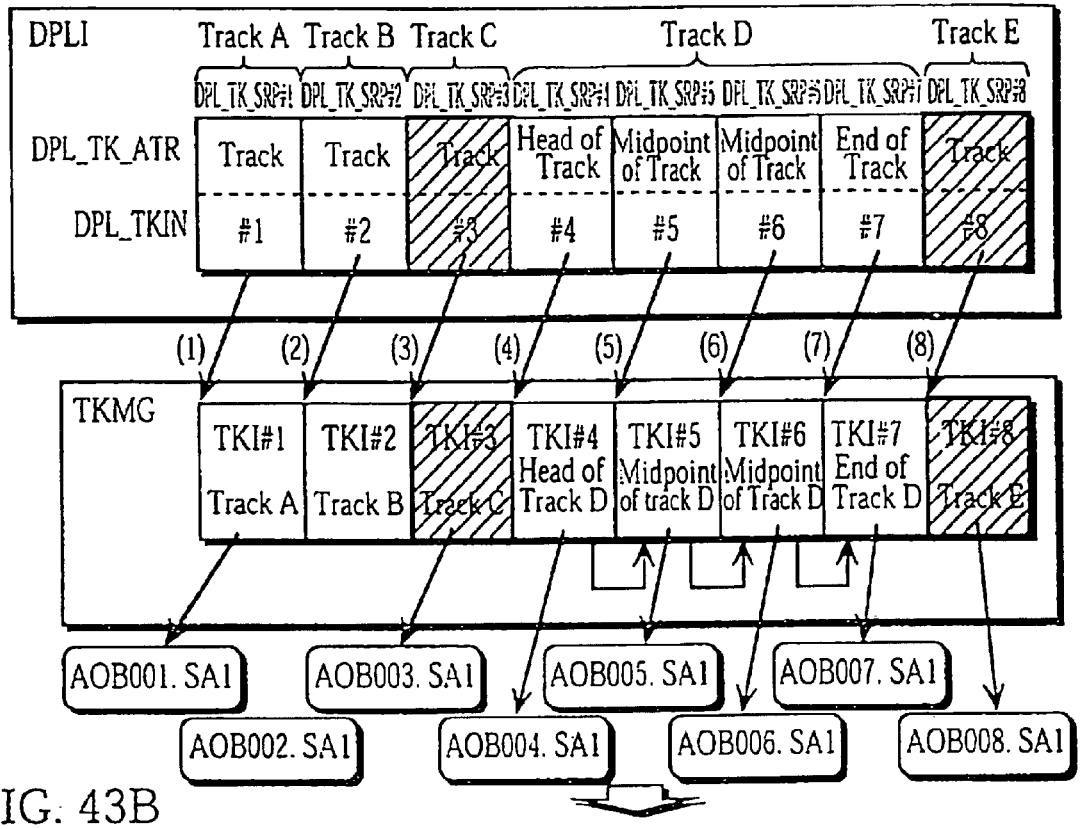
FIGS. 43A and 43B show how the order of tracks is rearranged.
Figure 43B:
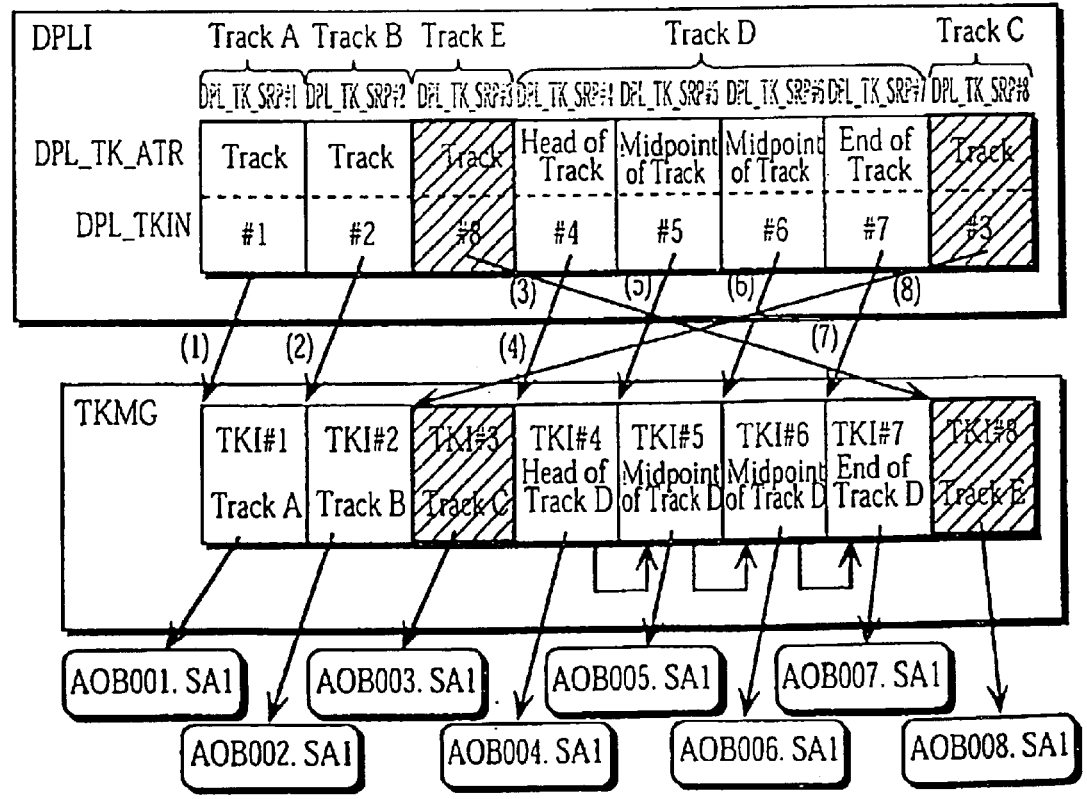

The following describes an editing operation that changes the playback order of tracks by reordering the DPL_TK_SRPs in the Default_PlaylistInformation. FIGS. 43A and 43B show one example of the reordering of tracks. The settings of the DPL_TK_SRPs and TKIs in FIG. 43A are the same as in FIG. 40.

In FIG. 40A, the DPL_TKIN in DPL_TK_SRP#3 is set at TKI#3, while the DPL_TKIN in DPL_TK_SRP#8 is set at TKI#8. The following describes the case when these DPL_TK_SRPs with the thick outlines in FIG. 40A are interchanged.

The numbers (1) (2) (3) (4) (5) (6) (7) (8) in FIG. 43B show the playback order of tracks after this editing operation. It should be noted here that while the playback order shown in FIG. 43A is TrackA, TrackB, TrackC, TrackD, TrackE, in FIG. 43B the DPL_TKINs of DPL_TK_SRP#3 and DPL_TK SRP#8 are interchanged in the Default_

Playlist_Information, so that the tracks will be played back in the order TrackA, Co TrackB, TrackE, TrackD, TrackC. In this way, the playback order of tracks can be easily changed by changing the order of the DPL_TK_SRPs in the Default_Playlist_Information.

While the above explanation deals with an editing operation that changes the order of tracks, the following will describe the following four operations that were explained with respect to the changes in the TKIS. These operations are a first case (case1) where a track is deleted, a second case (case2) where a new track is recorded, a third case (case3) where two freely selected tracks are combined to produce a new track, and a fourth case (case4) where a track is divided to produce two new tracks.

{17-9_40-3_44A,B} Deletion of a Track

The following describes case1 where a track is deleted.

Figure 44A:
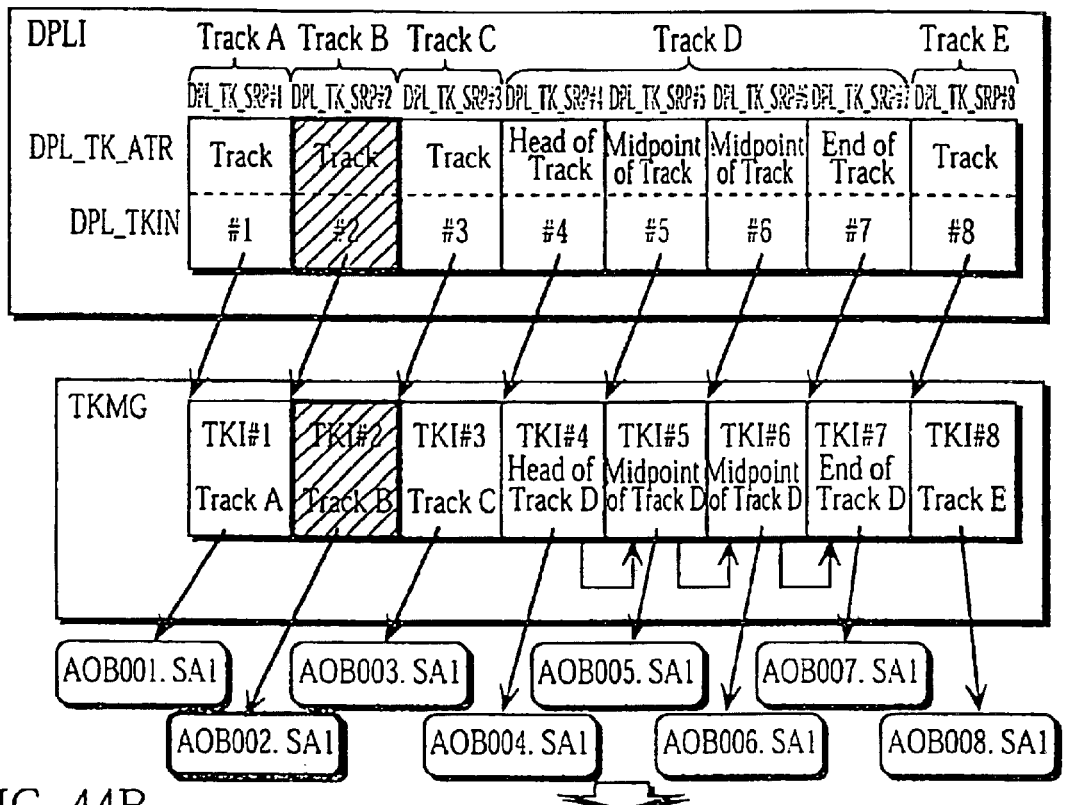
FIGS. 44A and 44B show how the Default_Playlist, TrackManager, and AOB files will be updated when DPL_TK_SRP#2 and TKI#2 are deleted from the Default_Playlist shown in FIG. 40.
Figure 44B:
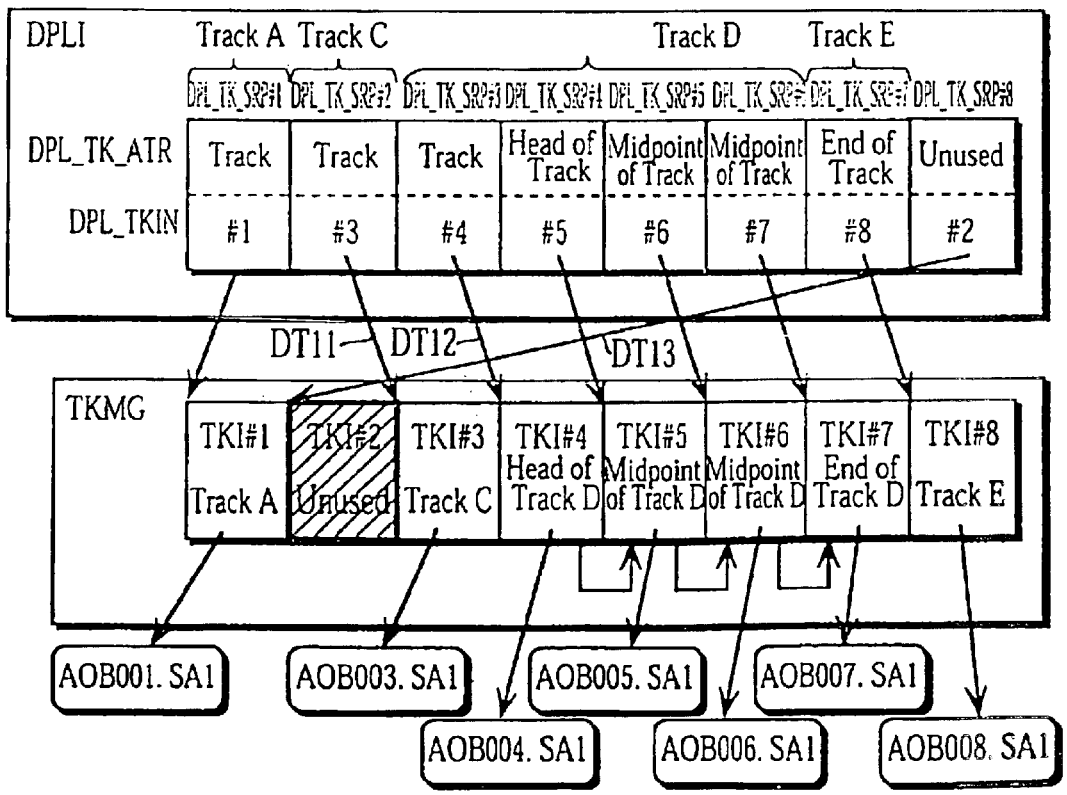

FIGS. 44A and 44B show how the Default_Playlist, TrackManager, and AOB files are updated when, out of the DefaultPlaylist shown in FIG. 40, DPL_TK_SRP#2 and TKI#2 are deleted. In these drawings, the same part of an AOB is deleted as in FIG. 27 that was used to describe the deletion of a TKI. As a result, the second, third, and fourth levels in FIGS. 44A and 44B are the same as in FIG. 27. The difference with FIG. 27 is that Default_Playlist_Information including a plurality of DPL_TK_SRPs is given on the first level, in the same way as FIG. 40.

The present example deals with the case when the user tit deletes TrackB composed of DPL_TK_SRP#2_TKI#2 ("AOB002.SA1") that is shown with the thick outline in FIG. 44A. In this case, DPL_TK_SRP#2 is deleted from Default_Playlist_Information and DPL_TK_SRP#3 to DPL_TK_SRP#8 are each moved up by one place in the playback order so as to fill the place in the order freed by the deletion of DPL_TK_SRP#2.

When the DPL_TK_SRPs are moved up in this way, the final DPL_TK_SRP#8 is set as "Unused". On the other hand, the TKI corresponding to the deleted part is set as "Unused" as shown in FIGS. 27A and 27B without other TKIS being moved to fill the gap created by the deletion. Deletion of the TKI is also accompanied by the deletion of the AOB file "AOB002.SA1".

In this way, DPL_TK_SRPs are moved up in the playback order but TKIs are not moved, so that in FIG. 44B only the DPL_TKINs in the DPL_TK_SRPs are updated. For this example, the DPL_TKIN in DPL_TK_SRP#2 is set so as to indicate TKI#3 as shown by the arrow DT11, the DPL_TKIN in DPL_TK_SRP#3 is set so as to indicate TKI#4 as shown by the arrow DT12, the DPL_TKIN in DPL_TK_SRP#4 is set so as to indicate TKI#5, and the DPL_TKIN in DPL_TK_SRP#5 is set so as to indicate TKI#6. The DPL_TKIN in DPL_TK_SRP#8 that has been set at "Unused" is set so as to indicate TKI#2, as shown by the arrow DT13.

When a track is deleted, the DPL_TK_SRP used for following tracks in the playback order are moved up, while the TKI corresponding to the deleted track is set at "Unused" while remaining in its present position. In this way, an editing operation is not accompanied by movement of TKIs, which suppresses the processing load when editing tracks.

{17-9_40-4_45A,B} Assignment of TRIS when Recording Tracks

Figure 45A:
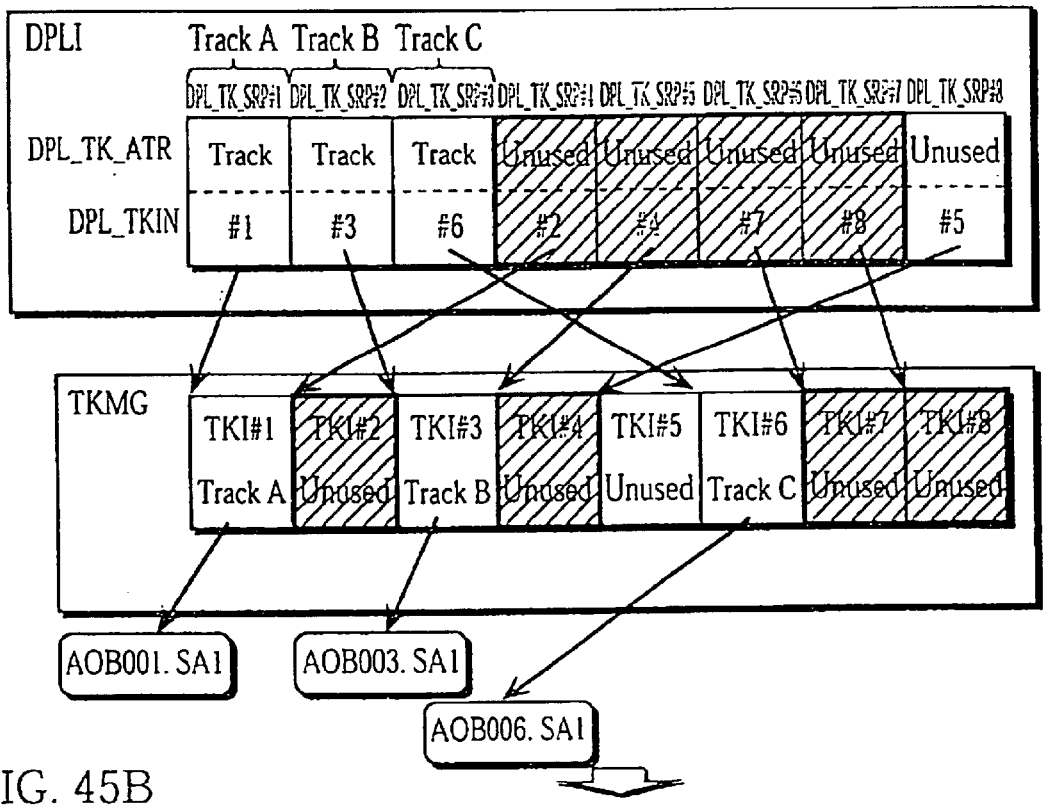
FIGS. 45A and 45B show how a new TKI and DPL_TK SRP are written when an "Unused" TKI and DPL_TK_SRP are present.
Figure 45B:
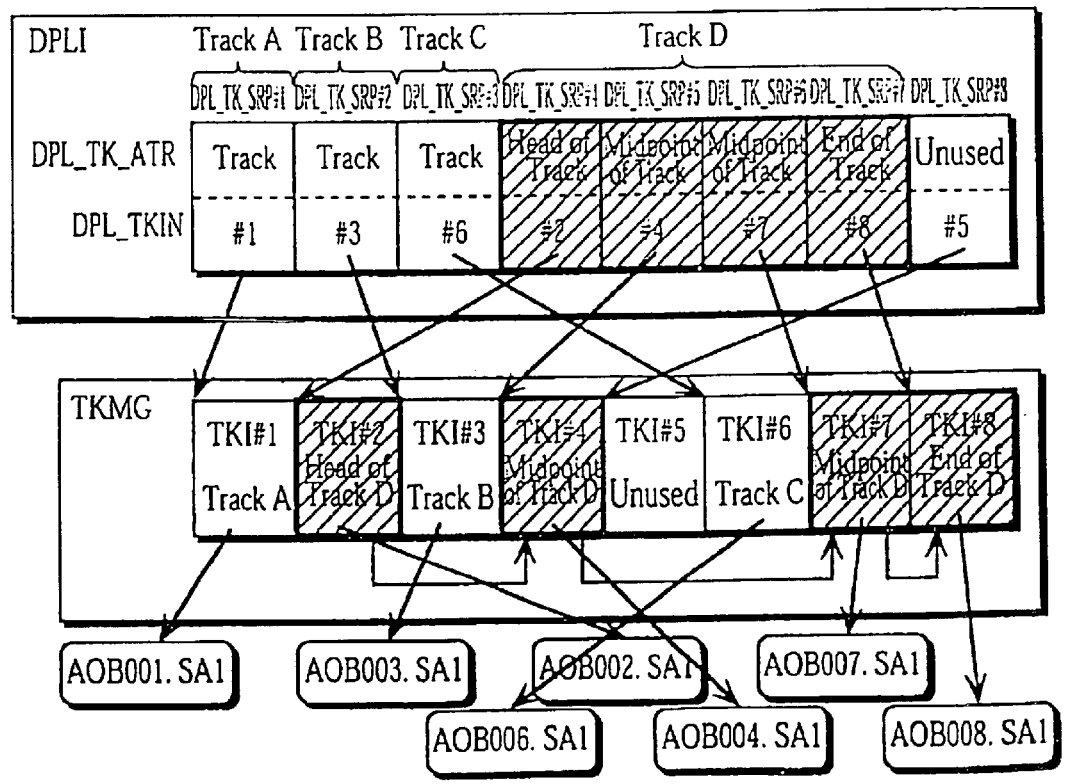

The following describes case2 when a new track is recorded following the partial deletion of a track. FIGS. 45A and 45B show how an operation that writes a new TKI and DPL_TK_SRP is performed when an "Unused" TKI and DPL_TK_SRP are present.

These drawings are largely the same as FIGS. 28A and 28B that were used to explain the assignment of a new TKI to a TKI set at "Unused". The second, third, and fourth levels in FIGS. 45A and 45B are the same as the first three levels in FIGS. 28A and 28B. The difference between these drawings is that the first levels in FIGS. 45A and 45B show the Default_Playlist_Information composed of a plurality of DPL_TK_SRP. In FIG. 45A, the DPL_TK_SRP#4 to DPL_TK_SRP#8 are set as "Unused". On the other hand, in FIG. 28 the TKI#2, TKI#4, TKI#5, TKI#7, TKI#8 are set as "Unused".

While TKIs set at "Unused" are present here and there in the TrackManager, the "Unused" DPL_TK_SRPs are positioned next to one another in the Default_Playlist_Information. This results from the used DPL_TK_SRPs being moved up in the Default_Playlist_Information as described above, while no such moving up is performed for TKIS.

The following explanation describes the case when TrackD composed of four AOBs is written. The TKIs for these four AOBs are respectively written into the following "Unused" TKIs in the TrackManager: TKI#2; TKI#4; TKI#7; and TKI#8.

The DPL_TK_SRPs for these four AOBs are written in DPL_TK_SRP#4 to DPL-TK-SRP#7 in the Default_Playlist_Information. Since these four AOBs compose a single track, the DPL_TK_ATR of DPL_TK_SRP#4 is set at "Head_of_Track", the DPL_TK_ATRs of DPL_TK_SRP#5 and DPL_TK_SRP#6 are set at "Middle_of_Track", and the DPL_TK_ATR of DPL_TK_SRP#7 is set at "End_of_Track".

The DPL_TKIN of DPL_TK_SRP#4 is set at TKI#2, the DPL_TKIN of DPL_TK_SRP#5 at TKI#4, the DPL_TKIN of DPL_TK_SRP#6 at TKI#7, and the DPL_TKIN of DPL_TK_SRP#7 at TKI#8.

By setting the DPL_TKINs and DPL_TK_ATRs in this way, TKI#2, TKI#4, TKI#7 and TKI#8 are managed as the fourth track TrackD.

In the above processing, a write is performed for "Unused" TKIs, though this has no effect on the other TKIs TKI#1, TKI#2, TKI#3, and TKI#4, as was also the case in FIGS. 28A and 28B.

{17-9_40-5_46A,B} Case3: Combining Tracks

Figure 46A:
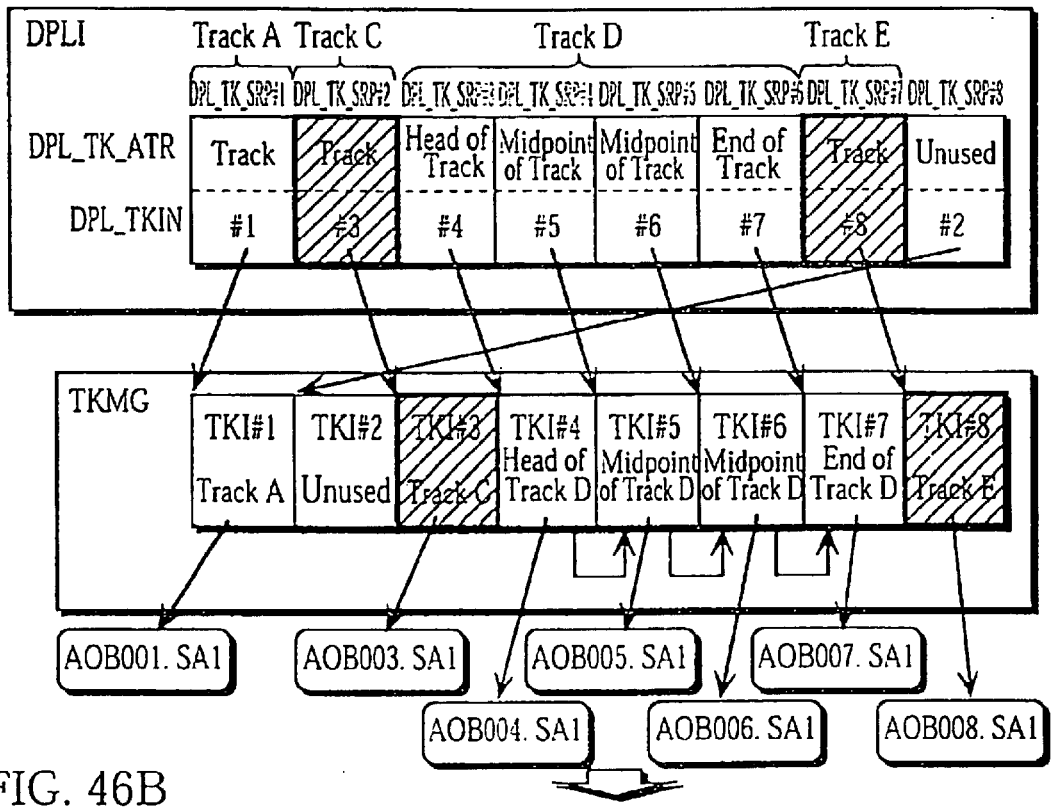
FIGS. 46A and 46B show how tracks are combined.
Figure 46B:
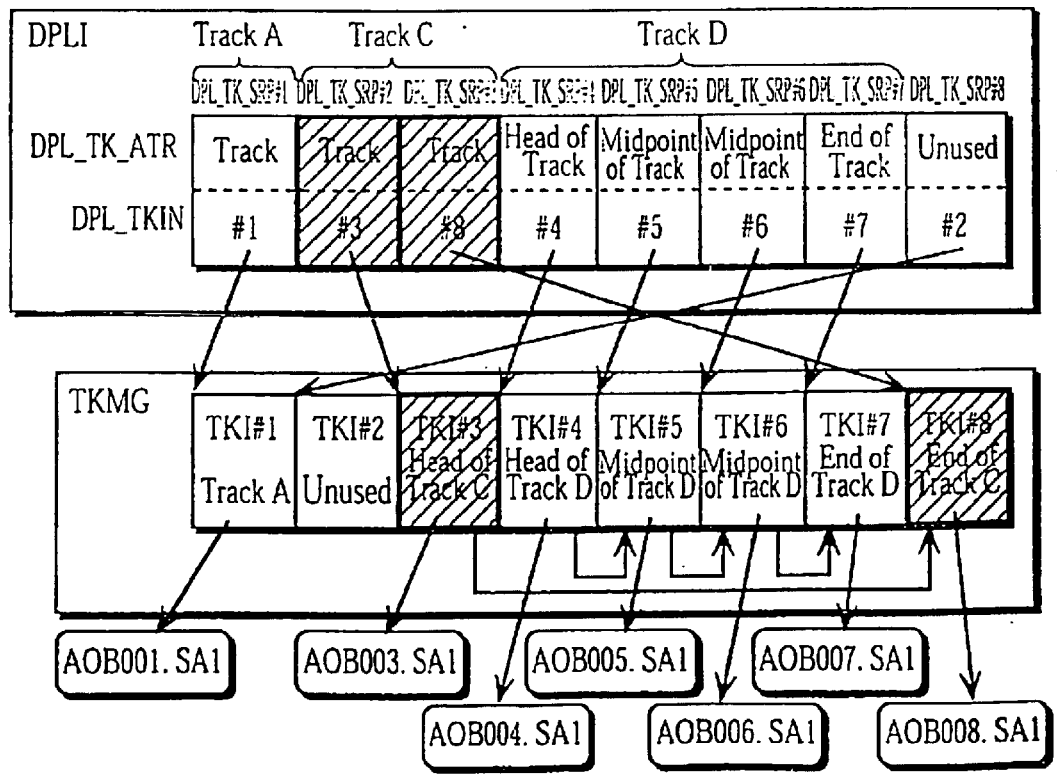

The following describes the updating of the Default_Playlist_Information when tracks are combined (i.e., in case3). FIGS. 46A and 46B show one example of the combining of tracks.

These drawings are largely the same as FIGS. 29A and 29B that were used to explain the combining of TKIs. The second, third, and fourth levels in FIGS. 46A and 46B are the same as the first two levels in FIGS. 29A and 29B. The difference between these figures is that the first levels in FIGS. 46A and 46B show Default_Playlist_Information, in which DPL_TK_SRP#8 is set at "Unused" and is related to TKI#2 that is also set at "Unused". When an editing operation combining tracks is performed for AOB files and TKIs as shown in FIGS. 29A and 29B, the contents of DPL_TK_SRP#3 to DPL_TK SRP#6 are each moved down by one and the content of DPL_TK_SRP#7 that is shown with the thick outline is copied into DPL_TK_SRP#3 as shown in FIGS. 46A and 46B. The TKIs are also updated, as shown in FIGS. 29A and 29B.

{17-9_40-6_47A,B} Case4: Division of a Track

The following describes the updating of the Default_Playlist_Information when a track is divided (case4).

Figure 47A:
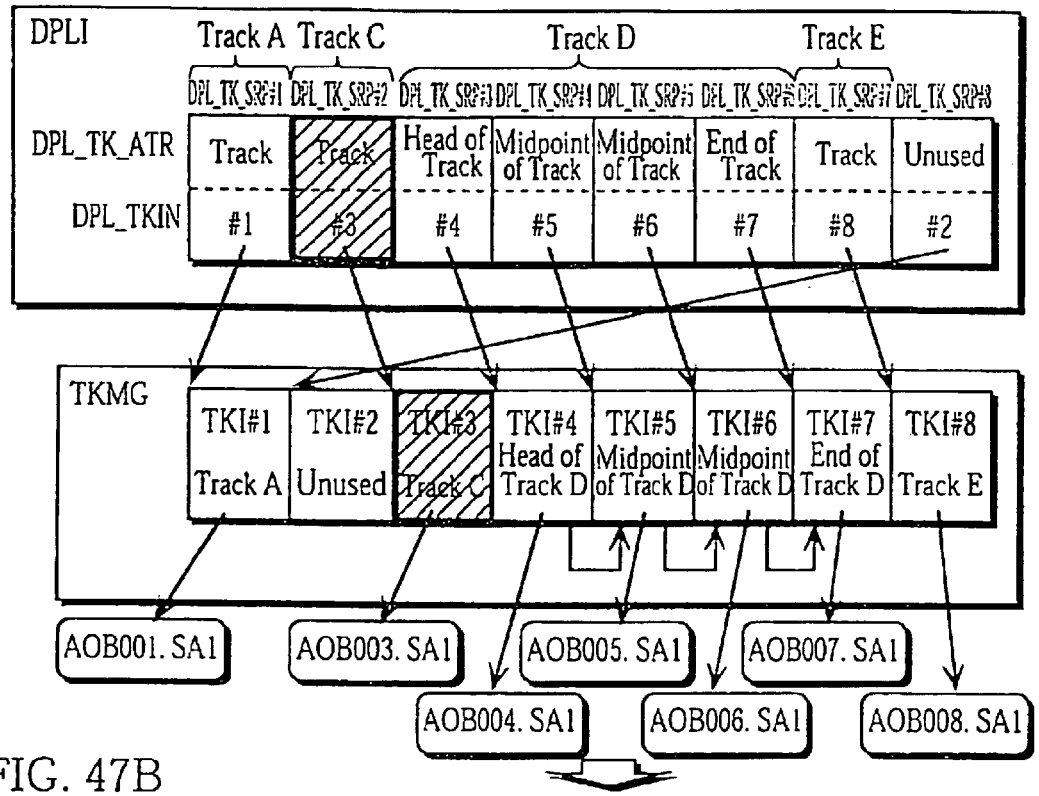
FIGS. 47A and 47B show how a track is divided.
Figure 47B:
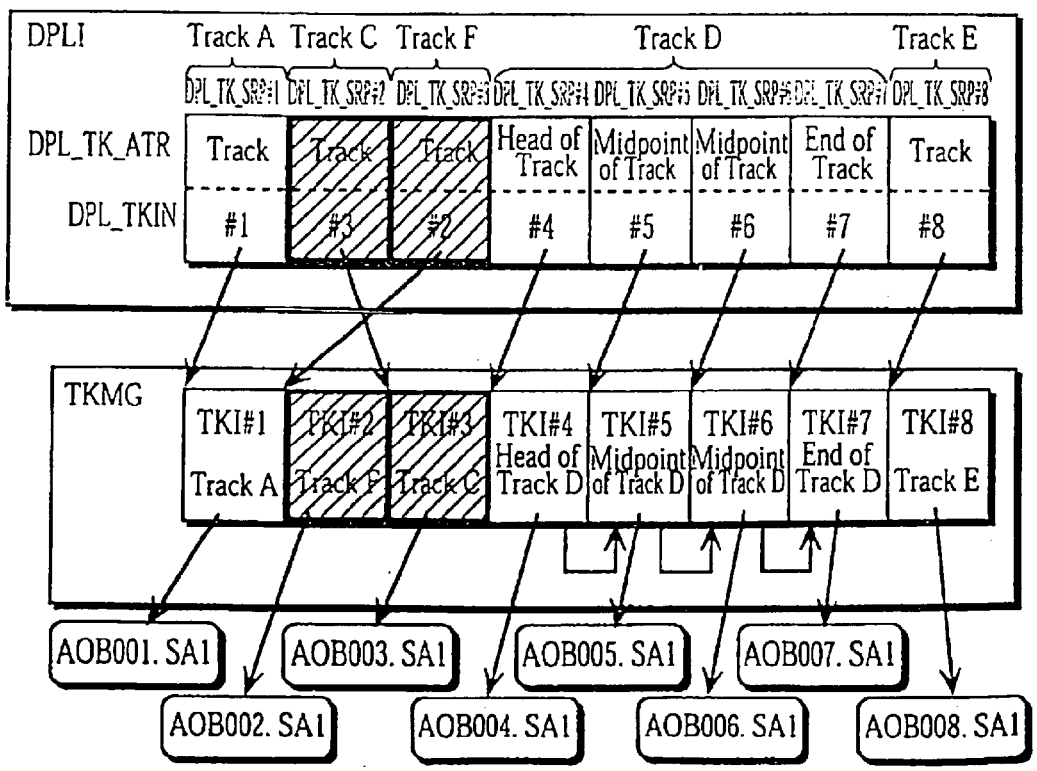

FIGS. 47A and 47B show one example of the division of a track. These drawings are largely the same as FIGS. 33A and 33B that were used to explain the division of TKIs. The second and third levels in FIGS. 47A and 47B are the same as the first two levels in FIGS. 33A and 33B. The difference between these figures is that the first level in FIGS. 47A and 47B shows Default_Playlist_Information, in which DPL_TK_SRP#8 is set at "Unused" and is related to TKI#2 that is also set at "Unused".

If, as in FIGS. 33A and 33B, the user indicates the division of TKI#3 ("AOB003.SA1") shown with the thick outline into two, the positions of DPL_TK_SRP#3 to DPL_TK_SRP#7 are each moved down by one in the order, and a DPL_TK_SRP set at "Unused" is moved within the Default_PlaylistInformation to the former position of DPL_TK_SRP#3.

This new DPL_TK SRP#3 is associated with the TKI, TKI#2, newly produced by the division. The AOB file "AOB002.SA1" associated with TKI#2 stores what was originally the latter part of the AOB file "AOB003.SA1". DPL_TK_SRP#2 is present before the DPL_TK SRP#3 that is associated with TKI#2 and is associated with TKI#2 and "AOB002.SA1".

This is to say, "AOB002.SA1" and "AOB003.SA1" respectively store the latter and former parts of the original "AOB003.SA1", with the DPL_TK_SRP#2 and DPL_TK_SRP#3 corresponding to these files indicating that these AOBs are to be played back in the order "AOB003.SA1" and "AOB002.SA1". As a result, the latter and former parts of the original "AOB003.SA1" will be played back in the order former part, latter part in accordance with the playback order given in the DPL_TK_SRP.

{17-9_40-8} Application of the Editing Processing

By combining the above four editing processes, a user can perform a great variety of editing operations. When, for example, a recorded track has an intro over which a disc jockey has talked, the user can first divide the track to separate the part including the disc jockey's voice. The user can then delete this track to leave the part of the track that does not include the disc jockey.

This completes the explanation of the navigation data. The following describes a playback apparatus with a suitable composition for playing back the navigation data and presentation data described above.

{48-1} External Appearance of the Playback Apparatus

Figure 48:
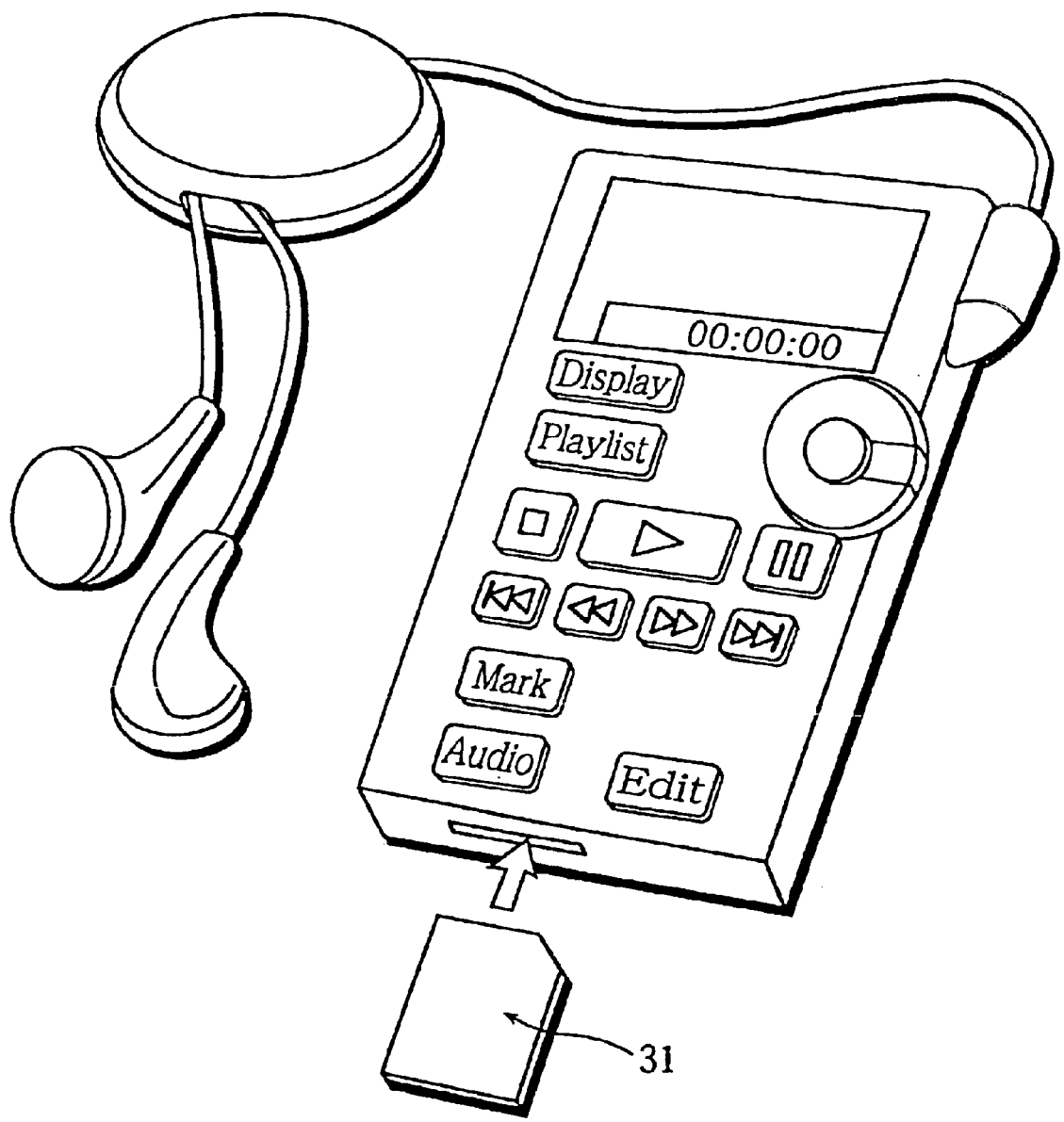
FIG. 48 shows the appearance of a portable playback apparatus for the flash memory card 31 of the present embodiments.

FIG. 48 shows a portable playback apparatus for the flash memory card 31 of the present invention. The playback apparatus shown in FIG. 48 has an insertion slot for inserting the flash memory card 31, a key panel for receiving user indications for operations such as playback, forward search, backward search, fast forward, rewind, stop, etc., and an LCD (liquid crystal display) panel. In terms of appearance, this playback apparatus resembles other kinds of portable music players.

The key panel includes:

a "Playlist" key that receives the selection of a playlist or a track;

a "|<<" key that receives a skip operation that moves the playback position to a start of the current track;

a ">>|" key that receives a skip operation that moves the playback position to a start of the next track;

a "<<" key and a ">>" key that respectively receive a backward search operation and a forward search operation enable the user to have the playback move quickly through the current track;

a "Display" key that receives an operation to have still images stored on the flash memory card 31 displayed;

a "Rec" key that receives a recording operation; an "Audio" key for receiving user selections of the sampling frequency or of stereo or monaural to be used;

a "Mark" key that receives user indications that mark positions in tracks; and an "Edit" key that receives user indications for the editing of tracks or for the input of track titles.

{48-2} Movements Made in This Portable Playback Apparatus for the Flash Memory Card 31

The differences between this portable playback apparatus of the flash memory card 31 and a conventional portable music player lie in the following four improvements (1) to (4)

(1) A list of playlist and tracks is shown on the LCD panel to allow the user to indicate Default_Playlist_Information, a PLI, or separate tracks.

(2) Keys on the key panel are assigned to the playlists and/or tracks displayed on the LCD panel to allow the user to select a track or playlist that is to be played back or edited.

(3) A time code showing a position in a track is displayed on the LCD panel 5 when a track is played back.

(4) A jog dial is provided to enable the user to set a time code for use as playback start time when using the time search function or as a division boundary when dividing a track.

{48-2_49_50} Improvement (2)

Figure 49:
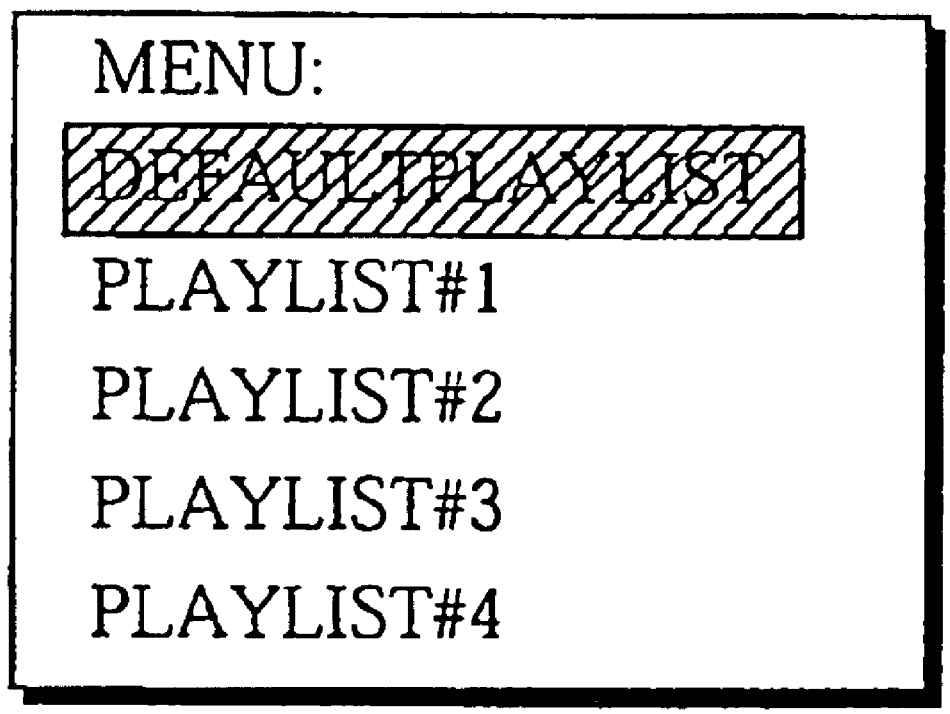
FIG. 49 shows one example of the display on the LCD panel when a playlist is selected.

The following describes improvement (2) in detail. FIG. 49 shows one example of a display screen shown on the LCD panel when the user selects a playlist, while FIGS. 50A to 50E show examples of the displayed content when the user selects a track.

In FIG. 49, the ASCII character strings "DEFAULTPLAYLIST", "PLAYLIST#1", "PLAYLIST#2", "PLAYLIST#3", and "PLAYLIST#4" represent the default playlist and the four playlists stored in the flash memory card 31.

Meanwhile, the ASCII character strings "Track#1", "Track#2$^1_1$, "Track#3", "Track#4", "Track#5" represent the five tracks that are indicated in the playback order given by the default playlist stored in the flash memory card 31. In FIGS. 49 and 50A, the highlighted Playlist and track show the track or Playlist that is currently indicated for playback or editing.

If the user presses the ">>" key when Track#1 is indicated for playback within a playback order given by kill the default Playlist displayed on the LCD panel, Track#2 will be indicated for playback within the list of tracks, as shown in FIG. 50B. If the user presses the " " key again, Track#3 will be indicated for playback within the list of tracks, as shown in FIG. 50C.

If the user presses the "<<" key when Track#3 is indicated for playback within a playback order given by the default Playlist displayed on the LCD panel, Track#2 will be indicated for playback within the list of tracks, as shown in FIG. 50D. As shown in FIG. 50E, if the user presses the "Play" key when any of the tracks is indicated, the playback of the indicated track will begin, while if the user presses the "Edit" key, the indicated track will be selected for editing.

{48-3_51} Improvement (4)

Figure 51A:
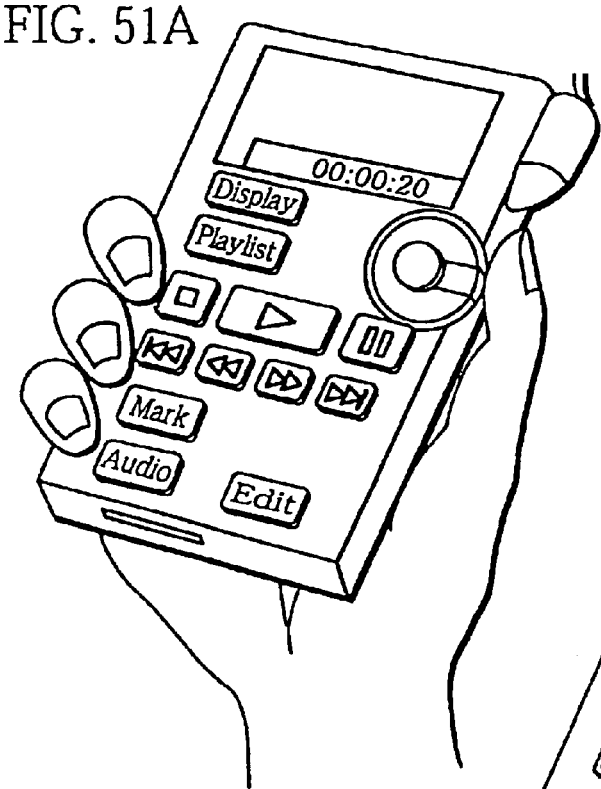
FIGS. 51A to 51C show example operations of the jog dial.
Figure 51C:
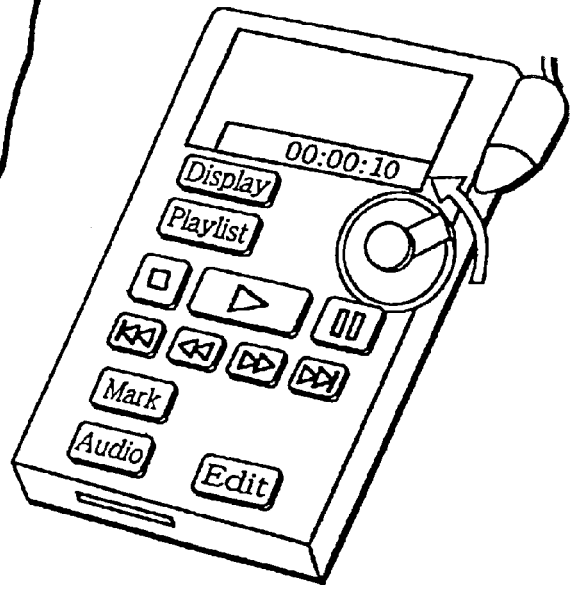
Figure 51B:
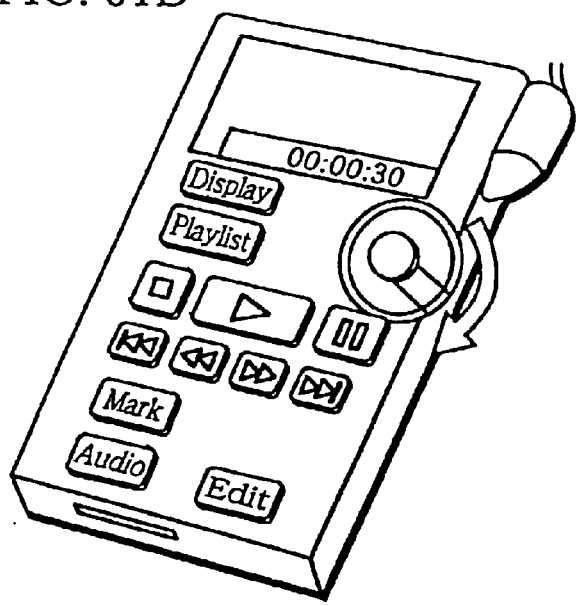

The following describes improvement (4) in detail. FIGS. 51A to 51C show an example operation of the jog dial. When the user rotates the jog dial by a certain amount, the playback time code displayed on the LCD panel will be increased or decreased in accordance with this certain amount. The example in FIG. 51A shows the case where the playback time code that is initially displayed on the LCD panel is "00:00:20".

When the user rotates the jog dial counterclockwise as shown in FIG. 51B, the playback time code is reduced to "0:00:10" in keeping with the amount by which the jog is dial was rotated. Conversely, when the user rotates the Jog dial clockwise as shown in FIG. 51C, the playback time code is increased to "0:00:30" in keeping with the amount l") by which the jog dial was rotated.

By allowing the user to change the playback time code in this way, the playback apparatus enables the user to indicate any playback time code in a track by merely rotating the jog dial. If the user then presses the "Play" key, AOBs will be played back starting from a position found according to Equation 2 and Equation 3.

By using the jog dial during a track dividing operation, the user can make fine adjustments to the playback time code used as the division boundary.

{52-1} Internal Construction of the Playback Apparatus

The following describes the internal construction of the playback apparatus. This internal construction is shown in FIG. 52.

Figure 52:
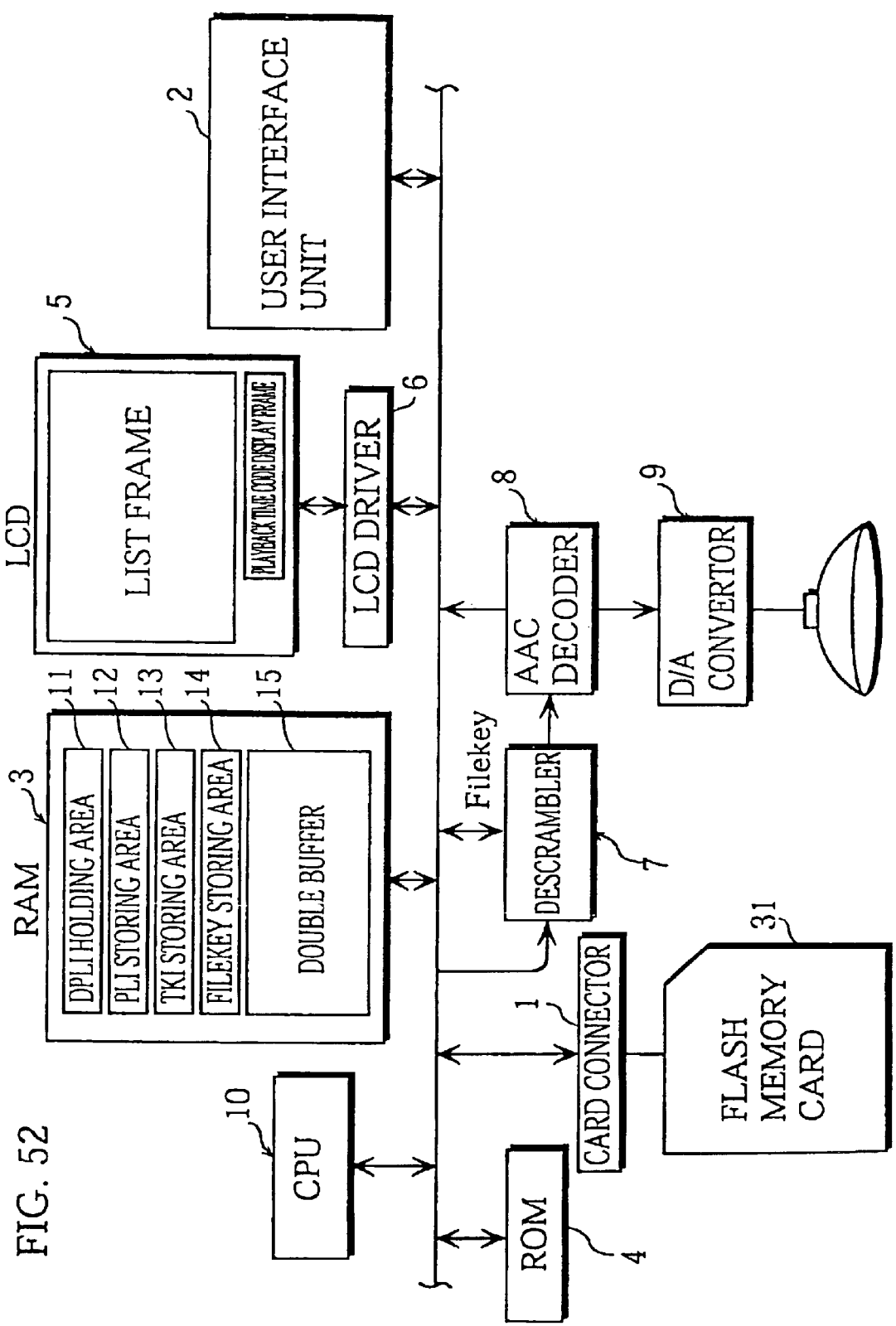
FIG. 52 shows the internal construction of the reproduction apparatus.

As shown in FIG. 52, the playback apparatus includes a card connector 1 for connecting the playback apparatus to the flash memory card 31, a user interface unit 2 that is connected to the key panel and the jog dial, a RAM 3, a ROM 4, a LCD panel 5 having a list frame for displaying a list of tracks or playlists and a playback time code frame for displaying a playback time code, an LCD driver 6 for driving the first LCD panel 5, a descrambler 7 for decrypting AOB_FRAMEs using a different FileKey for each AOB file, an AAC decoder 8 for referring to the ADTS of an AOB_FRAME descrambled by the descrambler 7 and decoding the AOB_FRAME to obtain PCM data, a D/A converter 9 for D/A converting the PCM data and outputting the resulting analog signals to a speaker or headphone jack, and a CPU 10 for performing overall control over the playback apparatus.

As can be understood from this hardware construction, the present playback apparatus has no special hardware elements for processing the TrackManager and Default_Playlist_Information. To process the TrackManager and Default_Playlist_Information, a DPLI holding area 11, a PLI storing area 12, a TKI storing area 13, a FileKey storing area 14, and a double buffer 15 are provided in the RAM 3, while a playback control program and an editing control program are stored in the ROM 4.

{52-2} DPLI Holding Area 11

The DPLI holding area 11 is an area for continuously holding Default_Playlist_Information that has been read from a flash memory card 31 connected to the card connector 1.

{52_12} PLI Storing Area 12

The PLI storing area 12 is an area that is reserved for storing Playlist_Information that has been selected for playback by the user.

{52-3} TKI Storing Area 13

The TKI storing area 13 is an area that is reserved for storing only the TKI corresponding to the AOB file that is currently indicated for playback, out of the plurality of TKI included in the TrackManager. For this reason, the capacity of the TKI storing area 13 is equal to the data size of one TKI.

{52-4} FileKey Storing Area 14

The FileKey storing area 14 is an area that is reserved for storing only the FileKey corresponding to the AOB file that is currently indicated for playback, out of the plurality of FileKeys included in "AOBSA1.KEY" in the authentication region.

{52-5} Double Buffer 15

The double buffer 15 is an input/output buffer that is used when an input process, which successively inputs cluster data (data that is stored in one cluster) read from the flash memory card 31, and an output process, which reads AOB_FRAMEs from cluster data and successively, outputs the AOB_FRAMEs to the descrambler 7, are performed in parallel.

The double buffer 15 successively frees the regions that were occupied by cluster data that has been outputted as AOB_FRAMEs and so secures regions for storing the next clusters to be read. This is to say, regions in the double buffer 15 are cyclically secured for storing cluster data using ring pointers.

{52-5_53_54A,B} Input and Output by the Double Buffer 15

Figure 53:
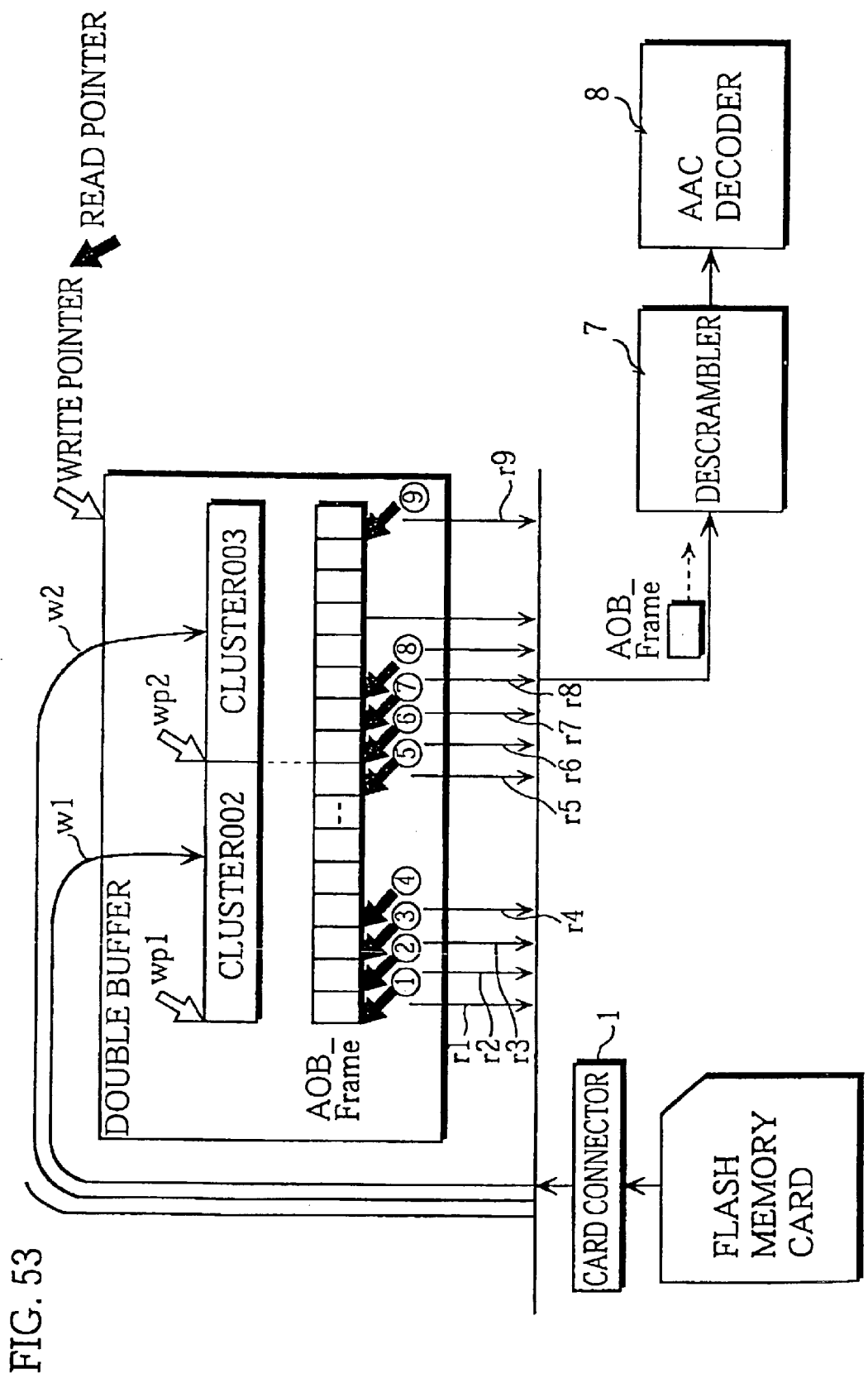
FIG. 53 shows how data is transferred in and out of the double buffer 15.
Figure 54A:
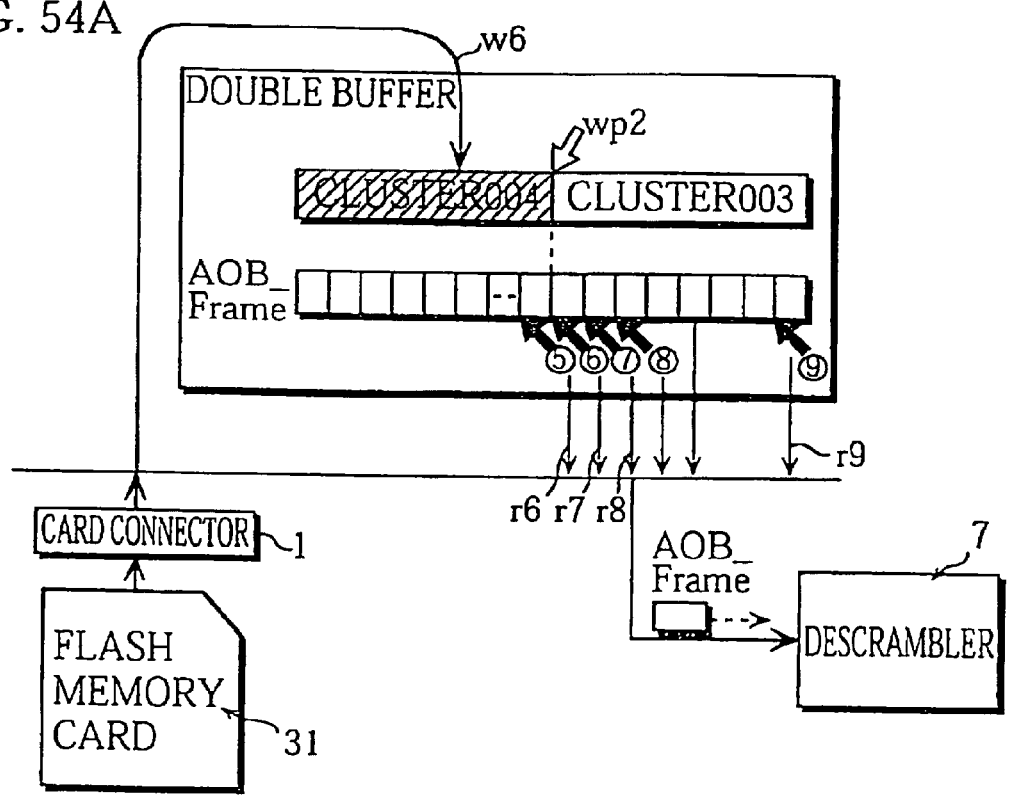
FIGS. 54A and 54B show how areas in the double buffer 15 are cyclically allocated using ring pointers.
Figure 54B:
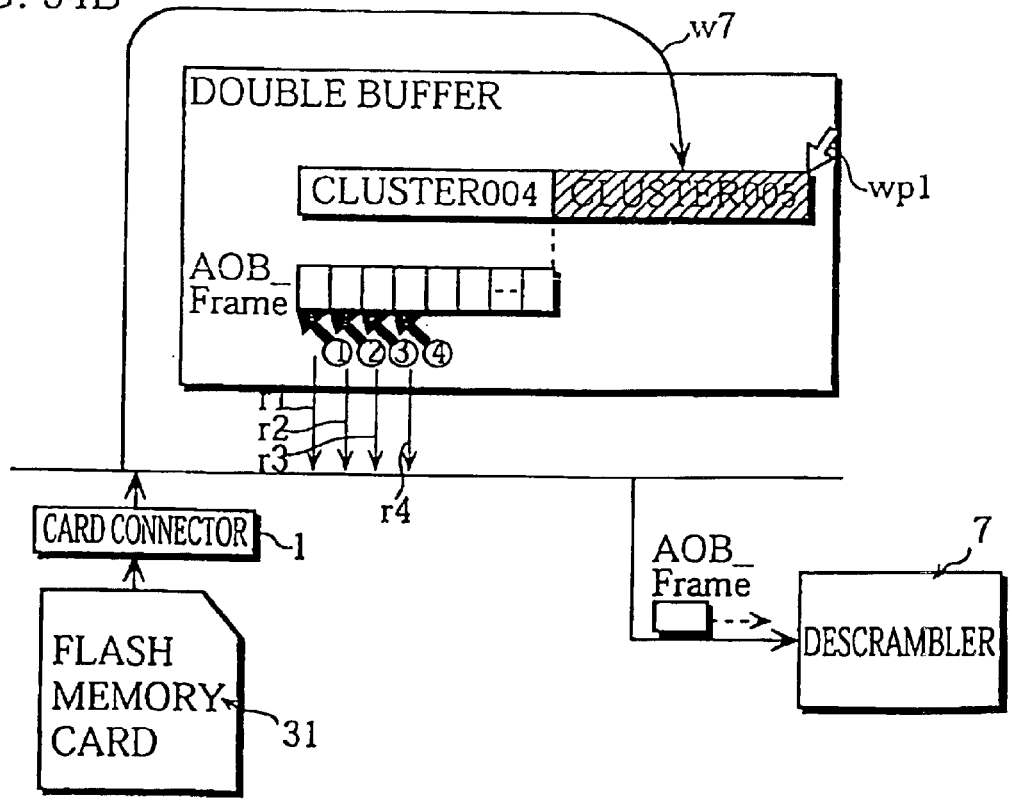

FIG. 53 shows how input and output are performed for the double buffer 15. FIGS. 54A and 54B show how regions in the double buffer 15 are cyclically secured for storing cluster data using a ring pointer.

The arrows pointing downward and to the left are pointers to write addresses for cluster data, which is to say, the write pointer. The arrows pointing upward and to the left are pointers to read addresses for cluster data, which is to say, the read pointer. These pointers are used as the ring pointer.

{54-6_53}

When a flash memory card 31 is connected to the card connector 1, cluster data in the user region of the flash memory card 31 is read out and stored in the double buffer 15 as shown by the arrows w1 and w2.

The read cluster data is successively stored into the positions in the double buffer 15 shown by the write pointers wp1 and wp2.

{52-7_54A}

Of the AOB_Frames included in the cluster data stored in this way, the AOB_Frames present at the positions ①②③④⑤⑥⑦⑧⑨ that are successively indicated by the read pointer are outputted one at a time to the descrambler 7 as shown by the arrows r1, r2, r3, r4, r5.

In the present case, the cluster data 002 and 003 are stored in the double buffer 15 and the read positions ①②③④ are successively indicated by the read pointer, as shown in FIG. 53. When the read pointer reaches the read position ⑤, all of the AOB_FRAMEs included in cluster 002 will have been read, so that cluster 004 is read and, as shown by the arrow w6 in FIG. 54A, is overwritten into the region that was previously occupied by cluster 002.

{52-8_54B}

The read pointer then advances to the read positions ⑥ and ⑦, and eventually reaches the read position ⑨, at which point all of the AOB_FRAMEs included in cluster 003 will have been read, so that cluster 005 is read and, as shown by the arrow w7 in FIG. 54B, is overwritten into the region that was previously occupied by cluster 003.

The output of an AOB_FRAME and the overwriting of cluster data are repeatedly performed as described above, so that the AOB_FRAMEs included in an AOB file are all successively outputted to the descrambler 7 and AAC decoder 8.

{52-9_55-58} Playback Control Program Stored in the ROM 4

The following describes the playback control program stored in the ROM 4.

Figure 55:
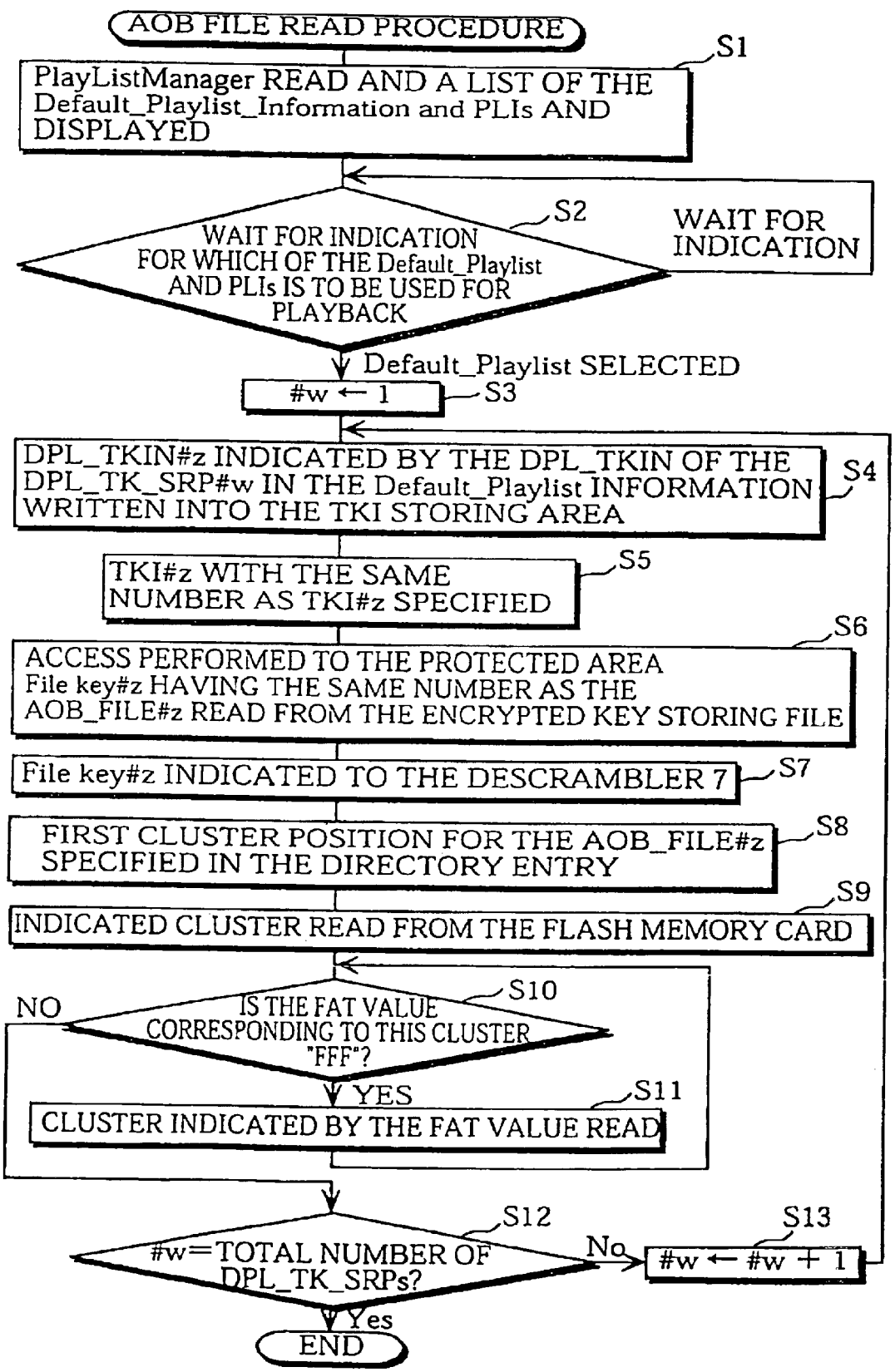
FIG. 55 is a flowchart showing the AOB file read procedure.
Figure 56:
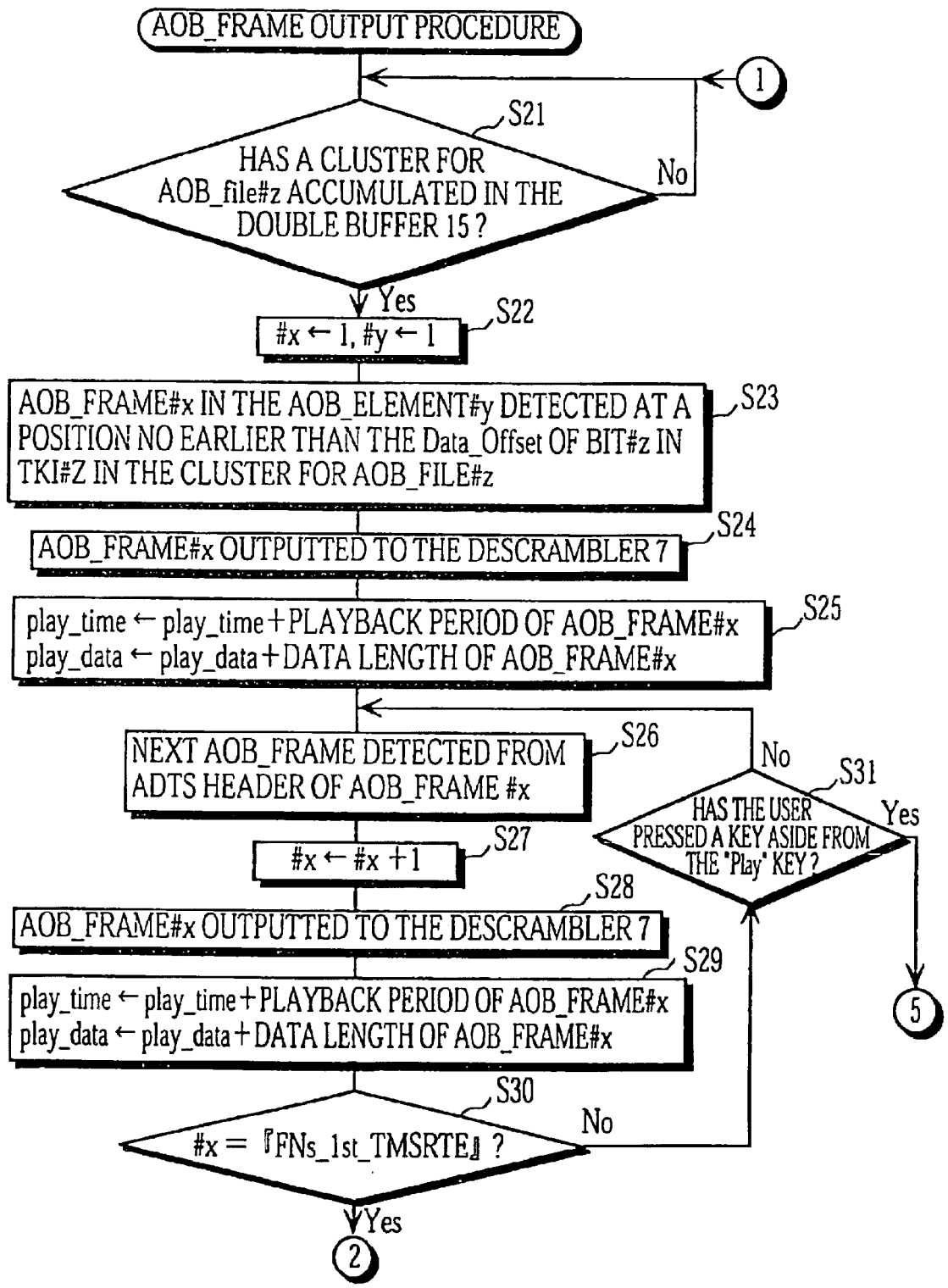
FIG. 56 is a flowchart showing the AOB file output procedure.
Figure 57:
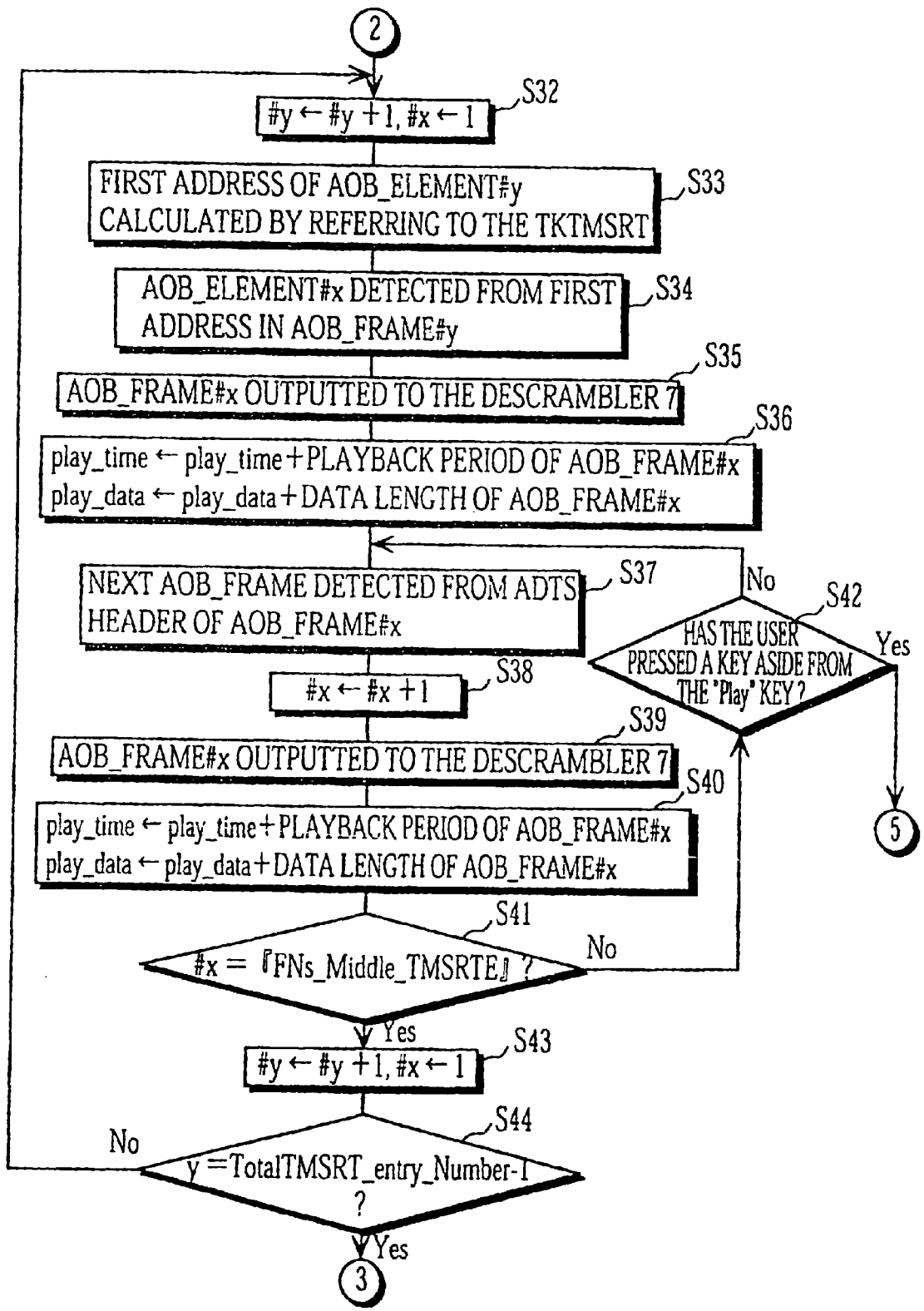
FIG. 57 is a flowchart showing the AOB file output procedure.
Figure 58:
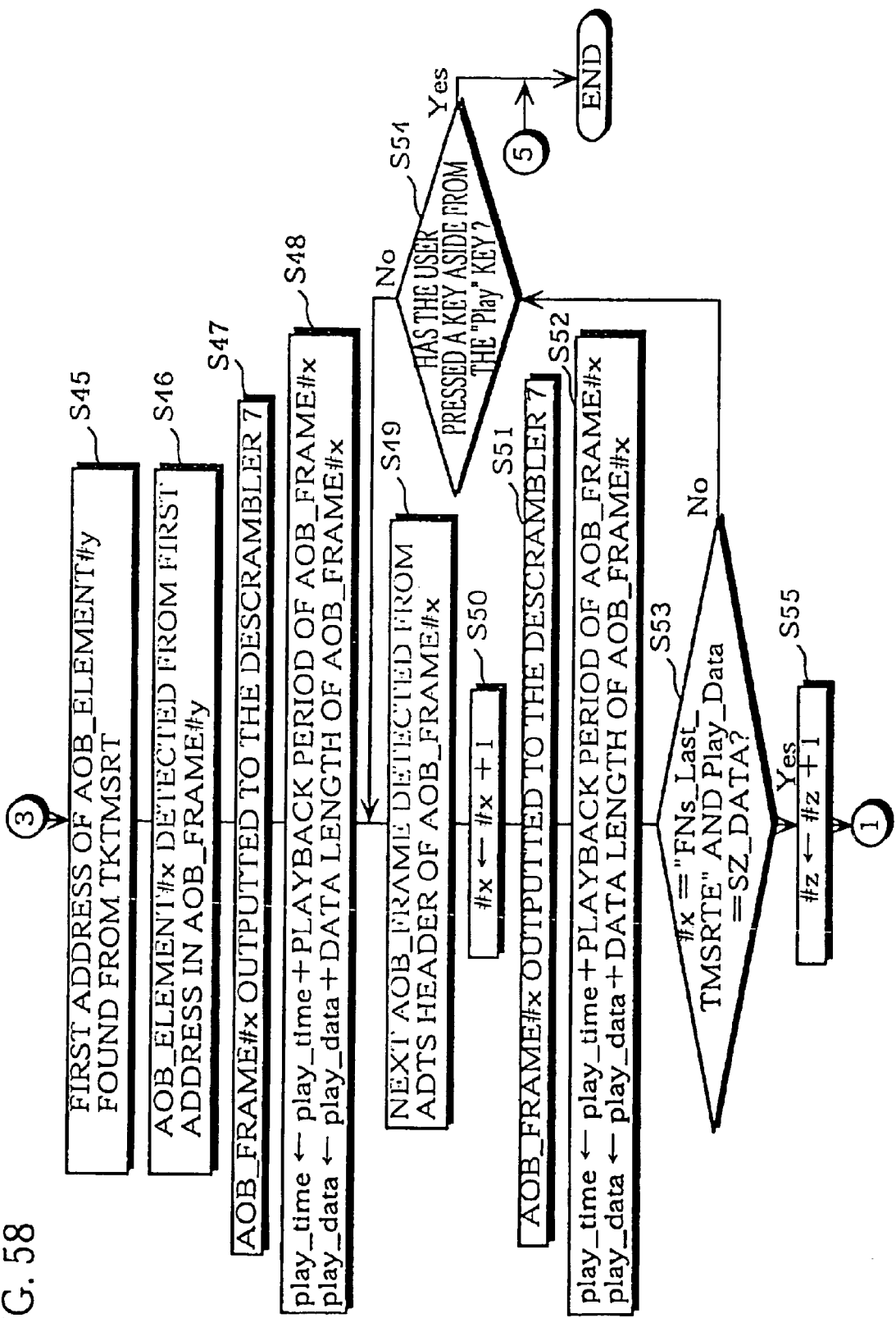
FIG. 58 is a flowchart showing the AOB file output procedure.

FIG. 55 is a flowchart showing the processing in the AOB file reading procedure. FIGS. 56, 57, and 58 are flowcharts showing the processing in the AOB_FRAME output procedure.

{52-9_55-1}

These flowcharts use the variables w, z, y, and x. The variable w indicates one of the plurality of DPL_TL_SRPs.

The variable z indicates an AOB file recorded in the user region, the TKI corresponding to this AOB file, and the AOB included in this AOB file. The variable y indicates an AOB_ELEMENT included in the AOB#z indicated by the variable z. The variable x indicates an AOB_FRAME included in the AOB_ELEMENT#y indicated by the variable y. The following first explains the processing in the AOB file read procedure, with reference to FIG. 55.

{52-9_55-2}

In step S1, the CPU 10 reads the PlaylistManager and displays a list including the Default_Playlist_Information and the PLIs.

In step S2, the CPU 10 waits for an indication to play back AOBs in accordance with either the Default_Playlist_Information or one of the PLIs.

When the Default_Playlist_Information is indicated, the processing moves from step S2 to step S3 where the variable w is initialized (#w←1) and then to step S4 where the TKI#z indicated by the DPL_TKIN corresponding to DPL_TK_SRP#w in the Default_Playlist_Information is specified and only this TKI#z is read from the flash memory card 31 and stored into the TKI storing area 13.

In step S5, an AOB file#z with the same number as TKI#z is specified. In this way, the AOB file that is to be played back is finally specified.

The specified AOB file is in an encrypted state and needs to be decrypted, so that steps S6 and S7 are performed. In step S6, the playback apparatus accesses the authentication region and reads the FileKey#z that is stored in a FileKey_Entry#z in the encryption key storing file, the FileKey_Entry#z having the same number as the specified AOB file. In step S7, the CPU 10 sets the FileKey#z in the descrambler 7. This operation results in the FileKey being set in the descrambler 7, so that by successively inputting In AOB_FRAMEs included in the AOB file into the descrambler 7, the AOB_FRAMEs can be successively played back.

{52-9_55-3}

After this, the playback apparatus successively reads the clusters that store the AOB file. In step S8, the "first cluster number in the file" is specified for the AOB_file#z in the directory entry. In step S9, the CPU 10 reads the data stored in this cluster from the flash memory card 31. In step S10, the CPU 10 judges whether the cluster number in the FAT value is "FFF". If not, in step S11 the CPU reads the data stored in the cluster indicated by the FAT value, before returning to step S10.

When the playback apparatus reads the data stored in any of the clusters and refers to the FAT value corresponding to this cluster, the processing in steps S10 and S11 will be repeated so long as the FAT value is not set at "FFF". This results in the playback apparatus successively reading clusters indicated by the FAT values. When the cluster number given by a FAT value is "FFF", this means that all of the clusters composing the AOB file#z have been read, so that the processing advances from step S10 to step S12.

{52-9_55-4}

In step S12, the CPU 10 judges whether the variable#w matches the total number of DPL_TK_SRPs. If not, the processing advances to step S13, where the variable#w is incremented (#w←#w+1) before the processing returns to step S4. In step S4, the playback apparatus specifies TKI#z which is indicated by the DPL_TKIN#w of DPL_TK_SRP#w in the Default_Playlist_Information, and writes only TKI#z into the TKI storing area 13. The TKI that was used up to this point will be still stored in the TKI storing area 13, though this current TKI will be overwritten by TKI#z that is newly read by the CPU 10.

This overwriting results in only the latest TKI being stored in the TKI storing area 13. Once the TKI has been overwritten, the processing in steps S5 to Sl2 is repeated for the AOB file#z. Once this processing has read all of the TKI and AOB files corresponding to all of the DPL_TK_SRPs included in the Default_Playlist_Information, the variable #z will match the total number of DPL_TK_SRP so that the judgement "Yes" is given in step S12 and the processing in this flowchart ends.

{52-9_56_57_58} Output Processing for an AOB_FRAME

In parallel with the AOB file reading procedure, the CPU 10 performs the AOB_FRAME output procedure in accordance with the flowcharts shown in FIGS. 56, 57, and 58. In these flowcharts, the variable "play_time" shows how long playback has been performed for a current track, which is to say, the playback time code. The time displayed in the playback time code frame on the LCD panel 5 is updated in accordance with changes to this playback time code. Meanwhile, the variable "play_data" represents the length of the data has been played back for the current track.

{52-9_56-1}

In step S21, the CPU 10 monitors whether cluster data for the AOB file#z has accumulated in the double buffer 15. This step S21 will be repeatedly performed until cluster data has accumulated, at which point the processing advances to step S22 where the variables x and y are initialized (#x←1, #y←1). After this, in step S23 the CPU 10 searches the clusters for AOB file #z and detects the AOB_FRAME#x in the AOB_ELEMENT#y that is positioned no earlier than the Data_Offset given in the BIT#z included in TKI#z. In this example, it is assumed that the seven bytes starting from the SZ_DATA are occupied by the ADTS header. By referring to the ADTS header, the data length indicated by the ADTS header can be recognized as audio data. The audio data and ADTS header are read together and are outputted to the descrambler 7. The descrambler 7 decrypts the AOB_FRAMEs, which are then decoded by the AAC decoder 8 and reproduced as audio.

{52-9_56-2}

After this detection, in step S24 the AOB_FRAME#x is outputted to the descrambler 7, and instep S25 the variable play_time is incremented by the playback period of the AOB_FRAME#x and the variable play_data is incremented the amount of data corresponding the AOB_FRAME#x. Since the playback time of AOB_FRAME is 20 msec in the present case, 20 msec is added to the variable "play_time".

Once the first AOB_FRAME has been outputted to the descrambler 7, in step S26 the playback apparatus refers to the ADTS header of AOB_FRAME#x and specifies where the next AOB_FRAME is. In step S27, the playback apparatus increments the variable#x (#x+#x+1) and sets AOB_FRAME#x as the next AOB_FRAME. In step S28, AOB_FRAME#x is inputted into the descrambler 7. After this, in step S29, the variable play_time is incremented by the playback period of the AOB_FRAME#x and the variable play_data is incremented the amount of data corresponding the AOB_FRAME#x. After incrementing AOB_FRAME#x, in step S30 the CPU 10 judges whether the variable #x has reached the value given in FNs_1st_TMSRTE.

If the variable #x has not reached the value in FNs_1st_TMSRTE, in step S31 the playback apparatus checks whether the user has pressed any key aside from the "Play" key, and then returns to step S26. The playback apparatus hereafter repeats the processing in steps S26 to S31 until the variable #x reaches the value in FNs_1st_TMSRTE or until the user presses any key aside from the "Play" key.

When the user presses a key aside from the "Play" key, the processing in this flowchart ends and suitable processing for the pressed key is performed. When the pressed key is the "Stop" key, the playback procedure stops, while when the pressed key is the "Pause" key, the playback is paused.
{52-9_57-1}

On the other hand, when the variable #x reaches the value in FNs_1st_TMSRTE, the judgement "Yes" is made in step S30, and the processing proceeds to step S32 in FIG. 57. Since all of the AOB_FRAMEs included in the present AOB_ELEMENT will have been inputted into the descrambler 7 in the processing between step S26 to S30, in step S32 the variable #y is incremented to set the next AOB_ELEMENT as the data to be processed and the variable #x is initialized (#y←#y+1, #x←1).

After this, in step S33 the playback apparatus refers to the TKTMSRT and calculates the first address of the AOB_ELEMENT#y.

The playback apparatus then performs the procedure made up of steps S34 to S42. This procedure reads the AOB_FRAMEs included in an AOB_ELEMENT one after another, and so can be said to resemble the procedure made up of steps S24 to S31. The difference with the procedure made up of steps S24 to S31 is the condition by which the procedure made up of steps S24 to S31 ends is whether the variable #x has reached the value shown by "FNs_1st_TMSRTE", while the condition by which procedure made up of steps S34 to S42 ends is whether the variable #x has reached the value shown by "FNs_Middle_TMSRTE".

When the variable #x reaches the value shown by "FNs_Middle_TMSRTE", the loop procedure made up of steps S34 to S42 ends, the judgement "Yes" is given in step S41 and the processing advances to step S43. In step S43, the CPU 10 increments the variable #y and initializes the variable #x (#y←#y+1, #x←1). After this, in step S44 the variable y judges whether the variable #y has reached a value that is equal to one less than the TotalTMSRT_entry_Number in the TMSRT_Header in the TKI#z.

When the variable #y is lower than (TotalTMSRT_entry_Number-1), the AOB_ELEMENT#y is not the final AOB_ELEMENT, so that the processing returns from step S44 to step S32 and the loop procedure of step S32 to step S42 is performed. When the variable #y reaches (TotalTMSRT_entry_Number-1) the read procedure can be assumed to have proceeded as far as the penultimate AOB_ELEMENT, so that the judgement "Yes" is given in step S44 and the processing advances to step S45 in FIG. 58.
{52-9_57-2}

The procedure composed of steps S45 to S54 resembles the procedure composed of steps S33 to S42 in that each of the AOB_FRAMEs in the final AOB_ELEMENT are read.

The difference with the procedure composed of steps S33 to S42 is that while the loop procedure composed of steps S33 to S42 ends when it is judged in step S41 that the variable #x has reached the value in "FNs_Middle_TMSRTE"$_1$ the loop procedure composed of steps S45 to S54 ends when it is judged in step S53 that the variable #x has reached the value in "FNs_Last_TMSRTE" and the variable play_data showing the size of the data that has hitherto been read has reached the value given as "SZ_DATA".

The procedure composed of steps S49 to S54 is repeated until the conditions in step S53 are satisfied, at which point the judgement "Yes" is given in step S53 and the processing advances to step S55. In step S55, the CPU 10 increments the variable #z (#z#z+1) before the processing returns to step S21 where the CPU 10 waits for the next 4) AOB file to accumulate in the double buffer 15. Once this happens, the processing advances to step S22 and the procedure composed of steps S22 to step S54 is repeated. This means that the TKI indicated by the DPL_TKIN of the next DPL_TK_SRP is specified and the AOB file corresponding to this TKI, which is to say, the AOB file with the same number as the TKI, is specified.

Figure 59A:
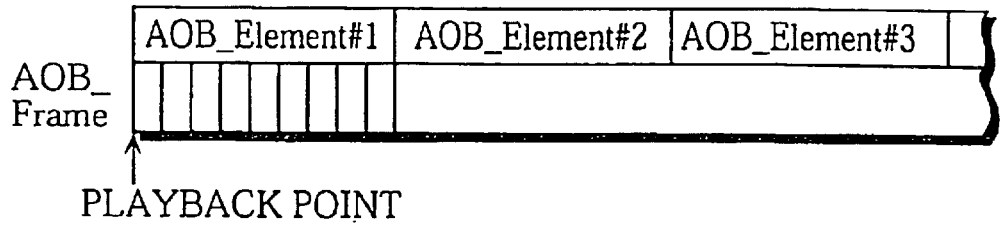
FIGS. 59A to 59D show how the playback time code displayed in the playback time code frame on the LCD panel 5 is updated in accordance with the updating of the variable Play time.
Figure 59B:
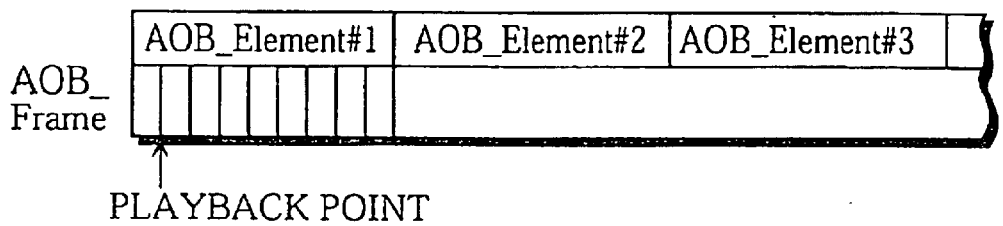
Figure 59C:
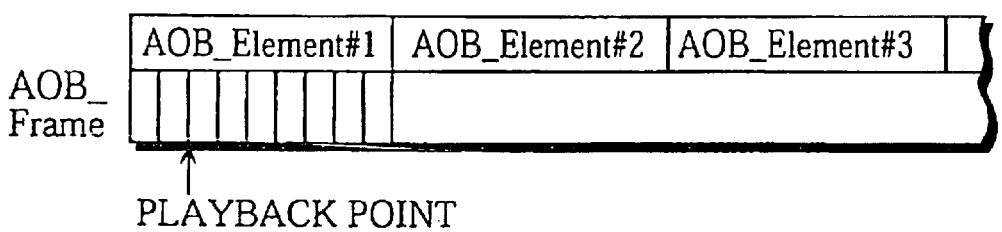
Figure 59D:
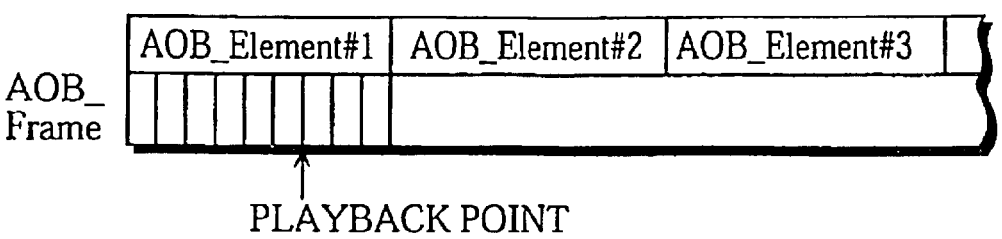

After this, the playback apparatus accesses the authentication region and specifies the FileKey, out of the FileKeys in the encryption key storing file, that has the same number as the TKI, before reading this FileKey and setting it in the descrambler 7. As a result, the AOB_FRAMEs included in the AOB file having the same number as the TKI are successively read and played back.
{52-9_57-3_59} Updating of the Playback Time Code FIGS. 59A to 59D show how the playback time code displayed in the playback time code display frame of the LCD panel 5 is increased in accordance with the updating of the variable playtime. In FIG. 59A, the playback time code is "00:00:00.000", though when the playback of AOB_FRAME#1 ends, the playback period 20 msec of AOB_FRAME#1 is added to the playback time code to update it to "00:00:00.020", as shown in FIG. 59B. When the playback of AOB_FRAME#2 ends, the playback period 20 msec of AOB_FRAME#2 is added to the playback time code to update it to "00:00:00.040", as shown in FIG. 59C. In the same way, when the playback of AOB_FRAME#6 ends, the playback period 20 msec of AOB_FRAME#6 is added to the playback time code to update it to "00:00:00.120", as shown in FIG. 59D.

This completes the description of the AOB_FRAME output procedure.

In step S31 of the flowchart in FIG. 56, if the user presses a key aside from the "Play" key, the processing in this flowchart is terminated. The processing that accompanies a pressing of "Stop" or "Pause" key has already been described, though when the user presses one of the keys provided to have the playback apparatus perform special playback, the processing in this flowchart, or in the flowcharts shown in FIG. 56, 57, or 58 is terminated and suitable processing for the pressed key is performed.

Figure 60:
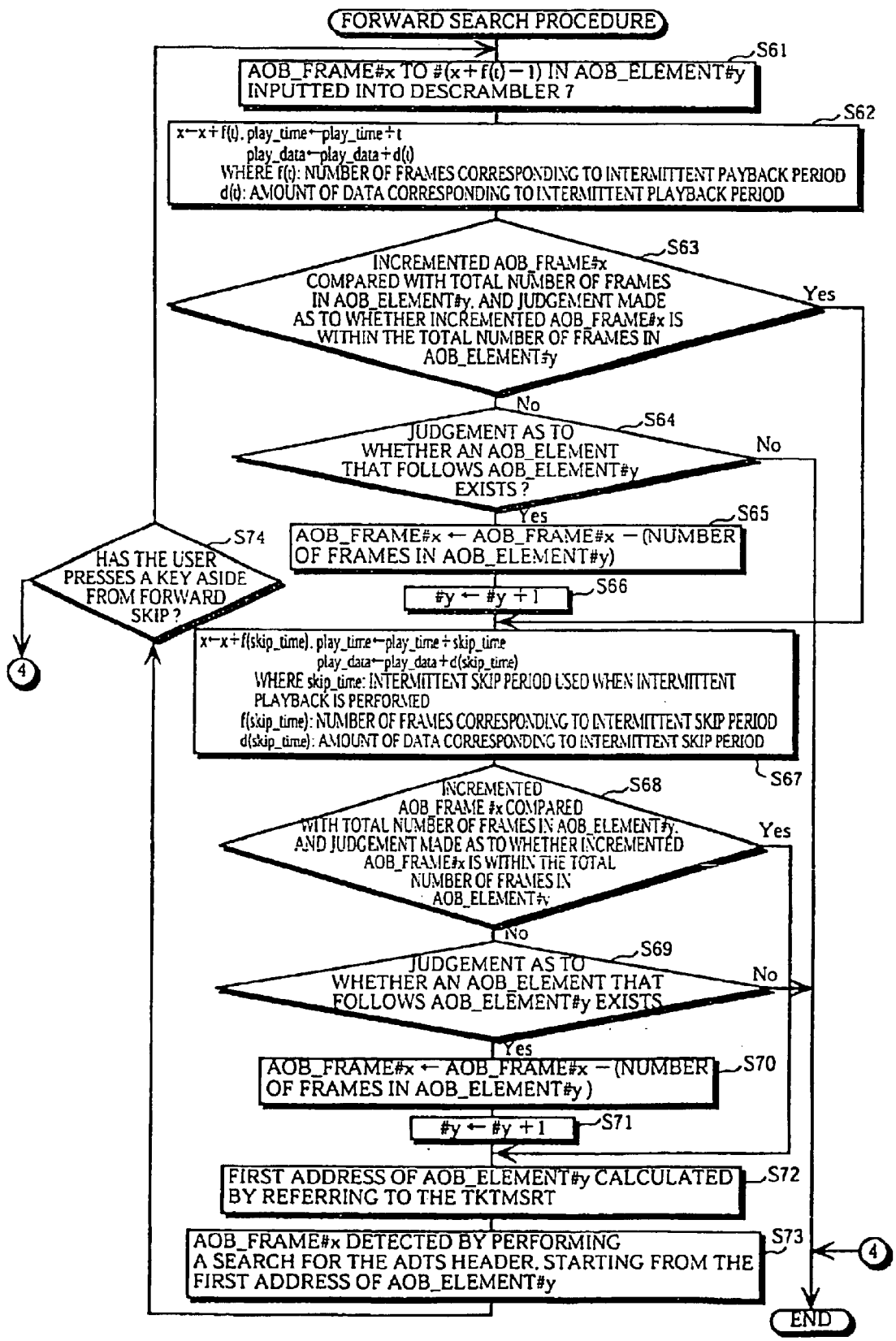
FIG. 60 is a flowchart shows the processing of the CPU 10 when the forward search function is used.

The following describes the procedure executed by the CPU 10 (1) when performing the forward search function in response to the user pressing the ">>" key and (2) when performing the time search function in response to the user operating the jog dial after pressing the "Pause" or "Stop" key.
{52-10_60} Forward Search Function FIG. 60 is a flowchart showing the procedure executed by the CPU 10 when performing the forward search function. When the user presses the ">>" key, the judgement "Yes" is given in step S31, step S42 or step S54 in the flowcharts in FIGS. 56, 57 and 58 and the CPU 10 performs the processing in the flowchart of FIG. 60.

In step S61, the AOB_FRAMEs #x to #(x+f(t)−1) are inputted into the descrambler 7. Here "t" represents the intermittent playback period, f(t) represents the number of frames corresponding to the intermittent playback period, and d(t) represents the amount of data corresponding to the intermittent playback period. In step S62, the variable play_time showing the playback elapsed time, and the variable play_data showing the playback data amount are respectively updated using intermittent playback period "t", the number of frames f (t) corresponding to intermittent playback period, and the amount of data d (t) corresponding to the intermittent playback period (x←x+f(t), play_time←play_time+t, play_data←play_data+d(t)). Note that the intermittent playback period will generally be 240 msec (equivalent to the playback period of twelve AOB_FRAMEs).

{52-10_60-1_61A,B}

Figure 61A:
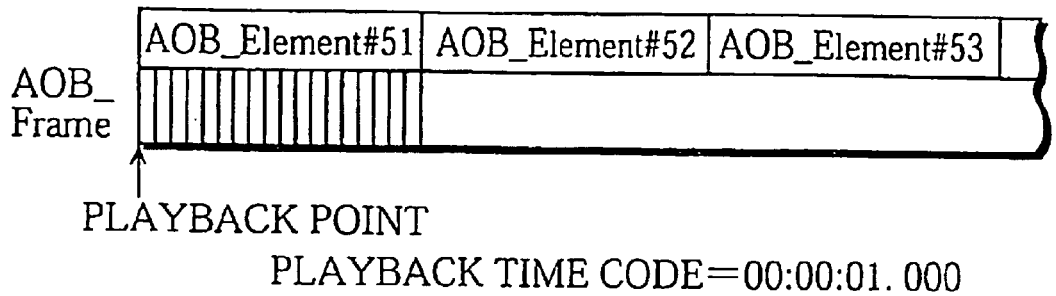
FIGS. 61A to 61D show how the playback time code is incremented when the forward search function is used.
Figure 61B:
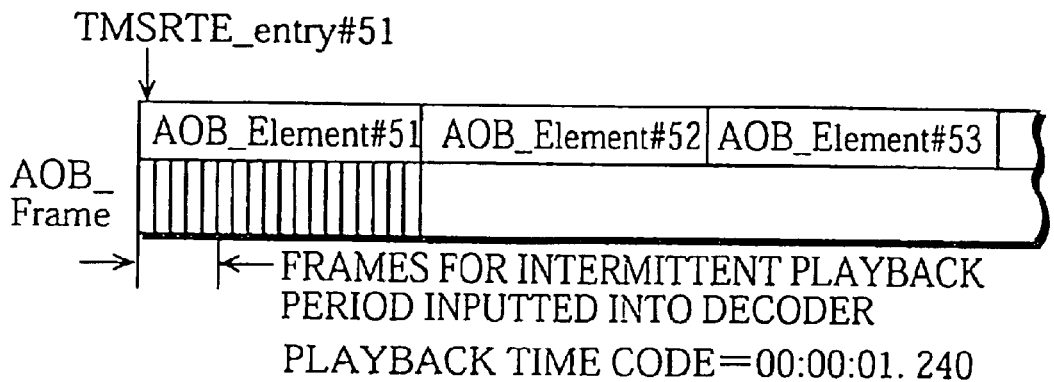

FIGS. 61A and 61B show the incrementing of the playback time code during a forward search operation. FIG. 61A shows the initial value of the playback time code, with the playback point being the AOB_FRAME#1 in AOB_ELEMENT#51.

The playback time code in this case is "00:00:01.000". When the first to twelve AOB_FRAMEs have been inputted into the descrambler 7 as the intermittent playback period, the playback period of twelve AOB_FRAMEs (i.e., 240 msec) is added to the playback time code so that the playback time code becomes "00:00:01.240", as shown in FIG. 61B.

{52-10_60-2}

After this updating, in step S63 the CPU 10 compares the incremented variable #x with the total number of frames in AOB_ELEMENT#y and judges whether the incremented variable #x is within the total number of frames in AOB_ELEMENT#y.

As mentioned earlier, the number of frames in an AOB_ELEMENT positioned at the start of an AOB is "FNs_1st_TMSRTE", the number of frames in an AOB_ELEMENT positioned in a central part of an AOB is "FNs_Middle_TMSRTE", and the number of frames in an AOB_ELEMENT positioned at the end of an AOB is "FNs_Last_TMSRTE".

The CPU 10 performs the above judgement by comparing an appropriate one of these values with the variable #x. When the variable x is not within the present AOB_ELEMENT#y, the CPU 10 then judges in step S64 whether there is an AOB_ELEMENT that follows the AOB_ELEMENT#y.

When the AOB_ELEMENT#y is the final AOB_ELEMENT in an AOB_BLOCK, there will be no AOB_ELEMENT that follows the AOB_ELEMENT#y, so that the judgement "No" is given in step S64 and the processing in the present flowchart ends. Conversely, when an AOB_ELEMENT that follows the AOB_ELEMENT#y exists, instep S65 the variable #x is reduced by the number of AOB_FRAMEs in the AOB_ELEMENT#y and in step S66 the variable#y is updated (#y-#y+1). As a result, the variable#x will now indicate the frame position of a frame in the next AOB_ELEMENT#y indicated by the updated variable #y. Conversely, when the variable #x indicates an AOB_FRAME that is present in the current AOB_ELEMENT (S63:Yes), the processing in steps S64-S66 is skipped and the processing advances to step S67.

{52-10_60-3}

After this, the variables #x, playtime, and play_data are updated in accordance with the intermittent skip period. The period "skip_time" that is equivalent to the intermittent skip period is two seconds, the number of frames that are equivalent to this skip_time is given as f(skip_time) and the amount of data that is equivalent to this skip_time is given as d(skip_time). In step S67, these values are used to update the variables #x, play_time, and play_data (#x #x+f(skip_time), play_time_play_time+skip_time, and play_data# play_data+d(skip_time)).

{52-10_60-4_61C}

Figure 61C:
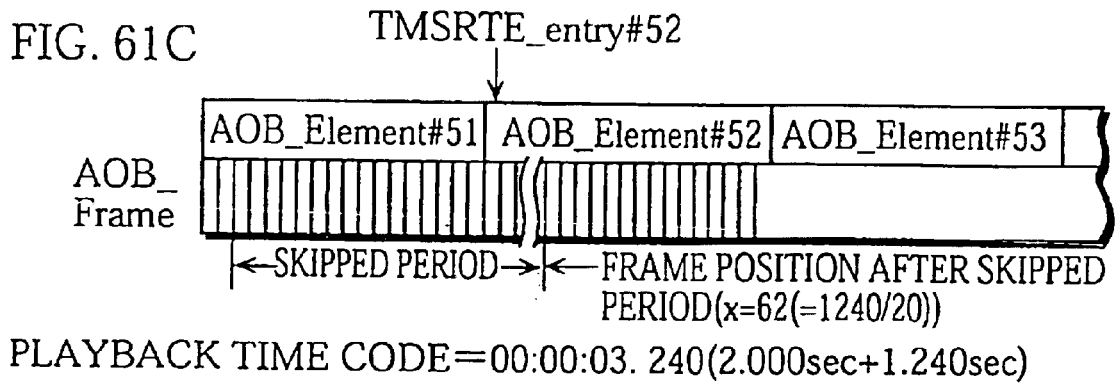

As shown in FIG. 61C, the intermittent skip period is added to the variable#x showing a frame position within the AOB_ELEMENT#51. When the updated variable #x exceeds the number of frames in AOB_ELEMENT#51, the variable #y is updated to indicate the next AOB_ELEMENT and the number of frames in the AOB_ELEMENT#51 is subtracted from the variable #x. As a result, the variable#x will now indicate a frame position within the AOB_ELEMENT#52 indicated by the updated variable by. The value 2.000 (=2 sec) is then added to the present value "00:00:01.240" of the playback time code so that it becomes "00:00:03.240". The variable #x is updated by calculating (3240 msec–2000 msec)/20 msec) to give the value "62", and so indicates the AOB_FRAME#62 in the AOB_ELEMENT#52.

{52-10_60-5_61(d)}

Figure 61D:
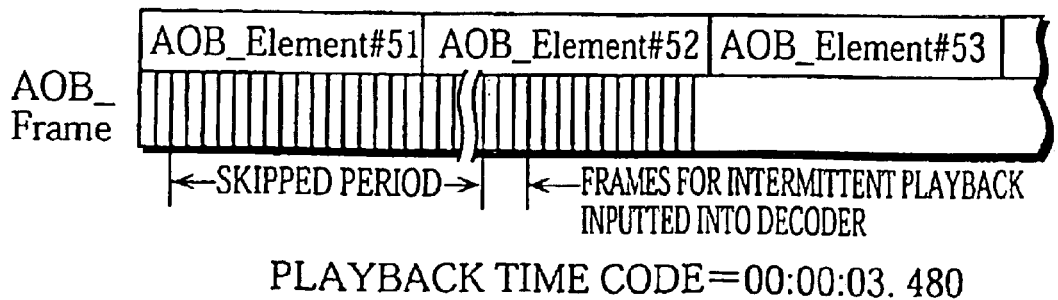

Once the AOB_FRAME#62 in the AOB_ELEMENT#52 has been inputted into the descrambler 7, the playback time code is updated as shown in FIG. 61D by adding "0.240" to the present value of "00:00:03.240" to give "00:00:03.480".

In step S67, the variables are updated in accordance with the intermittent skip time and then the processing in steps S68 to S71 are performed. This processing in steps S68 to S71 is the same as the processing in steps S63 to S66 and so updates the variable #x by a number of frames that is equivalent to the intermittent skip time "skip_time", before checking whether the variable#x still indicates an AOB_FRAME within the present AOB_ELEMENT#y. If not, the variable #y is updated so that the next AOB_ELEMENT is set as the AOB_ELEMENT#y and the variable#x is converted so as to indicate a frame position in this next AOB_ELEMENT.

Once the variables #x and #y have been in accordance with the intermittent playback time and intermittent skip time, in step S72 the CPU 10 refers to the TKTMSRT and calculates the start address for the AOB_ELEMENT#y. Then, in step S73, the CPU 10 starts to search for an ADTS header starting from the start address of the AOB_ELEMENT#y to detect the AOB_FRAME#x. In step S74, the CPU 10 judges whether the user has pressed any key aside from the forward search key. If not, the AOB_FRAMEs from the AOB_FRAME#x to the AOB_FRAME#x+f(t)−1 are inputted into the descrambler 7, and the processing in steps S62 to S73 is repeated.

The above procedure increments the variables #x and #y that indicate the AOB_FRAME#x and AOB_ELEMENT#y, and so advances the playback position. After this, if the user presses the "Play" key, the judgement "No" is given in FIG. 74 and the processing in the present flowchart ends.

{52-11} Execution of the Time Search Function

The following describes the processing performed when the time search function is used. First, the tracks in the Default_Playlist_Information are displayed and the user indicates a desired track. When this track has been indicated and the user has operated the jog dial, the playback time code is updated. If the user then presses the "Play" key, the playback time code at that point is used to set a value in the variable "Jmp_Entry" in seconds.

A judgement is then made as to whether the indicated track is composed of a plurality of AOBs or a single AOB. When the track is composed of a single AOB, the variables #y and #x are calculated so as to satisfy Equation 2. After this, a search for the AOB_FRAME#x is started from the address in the (y+2) th position in the TKTMSRT corresponding to this AOB. Once this AOB_FRAME#x has been found, playback starts from AOB_FRAME#x.

{52-12}

When the track is composed of a plurality of AOBs, the variables #n (indicating an AOB), #y and #x are calculated so as to satisfy Equation 3. After this, a search for the AOB_FRAME#x is started from the address in the $(y+2)^{th}$ position in the TKTMSRT corresponding to AOB#n. Once this AOB_FRAME#x has been found, playback starts from AOB_FRAME#x.

The following describes the case when playback is At commenced from an arbitrary position with an AOB where the "FNs_1st_TMSRTE" in the BIT is "180 frames", "FNs_Middle_TMSRTE" in the BIT is "94 frames", and the "FNs_Last_TMSRTE" in the BIT is "50 frames". {52-13_62A,B}

As one specific example of when the time search function is used, the following describes how the AOB_ELEMENT and frame position from which playback should start are specified when a playback time code is indicated using the jog dial.

Figure 62A:
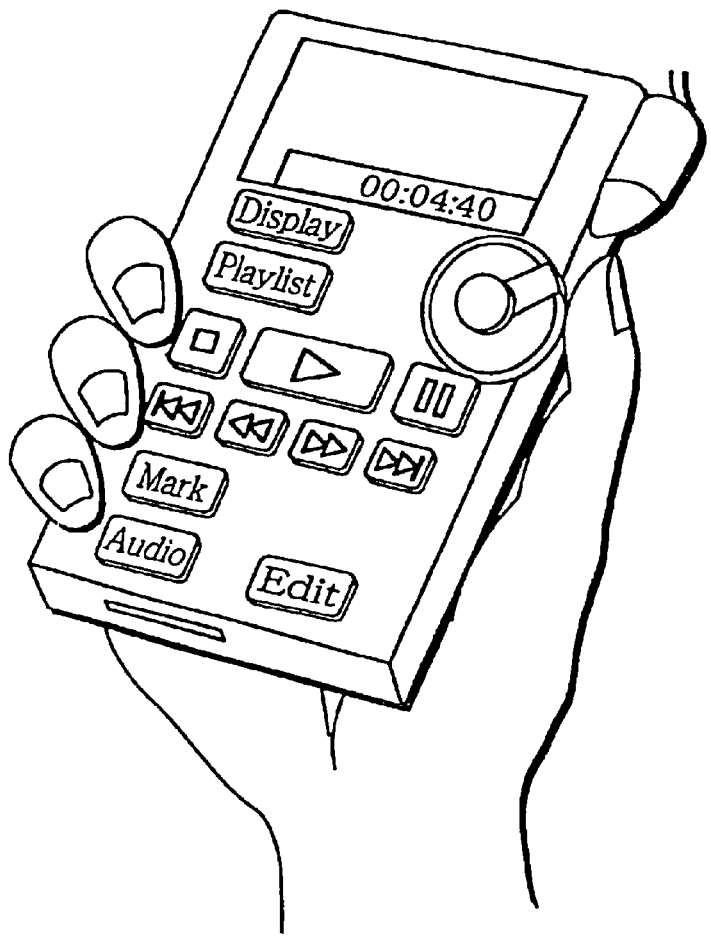
FIGS. 62A and 62B show specific examples of how the time search function is used.
Figure 62B:

As shown in FIG. 62A, the user holds the playback apparatus in his/her hand and rotates the jog dial with his/her right thumb to indicate the playback time code "00:04:40.000 (=280 sec)". When the BIT in the TKI for this AOB is as shown in FIG. 62B, Equation 2 is used as follows $$280sec=(FNs\_1st\_TMSRTE+(FNs\_Middle\_TMSRTE*y)+x)*20\ msec=(80+(94*148)+8)*20\ msec$$

so that the Equation 2 is satisfied for the values y=148 and x=8.

Since y=148, the entry address of the AOB_ELEMENT#150 (=148+2) is obtained from the TKTMSRT. Playback from the indicated playback time code 00:04:40.000(=280.00 sec) can then be performed by starting the playback at the eighth AOB_FRAME from this entry address.
{52-14_63_64_65}

Figure 64:
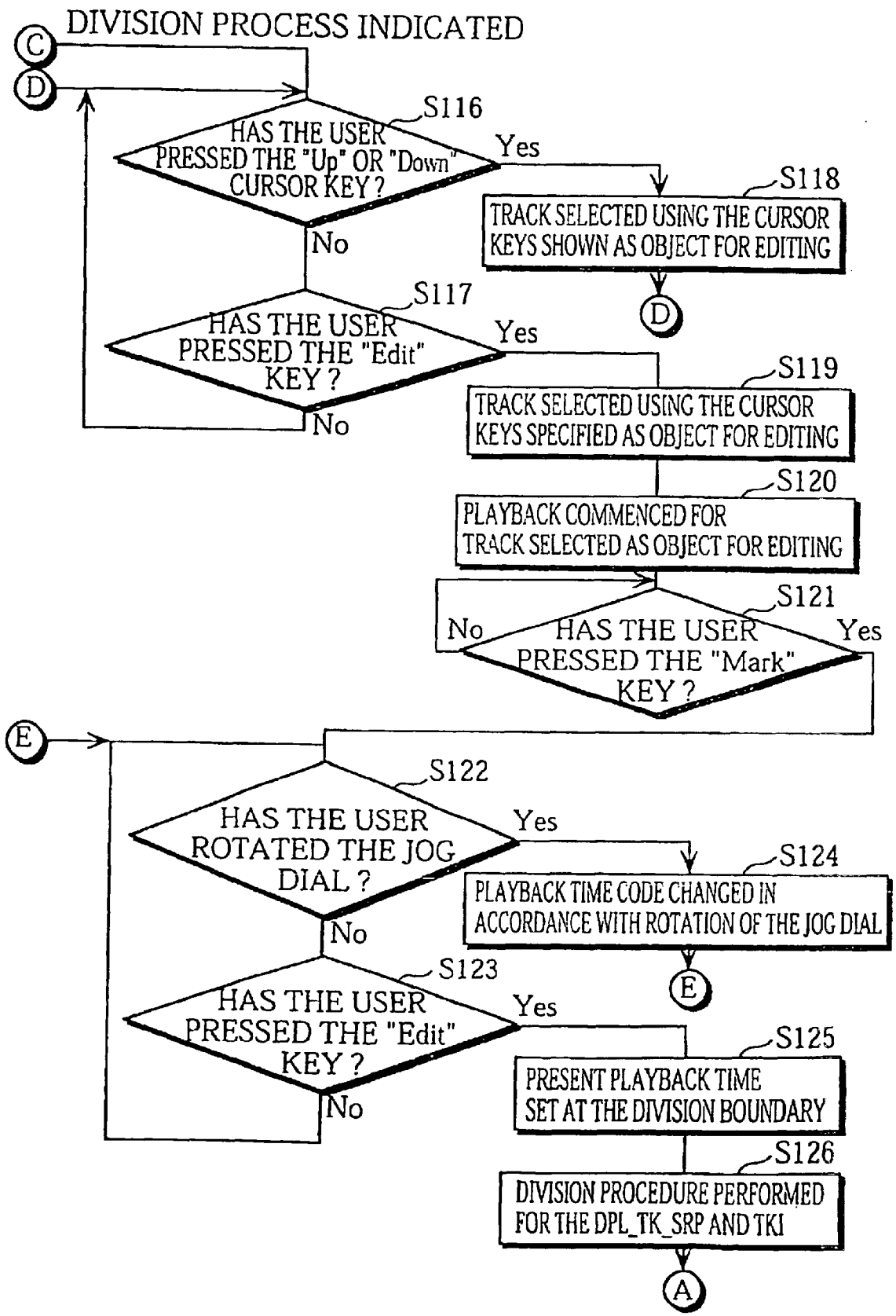
FIG. 64 is a flowchart showing the processing in the editing control program.

This completes the explanation of the processing of the CPU 10 in response to the user pressing the "Play" key. The following describes the editing control program stored in the ROM 4. This editing control program is executed when the user presses the "Edit" key, and contains the procedures shown in FIGS. 63, 64, and 65. The following describes the processing in this program with the flowcharts shown in these drawings.
{52-14_63-1} Editing Control Program When the user presses the "Edit" key, an interactive screen is displayed in step S101 in FIG. 63 to ask the user which of the three fundamental editing operations "deletion", "division" and "combining" is to be performed. In step S102, the CPU 10 judges what operation has been made by the user in response to the interactive screen. In the present example, it is assumed that the "|<<" and ">>|" keys on the key panel are also used as indicating "Up" and "Down" cursor operations, (i.e., these keys are used as "Up" and "Down" cursor keys). When the user indicates a "deletion" operation, the processing proceeds to the loop procedure composed of steps S103 and S104.

In step S103, the CPU 10 judges whether the user has pressed the "|<<" or ">>|" key. In step S104, the CPU 10 judges whether the user has pressed the "Edit" key. When the user has pressed the "|<<" or ">>|" key, the processing advances from step S103 to S105, where the indicated track is set as the track to be edited. On the other hand, when the user has pressed the "Edit" key, the indicated track is set as a track to be deleted. The processing shown in FIG. 44 is executed, so that the TKI_BLK_ATR of each TKI for the indicated track is set at "Unused" to delete the indicated track.
{52-14_63-2} Combining Process When the user selects the combining process, the processing proceeds from step S102 to the loop procedure composed of steps S107 to S109. In the loop procedure composed of steps S107 to S109, the playback apparatus receives user inputs via the "|<<", ">>|", and "Edit" keys. When the user presses the "|"<<" or ">>|" key, the processing advances from step S107 to step S110 where the indicated track is highlighted on the display. When the user presses the "Edit" key, the judgement "Yes" is given in step S108 and the processing advances to step S111. In step S111, the currently indicated track is set as the first track to be used in this editing process and the processing returns to the loop procedure composed of steps S107 to S109.

When a second track has been selected for editing, the judgement "Yes" is given in step S109, and the processing advances to step S112. In step S112, the CPU 110 refers to the BITs in the TKIs of the former and the latter tracks and judges what kind of AOBs (Type1 or Type2) are present at the respective start and end of each of these tracks and tracks on either side of these tracks, if present.

After identifying the type of each relevant AOB, in step S113 the CPU 10 judges whether the arrangement of AOBs matches a certain pattern. When the arrangement of AOBs matches one of the four patterns shown in FIG. 32A to 32D where it is clear that three Type2 AOBs will not be present consecutively after the combining, the former and latter tracks are combined into a single track in step S115.

In the other words, the operation shown in FIG. 46 is performed for the TKI and DPL_TK_SRP corresponding to these AOBs. By rewriting the TKI_BLK_ATRs in the TKIs, the plurality of tracks selected for editing are combined into a single track. When the arrangement of AOBs does not match any of the patterns in FIGS. 32A to 32D, meansing that there will be three or more Type2 AOBs after the combining, the CPU 10 judges that the combined track may cause a buffer underflow and so terminates the combining process.
{52-14_64-1} Track Division Process When the user indicates that a track is to be divided, the processing advances from step S102 to the loop procedure composed of steps S116 to S117. In the loop procedure composed of steps S116 to S117, the playback apparatus receives user inputs via the "|<<", ">>|", and "Edit" keys.

When the user presses the "|<<" or ">>|" key, the processing advances from step S116 to step S118 where the indicated track is set as the track to be edited. When the user presses the "Edit" key, the judgement "Yes" is given in step S117 and the processing advances to step S119.

In step S119, the indicated track is determined as the track to be edited and the processing advances to step S120 where the playback of this track is commenced. In step S121, the playback apparatus receives a user input via the "Mark" key.

When the user presses the "Mark" key, the playback of the track is paused and the processing advances to the loop procedure composed of steps S122 and S123. In step S122, the playback apparatus receives user operations made via the jog dial. When the user rotates the jog dial, the playback time code is updated in step S124 in accordance with the rotation of the jog dial.

After this, the loop procedure composed of steps S122 and S123 is repeated. If the user presses the "Edit" key, the processing proceeds from step S123 to step S125, where the playback time code displayed when the user pressed the "Edit" key is set as the division boundary. Note that an "Undo" function may be provided for this setting of the division boundary to allow the user to invalidate the selected division boundary.

After this, the processing explained with reference to FIG. 47 is executed in step S126 to update the DPLI and TKI so as to divide the selected track.

{52-14_65-1} Process Setting a Playlist

Figure 65:
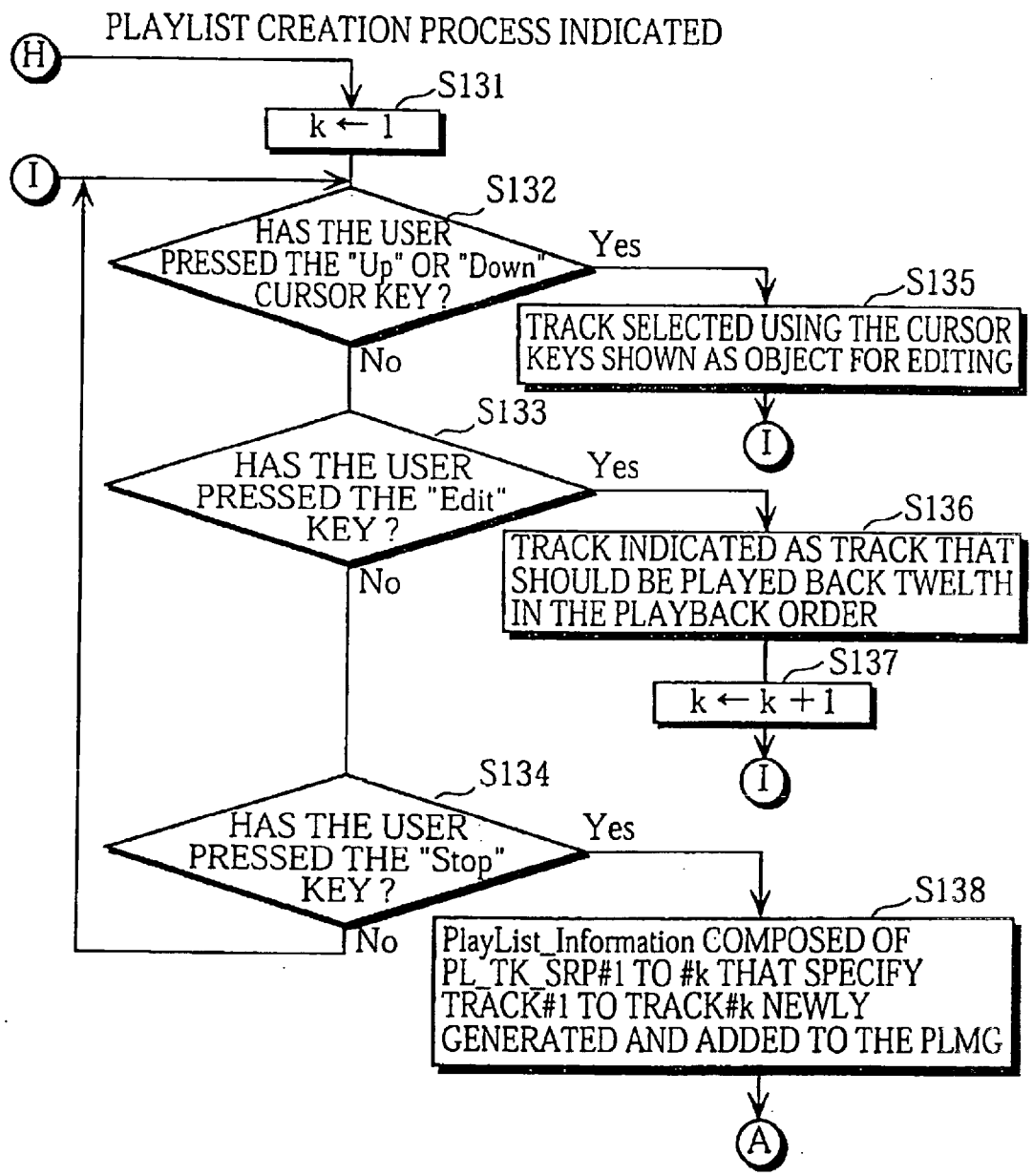
FIG. 65 is a flowchart showing the processing in the editing control program.

When the user chooses to set a Playlist, the processing switches to the procedure shown by the flowchart in FIG. 65. In this flowchart, the variable k given in this flowchart is used to indicate the position of a track in the playback order given by the Playlist that is being edited. The flowchart in FIG. 65 starts with this variable k being initialized to "1" in step S131, before the processing advances to the loop procedure composed of steps S132 to S134.

In the loop procedure composed of steps S132 to S134, the playback apparatus receives user operations made via the "|<<", ">>|", "Edit", and "Stop" keys. When the user presses the "|<<" or ">>|" key, the processing advances from step S132 to step S135 where a new track is indicated in accordance with the pressing of the "|<<" or ">>|" key. If the user presses the "Edit" key, the judgement "Yes" is given in step S133 and the processing advances to step S136.

In step S136, the track indicated when the user presses the "Edit" key is selected as the kth track in the playback order. After this, in step S137 the variable k is incremented and the processing returns to the loop procedure composed of steps S132 to S134. This procedure is repeated so that the second, third and fourth tracks are successively selected. If the user presses the "Stop" key have specified several tracks that are to be played back in the specified order as a new Playlist, the processing advances from step S134 to step S138 where a PLI composed of PL_TK_SRPs that specify the TKIs corresponding to these tracks is generated.

{66-1} Recording Apparatus

Figure 66:
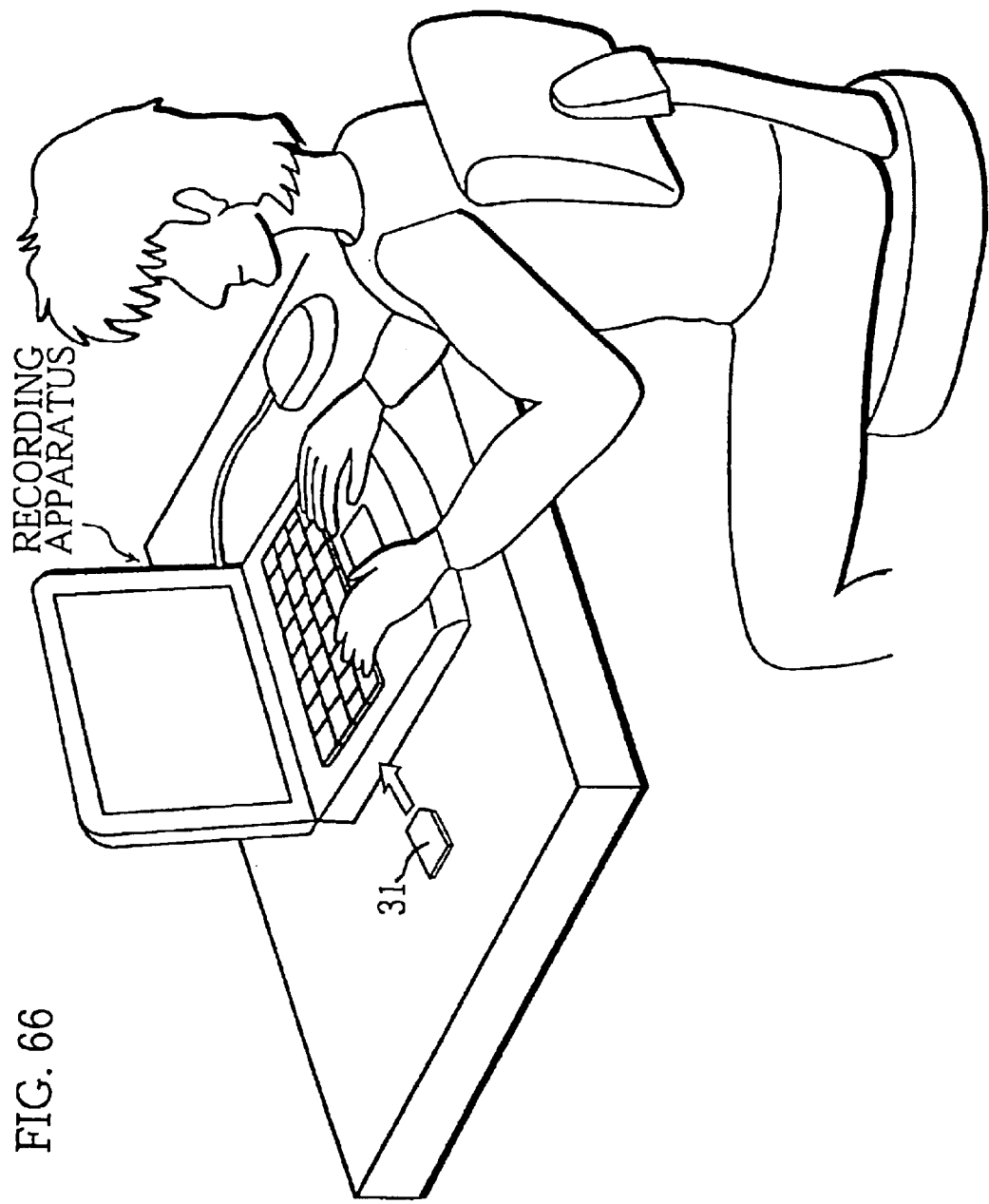
FIG. 66 shows one example of a recording apparatus for recording data onto the flash memory card 31.

The following describes one example of a recording apparatus for the flash memory card 31. FIG. 66 shows one example of a recording apparatus. This recording apparatus can be connected to the Internet, and is a standard personal computer that can perform reception when an encrypted SD-Audio directory is sent via communication lines to the recording apparatus by an electronic music distribution service, or when an audio data transport stream is sent via communication lines to the recording apparatus by an electronic music distribution service.

{67-1} Hardware Composition of the Recording Apparatus

Figure 67:
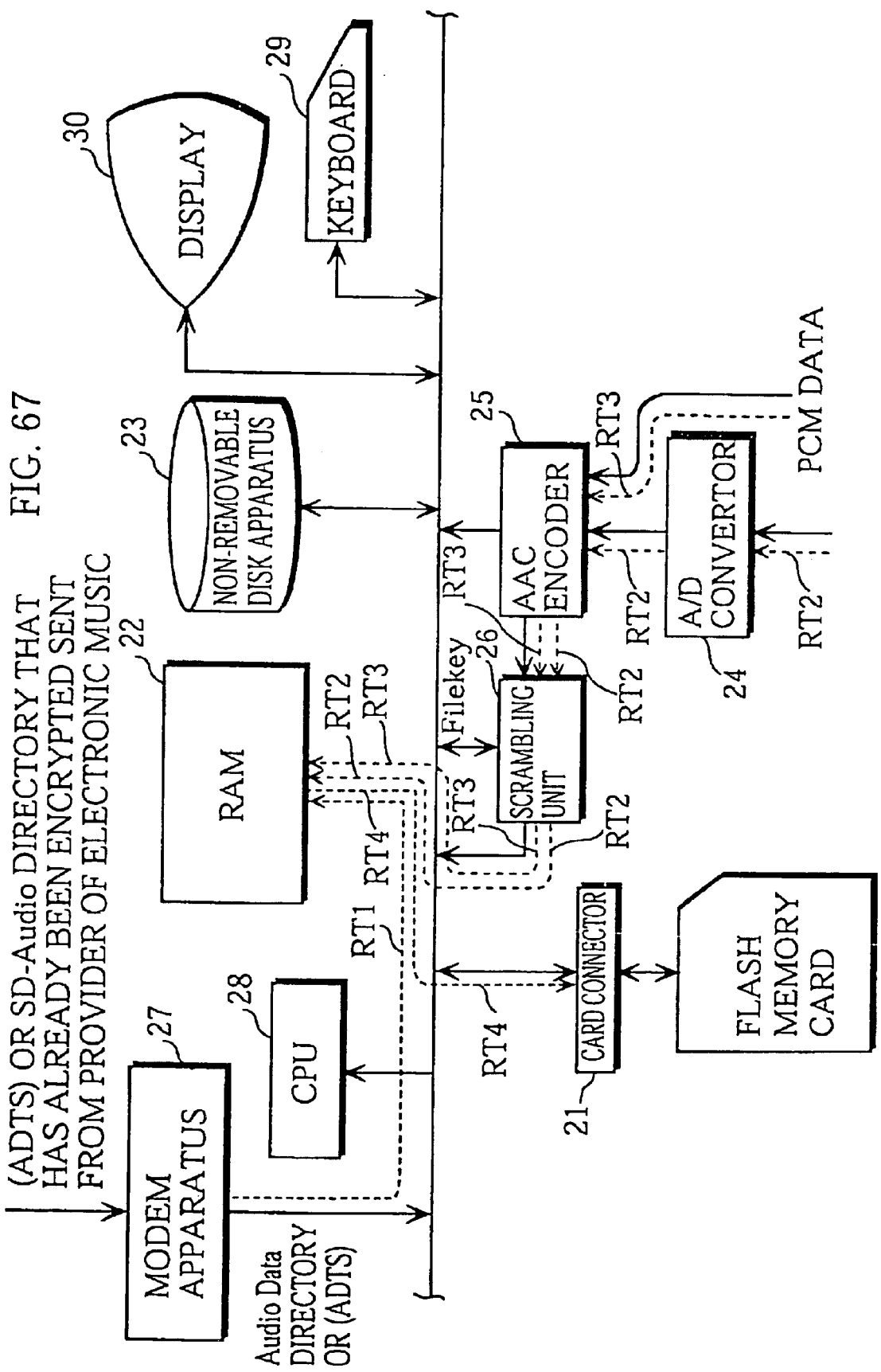
FIG. 67 shows the hardware configuration of the recording apparatus.

FIG. 67 shows the hardware composition of the present recording apparatus.

As shown in FIG. 67, the recording apparatus includes a card connector 21 for connecting the recording apparatus to the flash memory card 31, a RAM 22, a non-removable disk apparatus 23 for storing a recording control program that performs overall control over the recording apparatus, an A/D converter 24 that A/D converts audio inputted via a microphone to produce PCM data, an ACC encoder 25 for encoding the PCM data in units of a fixed time and assigning ADTS headers to produce AOB_FRAMEs, a scrambling unit 26 for encrypting the AOB_FRAMEs using a different FileKey for each AOB_BLOCK, a modem apparatus 27 for receiving an audio data transport stream when an encrypted SD-Audio directory is sent via communication lines to the recording apparatus by an electronic music distribution service, or when an audio data transport stream is sent via communication lines to the recording apparatus by an electronic music distribution service, a CPU 28 for performing overall control over the recording apparatus, a keyboard 29 for in receiving inputs made by the user, and a display 30.

{67-2} Input Circuits RT1 to RT4

When an encrypted SD-Audio directory, which is to be written in the data region and the authentication region, is sent via communication lines to the recording apparatus by an electronic music distribution service, the recording apparatus can write the encrypted SD-Audio directory into the data region and authentication region of the flash memory card 31 as soon as the encrypted SD-Audio directory has been properly received.

However, (1) when an audio data transport stream that is not in the form of SD-Audio directory is sent to the recording apparatus by an electronic music distribution service, (2) when data is inputted into the recording apparatus in PCM format, or (3) when analog audio is recorded by the recording apparatus, the recording apparatus uses the following four input routes to write an audio data transport stream onto the flash memory card 31.

As shown in FIG. 67, the four input routes RT1, RT2, RT3, and RT4 are used to input an audio data transport stream when an audio data transport stream is stored in the flash memory card 31.

{67-3} Input Route RT1

The input route RT1 is used when an encrypted SD-Audio directory is sent via communication lines to the recording apparatus by an electronic music distribution service, or when an audio data transport stream is sent via communication lines to the recording apparatus by an electronic music distribution service. In this case, the AOB_FRAMEs included in the transport stream are encrypted so that a different FileKey is used for the AOB_FRAMEs in different AOBs. Since there is no need to encrypt or encode an encrypted transport stream, the SD-Audio directory or audio data transport stream can be stored directly into the RAM 22 in its encrypted state.

{67-41} Input Route RT2

Input route RT2 is used when audio is inputted via a microphone. In this case, the audio inputted via the microphone is subjected to A/D conversion by the A/D converter 24 to produce PCM Data. The PCM data is then encoded by the AAC encoder 25 and assigned ADTS headers to produce AOB_FRAMEs. After this, the scrambling unit 26 encrypts the AOB_FRAMEs using a different FileKey for each AOB_FRAMEs in different AOB_FILEs to produce encrypted audio data. After this, the encrypted audio data is stored in the RAM 22.

{67-5} Input Route RT3

Input route RT3 is used when PCM data read from a CD is inputted into the recording apparatus. Since data is inputted in PCM format, the data can be inputted as it is into the AAC encoder 25. This PCM data is encoded by the ACC encoder 25 and assigned ADTS headers to produce AOB_FRAMEs.

After this, the scrambling unit 26 encrypts the AOB_FRAMEs using a different FileKey for the AOB_FRAMEs in different AOBs to produce encrypted audio data. After this, the encrypted audio data is stored in the RAM 22.

{67-6} Input Route RT4

The input route RT4 is used when a transport stream inputted via one of the three input routes RT1, RT2, and RT3 is written into the flash memory card 31.

This storing of audio data is accompanied by the generation of TKIs and Default_Playlist Information. In the same way as the playback apparatus, the main functioning of the recording apparatus is stored in the ROM. This is to say, a recording program that includes the characteristic processing of the recording apparatus, which is to say, the recording of AOBs, the TrackManager, and the PlaylistManager, is stored in the non-removable disk apparatus 23.

{67-7_68} Processing of the Recording Apparatus

Figure 68:
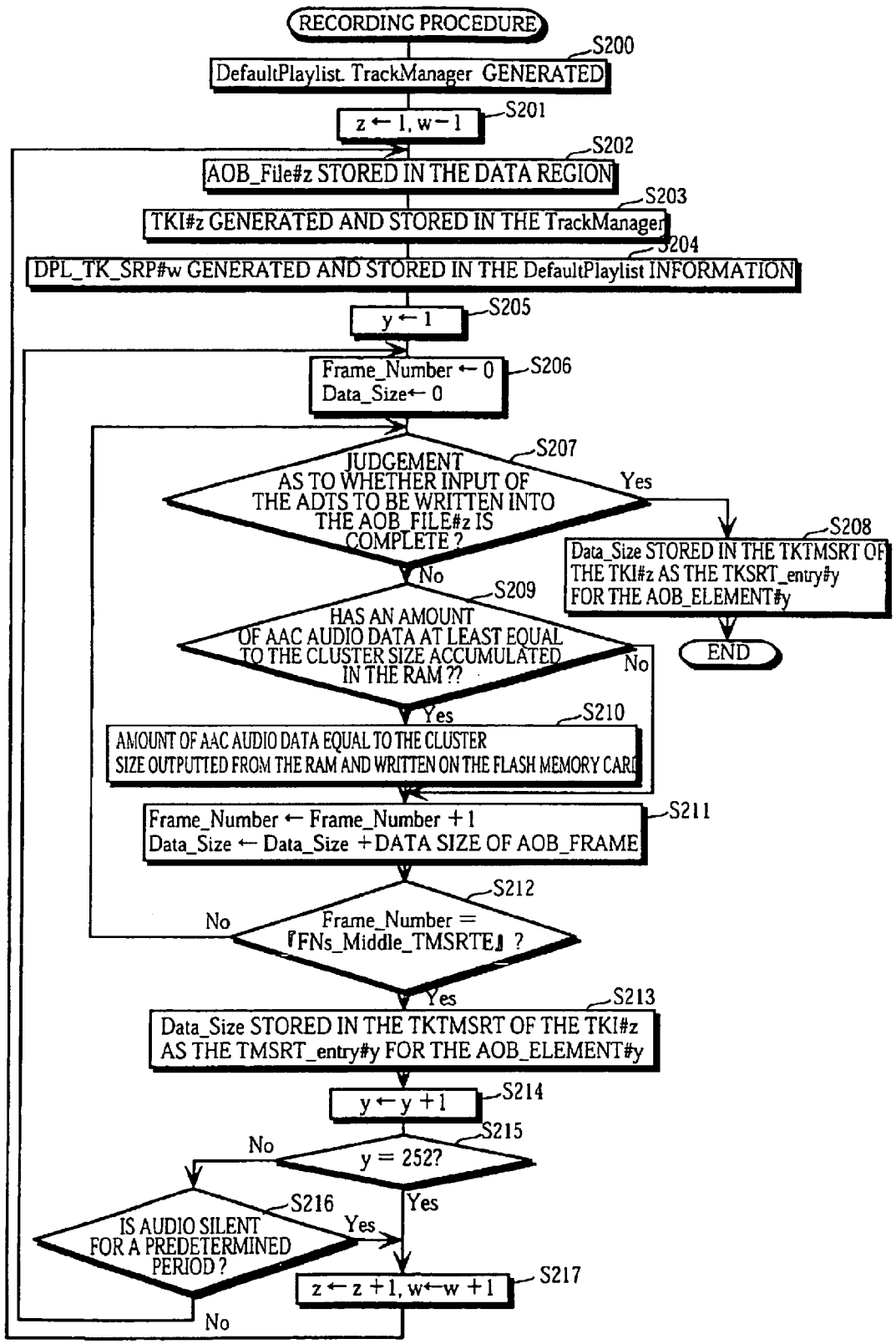
FIG. 68 is a flowchart showing the processing during recording.

The following describes the processing in the recording procedure that writes a transport stream in the flash memory card 31 via the input routes RT1, RT2, RT3 and RT4, with reference to the flowchart in FIG. 68 that shows this processing.

The variables "Frame_Number" and "Data_Size" used in this flowchart are as follows. The variable Frame_Number is used to manage the total number of AOB FRAMEs that have already been recorded in an AOB_FILE. The variable Data_Size is used to manage the data size of the AOB_FRAMEs that have already been recorded in the AOB_FILE.

The processing in this flowchart starts in step S200 with the CPU 28 generating the DefaultPlaylist and the TrackManager. In step S201, the CPU 28 initializes the variable #z (z+1). In step S202, the CPU 28 generates the AOB_FILE#z and stores it in the data region of the flash memory card 31, At this point, the filename, filename extension, and first cluster number for the AOB_FILE#z will be set in a directory entry in the SD_Audio Directory in the data region. After this, in step S203, the CPU 28 generates TKI#z and stores it in the TrackManager. In step S204, the CPU 28 generates the DPL_TK_SRP#w and stores it in the Default_Playlist_Information. After this, in step S205 the CPU 28 initializes the variable#y (#y←−1) and in step S206, the CPU 28 initializes the Frame_Number and Data_Size (Frame_Number←0,Data_Size←0).

In step S207, the CPU 28 judges whether the input of the audio data transport stream that should be written in the AOB_FILE# has ended. When the input of an audio data transport stream that has been encoded by the AAC encoder 25 and encrypted by the scrambling unit 26 into the RAM 22 continues and it is necessary to continue the writing of cluster data, the CPU 28 gives the judgement "No" in step S207 and the processing advances to step S209.

In step S209, the CPU judges whether the amount of AAC audio data that has accumulated in the RAM 22 is at least equal to the cluster size. If so, the CPU 28 gives the judgement "Yes" and the processing advances to step S210 where an amount of AAC audio data equal to the cluster size is written into the flash memory card 31. The processing then advances to step S211.

When sufficient AAC audio data has not accumulated in the RAM 22, step S210 is skipped and the processing advances to step S211. In step S211, the CPU increments the Frame_Number (Frame_Number←Frame_Number+1) and increases the value of the variable Data_Size by the data size of the AOB_FRAME.

After this updating, in step S212 the CPU 28 judges whether the value of Frame_Number has reached the number of frames that is set in "FNs_Middle_TMSRTE", the value of "FNs_Middle_TMSRTE" is set in accordance with the sampling frequency used when encoding the audio data transport stream. When the value of Frame_Number has reached the number of frames set in "FNs_Middle_TMSRTE", the CPU 28 gives the judgement "Yes" in step S212. If not, the CPU 28 gives the judgement "No" and the processing returns to step S207. The processing in steps S207 to S212 is therefore repeated until the judgement "Yes" is given in either step S207 or in step S212.

When the variable Frame_Number reaches the value of "FNs_Middle_TMSRTE", the CPU 28 gives the judgement "Yes" in step S212 and the processing advances from step S212 to step S213 where Data_Size is stored in the TKTMSRT of TKI#z as the TMSRT_entry#y for the AOB_ELEMENT#y. In step S214, the CPU 28 increments the variable#y (#y←#y+1) before checking in step S215 whether the variable#y has reached "252".

The value "252" is used since this is the maximum number of AOB_ELEMENTs that can be stored in a single AOB. If the variable #y is below 252, the processing advances to step 5216, where the CPU 28 judges whether a silence of a predetermined length is present in the encoded audio, which is to say that the audio data has reached a gap present between tracks. When no such continuous silence is present, the processing composed of steps S206 to S215 is repeated. When the variable#y has reached the value 252, or a silence of a predetermined length is present in the encoded audio, the judgement "Yes" is given in one of steps S215 and S216 and the processing advances to step S217 where the variable#z is incremented (#z←#z+1).

After this, the processing in steps S202 to S216 is repeated for the incremented variable#z. By repeating this processing, the CPU 28 can have AOBs including a plurality of AOB_ELEMENTs recorded one after the other into the flash memory card 31.

When the transfer of an audio data transport stream by the AAC encoder 25, the scrambling unit 26, and the modem apparatus 27 is complete, this means that the input of the audio data transport stream to be written into the AOB_FILE#z will also be complete, so that the judgement "Yes" is given in step S207 and the processing advances to step S208. In step S208, the CPU 28 stores the value of the variable Data_Size in the TKTMSRT of the TKI#z as the TMSRT Entry#y for the AOB_ELEMENT#y. After storing the audio data accumulated in the RAM 22 in the AOB file corresponding to the AOB#z, the processing in this flowchart ends.

The above processing results in an encrypted audio data transport stream being stored in the flash memory card 31. The following procedure is then used to store the FileKey required for decrypting this encrypted audio data transport stream in the authentication region.

When the audio data transport stream has been inputted via input route RT1, the AOB file (s), the file storing the TKMG, the file storing the PLMG, and the encryption key storing file storing a different FileKey for each AOB are sent to the recording apparatus by a provider of the electronic music distribution service. The CPU 28 receives these files and writes the AOB file(s), the file storing the TKMG, and the file storing the PLMG into the user region of the flash memory card 31. On the other hand, the CPU 28 writes only the encryption key storing file storing a different FileKey for each AOB into the authentication region.

When the audio is inputted via the input route RT2 or RT3, the CPU 28 generates a different FileKey every time the encoding of a new AOB commences and sets the generated key in the scrambling unit 26. In addition to being used by the scrambling unit 26 to encrypt the present AOB, this FileKey is stored following the FileKey Entry in the encryption key storing file present in the authentication region.

With the present embodiment describes above, the files storing AOBs are encrypted using different encryption keys, so that if the encryption key used to encrypt one file is decoded and exposed, the exposed encryption key can only be used to decrypt a file storing one AOB, with such exposure having no effect on other AOBs that are stored in other files. This minimizes the damage caused when one encryption key is exposed.

Note that while the above description focuses on an example system that is thought to be the most effective embodiment of the present invention, the invention is not limited to this system. Various modifications are possible within the scope of the invention, with examples of the such being given as (a) to (e) below.

(a) The above embodiment describes a semiconductor memory (flash memory card) as the recording medium used, though the present invention can be applied to other media including optical discs, such as DVD-RAM, or a hard disk.

(b) In the above embodiment, the audio data was described as being in AAC format, though the present invention can also be applied to audio data in another format such as MP3 (MPEG1 Audio Layer 3), Dolby-AC3, or DTS (Digital Theater System).

(c) While the file storing the TKMG and the file storing the PLMG were described as being received from the provider of the electronic music distribution service in a complete form, the main information used to create the TKMG and PLMG can be transmitted together with the encryption key storing file that stores a different encryption key for each AOB. The recording apparatus may then process this information to obtain the TKMG and PLMG which it then records in the flash memory card.

(d) For ease of explanation, the recording apparatus and playback apparatus were described as being separate devices, though a portable playback apparatus can be equipped with the functioning of the recording apparatus and a recording apparatus in the form of a personal computer can be equipped with the functions of the playback apparatus. Aside from the portable playback apparatus and personal computer recording apparatus, the functions of the playback apparatus and recording apparatus can also be provided to a communication device that is capable of downloading content from a network.

As one example, a mobile telephone capable of Internet access may be provided with the functions of the playback apparatus and recording apparatus described in the above embodiment. This mobile telephone may store contents downloaded via a wireless network in the flash memory card 31 in the same way as in the above embodiment. Also, while the recording apparatus described in the above embodiment is provided with the modem apparatus 27 for connecting to the Internet, any other device capable of connecting to the Internet, such as a terminal adapter for an ISDN line, may be provided instead.

(e) The procedures shown in the flowcharts shown in FIGS. 55 to 58, FIG. 60, FIG. 63 to FIG. 65, and FIG. 68 can be achieved by executable programs that may be distributed and sold having been recorded on a recording medium. This recording medium may be an IC card, an optical disc, a floppy disk, or the like, with the programs recorded on the recording medium being used having first been installed into standard computer hardware. By performing processing in accordance with such installed programs, standard computer hardware can perform the same functioning as the playback apparatus and recording apparatus described in the above embodiment.

(f) While the above embodiment describes the case where a plurality of AOBs and a plurality of FileKeys are stored on the flash memory card 31, only one AOB and one FileKey need be stored. Also, it is not essential for the AOBs to be encrypted, so that AOBs may be stored on the flash memory card 31 in ACC format.

Second Embodiment

{69-1} Overall Composition of the PlaylistManager in the Second Embodiment

Figure 69:
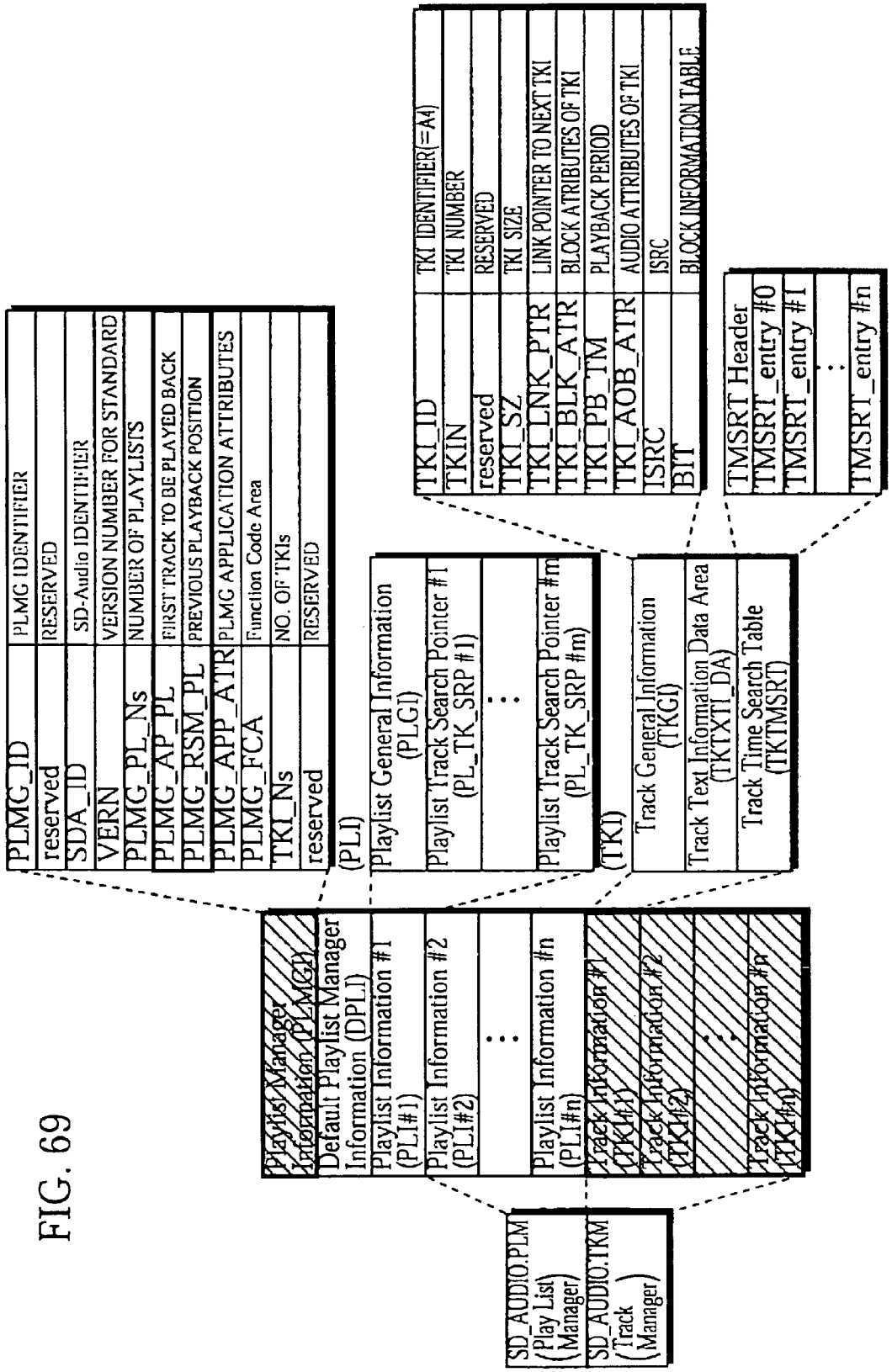
FIG. 69 shows the internal composition of the PlaylistManager and TrackManager in the second embodiment.

This second embodiment relates to an improvement in the semiconductor memory card of the first embodiment that allows a playback apparatus to resume playback without repeating tracks that were previously played. FIG. 69 shows the internal composition of the PlaylistManager and TrackManager in this second embodiment. The PlaylistManager and TrackManager in this second embodiment differ from those shown in FIG. 17 in that the composition of the PlaylistManager_Information (PLMGI) is shown clearly in FIG. 69, unlike in FIG. 17.

Of particular importance in the PLMGI is the PLMG_RSM_PL. This shows the playback resume position, and is stored on the semiconductor memory card to enable a playback apparatus to resume playback of the content without repeatedly playing back the same data.

{70-1} Detailed Composition of the PlaylistManager Information

Figure 70:
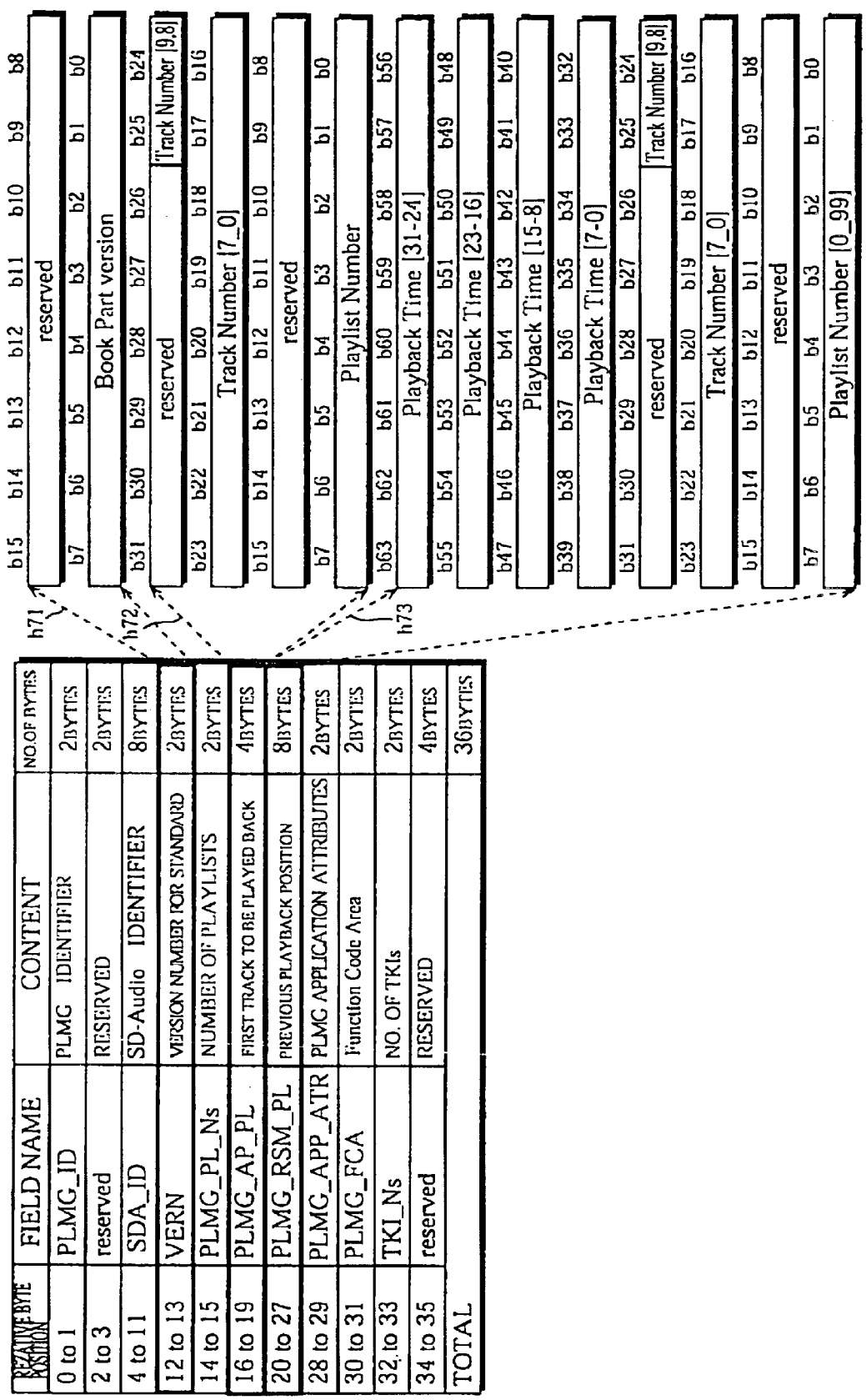
FIG. 70 shows the detailed composition of the PlaylistManager_Information.

FIG. 70 shows the detailed composition of the PlaylistManager_Information. As shown in the drawing, the PLMGI has a PLMG_ID field that occupies the 0th and first bytes, a reserved field that occupies the second and third bytes, an SDA_ID field that occupies the fourth to eleventh bytes, a VERN field that occupies the twelfth and thirteenth bytes, a PLMG_PL_Ns field that occupies the fourteenth and fifteenth bytes, a PLMG_AP_PL field that occupies the sixteenth to nineteenth bytes, a PLMG_RSM_PL field that occupies the twentieth to twenty-seventh bytes, a PLMG APP_ATR field that occupies the twenty-eighth and twenty-ninth bytes, a PLMG_FCA field that occupies the thirtieth and thirty-first bytes, a TKI_Ns field that occupies the thirty-second and thirty-third bytes, and a reserved field that occupies the thirty-fourth and thirty-fifth bytes. Of these fields in the PlaylistManager, the PLMG_AP_PL and PLMG_RSM_PL are of most importance in this second embodiment.

{70-2} Information Aside From the PLXG_AP_PL and PLG_RSM_PL

The following first describes the fields in the PlaylistManager aside from the PLMG_AP_PL and PLMG_RSM_PL.

The PLMG_ID is set at "Al" (a character string set according to IS0646 Standard) to show that the present information is a PLMGI.

The SDA_ID is set at "SD-AUDIO" (a character string set according to IS0646 Standard) to show that the present PlaylistManager is data in accordance with the SD-AUDIO specification.

A version number for the SD-AUDIO specification used is set in the VERN field. The broken line h71 in FIG. 70 shows the bit composition of the version number. The field composed of bits b7 to b0 is used to store the version number. When, for example, the version number of the present PlaylistManager is "Version 0.9", "09h" is written in this field, and when the version number is "Version 1.0", "10h" is written in this field. The field composed of bits b15 to b8 is reserved for future use.

The number of playlists managed by the PLMG, which is to say, the number of playlists recorded on the present flash memory card is written in the PLMG_PL_Ns field.

The application category ID, which shows the category of the application recorded on the present flash memory card, is written in the PLMG_APP_ATR field. When, as in the first embodiment, the application stored on the present flash memory card is music, the value "01h" is written in this field.

When the application recorded on the present flash memory card is karaoke software, the value "02h" is written in this field, when the application is presentation data, the value "03h" is written in this field, and when the application is an audiobook, the value "04h" is written in this field.

When the application category ID is "02h", the audio data is recorded on the present flash memory card as karaoke data, so that the right channel is used for the backing track and the left channel is used for the vocals. When audio data is recorded in this way, a playback apparatus can play back a karaoke backing track by playing back the audio data for the right channel on both the left and right channels.

The PLMG_FCA field is reserved for future use.

An integer showing the number of TKIs, like that in the first embodiment, is written in the TKI_Ns field. This value is given in the range from "1" to "999".

This completes the explanation of the fields in the PlaylistManager aside from the PLMG_AP_PL and PLMG_RSM_PL.

{70-3} PLMG_AP_PL

The PLMG_AP_PL shows the number of a playlist that is to be automatically read and the number of the first track to be automatically played back in that playlist when the present flash memory card is loaded into a playback apparatus and the playback apparatus activated. The broken line h72 in FIG. 70 shows the bit composition of the four bytes of the PLMG_AP_PL. The field between bit b31 and b26 and the field between b15 and b8 are reserved for future use. Bits b7 to b0 form a Playlist Number field in which a number of the playlist to be automatically read is given in the range of "1" to "99" (in decimal). The number written in this field is the number of a Playlist_Information (PLI) as described in the first embodiment. To indicate the Default_Playlist_Information, the number "0" is written.

Bits b25 to b16 form a Track Number field in which a number of the track to be automatically played back out of the plurality of tracks specified by the playlist is given. The number written in this field is the Track_Number as described in the first embodiment. The values in the fields of the PLMG_AP_PL can be freely set by the user, and must be set at "0" when the PLMG_AP_PL is not used.

{70-4} PLMG_RSM_PL

When playback has already been performed for one or more AOB files recorded on the flash memory card, the PLMG_RSM_PL will include a Playlist Number showing the playlist that was used for the previous playback of data on the flash memory card, a Track Number showing the number of the last track to be played back according to this playlist, and a Playback Time showing at what point the playback stopped in the track indicated by the Track Number.

In FIG. 70, the broken line h73 shows the bit composition of the PLMG_RSM_PL. The bit composition of bit number b31 to bit number b0 is the same as the PLMG_AP_PL. The number of the playlist that was used for the preceding playback is written as a value in the range from "0" to "99" in the Playlist Number field that occupies the region from bit number b7 to bit number b0. The number of the last track to be played back out of the various tracks specified by this playlist is written in the Track Number field that occupies the region from bit number b25 to bit number b16.

Unlike the bit composition of the PLMG_AP_PL, the region from bit number b32 to bit number b63 of the PLMG_RSM_PL forms a Playback_Timefield. The time at which the preceding playback of the track indicated by the Track Number was stopped is written in this field to millisecond accuracy. Note that when PLMG_RSM_PL is not used by the user, the value "0" must be set in all fields of the PLMG_RSM_PL.

Figure 71:
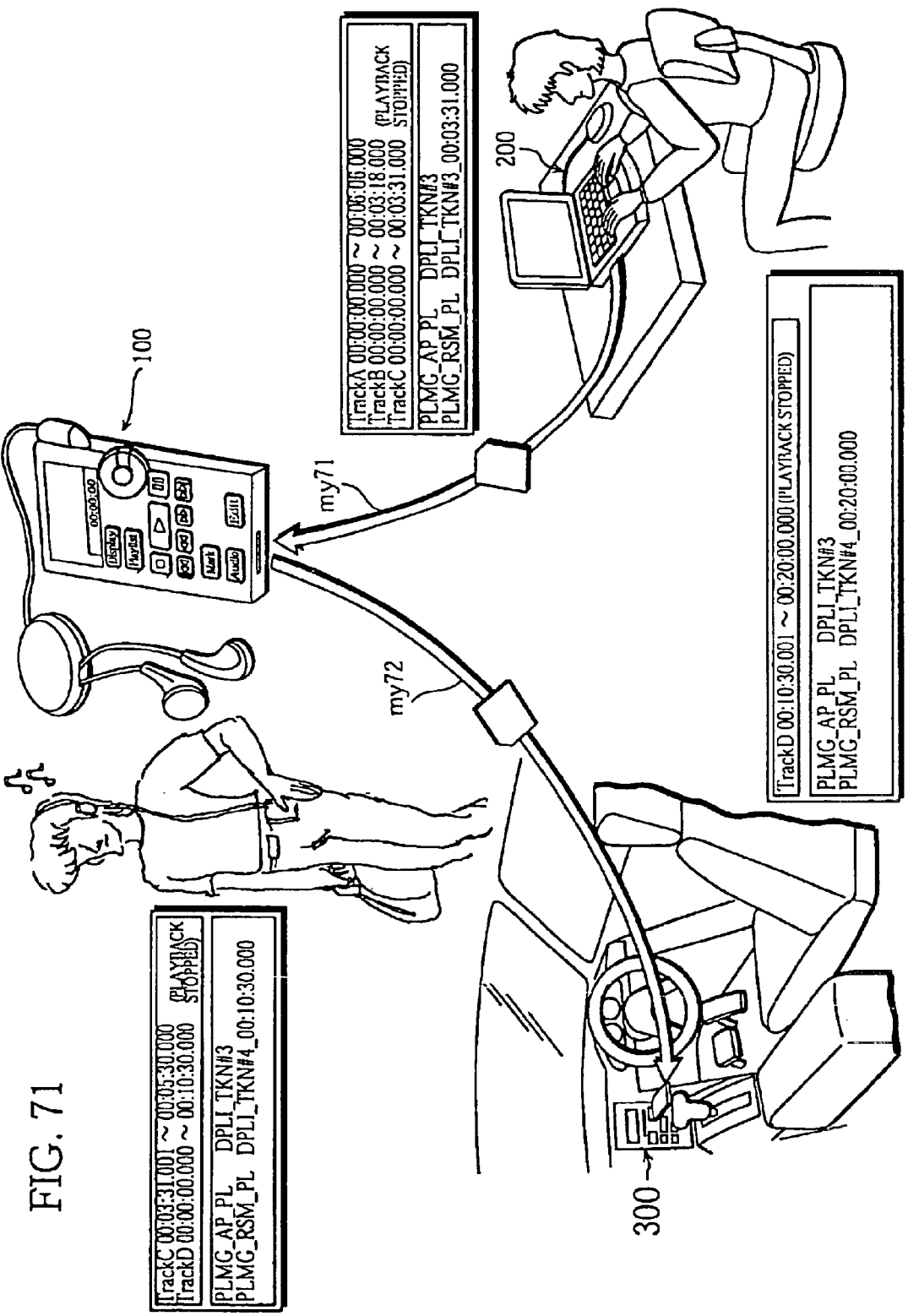
FIG. 71 shows how the PLMG_AP_PL and PLMG_RSM_PL are set when the flash memory card of the second embodiment is transferred between a plurality of playback apparatuses.

{70-4_71} Setting of the PLMG_RSM_PL when the Flash Memory Card is Transferred Between Playback Apparatuses The following describes how the PLMG_AP_PL and PLMG_RSM_PL are set when the flash memory card of this second embodiment is transferred between playback apparatuses. FIG. 71 shows how the PLMG_AP_PL and PLMG_RSM_PL are set when the flash memory card of this second embodiment is transferred between playback apparatuses.

In FIG. 71, the flash memory card is transferred between a plurality of playback apparatuses that are composed of a standard personal computer, a portable playback apparatus and an in-car playback apparatus. Note that each of these playback apparatuses is equipped with the functions of the playback apparatus and recording apparatus described in the first embodiment.

The present explanation describes a flash memory card that stores AOB files composing TrackA to TrackE, in the same way as in FIG. 16.

Assume that the flash memory card of this second embodiment is first loaded into the personal computer 200 which records the presentation data and navigation data described in the first embodiment. Assume that after this, the personal computer 200 sets the PLMG_AP_PL with the Playlist_Number "0" indicating the Default_Playlist Information and the Track_Number "3" indicating TrackC. In this example, the user has the AOB files on the flash memory card played back in the order TrackA, TrackB, TrackC and stops the playback at a point 3 min 31 secs into the playback of TrackC whose playback period is 5.5 minutes. In this case, the personal computer 200 writes the Playlist_Number "0" indicating the Default_Playlist_Information and the Track_Number "3" indicating TrackC into the PLMG_RSM_PL field. In addition, the personal computer 200 also writes the value "00:03:31:000" showing the point where playback was stopped for TrackC into the Playback_Time field in the PLMG_RSM_PL. After this, the user removes the flash memory card from the personal computer 200 and, as shown by the arrow my71, loads it into the portable playback apparatus 100.

In the first embodiment, the playback apparatus (the portable playback apparatus 100) starts the playback with the first AOB_FRAME in TrackA that is specified by the Default_Playlist_Information. In this second embodiment, however, the PLMG_AP_PL and PLMG_RSM_PL are provided in the PlaylistManager_Information, so that the playback apparatus can start the playback from any AOB_FRAME in accordance with the content of this information.

Since the personal computer 200 set the value "0" in the Playlist_Number to indicate the Default_Playlist_Information, the value "3" in the Track_Number to indicate TrackC and "00:03:31.000" in the Playback_Time, the portable playback apparatus 100 can know that the playback has already been performed up to a point 3 min 31 secs into TrackC in the Default_Playlist_Information and that playback should be performed from a point 3 minutes and 31.001 seconds into TrackC.

Assume that the user puts in the earphones attached to the portable playback apparatus 100 and leaves the house after the playback of TrackC has commenced.

In the present example, the user listens to the end part of TrackC and then a first part of TrackD, stopping the playback at a point 10 minutes and 30 seconds into the playback of TrackD. In this case, the portable playback 13 apparatus 100 updates the content of the PLMG_RSM_PL by writing "0" in the Playlist_Number to indicate the Default_Playlist_Information, "4" in the Track_Number to indicate TrackD, and "00:10:30.000" in the Playback_Time to indicate that playback was stopped at a point 10 minutes and 30 seconds into the playback of TrackD. On the other hand, the content of the PLMG_AP_PL is not rewritten, so that the Playlist_Number stays at "0" to indicate the Default_PlaylistInformation and the Track_Number remains at "3" to indicate TrackC.

After this, assume that the user removes the flash memory card from the portable playback apparatus 100 and, as shown by the arrow my72 in FIG. 71, loads it into the in-car player 300.

Since the portable playback apparatus 100 set the value "0" in the Playlist_Number to indicate the Default_Playlist_Information, the value "4" in the Track_Number to indicate TrackD and "00:10:30.000" in the Playback_Time, the in-car player 300 can know that the playback has already been performed up to a point 10 min 30 secs into TrackD in the Default_Playlist_Information and that playback should be performed from a point 10 minutes and 30.001 seconds into TrackD.

The playback of TrackD commences from this point and continues for 9 minutes and 30 seconds before the user stops the playback once again. Since part of TrackD remains, the Playlist_Number and Track_Number in the PLMG_RSM_PL are left unchanged, and only the Playback_Time is updated using the value "00:20:00.000".

As described above, when the flash memory card is removed from the personal computer 200 and loaded into the portable playback apparatus 100, playback commences from a point immediately following the point where playback by the personal computer 200 was stopped.

In the same way, when the flash memory card is removed from the portable playback apparatus 100 and loaded into the in-car player 300, playback commences from a point immediately following the point where playback by the portable playback apparatus 100 was stopped. This means that the flash memory card can be transferred from the personal computer 200 to the portable playback apparatus 100 and then to the in-car player 300 without the same data being played back twice.

{70-5} Updating of the PLMG_AP_PL and PLMG_RSM_PL When the TRI is Edited

No further explanation of the PLMG_AP_PL and PLMG_RSM_PL will be given. Instead, the following will describe how the content of the PLMG_AP_PL and PLMG_RSM_PL are updated for four editing operations described in the first embodiment. These are case1 where a track is deleted, case3 where two tracks are combined, case4 where a track is divided into two, and case5 where the playback order of tracks is rearranged.

When in case1, the track specified by the PLMG_AP_PL and PLMG_RSM_PL is deleted, the Track_Number given in the PLMG_AP_PL and PLMG_RSM_PL in the PlaylistManager is set so as to indicate the track that follows the deleted track in the indicated playlist. The Playback_Time in the PLMG_RSM_PL is also set at "00:00:00.000" to indicate the start of this following track.

When in case3, the track specified by the PLMG_AP_PL and PLMG_RSM_PL is combined with another track, the Track_Number given in the PLMG_AP_PL and PLMG_RSM_PL in the PlaylistManager is set so as to indicate the position of the combined track in the indicated playlist.

When in case4, the track specified by the PLMG_AP_PL and PLMG_RSM_PL is divided, the Track Number given in the PLMG_AP_PL and PLMG_RSM_PL in the PlaylistManager is set so as to indicate the position of the former part or latter of) part of the divided track in the indicated playlist. The Playback_Time is compared with the division boundary and when the Playback_Time is before the division boundary, the Track_Number of the track corresponding to the former Un part of the divided track is set in the PLMG_RSM_PL. When the Playback_Time is after the division boundary, the Track_Number of the track corresponding to the latter part of the divided track is set in the PLMG_RSM_PL.

When in case5 the position of the track indicated by the PLMG_AP_PL and PLMG_RSM_PL in the indicated playlist is changed, the Track_Number given in the PLMG_AP_PL and PLMG_RSM_PL in the PlaylistManager is set so as to indicate the new position of the track in the indicated playlist.

While the above explanation states that the PLMG AP PL and PLMG_RSM_PL are updated when tracks are edited, the settings of the PLMG_AP_PL and PLMG_RSM_PL may simply be cleared when track editing is performed.

{72-1} Setting of How the PLMG_RSM_PL, PLMG_AP_PL are Used

The following describes the playback apparatus of this second embodiment. This playback apparatus has three main differences from the playback apparatus described in the first embodiment.

Figure 72:
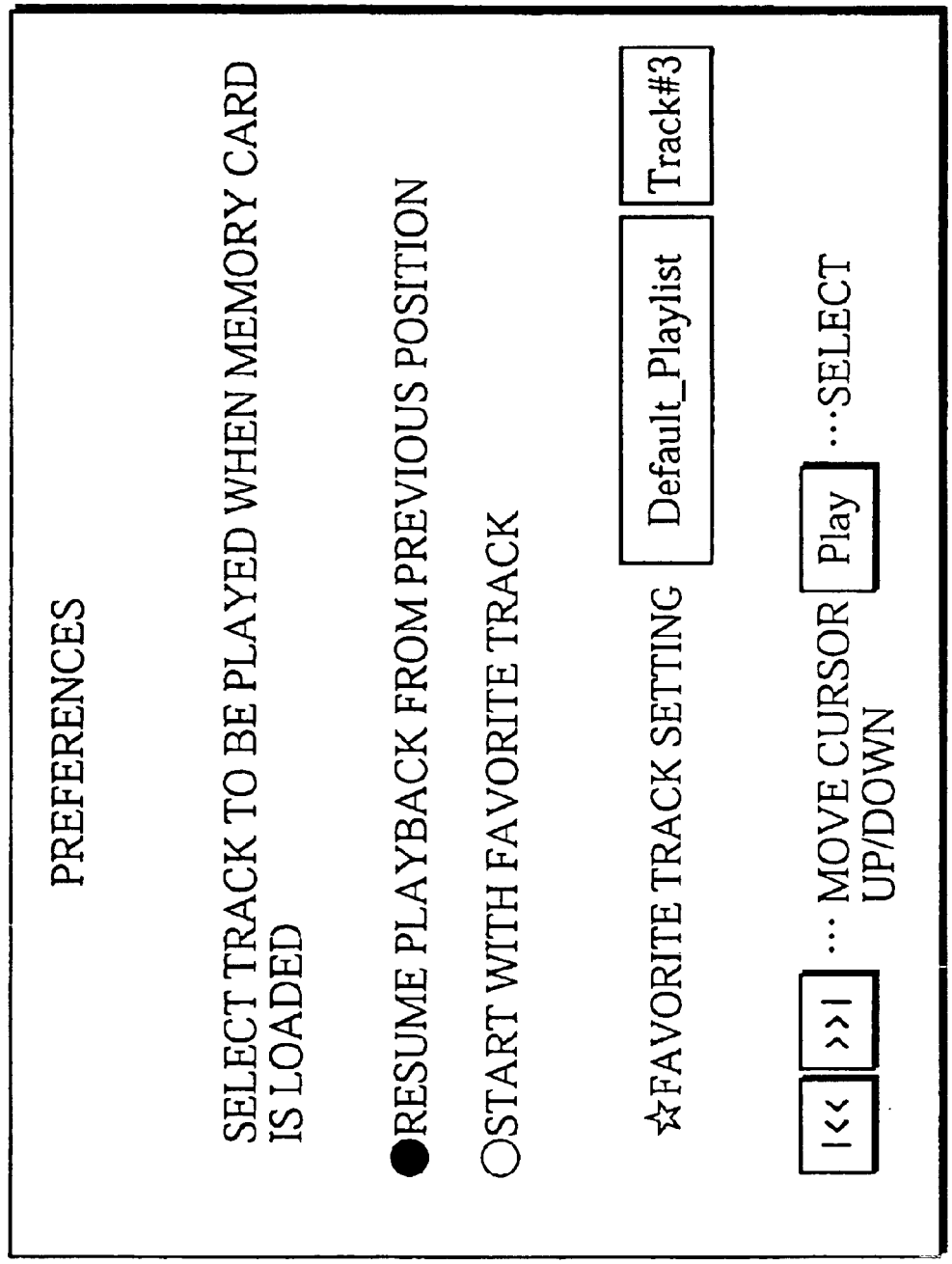
FIG. 72 shows the menu screen used to receive a user setting of the PLMG_AP_*PL and the activation setting.

A first difference is the playback apparatus receives the setting of the PLMG_AP PL and the initial settings from the user. FIG. 72 shows the menu screen used for receiving a user input of the PLMG_AP_PL and the initial settings.

As shown in FIG. 72, by selecting one of the character strings "resume playback from previous position" or "start with favorite track", the user can have the playback apparatus refer to either the PLMG_AP_PL or PLMG_RSM_PL when a flash memory card is loaded. In this example, the user's "favorite track" is the track specified by the Playlist_Number and Track_Number given in the PLMG_AP_PL.

When the user selects one of these character strings, the playback apparatus sets an appropriate flag. This flag (called the "activation flag") shows whether the playback should start from the Playlist_Number and Track_Number given in the PLMG_AP_PL or from the Playlist_Number, Track_Number and Playback_Time given in the PLMG_RSM_PL. When the user selects "resume playback from previous position", the activation flag is set at "on", so that when a flash memory card is loaded, the playback apparatus refers to the PLMG_RSM_PL and starts playing back data from the point where playback was previously stopped. When the user selects "start with favorite track", the activation flag is set at "off", so that when a flash memory card is loaded, the playback apparatus starts the playback with the track indicated in the PLMG_AP_PL.

The menu screen shown in FIG. 72 also allows the user to set his/her favorite track. When the user performs an input operation using a key panel, the PLMG_AP_PL on the flash memory card is written so as to show the indicated playlist and track. Note that the activation flag may be set in other ways, such as by a dip switch or a push-button switch provided on the playback apparatus.

{56_57_58-1} Updating the PLMG_RSM_PL

A second difference with the first embodiment is that when the user presses the "Stop" key, the playback apparatus of the second embodiment updates the setting of the PLMG_RSM_PL. In the first embodiment, a pressing of the "Stop" key in any of the flowcharts in FIGS. 56, 57 and 58 results in the judgement "Yes" being given instep S31, step S42, or step S54 and the processing in that flowchart ending.

In the second embodiment, however, the playback apparatus will then set values in the PLMG_RSM_PL. In more detail, the playback apparatus specifies the Playlist_Number of the playlist currently being used for playback and the Track_Number corresponding to the AOB currently being played back and writes these into the PLMG_RSM_PL. The playback apparatus also refers to the value of the variable play_time (that was described in the first embodiment) at the point when playback was stopped and sets this value in the PLMG_RSM_PL as the Playback_Time.

In addition to when the "Stop" key is pressed, the playback apparatus may also update the settings in the PLMG_

RSM_PL when the user presses the "Pause" key. The playback apparatus may also update the settings of the Playlist_Number, Track_Number and Playback_Time in the PLMG_RSM_PL when the remaining power in the batteries is low. As a result, valid information can be set in the PLMG_RSM_PL for the case where playback stops not because the user has pressed the "Stop" key but because the batteries of the playback apparatus have run out.

{73-1} Playback Position Specifying Procedure

Figure 73:
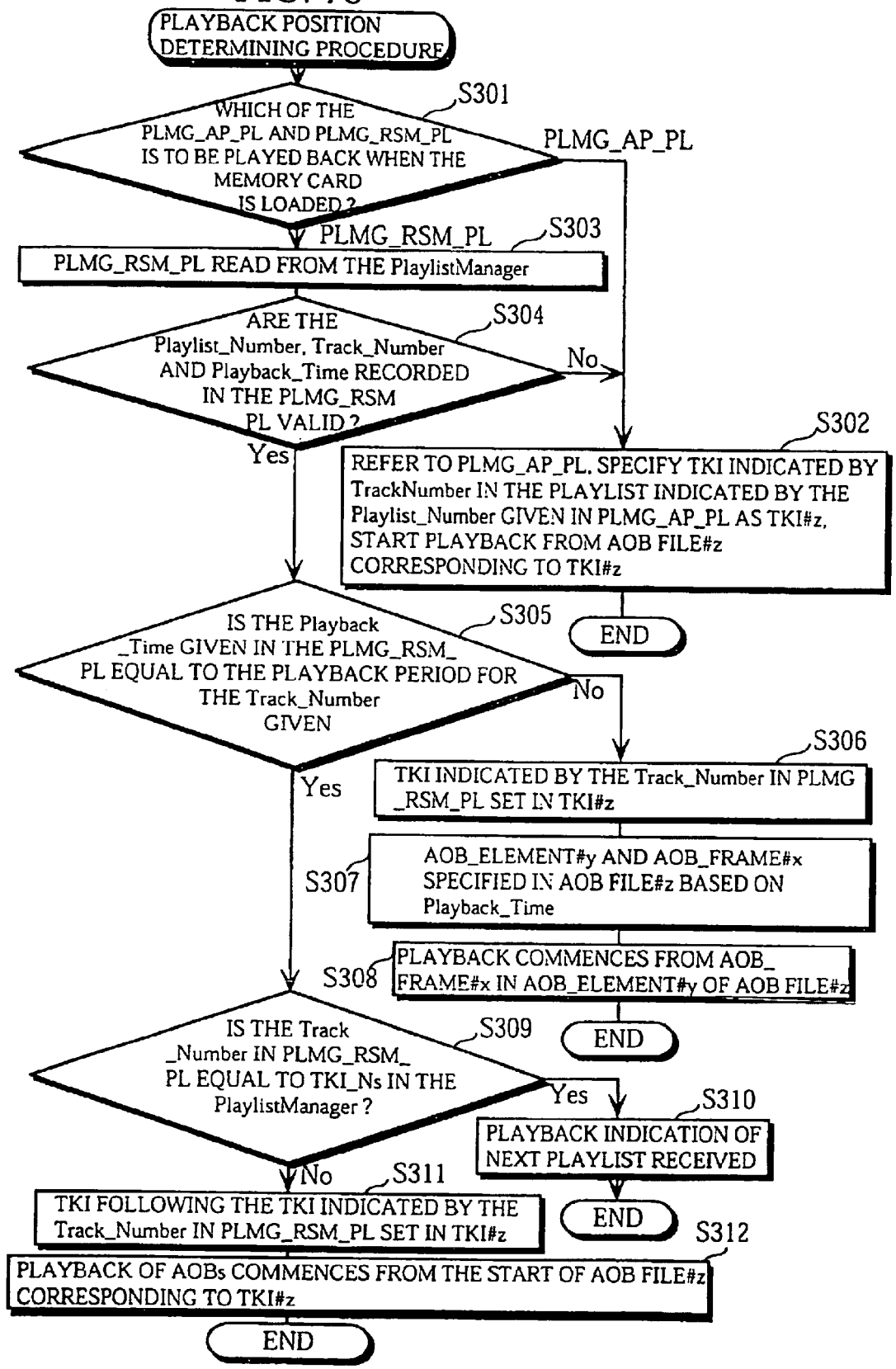
FIG. 73 is a flowchart showing the playback position determining procedure performed based on the PLMG_AP_PL en and the PLMG_RSM_PL.

The following describes the third difference with the first embodiment. In the first embodiment, AOB files are played back in the order in which they are specified by a playlist. In this second embodiment, however, playback is performed starting from the playback position determined in accordance with the procedure shown in FIG. 73. The following describes the playback position determining procedure based on the PLMG_AP_PL and PLMG_RSM_PL. This description refers to the flowchart in FIG. 73.

Once the processing in this flowchart is activated, in step S301 the CPU 10 refers to the activation flag that was set using the menu screen in FIG. 72 and determines which of the PLMG_AP_PL and PLMG_RSM_PL should be referred to when a flash memory card is loaded.

When the activation flag indicates the PLMG_AP_PL, the processing advances from step S301 to step S302. In step S302, the CPU 10 refers to the PLMG_AP_PL and specifies the TKI of the track specified by the Track Number in the playlist specified by the Playlist_Number as the TKI#z that was described in the first embodiment. The CPU 10 then starts playing back the AOB file#z that corresponds to TKI#z.

When the activation flag indicates that priority should be given to the PLMG_RSM_PL, the processing advances from step S301 to step S303. In step S303, the CPU 10 reads the PLMG_RSM_PL from the PlaylistManager_ Information and in step S304 the CPU 10 judges whether the Playlist_Number, Track_Number, and Playback_Time written in the PLMG_RSM_PL are valid.

When the PLMG_RSM_PL was not properly set the last time playback stopped, or when there is an error during a read of clusters indicated by the PLMG_RSM_PL, the CPU 10 will judge that the PLMG_RSM_PL is invalid. The processing will then proceed from step S304 to step S302 where the CPU 10 starts playback based on the PLMG_AP_PL.

When the Playlist_Number, Track_Number, and Playback_Time in the PLMG_RSM_PL are valid, the processing proceeds from step S304 to step 3305 where the CPU 10 judges whether the value of Playback_Time given in the PLMG_RSM_PL is the same as the playback period (TKI_PB_TM) of the track indicated by the Track_ Number written in the PLMG_RSM_PL. If these two values are not equal, part of the track indicated by the Track_Number is yet to be played back, so that in step S306 the CPU specifies the TKI indicated by the Track_Number in the PLMG_RSM_PL as TKI#z and in step S307 the CPU 10 specifies the AOB_FRAME#x and AOB_ ELEMENT#y from which playback should start within an AOB file corresponding to this TKI, based on the Playback_ Time given in the PLMG_RSM_PL.

The procedure for specifying the AOB_ELEMENT#y and AOB_FRAME#x that correspond to any particular playback start time within a track was described in the first embodiment using Equations 1 to 3. The CPU 10 uses these equations to calculate the AOB_ELEMENT#y and AOB_ FRAME#x and then in step S308 starts the playback from the AOB_FRAME#x in the AOB_ELEMENT#y in the AOB file#z.

When the value of Playback_Time is equal to the value of TKI_PB_TM, the judgement "Yes" is given in step S305 and the processing advances to step S309. The CPU 10 then judges whether the Track_Number in the PLMG_RSM_ PL is equal to the TKI_Ns given in the PlaylistManager. If not, this means that at least one track is yet to be played back in the playlist specified by the Playlist_Number, so that the processing advances from step S309 to step S311. In step S311, the TKI following the TKI specified by the Track_ Number in the PLMG_RSM_PL is specified as TKI#z and in step S312 the CPU 10 starts the playback of AOBs from the start of the AOB file#z that corresponds to TKI#z.

When the TKI_PB_TM is equal to the Playback_Time and the Track_Number given in the PLMG_RSM_PL is equal to the TKI_Ns, it can be assumed that the playlist indicated by the Playlist_Number in the PLMG_RSM_PL will have been played back in its entirety, so that the playback apparatus will then receive a user input of the next playlist to be played back.

With the present embodiment, PLMG_RSM_PL is recorded on the semiconductor memory card as the playback resume position. This information shows how far the previous playback of the semiconductor memory card proceeded, so that when the semiconductor memory card is removed from a playback apparatus and loaded into another playback apparatus, this second playback apparatus can commence playback at a point immediately following the point where playback by the first playback apparatus ended.

As a result, when the user listens to a part of a music album composed of TrackA to TrackE on a first playback apparatus, stops the playback, and then has the album played back on a different playback apparatus, this second playback apparatus can refer to the PLMG_RSM_PL showing the point where the previous playback stopped and so know what part of the album has already been played back to millisecond accuracy. The playback apparatus can therefore resume the playback from a point immediately following the point where playback was stopped. This means that the user does not have to listen to the same tracks, even when the semiconductor memory card is transferred from one playback apparatus to another.

Third Embodiment

{74-1} DPLI RSM_PL, PLI_RSM_PL

Figure 74:
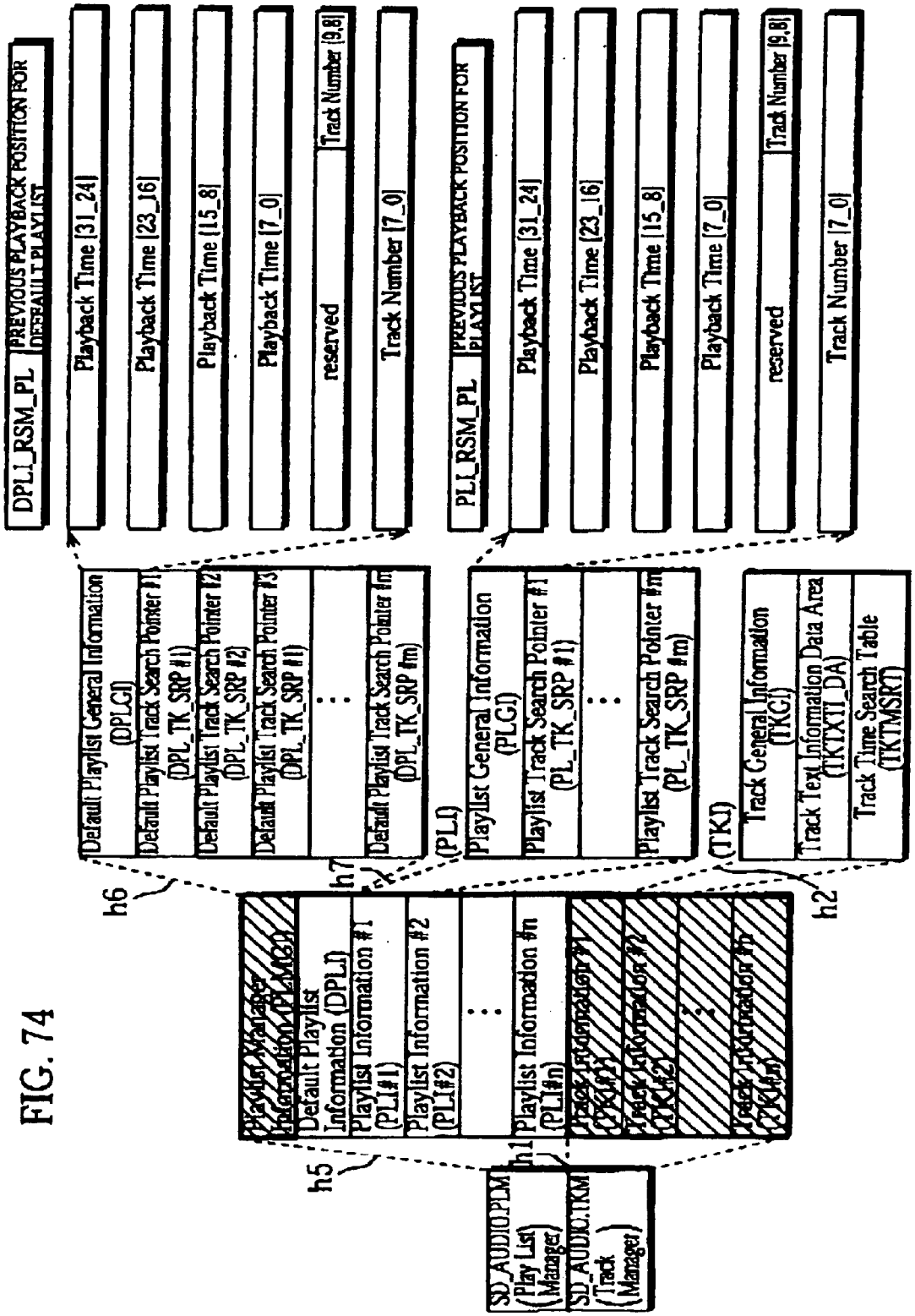
FIG. 74 shows the data construction used when the upper six bytes of the PLI_RSM_PL (DPLI_RSM_PL) are stored in the DPLGI for the DPLI and in the PLGI for a PLI.

In this third embodiment, the DPLI and each PLI are each provided with their own playback resume information, DPLI_RSM_PL or PLI_RSM_PL, to show at what point the previous playback of that playlist ended. FIG. 74 shows the Default_Playlist_Information that has a DPLI_RSM_ PL in the DPLGI and a PLI that has a PLI_RSM_PL in the PLGI.

DPLI_RSM_PL (PLI_RSM_PL) only includes a Track_Number and Playback_Time, and so differs from the PLMG_RSM_PL in that a Playlist_Number is unnecessary. As another difference, when all of the tracks in the playback order indicated by the DPLI or a PLI have been completely played back, the value "FF" is set in the Track_ Number in the DPLI_RSM_PL (PLI_RSM_PL) to show that the playlist was completely played back.

The following describes the playback apparatus of the third embodiment.

When the playback of the tracks specified in the playback order of a PLI is stopped midway, the playback apparatus writes the PlayList_Number of that PLI, the Track_ Number of the current track, and the Playback_Time into the PLMG_RSM_PL in the same way as in the second embodiment. As a difference, however, the playback apparatus also writes the Track_Number and the Playback_

Time into the PLI_RSM_PL corresponding to that Playlist_Number.

In the same way as in the first embodiment, a user can indicate a playlist to be played back. In this third embodiment, however, the playback apparatus will refer to the PLI_RSM_PL of the PLI for the indicated playlist. When no values are given in the Track_Number and Playback_Time in the PLI_RSM_PL of that playlist, the playback apparatus starts the playback from the start of the first track in the playback order given in the PLI. Conversely, when values are given in the Track_Number and Playback_Time in that PLI_RSM_PL, the playback apparatus plays back the tracks in the playback order given in that PLI starting from the position indicated by the Track_Number and Playback_Time.

{74-2_75_76}

Figure 76:
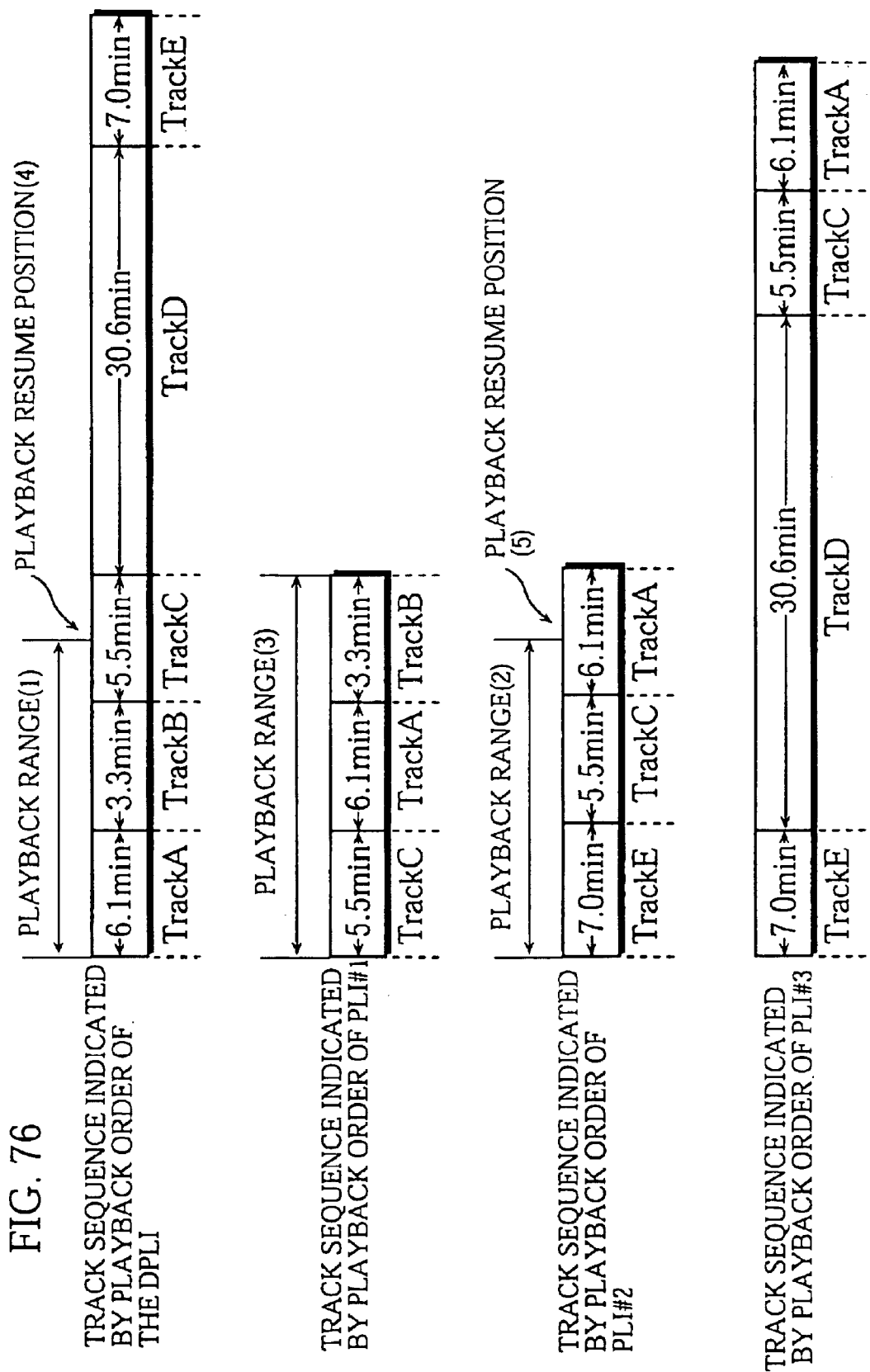
FIG. 76 shows the track sequences composed of the playback orders indicated by the playlists shown in FIG. 41 referred to by the first embodiment.

FIG. 75 shows how the DPLI_RSM_PL of the DPLI and the PLI_RSM_PLs of several PLIs are set. FIG. 76 shows a track sequence composed of the playback order specified by the playlist shown in FIG. 41 that was referred to in the first embodiment.

Track sequences are separately specified by the DLPI, PLI#1, and PLI#2, with the playback ranges (1) to (3) in FIG. 76 showing the parts of these track sequences that have already been played back.

The following describes where the playback will commence when one of the DLPI, PLI#1, or PLI#2 is indicated for playback with the playback ranges (1) to (3) having already been played back.

{74-3_75_76}

Playback of the track sequence indicated by the DPLI was previously performed up to a point midway through TrackC, so that in the DPLI_RSM_PL in the DPLI, "TrackC" and "00:03:31.00004" are set in the Track_Number and Playback_Time to show the playback resume position (4) at the end of the playback range (1).

Reproduction of the track sequence indicated by PLI#1 was previously performed up to the end, so that in the PLI_RSM_PL of PLI#1, "FF" is set in the Track_Number.

Reproduction of the track sequence indicated by PLI#2 was previously performed up to a point midway through TrackA, so that in the PLI_RSM_PL of PLI#2, "TrackA" and "00:01:11.00000" are set in the Track-Number and Playback_Time to show the playback resume position (5) at the end of the playback range (2).

Since PLI#3 is yet to be indicated and its track sequence has not been played back, the value "00" is set in the Track_Number in the PLI_RSM_PL of PLI#3.

As the PLI_RSM_PL (DPLI_RSM_PL) of each PLI (and the DPLI) are set as shown in FIG. 75, if the user indicates the DPLI after indicating PLI#1, the playback of the track sequence indicated by the DPLI will be resumed from the playback resume position (4) immediately after the playback range (1).

If the user indicates PLI#2 once the track sequence indicated by the DPLI has been completely played back, the playback of the track sequence indicated by PLI#2 will be resumed from the the playback resume position (5) immediately after the playback range (2).

With this embodiment, when a playlist is indicated for playback by a user operation, the playback apparatus will refer to the PLI_RSM_PL (DPLI_RSM_PL) for the indicated playlist and will resume the playback of the track sequence specified by that playlist in accordance with the Track_Number and Playback_Time given in that PLI_RSM_PL (DPLI_RSM_PL). This means that playback can be resumed for any of the playlists without repeating tracks that have been previously played back.

Figure 77:
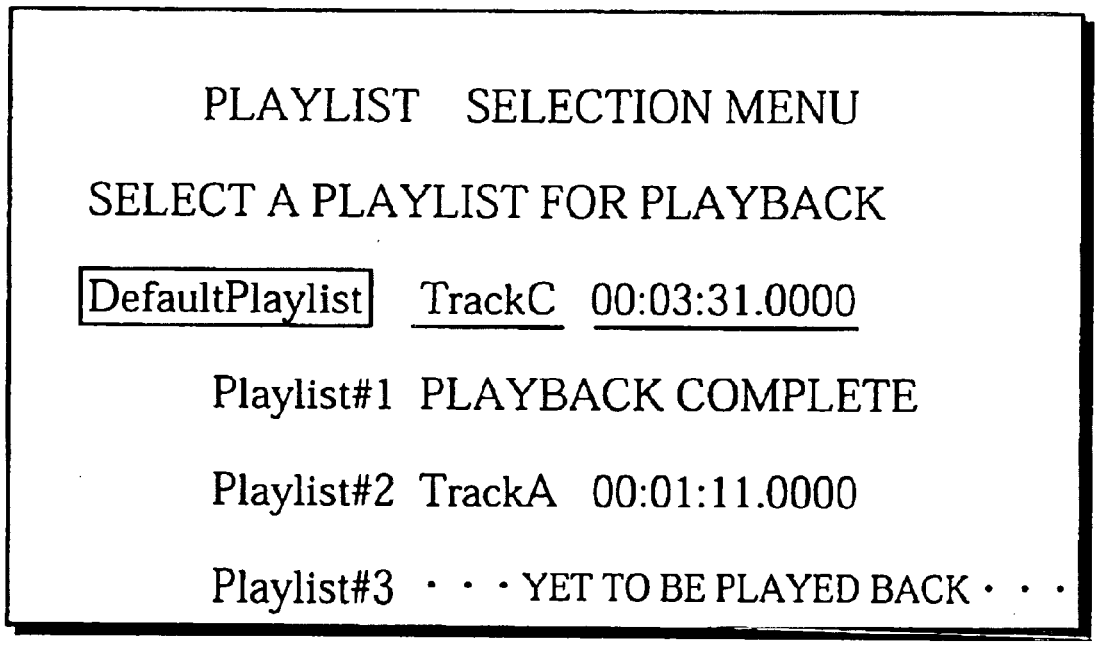
FIG. 77 shows one example of a menu screen that shows each playlist together with the setting of the PLI_RSM_PL for a case where the playback ranges (1) to (3) in FIG. 76 have been already played back.

Note that since the resumption of playback for every playlist is performed in this embodiment according to the Track_Number and Playback_Time in the PLI_RSM_PL (DPLI_RSM_PL), it is preferable for the user indication of the playlist to be made via a menu like that shown in FIG. 77 instead of via the menu of the first embodiment shown in FIG. 49 that merely gives a list of the playlists. FIG. 77 shows an example menu that displays the playlists together with the settings of the PLI_RSM_PL for each playlist for the case where the playback ranges (1) to (3) shown in FIG. 76 have already been played back. PLIs that have not had their track sequences played back in their entirety are displayed with a track number showing the Track_Number in the PLI_RSM_PL and a playback time based on the value of the Playback_Time in the PLI_RSM_PL. Conversely, PLIs that have had their track sequences played back in their entirety have the value "FF" set in the Track_Number in the PLI_RSM_PL and so are displayed with an indication showing that playback is complete. As a result, this menu tells the user how much of each playlist has been played back, so that the user can know which playlists have been entirely played back and which playlists have only been partially played back.

Fourth Embodiment

While music applications are stored on the flash memory card 31 in the first to third embodiments, the present embodiment relates to an improvement in the storage of short-lived applications. Here a "short-lived application" refers to any application, such as news, an audio magazine, a recording of a speech, etc., that only needs to be listened to once, and so differs from music applications that are repeatedly listened to. As conventional examples of the short-lived applications, magazines tend to be published weekly or monthly while news tends to be published every day.

When a recording apparatus downloads a short-lived application via a network, the recording apparatus records the audio data composing the short-lived application onto the flash memory card 31 as AOBs, generates a plurality of TKIs for the AOBS, and stores these TKIs on the flash memory card 31. The recording apparatus also generates Playlist_Information specifying the TKI(s) for this short-lived application and records the PLI onto the flash memory card 31.

Figure 78:
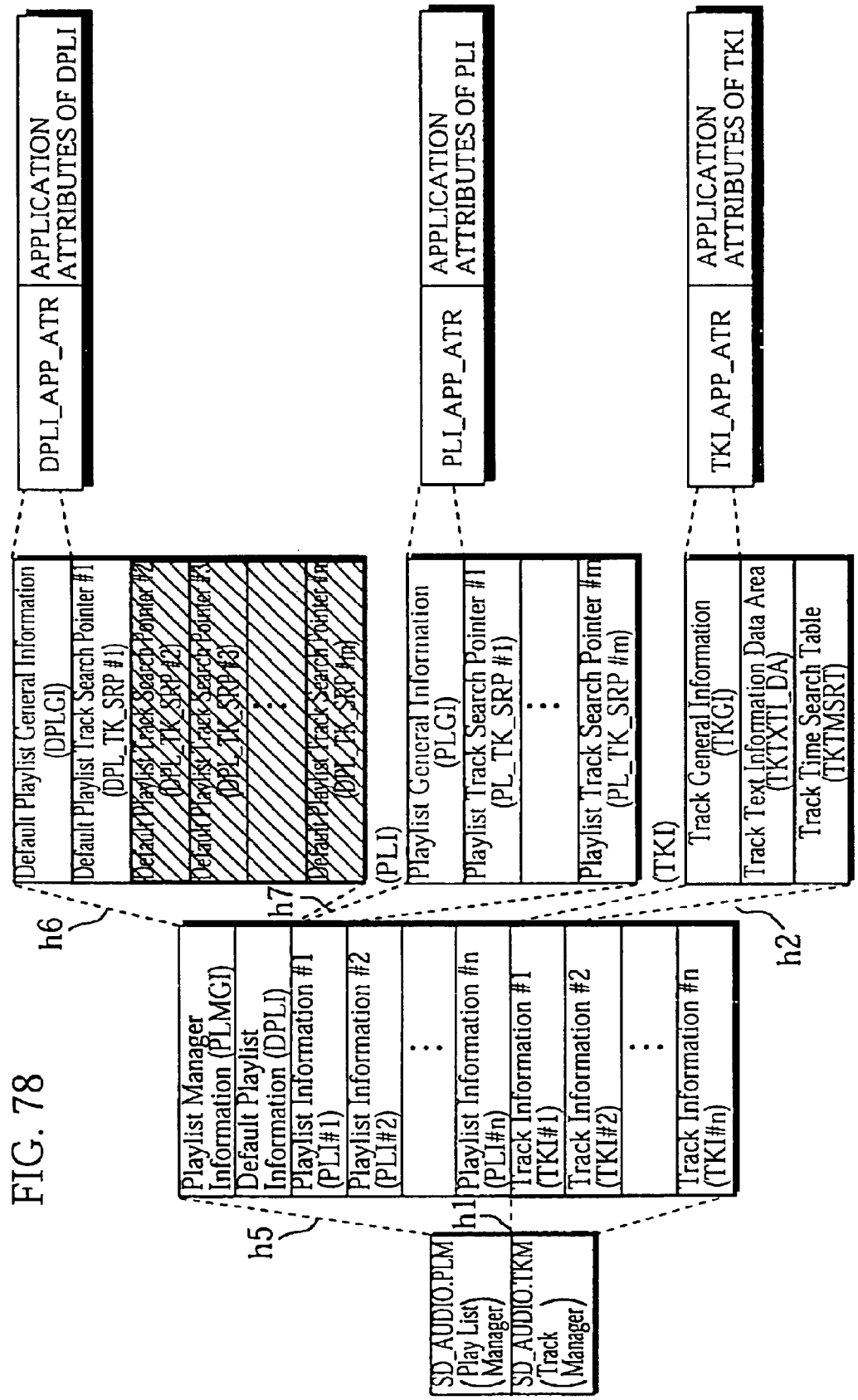
FIG. 78 shows the data format of the DPLGI, PLGI, TKGI in the fourth embodiment of the present invention.

The following describes the improvements in the DPLI, PLIs and TKIs made in this fourth embodiment. In the second embodiment, the PLI_APP_ATR is provided in the PlaylistManager as information showing the attributes of an application. In the fourth embodiment, PLI_APP_ATR and TKI_APP_ATR area also provided as the application attributes in the DPLGI, PLGI, and TKGI. FIG. 78 shows the data format of the DPLGI, PLGI, and TKGI in this fourth embodiment.

Like the "PLMG_APP_ATR" in the second embodiment, the PLI_APP_ATR in a PLGI includes an application category ID showing the category to which the PLI belongs. When the genre of an application corresponding to a PLI is music like in the first embodiment, the value "01h" is set in this field.

In the same way, the value "02h" is set in this field when the application corresponding to a PLI is a karaoke software, the value "03h" when the application is presentation data, and the value "04h" when the application is an audiobook. Other values may also be used to indicate other types of application. In the PLI for a short-lived application, the PLI_APP_ATR in the PLGI is set at "04h" to indicate an audiobook.

A recording apparatus generates a PLI for a short-lived application in this way and stores this PLI on a flash memory card 31 so as to be associated with the short-lived application.

The following describes the problems that occur when short-lived applications are stored on a flash memory card 31. When a short-lived application is used for news, only the most recent application is sent to the recording apparatus every day. If the recording apparatus accumulatively stores every day's news onto a flash memory card 31, the limited storage capacity of the flash memory card 31 will soon be taken up by such short-lived applications.

To stop short-lived applications from taking up too much space on the flash memory card 31, the recording apparatus should refer to the PLI__RSM__PL and PLI__APP__ATR and perform the operations described below. Since short-lived applications are stored on the flash memory card 31 together with PLIs where the PLI__APP__ATR is set to indicate an audiobook, a recording apparatus can determine which PLIs, TKIS, and AOBs correspond to short-lived applications by referring to the PLI__APP__ATRs.

In the PLI for a short-lived application, the value "IFF" is set in the PLI__RSM__PL if all of the tracks in the indicated playback order have been entirely played back, or at a different value if the playback of the tracks in the indicated playback order has not been completed. Accordingly, a recording apparatus can know whether a short-lived application has been played back in its entirety 41 simply by referring to the Track__Number in the PLI__RSM__PL.

After checking the Track__Number in this way, the recording apparatus can delete the TKIS, AOBS, and PLIs for short-lived applications that have been played back in their entirety. This stops the storage capacity of the flash memory card 31 from being overwhelmed by the accumulation of a large number of short-lived applications. Note that while the above example refers to the case where the recording apparatus refers to the PLI__RSM__PL and PLI__APP__ATR, the same control can be performed for the DPLI__RSM__PL and DPLI__APP__ATR.

With this embodiment, short-lived applications, such as news, can be downloaded and stored on a flash memory card 31. Such short-lived applications can be deleted starting with the applications that have been entirely played back, so that even when a short-lived application such as news is produced every day, such short-lived applications can be prevented from taking up all of the storage capacity of the flash memory card 31.

Although the present invention has been fully described by way of example with reference to the accompanying drawings, it is to be noted that various changes and modifications will be apparent to those skilled in the art. Therefore, unless such changes and modifications depart from scope of the present invention, they should be construed as being included therein.

What is claimed is:

1. A semiconductor memory card storing:

an audio sequence in which a plurality of audio objects are arranged;

resume information including a type 1 resume position set according to a user operation, and including, using time information, a type 2 resume position that was automatically set when playback of the audio sequence last stopped; and a plurality of pieces of entry information, each of which is respectively associated with a different audio object, each piece of entry information showing at least one entry position in the respectively associated audio object, adjacent entry positions being separated by an interval equivalent to y seconds, wherein each audio object includes a plurality of audio frames, each audio frame has a reproduction time of x seconds and comprises a header part and a data part, the data part having been compressed by a variable-length encoding method, and the y seconds are not less than twice the x seconds.

2. A semiconductor memory card in accordance with claim 1 further storing at least one piece of playback route information, each of which defines a playback route by including identification information of at least one audio object and a playback position of the at least one audio object in the playback route, wherein the resume information further includes specifying information that specifies one piece of playback route information, and the resume information shows the type 1 resume position by using a piece of identification information and a playback position of an audio object in the specified piece of playback route information, and shows the type 2 resume position by using the time information combined with a piece of identification information and a playback position of an audio object in the specified piece of playback route information.

3. A semiconductor memory card in accordance with claim 2, further storing a piece of supplementary resume information respectively corresponding to each piece of playback route information, wherein each piece of supplementary resume information shows a position in an audio object from which playback should start when audio objects are to be played back in accordance with the respectively corresponding piece of playback route information, using the time information combined with a piece of identification information of the audio object from which playback should start, and each resume position shown by the resume information is one of a plurality of positions shown by a plurality of pieces of supplementary resume information.

4. A semiconductor memory card in accordance with claim 3, wherein a first value is set in each piece of supplementary resume information when playback is complete for all audio objects whose identification information is indicated by the respectively corresponding piece of playback route information, and a second value, which is represented by the time information combined with a piece of identification information of an audio object, is set in each piece of supplementary resume information when playback is not complete for all audio objects whose identification information is indicated by the respectively corresponding piece of playback route information.

5. A playback apparatus for a semiconductor memory card that stores (1) an audio sequence in which a plurality of audio objects are arranged, (2) resume information including a resume position for use when playback of the audio sequence resumes within the audio sequence, and (3) a plurality of pieces of entry information, each of which is respectively associated with a different audio object, each piece of entry information showing at least one entry position in the respectively associated audio object, adjacent entry positions being separated by an interval equivalent to y seconds, the playback apparatus comprising:

a receiving unit operable to receive, from a user, a first playback operation specifying one of the audio objects or a second playback operation that does not specify any of the audio objects; and a playback unit operable to play back the specified audio object when the receiving unit has received the first playback operation, and read the resume information from the semiconductor memory card and play back the audio sequence starting from the resume position shown by the resume information when the receiving unit has received the second playback operation, wherein the playback unit, when resuming a playback from an audio object, (a) detects, when the audio object has a plurality of entry positions, an entry position that is before and closest to the resume position, and (b) detects an audio frame corresponding to the resume position by referring to header parts of audio objects after the detected entry position.

6. The playback apparatus of claim 5, wherein the playback unit detects the audio frame corresponding to the resume position by:

(1) acquiring a size of an audio frame u from the audio frame u;

(2) adding a playback time period of the audio frame u to a playback time v; and (3) accessing an audio frame that follows the audio frame u, based on the acquired size of the audio frame u, and recognizing the accessed audio frame as the audio frame u, and wherein the audio frame u represents an audio frame that exists immediately after the detected entry position, and the playback time v represents a playback time indicated by a piece of entry information corresponding to the audio object.

7. A recording apparatus for a semiconductor memory card, the recording apparatus comprising:

a receiving unit operable to receive an operation made by a user;

a playback unit operable to play back audio objects included in an audio sequence when the received operation is a playback operation; and a recording unit operable to specify, when the received operation is a stop operation, a resume position based on a playback time corresponding to a playback position where the user made the stop operation, the resume position showing where playback of the audio sequence should be resumed, and record resume information including the resume position onto the semiconductor memory card.

8. A playback method for a semiconductor memory card that stores (1) an audio sequence in which a plurality of audio objects are arranged, (2) resume information including a resume position for use when playback of the audio sequence resumes within the audio sequence, and (3) a plurality of pieces of entry information, each of which is respectively associated with a different audio object, each piece of entry information showing at least one entry position in the respectively associated audio object, adjacent entry positions being separated by an interval equivalent to y seconds, the playback method comprising:

a receiving operation of receiving, from a user, a first playback operation specifying one of the audio objects or a second playback operation that does not specify any of the audio objects; and a playback operation of playing back the specified audio object when the receiving step operation has received the first playback operation, and reading the resume information from the semiconductor memory card and playing back the audio sequence starting from the resume position shown by the resume information when the receiving operation has received the second playback operation, wherein the playback operation, when resuming a playback from an audio object, (a) detects, when the audio object has a plurality of entry positions, an entry position that is before and closest to the resume position, and (b) detects an audio frame corresponding to the resume position by referring to header parts of audio objects after the detected entry position.

9. The playback method of claim 8, wherein the playback operation detects the audio frame corresponding to the resume position by:

(1) acquiring a size of an audio frame u from the audio frame u;

(2) adding a playback time period of the audio frame u to a playback time v; and (3) accessing an audio frame that follows the audio frame u, based on the acquired size of the audio frame u, and recognizing the accessed audio frame as the audio frame u, and wherein the audio frame u represents an audio frame that exists immediately after the detected entry position, and the playback time v represents a playback time indicated by a piece of entry information corresponding to the audio object.

10. A recording method for a semiconductor memory card, the recording method comprising:

receiving an operation made by a user;

playing back audio objects included in an audio sequence when the received operation is a playback operation; and specifying, when the received operation is a stop operation, a resume position based on a playback time corresponding to a playback position where the user made the stop operation, the resume position showing where playback of the audio sequence should be resumed, and recording resume information including the resume position onto the semiconductor memory card.

* * * * *